United States Patent
Ackerman et al.

(10) Patent No.: US 11,710,051 B2
(45) Date of Patent: Jul. 25, 2023

(54) ENTITY-SPECIFIC DATA-CENTRIC TRUST MEDIATION

(71) Applicant: Go Logic Decision Time, LLC, Chesapeake, VA (US)

(72) Inventors: Dennis Paul Ackerman, Chesapeake, VA (US); Stephen Francis Taylor, Virginia Beach, VA (US)

(*) Notice: Subject to any disclaimer, the term of this patent is extended or adjusted under 35 U.S.C. 154(b) by 0 days.

(21) Appl. No.: 18/094,002

(22) Filed: Jan. 6, 2023

(65) Prior Publication Data

US 2023/0142664 A1     May 11, 2023

Related U.S. Application Data

(63) Continuation of application No. 17/989,514, filed on Nov. 17, 2022, which is a continuation of application
(Continued)

(51) Int. Cl.
| | |
|---|---|
| *G06F 16/00* | (2019.01) |
| *G06N 5/022* | (2023.01) |
| *G06F 16/21* | (2019.01) |
| *G06F 16/28* | (2019.01) |
| *G06Q 10/00* | (2023.01) |

(Continued)

(52) U.S. Cl.
CPC ........... *G06N 5/022* (2013.01); *G06F 16/212* (2019.01); *G06F 16/288* (2019.01); *G06F 30/20* (2020.01); *G06N 5/027* (2013.01); *G06Q 10/00* (2013.01); *G06Q 10/067* (2013.01); *G06F 9/541* (2013.01)

(58) Field of Classification Search
CPC ...... G06N 5/022; G06N 5/027; G06F 16/212; G06F 16/288; G06F 30/20; G06F 9/541; G06Q 10/00; G06Q 10/067
See application file for complete search history.

(56) References Cited

U.S. PATENT DOCUMENTS

| | | |
|---|---|---|
| 4,675,829 A | 6/1987 | Clemenson |
| 5,280,547 A | 1/1994 | Mahoney |

(Continued)

OTHER PUBLICATIONS

Chakraborty et al., TrustBAC: integrating trust relationships into the RBAC model for access control in open systems, SACMAT '06, retrieved on Mar. 22, 2023, retrieved from the Internet <URL: https://dl.acm.org/doi/abs/10.1145/1133058.1133067> (Year: 2006).*

(Continued)

*Primary Examiner* — Tyler J Torgrimson
(74) *Attorney, Agent, or Firm* — NextWave IP Legal; Leon Fortin, Jr.

(57) ABSTRACT

Establishing event-specific trust through data-centric mediation by: generating a mediated covenant of association as an instance of trust among a plurality of entities at an association layer of a multi-layer computer security system; constructing a security model enforceable by the multi-layer computer security system that expresses node-node semantic relationships as links among nodes of the model representing protectable computing resources; and producing an event-specific security model via informatic convolution of elements of the covenant with elements of the security model, so that the event-specific security model is operable to constrain a computing action among computing resources represented by the plurality of entities.

41 Claims, 45 Drawing Sheets

Related U.S. Application Data

No. 17/939,766, filed on Sep. 7, 2022, which is a continuation of application No. 17/743,132, filed on May 12, 2022, now Pat. No. 11,481,643, which is a continuation of application No. 17/524,202, filed on Nov. 11, 2021, now Pat. No. 11,361,228, which is a continuation of application No. 17/157,496, filed on Jan. 25, 2021, now Pat. No. 11,200,499, which is a continuation of application No. 16/841,990, filed on Apr. 7, 2020, now Pat. No. 10,936,957, which is a continuation of application No. 16/238,122, filed on Jan. 2, 2019, now Pat. No. 10,650,313, which is a continuation-in-part of application No. PCT/US2017/040525, filed on Jun. 30, 2017.

(51) Int. Cl.
*G06F 30/20* (2020.01)
*G06Q 10/067* (2023.01)
*G06N 5/02* (2023.01)
*G06F 9/54* (2006.01)

(56) References Cited

U.S. PATENT DOCUMENTS

| | | | |
|---|---|---|---|
| 5,406,477 A | 4/1995 | Harhen |
| 5,615,109 A | 3/1997 | Eder |
| 6,751,622 B1 | 6/2004 | Puri |
| 7,058,644 B2 | 6/2006 | Patchet |
| 7,149,679 B2 | 12/2006 | Woodring |
| 7,149,700 B1 | 12/2006 | Munoz |
| 7,222,345 B2 | 5/2007 | Gray |
| 7,483,890 B2 | 1/2009 | Zhou |
| 7,506,302 B2 | 3/2009 | Bahrami |
| 7,574,454 B2 | 8/2009 | Lee |
| 7,587,404 B1 | 9/2009 | Albertelli |
| 7,617,014 B1 | 11/2009 | Rangan |
| 7,711,670 B2 | 5/2010 | Roediger |
| 7,725,343 B2 | 5/2010 | Johanson |
| 7,747,625 B2 | 6/2010 | Gargi |
| 7,822,592 B2 | 10/2010 | Hawkins |
| 7,856,383 B2 | 12/2010 | Solberg |
| 7,987,144 B1 | 7/2011 | Drissi |
| 8,060,553 B2 | 11/2011 | Mamou |
| 8,086,467 B2 | 12/2011 | Jin |
| 8,121,967 B2 | 2/2012 | Cheng |
| 8,131,694 B2 | 3/2012 | Bender |
| 8,165,983 B2 | 4/2012 | Li |
| 8,331,699 B2 | 12/2012 | Dewan |
| 8,346,686 B2 | 1/2013 | Gionis |
| 8,380,468 B1 | 2/2013 | McCracken |
| 8,412,548 B2 | 4/2013 | Benavon |
| 8,438,533 B2 | 5/2013 | Fritzsche |
| 8,560,574 B2 | 10/2013 | Austin |
| 8,595,269 B2 | 11/2013 | Farcasiu |
| 8,640,110 B2 | 1/2014 | Kopp |
| 8,788,248 B2 | 7/2014 | Benavon |
| 8,838,468 B2 | 9/2014 | Kano |
| 8,886,587 B1 | 11/2014 | Hainsworth |
| 8,893,086 B2 | 11/2014 | Bassin |
| 8,990,531 B2 | 3/2015 | Ahmad |
| 8,996,494 B2 | 3/2015 | Liebich |
| 9,058,314 B2 | 6/2015 | Boss |
| 9,171,259 B1 | 10/2015 | Laxmanan |
| 9,201,989 B2 | 12/2015 | Haas |
| 9,244,899 B1 | 1/2016 | Greenbaum |
| 9,262,449 B2 | 2/2016 | Amarendran |
| 2009/0178144 A1* | 7/2009 | Redlich ............... G06F 21/6209 726/27 |
| 2012/0011126 A1 | 1/2012 | Park |
| 2013/0246046 A1 | 9/2013 | Fan |
| 2014/0108308 A1 | 4/2014 | Stout |
| 2017/0083792 A1 | 3/2017 | Rodriguez-Serrano |
| 2017/0234824 A1 | 8/2017 | Liu |
| 2019/0278777 A1 | 9/2019 | Malik |
| 2019/0354544 A1 | 11/2019 | Hertz |

OTHER PUBLICATIONS

Balasubramanyan et al., Entropic Regularization of Mixed-membership Network Models using Pseudo-observations. Proceedings of the 29th International Conference on Machine Learning, Edinburgh, Scotland, UK, 2011, Retrieved from the Internet <URL: http://www.cs.cmu.edu/~wcohen/poscript/mlg-2012.pdf> (Year: 2012).
Soundararajan et al., RRED Indices: Reduced Reference Entropic Differencing for Image Quality Assessment, IEEE International Conference of Acoustics, Speech, and Signal Processing 2011, Retrieved from the Internet <URL: https://ieeexplore.ieee.org/abstract/document/5999718> (Year: 2011).

* cited by examiner

ENTITY-SPECIFIC DATA-CENTRIC TRUST MEDIATION

CLAIM TO PRIORITY

This application is a continuation of U.S. patent application Ser. No. 17/989,514 filed Nov. 17, 2022. Ser. No. 17/989,514 is a continuation of U.S. patent application Ser. No. 17/939,766 filed Sep. 7, 2022. Ser. No. 17/939,766 is a continuation of U.S. patent application Ser. No. 17/743,132 filed May 12, 2022. Ser. No. 17/743,132 issued as U.S. Pat. No. 11,481,643 on Oct. 25, 2022. Ser. No. 17/743,132 is a continuation or U.S. patent application Ser. No. 17/524,202 filed Nov. 11, 2021. Ser. No. 17/524,202 issued as U.S. Pat. No. 11,361,228 on Jun. 14, 2022. Ser. No. 17/524,202 is a continuation of U.S. patent application Ser. No. 17/157,496 filed Jan. 25, 2021. Ser. No. 17/157,496 issued as U.S. Pat. No. 11,200,499 on Nov. 13, 2021. Ser. No. 17/157,496 is a continuation of U.S. patent application Ser. No. 16/841,990 filed Apr. 7, 2020. Ser. No. 16/841,990 issued as U.S. Pat. No. 10,936,957 on Mar. 2, 2021. Ser. No. 16/841,990 is a continuation of U.S. patent application Ser. No. 16/238,122 filed Jan. 2, 2019. Ser. No. 16/238,122 issued as U.S. Pat. No. 10,650,313 on May 12, 2020. Ser. No. 16/238,122 is a continuation in part of International Patent Application Serial No. PCT/US17/40252 filed Jun. 30, 2017. The entirety of each of the preceding applications is incorporated herein.

BACKGROUND

1. Field

This disclosure relates to the fields of analytics and of modeling and simulation and more particularly relates to a platform, with various technology components, for improved handling of alternative points of view of individuals involved in decision-making situations.

2. Description of the Related Art

Individuals in business situations and other situations frequently face decisions that depend on the analysis of facts. Big data platforms, analytic tools, and similar systems allow individuals to apply various analytic techniques to data sets (such as financial and operational data of an enterprise) to draw conclusions, support arguments, and the like. However, despite the fact that the structure or organization of data, of an enterprise, or of its activities can strongly influence understanding, such systems do not readily facilitate presentation of a variety of potential structures or organizations for these and other items, such as ones reflecting different points of view. Simulation systems exist, but these also typically fail to readily enable handling alternative points of view. A need exists for methods and systems for facilitating modeling, simulation and other analytic activities that facilitate the improved handling of alternative points of view.

SUMMARY

In an aspect, a method of establishing event-specific trust in a multi-layer computer security system may include generating a mediated covenant of association among a plurality of entities of a plurality of different types of entities including at least one user-type entity, at least one process-type entity representing one or more computing system processes, and at least one data-type entity, the covenant comprising properties representing semantically interconnected topical capabilities sourced from ancillary data associated with one or more entity of the plurality of entities, wherein the covenant expresses an instance of trust among the plurality of entities at an association layer of the multi-layer computer security system. The aspect may further include constructing a security model enforceable by the multi-layer computer security system so that at least a subset thereof may be associated with one or more nodes representing encoded aspects of resources protected by the computer security system, wherein links between nodes in the security model represent semantic relationships based on a security ontology associated with the multi-layer computer security system. The aspect may further include producing a computer security event-specific model, which reflects impacts of at least one of the properties of the covenant at one or more of the nodes, via informatic convolution of the security model with the semantically interconnected topical capabilities of the covenant, wherein the at least one of the properties of the covenant takes on an event-specific meaning in the event-specific model based on the security ontology, and wherein the event-specific model may be operable at an event-layer in the multi-layer computer security system by constraining a computing system action of the one or more computing system processes associated with the process-type entity that acts upon data structures of the data-type entity, the constraining based at least on part on the instance of trust expressed at the association layer.

In the method, generating the mediated covenant of association may include recombinant mediated association among a plurality of entities that may include a first plurality of entities as represented in a first mediated covenant of association and at least one other entity, the mediated covenant of association including a second generation of diffusion of topical capabilities of entities in the first plurality of entities based on and including at least a portion of a root portion of topical capabilities sourced from the first mediated covenant of association for each of the entities in the first plurality of entities, the mediated covenant of association further including a diffusion of topical capabilities of the at least one other entity based on and including at least a portion of a root portion of topical capabilities of the at least one other entity that may be sourced from at least one of a root certificate of the at least one other entity or a mediated covenant of association of the at least one other entity.

In the method, generating the mediated covenant of association may include mediated association among the first plurality of entities, the first mediated covenant of association including a first generation of diffusion of topical capabilities of entities in the first plurality of entities, the first generation of diffusion based on and including at least a portion of a root portion of topical capabilities for each of the entities in the first plurality of entities, the portion of a root portion of topical capabilities sourced from a root certificate of a corresponding entity.

The method further may include performing the computing system action responsive to validation of topical capabilities of each entity of the mediated covenant of association by traversing a chain of certificates, each of which represents a distinct generational mediated covenant, from a certificate representing the event-specific model to a root certificate of at least one of the user-type entity, the data-type entity, or the process-type entity.

Further in the method, the mediated covenant of association represents an outcome of convolution of topical capabilities of a first mediated covenant of association upon topical capabilities of at least one other entity.

Yet further, the convolution may include node-by-node informatic convolution of a hierarchy of informational nodes present in the topical capabilities of the first mediated covenant of association upon hierarchy of informational nodes present in the topical capabilities of the at least one other entity.

In the method generating the mediated covenant of association comprises determining points of connection among a first directed graph representing topical capabilities of a first meditated covenant of association of a first plurality of entities and a second directed graph representing topical capabilities of at least one other entity. Yet further, generating a mediated covenant of association represents a decimation of a taxonomy of a corresponding root portion of topical capabilities.

Further in the method, producing an event-specific model comprises performing a sequence of informatic convolutions of the security model for each node along a directed path in the model of access requirements that may include the one or more of the nodes.

Also, constructing the security model may include extracting a content portion of the resources protected by the security system, constructing a security assertion model from the security ontology, and producing the security model by performing informatic convolution of the security assertion model upon the extracted content portion. Further, producing the event-specific model may include performing information convolution of the security assertion model upon a set of data representing at least one constraint imposed by the security ontology of the links between the nodes. Additionally, constructing the security model may include induction-based content-centric feature mapping of at least one of the extracted content portion or the set of data representing at least one constraint imposed by the security ontology. Further, constructing the security model may include excluding a relationship among at least two of the one or more nodes. Also, excluding a relationship among at least two of the one or more nodes may include severing at least one semantic relationship among the at least two of the one or more nodes. Further, the relationship may be imposed by the security ontology.

Yet further, producing the security model may include excluding from the security model a meaning of at least one entry in the extracted content portion. Also, performing the informatic convolution of the security assertion model upon the extracted content portion may include adapting extracted content portion data elements to comply with the security ontology optimized for event-specific use of the security model.

In the aspect, the ancillary data may include a local access policy associated with a corresponding entity of the plurality of entities. Yet further the ancillary data may include a set of privileges for a corresponding entity of the plurality of entities, the set of privileges including at least one of computational privileges, access privileges, associational rights, exchange privileges, or licenses.

The ancillary data may include a set of aspects of an identity of a corresponding entity of the plurality of entities, the set of aspects including at least one of a cryptographic signature, a password, a unique identifier, or an identity validating token. And, the ancillary data may include a historical context of a corresponding entity of the plurality of entities, the historical context including at least one of previous mediated association outcomes, or a disposition of the corresponding entity. Further, a portion of the ancillary data associated with two or more entities of the plurality of entities may be dispositive as to whether and how the two or more entities establish trust.

In the aspect, the links between nodes that represent semantic relationships may be further based on a determination of a semantic interconnect between linked nodes independent of content thereof. Also, the event-specific meaning may be imputed upon the at least one of the properties of the covenant during the informatic convolution. Note that producing the computer security event-specific model may be based on compositional factors and content factors of a corresponding computing system event. The aspect may include performing the computing system action responsive to validation of the covenant of association by traversing a chain of certificates, each of which represents a distinctly mediated covenant, from a certificate representing the event-specific model to a root certificate of at least one entity of the plurality of entities. Yet further, the certificates in the chain of certificates may be enveloped in blockchain wrappers and enchainment data among the enveloped certificates may be controlled by a blockchain.

In another aspect, a method of securing a computing system, the method may include method steps including: generating a trusted set of semantically interconnected topical capabilities sourced from ancillary data associated with one or more of a plurality of entities; configuring the set of semantically interconnected topical capabilities into a covenant of trust among the plurality of entities; constructing a security model enforceable by the computing system so that at least a subset thereof may be associated with one or more nodes representing encoded aspects of resources associated with the computing system, wherein links between nodes in the security model represent semantic relationships based on a first ontology; and producing a computing event-specific model, which reflects impacts of at least one capability of the trusted set of semantically interconnected topical capabilities at one or more of the nodes, via informatic convolution of the security model with the trusted set of semantically interconnected topical capabilities, wherein the at least one capability of the trusted set of semantically interconnected topical capabilities takes on an event-specific meaning in the computing event-specific model based on the first ontology, and wherein the computing event-specific model may be operable in securing the computing system by constraining a computing system action of a process-type entity of the plurality of entities.

This aspect further may include performing the computing system action responsive to validation of the covenant of trust by traversing a chain of certificates, each of which represents a distinctly mediated covenant, from a certificate representing the computing event-specific model to a root certificate of at least one of the plurality of entities. Wherein the links between nodes in the security model that represent semantic relationships may be further based on a determination of a semantic interconnect between the linked nodes independent of content thereof.

In yet another aspect, a multi-layer computer security system may include a recombinant access mediation system generating a mediated covenant of association among at least one user-type entity, at least one process-type entity representing one or more computing system processes, and at least one data-type entity, the covenant comprising properties representing semantically interconnected topical capabilities sourced from ancillary data associated with one or more of the at least one user-type entity, the at least one process-type entity, and the at least one data-type entity, wherein the covenant expresses an instance of trust among each of the at least one user-type entity, the at least one process-type entity, and the at least one data-type entity at an association layer of the multi-layer computer security system. The multi-layer computer security system also may include a processor-accessible security model constructed so that at least a subset thereof may be associated with one or more nodes representing encoded aspects of computing resources, wherein links between nodes in the security model represent semantic relationships based on an ontology associated with the multi-layer computer security system. The multi-layer computer security system further may include a topical capabilities mediation system producing an event-specific model via informatic convolution of the security model with the semantically interconnected topical capabilities of the covenant, wherein the informatic convolution causes at least one of the properties of the covenant to take on an event-specific meaning in the event-specific model based on the ontology and the event-specific model reflects impacts of at least one of the properties of the covenant at one or more of the nodes. And the multi-layer computer security system may include an event-layer in the multi-layer computing security system providing processor access to the event-specific model to constrain through application of the event-specific model an action of the one or more computing system processes of the process-type entity that acts upon data structures of the data-type entity, the constraining based at least in part on the instance of trust expressed at the association layer. In example embodiments, the ancillary data may include a local access policy associated with a corresponding entity. Further the ancillary data may include a set of privileges for a corresponding entity, the set of privileges including at least one of computational privileges, access privileges, associational rights, exchange privileges, or licenses. Yet further, the ancillary data may include a set of aspects of an identity of a corresponding entity, the set of aspects including at least one of a cryptographic signature, a password, a unique identifier, or an identity validating token. Also, the ancillary data may include a historical context of a corresponding entity, the historical context including at least one of previous mediated association outcomes, or a disposition of the corresponding entity. In this aspect, links between nodes that represent semantic relationships may be further based on a determination of a semantic interconnect between linked nodes independent of content thereof. Note that the event-specific meaning may be imputed upon the at least one of the properties of the covenant during the informatic convolution. In example embodiments, a portion of the ancillary data that may be associated with two or more entities may be dispositive as to whether and how the two or more entities establish trust.

In this aspects, the event-specific model may be based on compositional factors and content factors of a corresponding event. Further in this aspect, constraining the computing system action may be responsive to a result of validation of the covenant of association by traversing a chain of certificates, each of which represents a distinctly mediated covenant, from a certificate representing the event-specific model to a root certificate of at least one of the entities of the covenant. And, the certificates in the chain of certificates may be enveloped in blockchain wrappers and enchainment data among the enveloped certificates may be controlled by a blockchain.

DETAILED DESCRIPTION

Figure 1:
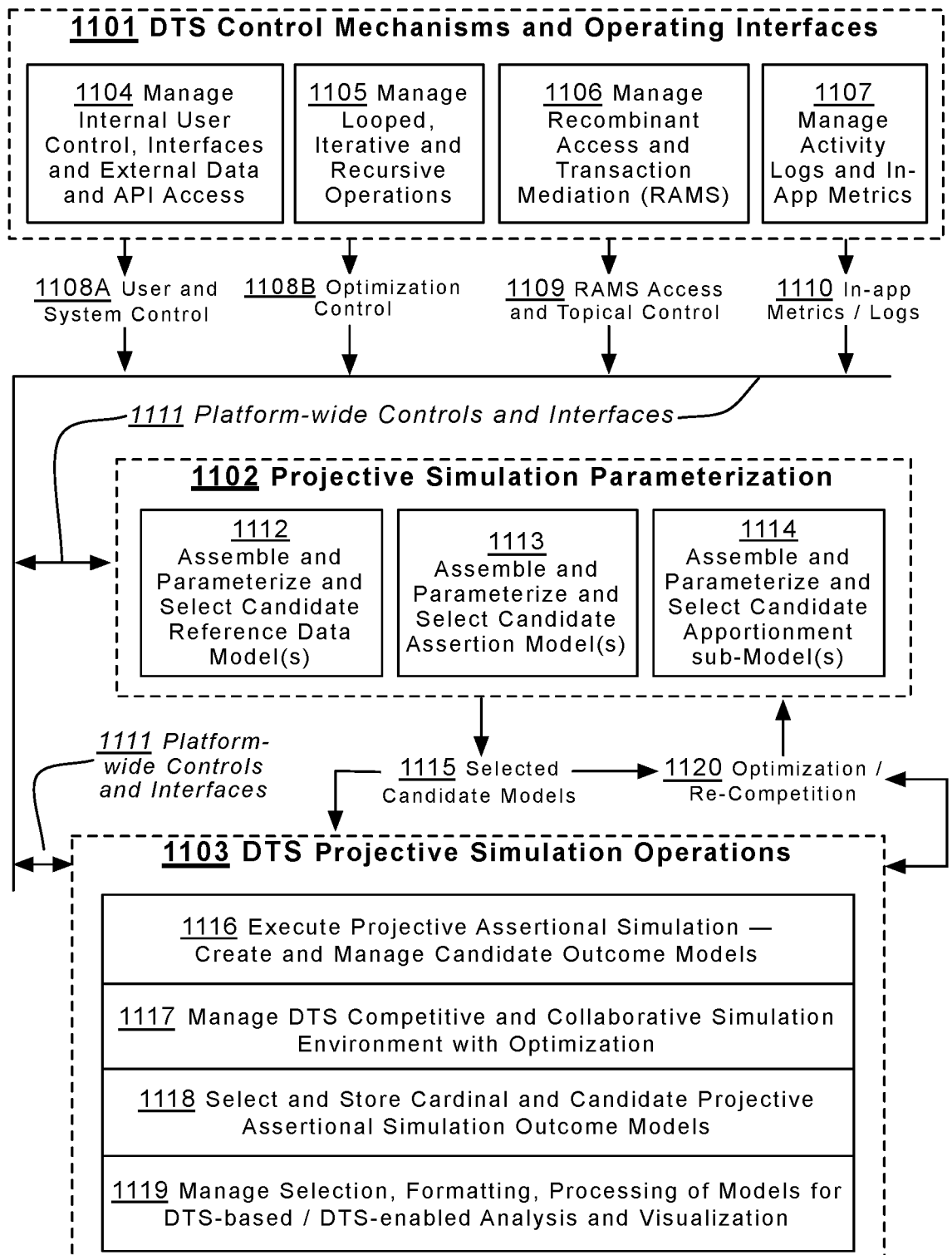
FIG. 1 illustrates a global representation of the system components in the Decision Time System (DTS) Platform.

The Decision Time System (DTS) and its Assertional Simulation processes (and its variations) embody systematic transformation, improvement and integration of various computer-implemented methods and solutions to a number of practical problems. Among other things, DTS integrates in unique ways the functionality provided by a patchwork of disparate technologies into an integrated system ("DTS Platform" or "Platform"), and, deploying novel enhanced and integrated functionality, extends these capabilities within an expansive and systematic synthesis, thereby providing new and previously unavailable capabilities while addressing existing problem-sets in novel ways.

In embodiments, DTS traverses and encompasses an intersection of two major areas of technology: modeling/simulation and business/performance analytics. These areas share some technical, theoretic, and even practical use similarity; however, the distinct commercial and technological vectors that define modeling/simulation on the one hand and business/performance analytics on the other bear only tangential similarity to one another, share few tangible or required methodologies and explicitly address few common problems.

It is in this light and based upon the practice-grounded origins and the multi-pronged applications of DTS that the teachings embodied in DTS (and in its various operational implementations) represent a departure from and an improvement of previous application areas, systems and capabilities, most especially (but not exclusively) in respect to modeling/simulation and business/performance analytic systems but also with respect to other ostensibly unrelated and varied application areas, systems and capabilities such as (without limitation) financial and transaction and topical enablement and mediation systems; business development and business initiative analytics; intra-organizational initiatives and opportunity analysis; prospective customer and sales analysis; customer recruitment prioritization systems; cost accounting and operations analysis; computer, system and network access control, security and execution-rights mediation, and the like. The methods and systems of DTS also reveal novel application of nominally unrelated fields of pursuit, including, without limitation, machine learning, applied computational geometry, applied elements of set and category mathematics, genetic and competitive programming, adaptive artificial intelligence (AI) systems and dynamic communication networks. This departure, as described in this disclosure and as may be understood by those of skill in the related arts, encompasses differences in architecture, in the application of combinations of methods and procedures, in the dynamic manner in which such methods and procedures are contextually invoked and in the structural and organizational underpinnings, as well as in its practical application and usage.

In the most general statement of its core overall functionality, a DTS Assertional Simulation, and the constituent, ancillary and supportive operating components and interfaces (in variations) enable imposition, or projection of a formalized and structured informatic contention which may (without limit) comprise possibly diverse schematic structures (each a schema), computational transformations, semantic changes in reference frameworks of elements (including without limitation, transformative semantic re-referencing and/or re-orientation of constituent information elements) upon one or more reference targets, where such reference targets are typically separate and distinct entities (such as, without limitation, a hierarchical data structure with information content) to produce a third entity, which embodies the result of the imposition of the contention upon the reference targets.

Assertional Simulation (also referred to as DTS Assertional Simulation) encompasses cumulative operations that simulate the effect of such proposals upon such targets, thereby yielding one or more derivative and typically separate and semantically distinct entities that comprise structural alterations and/or compositional transformations and/or reference frame transformations (or other changes in structure and/or composition) effectuated by means of the joint application of one or more of the elements composed within its precursor structures (the proposal and the reference target). Each of these separate resultant entities, or outcomes, may, in embodiments, reflect types and degrees of correlation to its progenitors which, though at least partially disjoint from one or more elements composing the semantical frame its progenitors, reflects a derived informatic relation which unifies, on the one side, the original structure and semantic meaning (or reference frame) of a composed or constructed assertion (where this assertion may, for example without limitation, be germane to a perceived truth of some matter relating to or subsumed within the structured target entity but where each entity may respectively exist within disjoint semantical frameworks), and on the other side, the structure and semantic meaning embodied in the reference target, such that, as a result of the imposition (or coercion) of the assertion upon the reference target, this derived informatic relation serves as one basis of the schema and the semantic frame used for the particular projection, a form of formalized opinion or judgment.

This characterization of the execution of an Assertional Simulation conveys a basic and general expression of the diverse and varied suite of transformative, synthetic, normative and analytic operations applied by and within a DTS Platform to execute various modalities of this novel variation and extension of the art and science of simulation. Employing a complex of dynamically assembled and adaptive computational functionality, Assertional Simulation executes a unique projection of a set of formalized parameterized assertions upon one or more target references using, in embodiments, a form of informational re-composition, one re-purposed within DTS. In DTS-terminology, these collective operations are referred to as "DTS Shannon entropic imposition", language specifically employed within DTS to reflect the tangible, computationally executed "forced assertion or projection of one informatic structure upon another", an operation also referred to, in some cases as "coercive assertion". (Note that the term "Shannon entropy" (and related terms) are used in this disclosure as defined in information theory and not in the colloquial sense (as related to thermodynamics). In embodiments and in general (but not exclusively), the transformational nature of DTS Shannon entropic imposition is coercive in that, among other things, both the schemata and inhered semantical bindings and boundaries defining the informatic reference frame of the assertion is projected upon elements within the target (which may or may not have an entirely different schema and semantical framework but which in any case may, in variations, be treated as such within DTS) such that the structure and semantical frame embedded within and defining the resulting outcome reflect the composite structure(s), schemata and compositional framework(s) which composed and defined its antecedents but which is nonetheless distinct from either.

In embodiments, a DTS Platform provides methods and procedures and interfaces that provide users (and/or system processes and/or combinations) extended capabilities by means of which to create, organize, parameterize, duplicate, restructure, transform and otherwise manipulate the aforementioned organizational and relational and geometric schemata and/or the composition and semantical framework(s) (as well as other transformative and supplemental affiliates) that define the elements subsumed and composed within an assertional structure, where these combined and possibly disjoint properties, in aggregate, give such assertional structures definition, form and composition. This collective DTS capability enables users (and/or system processes) to embed within or formally imbue and/or organize or otherwise arrange collections of assertional structural and compositional propositions, proposals and interpretations about the target (or the manner in which a target should be modified or should have been modified), thereby composing a systematized and formalized actualization of a point of view or judgement regarding one or more target structures, an informatic aggregation (or, in variations, two or more aggregations) that cumulatively reflect combinations (without limitation) of objective facts, quantities and transformations, interpretations about the form and application of objective facts, quantities and transformations, subjective judgements, interpretive and opinion-based application of varieties of domain expertise, but also, importantly, represent and permit users to crystallize and imbue such structures with distillations of experience and intuition and/or consensus regarding any of the foregoing gathered from affiliated parties or processes. This versatile, flexible and context-determined schematic and compositional aggregation (and the systems by means of which it may be actualized and manipulated) embodies a unique extension and enhancement to these arts: a formalized structural and semantic basis for the application of the aforementioned DTS Shannon entropic imposition (and its DTS-developed corollaries), noting, as well, however, that, in variations, the extended capabilities conferred by these innovations may have broad additional application in non-DTS applications and beyond DTS Assertional Simulation, most particularly when executed in conjunction with other DTS-unique, re-purposed capabilities, as outlined in the following figures, descriptions and examples.

DTS is also founded upon an unusual entity-centric and event-triggered design where each such formalization and the related and consequent aggregates of information (or sections therein) as well as one or more elements within any of the ancestral progenitorial forms, its byproducts and its analytic results are owned by users, by groups of users and/or by system processes and/or by other data structures. Entity-centric ownership is a tangible expression of a seminal architectural and operational characteristic that is foundational to DTS Platforms: users, system processes and information aggregates are not only co-equal as operating "entities" but may be (and in embodiments and, in some contexts, must be) "owned" by another entity. Note, however, that in variations, the substantive and concrete results and consequences of this mandated entity inter- and intra- and cross-ownership may be multi-leveled and conditional and, in variations, context-bound and may be expressed in a number of modalities. Thus, users may fully or partially and conditionally own other users, users may own data and may own processes (again fully or partially and conditionally) but equally, processes may also own users and/or data, and so on. But entities also possess properties and characteristics (referred to as entity "ancillary data" within this disclosure) and DTS provides extensive methods to mediate and arbitrate how the various rights and capabilities apply in operational and functional contexts. In modalities and applications, such a layered ownership scheme may become complex: entities, for example, may confederate into both transient and permanent associations and may possess and assume different roles which may carry different ownership schemata and provenance. The management and administration and enforcement of this potentially complex framework is interwoven throughout the methods and procedures and interfaces embodied within DTS Platforms and represents not only a novel operational structure but enables and enhances many unique DTS capabilities, features and functions. The DTS-generated term that encompasses the collection of DTS-based (and/or DTS-enabled and/or DTS-accessible) methods and procedures and interfaces that execute and maintain this functionality is "DTS Entity-Management Fabric" and its constituent elements Associational Process Management (APM), RAMS (Recombinant Access Mediation System) and Topical Capability Mediation (TCM), functional components within DTS that are described in the following paragraphs and in figures within this disclosure.

The practical consequences of the pervasive, system-wide coercion of both entity equality and the layered and context-adaptive ownership scheme redound throughout a DTS Platform, improving and extending, for example, execution modalities of Assertional Simulation and the operations related to the creation and maintenance of elements that contribute to such operations but also provide additional, previously unavailable capabilities in access control and security operations. Equally, however, this unique approach also permits new and novel extensions throughout the DTS Platform, permitting, for example, broad expansion of Assertional Simulation into new application arenas, enhancement and enrichment of the integrated competitive, collaborative and comparative environments and the extension of the capability for user (and system processes) to engage in detailed, fulsome and variegated strategies in pursuit of various system-fostered goals.

In the context of the DTS entity relationships and ownership scheme, each formalization of an assertion embodies one or more forms of a structured contention or point of view promulgated by those owner(s) (for whatever reason) concerning one or more aspects of one or more aspects within a target entity. These proposed transformations reflect and compose a coherent belief in the veracity of a perceived version of "ground truth" according to that owner's point of view. Assertional Simulation executes the mathematical composition of these structured declarations upon target aggregates of information and produces a jointly derivative result that reflects the imposition (or projection or DTS Shannon entropic imposition) of that belief about "ground truth" upon the target entity.

This high-level functional portrayal of Assertional Simulation is reflected in a developed DTS-centric nomenclature, a set of context-bound terms and groups of terms used for both convenience and precision in the development and implementation and deployment of instantiations of DTS but also present in the following descriptions, illustrations and specifications of the actions executed within and by embodiments of DTS Platforms. As discussed, in the most general terms, the aforementioned user- or system process-associated proposal skein represents a formalized point of view concerning how "ground truth", as defined by one or more entities (most often users) should be (or ought to be) imposed upon or otherwise reflected within the structure and/or composition of a target entity. In DTS, this point of view is formally composed within and composes the central propositional characteristic of an entity called an Assertion Model, which, as stated, is a DTS-centric term referencing a structured informatic aggregation. An Assertion Model may be optionally combined with a distinct informatic aggregation called in DTS terminology an Apportionment sub-Model, an adjunct reflective of its "governing" Model (usually the Assertion Model) which provides transformative and/or scaling and/or apportioning information structurally correlated to and ontologically derivative from one or more "governing" Assertion Model(s). These combined entities (referred to in the context of DTS as an Assertion-Apportionment Model pair or as an Assertion-Apportionment Frame) may be applied to the previously-referenced target entity which is called the Reference Data Model. The result of the application of a DTS Assertional Simulation using these (and related) entities is called a DTS Outcome Model, an informatic entity jointly derivative of and ontologically and structurally reflective of the systematic projection (or the application of DTS Shannon entropic imposition) of the Assertion Model (and optionally an Apportionment sub-Model) upon the Reference Data Model.

A DTS Platform operating environment supports a broad range of extensions to and enhancements of the information processing and analytic capabilities characteristic of Assertional Simulation. DTS provides not only standard framework-like capabilities (such as API support and a variety of standard user interfaces) but additional capabilities, such as, for example, without limit, specialized user interfaces, services, features, and extensions providing the means to create, reconstitute, modify, enhance and otherwise manipulate Assertion Models and Reference Data Models and elements thereof, and to similarly modify and parameterize Apportionment sub-Models; methods and procedures and interfaces that, in variations, enable DTS-based, DTS-enabled, DTS-accessible and system-external analytic computational activity to be applied: to one or more DTS models and one or more elements thereof; to information that may be composed within discrete DTS models and related informatic structures and elements that may be inferred from such entities as well as to combination of other DTS-based and/or DTS-enabled and/or DTS-accessible analytic products and activities.

The following description details various embodiments and variations composing a DTS Platform and the implementations and variations of the methods and procedures by means of DTS Assertional Simulation and contains examples, narratives and supporting figures that illustrate embodiments of the broadly-based, real-world applicability of DTS Assertional Simulation and associated DTS Platforms. The versatility of the design and the novel combination of functionality and capabilities that may be applied to and which surround and extend and enhance DTS Assertional Simulation provides the basis for this wide-spread utility.

DTS Assertional Simulation and the broad collection of DTS-based (and DTS-enabled and DTS-accessible) components, methods and procedures provided within and by means of a DTS Platform (outlined in the following description) find great value across a broad range of circumstances and enterprises where users or groups of users advocate alternative points of view and priorities based upon differing opinions, judgements and perceptions. A sampling of such circumstances where the features and functions provided by and within DTS Platforms include (without limitation): (i) enterprises wherein users or groups of users may debate how their organization or entities within that organization entity should be organized and, further, how organization- and entity-related information or operational processes should be (or should have been) structured, evaluated and, ultimately acted upon; (ii) organizations where decisions are routinely made concerning how projects, initiatives and other developmental activities should be evaluated, pursued, prioritized and configured, in what way the required resources should be deployed and how related costs should be estimated, allocated, distributed and even sequenced over time; (iii) exchanges and marketplaces and other transaction-based environments where users and groups of users on opposing sides of a transaction reciprocally engage in a variety of transaction-related activities including (without limit) internal debates about analysis and valuation of elements composing the transaction, evaluation of the importance and degree of exposure to risk, status of contingencies, prevalence of market hazards and other domain-related considerations where each participant on the respective sides of the transaction typically opines from a position of interest in the transaction, but in general advocates positions definitionally based upon or influenced by judgement, opinion and orientation and which are further informed by degrees of experience and extent of domain knowledge, and which involve subjects that are multi-disciplined, complex, nuanced and layered; (iv) strategic planning environments where differences in perception of the relative value and the consequences of choices may be expressed in qualitative and quantitative frameworks, where such diverse factors need to be formatted, revised, framed, visualized, presented, evaluated and reconciled; (v) commercial and non-commercial organizations in all sectors and of all sizes and complexity operating both simple and complex accounting systems where the actual consumption and optimal allocation of resources is a common and contested topic debated in many contexts involving such issues as (without limit) profit center evaluation, cash flow assessment and budgeting and forecasting exercises—these instances cite but a few of the areas in which the novel capabilities of the current invention may be employed.

In embodiments, a DTS Platform provides an integrated operating environment wherein users may construct, present and advocate propositions, proposals and solutions (as embodied within both user-generated and (optionally) system-enhanced) Assertional Simulations and may thereby obtain the means to actualize and make tangible and present a variety of alternative choices, versions of opinions and proposals. In this context, competing and even adjunctive propositions may be presented, examined, subjected to debate, analysis and evaluation. This collection of DTS-provided capabilities and activities enables and enhances the competitive, comparative and collaborative activities and environments that commonly exist in many professional (and even personal) settings and organizations where alternate points of view are not only held and advocated by individuals and groups of individuals but are also are presented and debated, often in an unsystematic way. Utilizing methods and procedures and interfaces provided within (or enabled by) DTS Platforms, elements of and results from various types of DTS Assertional Simulation (as embodied in Outcome Models and other ancillary information) incorporate these propositions in a systematic operational skein so that solutions may be examined, may be subjected to further analysis and interpretation, tweaked and repeatedly simulated, dynamically modified and tested and compared and contrasted to collections of results spawned by application of other Assertional Simulations, possibly originating from and advocated by other users or groups of users. A DTS Platform not only formalizes points of view within Assertion-Apportionment Frames constructed by users to reflect their belief about a Reference Data Model, but also formalizes the means by which such alternate views may be compared. Thus, DTS Platforms provide a suite of competitive and collaborative and comparative capabilities explicitly designed and enabled to facilitate not only inter-user propositions but which also permits users to continually construct, modify, test, combine, duplicate and perfect their own Assertion Model/Apportionment sub-Model/Reference Data Model/Outcome Model sets. Such layered evaluative capabilities within embodiments of DTS Platforms comprise but one application of the variegated types of activities surrounding Assertional Simulation that are available to Platform users, but one that extends and enhances the utility and application of Assertional Simulation.

The competitive, collaborative and comparative component of DTS and its DTS-based (and DTS-enabled and DTS-accessible) extensions and the use of the varieties of constituent Assertional Simulations combine to support a constellation of activities surrounding advocacy, and this broadly-based capability directly addresses common and vital activities encountered in nearly all aspects of business and government. Managers around the world, for example, in businesses of all sizes and types, must routinely make operational and financial decisions in pursuit of both simple and complex strategic and tactical goals. In many such instances, participants must balance numerous alternatives with interrelated levels of consideration, some nuanced, some extending over time, some integrating cross-discipline and inter-domain specificity and some requiring consideration of both quantitative and qualitative factors.

One distinguishing feature in this common managerial exercise, however, is that much of the decision calculus is infused with, informed by and influenced by the opinions, judgements, expertise and experience of the respective advocate(s). But as a measure of the novel approach in DTS, the subjective activity associated with these common operational and interactional paradigms are, as described in the foregoing, formally captured, framed and structured by a DTS Platform as assertions and reference targets—that is, as collections of Assertion Models, Reference Data Models and the associated Outcome Models. But more, these Models that crystallize these common decision paradigms are made available to, are supported by and are enhanced and extended as a result of application of a wide variety of ancillary and supportive capabilities within a DTS Platform.

Note, however, that the nature of Assertional Simulation is not only fundamentally analytic but provides a new type of predictive analytic. In particular, the production of Outcome Models provides a novel, multi-part and context-sensitive predicative capability as part of its overall analytic overlay, both of which are fundamental results and characteristics of Assertional Simulation. The use of Assertional Simulation as a tool for the probabilistic prediction of the past, present and future veracity and efficaciousness of a transformed-by-assertion Reference Data Model (as embodied within an Outcome Model) yields a variety of context- and content-sensitive results which are useful across many applications and in many environments.

The predictive analytic nature of Assertional Simulation is simple and clear to see when considering that, as stated, the objective of Assertional Simulation is to produce a "better" representation of the reality encoded in a Reference Data Model. Thus, users predict that the choices they make within their Assertion Model will not only result in the desired improvement (as they understand it) but that the parametrization of this admixture of facts, opinions, judgments and expertise within the Assertion-Apportionment pair is the best means to do so. Thus, by its nature, the quantitative and subjective choices imbued and initialized by users or system processes within Assertion-Apportionment pairs are chosen to maximize the probability that the Outcome Model will comprise the best representation of their vision of what reflects a "good" or "true" or, at least, their desired set of changes to a reality encoded in the Reference Data Model. This is a new type of predictive analytic, one that incorporates some of the novel aspects of DTS but which also, in variations, extends beyond this simple example.

Thus, in embodiments, a DTS Platform may be used both as an analysis mechanism in itself and an enablement facility for analysis creating the conditions for presentation, explication and resolution of many practical and immediate business enterprise problems where important aspects of the advocacy and decision-frames are opinion-, experience- and judgement-based, such as (without limitation) optimal profit center organization; actual cost of resource deployment for projects and initiatives; actual cost to pursue new initiatives, to develop new business and to extend the scope and operations of existing business units; indirect cost allocation among operating units and profit centers; contextual and dynamic assessment and assignment of employee costs; integration of the foregoing into budgeting and forecast proposals; creation and comparison and analysis of varieties of "what-if" scenarios, use of proceeds and evaluation of initiatives and many other day-in-day-out activities. These are common activities which managers of all levels in small and large organizations of all types regularly engage in, and they share the common feature that opinion, experience and judgement influence and often play a key role in the results. A DTS Platform is specifically designed to use various forms of Assertional Simulation and to deploy a broadly-based and versatile suite of ancillary and support functionality to provide an integrated environment and solution-set but to also facilitate the novel predictive aspects of Assertional Simulation to be applied to such real-word problems.

As one simple example among many, suppose a group of managers within an enterprise have different views about how the enterprise should be organized, such as with respect to its organizational chart. These different points of view held by the managers (and the underlying rationale and supporting logic) may be reflected in one or more propositions that can be structured and applied by each party via a step-by-step (and in implementations, system-guided) process of construction and parametrization of one or more Assertion Model(s) and Apportionment sub-Model(s), through the structural assembly and compositional construction of Reference Data Model(s) and application of DTS Assertional Simulation, processes executed by each manager. In general (but not exclusively), common (or shared) Reference Data Models are used by all parties and may (typically but again not exclusively) be extracted or derived from one or more existing data structures available to the management group from within the enterprise (such as operational or accounting data). These elements permit each party to create collections of Outcome Models that reflect that party's various points or views and opinion pertaining to one or more potential or optimal results. These collections of results-sets (and the progenitorial structures and ancillary information from which they were derived) may be used to arrive at a collectively agreed-upon solution but in the process of arriving at this consensus, these DTS-fostered processes and the constituent structures may reveal insights about the enterprise and even about the participating parties, inferences and conclusions that are drawn from, based upon and made possible by the DTS operations that permit formalization, comparison, modification, presentation and analysis of the alternative perspectives. Among many examples, enterprise structures involving organizational charts, reporting channels, communication channels, charts of account, allocations of profits and losses, allocations of costs, allocations of assets, and many other common elements in enterprise operations may benefit from Assertional Simulations and the capabilities provided by a DTS Platform.

The breadth and variety of enterprise-centric, operational, financial and commerce-based applications of the DTS Platform reveal one aspect of its novel design; namely that DTS Assertional Simulation and the associated DTS Platform-based functionalities can (in various implementations) be operated in multiple modes and orientations, in some cases transitioning between and employing such modes dynamically and within computational and informatic compositional contexts, and in variations, transparently to users, without requiring direct (or even indirect or even any) user prompting. Certain Assertional Simulation applications, by their nature, combine certain modes.

A user, for example, may invoke certain permutations of an Assertional Simulation. In embodiments, these permutations may have been pre-built-into a DTS Platform or assembled, named and saved by user(s)). In the process of construction of permutations, one or more versions of Assertion Model(s), Apportionment sub-Model(s) and permutations of Reference Data Models may (without limitation) be permanently, dynamically or deterministically arranged, layered, sequenced, re-sequenced and/or rearranged in one or more pre-set or conditional or determinative computational orders. Such construction procedures may (without limitation) produce or derive and reuse one or more versions of resultant Models. In embodiments, the computational objective of permutation construction and/or supplied parameters may be optionally based upon, inferred from or derived from any or all of the following (in any order and without limitations): (i) user and/or system and/or extra-system input; (ii) information supplied by and/or derived from local and/or global and/or extra-system conditions; (iii) data and/or metadata and/or other transformative parameters extracted from and/or produced from or by one or more current or previous execution results (and/or by and from one or more elements therein). In embodiments, this information may be utilized conditionally or deterministically to produce one or more Outcome Models such that any of all of these results may be presented, analyzed and visualized in a variety of ways but such that the net operation may be understood in user-terms as composing a single operation. In plainer language, a DTS Platform permits users to combine and instigate Assertional Simulation by assembling collections of (and elements from) Assertion Models (and Assertion-Apportionment Model Pairs) from a variety for sources and in a variety of ways, even from previously derived (and possibly discarded) results-sets. The results of such combinatorial modes of composite assembly may also include the antecedent processes that produce the results and may be preserved for reuse or for reference or for any reason (such as, for example for inclusion in an audit trail of activity). Moreover, in other variations, such operations as in the foregoing (e.g., as composed within methods, procedures and interfaces within a DTS Platform) may execute functionality outside such composite operations but which may (with or without user prompting) transiently assemble elements as a "composite confederation" and execute all or part of such compound Assertional Simulations, where the aggregation is dynamically actuated and available in any number of computational contexts, where such aggregations may conjunctively, adjunctively and conditionally or deterministically also (without limitation) execute and incorporate one or more ancillary and supportive operations, thereby assembling combinations of capabilities to execute and leverage the constructive and analytic capabilities of an Assertional Simulation.

Among other advantages, the dynamic, adaptive and multi-modal, layered execution architecture of the DTS Platform and its constituent elements not only extends and enhances the inherent capabilities of Assertional Simulation (and its ancillary and supportive operations) but also permits and extends broad application in commercial, non-profit, personal and governmental applications. In embodiments, this architecture hides much of the complexity from users and operators and permits users of all levels of expertise to seamlessly (and often transparently) adapt to and transition to and transition from, transition within and transition between a variety of functional and operational modes and conditions.

One versatile capability that is broadly-deployed within various operations within the DTS Platform (e.g., operations where its multi-modal capabilities may be evident) centers about comparison, differential analysis and competition between ideas and proposals and other by-products of Assertional Simulation. These capabilities apply not only within organizations that may be assessing the relative value of various initiatives but also between market competitors such as, for example, competitors that may be involved in transactions within market exchanges. In such undertakings, and indeed in many commercial and non-commercial endeavors, competing and alternate viewpoints about value and relative value of certain propositions (and even of goods, commodities or services) often form the basis of internal deliberation and debate in the process of decision-making (e.g., in the case of enterprise-based operations) and competitive bidding and negotiation (e.g., in markets for goods and services).

Note, however, that in business and in governmental enterprises, managers not only compete for resources but also advocate particular views of ground truth and put forward opinions (often underscored and reinforced by quantitative factors and arguments) about how the interests of the organization (or their part of it) may be pushed forward by selecting one proposal (or approach) over another. In many instances, such a proposal may combine objective facts and quantities, assert interpretations about how to use such data and advocate beliefs about its relative importance, thus creating an inherent subjectivity, a perspective underscored by the common inclusion of subjective judgements, interpretive application of domain expertise and opinion culled from experience and intuition. These situations and other common environments embody at least one application domain of Assertional Simulation. The DTS Platform combines many disciplines and diverse techniques and transforms and interconnects nominally unrelated components to enable systematic methods that permit users of all types and levels of expertise to address and solve these problems.

The DTS-based (or DTS-accessible or DTS-enabled) components, methods and procedures that comprise the DTS Platform may be employed in various modes and novel combinations, and, as a consequence, the Platform and variations of Assertional Simulation find utility and applicability in many aspects of commerce and enterprise operations. As an example, the methods and procedures permitting the projection of a domain of asserted propositions across a domain of reference targets to produce an outcome that may be evaluated and compared in order to find such utility and applicability. The following description will elucidate but a few such applications, and those skilled in the relevant arts may plainly see others not here described.

Note, further that it is characteristic of embodiments of Assertional Simulation and the DTS Platform in general that, in variations, the specific operations used to execute certain types and classes of calculations (and other related operations) may utilize any number of computational techniques, depending upon any or all of the following considerations without limitation: structural and compositional factors; operational, procedural and computational context; explicit and inferred user preferences, user activity history and other context-based activity-based operations; explicit and implied user mandate; and system requirements, limitations or constraints. Thus, for example, operations executed within any given Assertional Simulation (or as may be executed within an iteration composed with a sequence of such simulations) may adapt to and may be altered or otherwise adjusted in response to the immediate (that is, the current) system state, conditions and context, and/or to previous states and conditions, and in variations, to projected future states and conditions, where such states and conditions and context may include but may not be limited to any combination of the following factors: (i) one or more aspects related to (or which may be inferred from) the content of the data being processed; (ii) one or more aspects related to (or which may be inferred from) the geometric structure and relationships to other information; (ii) user and/or system mandates and intentionality; and/or (iv) specific requirements or constraints that may result from any of the foregoing but also from one or more aspects of a specific computational executable.

In one example, presented without loss of general applicability of alternative methods, Assertional Simulation may, in variations and in some circumstances, execute a node-by-node, discrete and/or piecewise informational convolution between elements composing proposed assertion or declaration structures and elements within targets (in DTS terminology, this operation is called DTS informatic convolution to distinguish this DTS-engendered coercion from other forms of convolution which, in variations, may also be applied within DTS implementations), wherein one or more nodes within the proposed schematic geometry (composing the structured assertions) may be applied upon one or more nodes within target entities, such that one or more DTS executable methodologies collectively produce structurally and ontologically correlated derivative and logically discrete result entities composed within designated, distinct and addressable informatic entities. In DTS, these derivative structures are called Outcome Models and embody and embed the mutual information jointly extracted from and reflective of their particular proposition-target precursors.

As one use-case example of this specialized type of informatic convolution (which is, itself a novel use of the well-known convolution operator seen in linear mathematics—again, referenced with the DTS-spawned term DTS informatic convolution), consider the application of Assertional Simulation to a common problem in operations: the allocation of indirect expenses to profit centers. Accurate reflection of how resources associated with these profit centers are actually consumed (as opposed to a formulaic estimation often applied by accounting personnel and rarely changed) is vital in assessing profitability throughout a company but is very often a matter of judgment and opinion. Managers, for example, in charge of profit centers that use resources shared with other such centers such as, for example, a conference room, may offer different opinions about true usage by their personnel within their profit centers. To illustrate the manner in which Assertional Simulation may be applied here, suppose there are 6 profit centers within a section of a company with 6 managers in charge of their budgets and responsible for their profitability. Let Department A have fewer personnel than the others but, in this example, uses a conference room much more often than Department B which has more employees assigned to it, while Departments C though E (whose headcount lies between the Departments A and B) barely use the room at all, while Department F, which has the highest employee headcount, never uses it. And yet the cost of maintaining the room (designated as an indirect cost) is allocated across the 6 departments using a formula set up and maintained by a remote accounting department which does not itself use the resource nor witness its usage. This situation is common in organizations of all types and sizes. In the current example, the indirect costs accrued for maintaining the conference room are formulaically spread by headcount among the 6 Departments, also a common practice. But Department A is the most profitable among this group while Department F is the least. By deploying DTS Assertional Simulation, the cost of the conference room (contained in accounting data and reflected in the relevant Chart of Accounts entries) may be made to serve as the Reference Data Model. Each manager may then assemble their own Assertion-Apportion Model pairs wherein each embeds their opinion about how their respective Departments utilize the conference room—that is, they assign a percentage, by month, for each Department within their Assertion Models. Each manager executes an Assertional Simulation producing a set of Outcome Models, each reflecting the view each manager has of the proper apportionment of the cost of that resource to their Department. In this example, using the competitive and collaborative capabilities within a DTS platform, the various points of view (as embodied in the aforementioned Models and Outcomes) are examined and analyzed and, in this case, it develops that in reality Department A uses the room 70% of the time but is only assigned about 16% of the cost by the headcount-based formulaic allocation of the total costs for the conference room, whereas Department F consumes 0% of the resource but is also assigned 30% of the cost. The other Departments discover similar disparities.

In this instance, the managers and their supervisors agree to adjust the allocations and the result is that not only does the accounting of the consumption of this resource more accurately reflect the actual "ground truth" but the profitability of each department changes, as well. Thus, a set of conclusions were derived through consensus by a group of stakeholders, each creating, parameterizing and executing their own Assertional Simulations, producing unique-to-them Outcomes, information that could be compared and analyzed. There are many ways that a DTS Platform may assist in and augment and enhance even a simple Assertional Simulation exercise like this, and such capabilities and relevant examples will follow in this description facilities.

In its most essential expression, therefore, DTS Assertional Simulation formalizes the imposition or coercion of structured user-perceived, user-nominated (or in some contexts system-driven) "ground truths", a DTS-specific term used to encompass and describe not only verifiable facts, but which may also include points-of-view about such facts where such perceptions may differ between system users and even within and between system processes and information structures. Such coercion of an assertion of "ground truth" is applied by application of dynamically invokable content-sensitive and content-responsive computational functions upon targeted information sources such that the consequent results simulate such imposition or coercion upon a target. Result-sets, in turn, embed the precepts that were embedded within the declarative assertions (and applied by projection to target structures) and are (or should be, according to the asserted ground truth) valid in the informatic context of the target. Thus, in this most general statement of its overall functionality, DTS and Assertional Simulation (and the supporting and ancillary components described in this disclosure) enables imposition, or projection of one or more proposed schematic structures and additional related scaling or apportioning information (the Assertion Model and Apportionment sub-Models—often collectively referred to in DTS terminology as the Assertion-Apportionment pair) upon information elements within a target (the Reference Data Models), a typically separate, structured entity (such as, without limitation, a hierarchical data structure with information content). Assertional Simulation encompasses cumulative operations that simulate the effect of the imposing the schemata and affiliated information within an Assertion-Apportionment pair upon such targets, yielding one or more derivative and typically separate entities (Outcome Models) that, in some modalities, reflect structural and/or compositional and/or normative and/or translational re-composition derived from its precursors. Each of these separate entities, or Outcome Models, reflects the broadly-defined semantic meaning or intentionality which reflects, as in the foregoing, a point of view stipulated by users and/or system processes about one or more aspects within the Reference Data Model, where such semantic meaning or intentionality is embedded within an Assertion-Apportionment pair. In DTS terminology, this characterization of Assertional Simulation is referred to as a Shannon entropic imposition.

In embodiments, therefore, DTS-based (and/or DTS-enabled and/or DTS-accessible) methods and procedures and interfaces permit users (and/or system processes) to create, organize, parameterize, restructure and otherwise manipulate the aforementioned informatic structures in order to embed propositions, proposals and interpretations about the target, a systematized and formalized point of view which forms the structural and semantic basis for the aforementioned entropic imposition; in DTS, each such formalization may be associated with and owned by users, by groups of users and/or by system processes and may embody the owner's structured contention concerning the appropriate composition of one or more aspects within a target entity, an asserted veracity that reflects the ground truth according to a given point of view. The functional composition of these structured declarations upon target entities produces a jointly derivative and correlated result reflecting the imposition (or projection) of the ground truth propositions upon the target entity. Among other applications, DTS Assertional Simulation is of great value in situations where there may be alternative points of view about how an entity or its associated information or processes should be structured.

In practice, this collection of methods and procedures produces novel informatic structures that, in implementations, may be used in numerous ways by DTS users and, by others (by means of API's and formatting procedures), by DTS-based and DTS-enabled system processes as well as by other external resources. Further, the result-entities from Assertional Simulations may be used in a number of ways, including but not limited to: (i) as standalone analytical products that reveal the consequence of the imposition of a particular set of truths or points-of-view upon targets, surfacing, in many instances and variations information or insights that may have been previously obscured; and (ii) as tangible re-structured admixtures of information elements that are systematically derived from the progenitorial entities and that are recast based upon user-driven (and in variations, system-mandated) points-of-view (thereby crystallizing the outcome of applying structured assertions upon the information involved in a given situation).

In this sense, in some variations, DTS Assertional Simulation results-sets (and byproducts of its operations) may, in variations, be used in a variety of ways and may be used to serve multiple purposes, and in many cases, specific utilization choices may depend upon (or may be influenced by) such example factors as user intention, data type or structure. Most fundamentally, however, in a common but elemental usage, the result sets produced by DTS Assertional Simulation (and in variations, sub-sections thereof) may themselves compose the desired end-point analytic. That is, in many applications, one or more result sets (in part or in whole) provide users (or system processes) with sufficient information for the current task-at-hand such that the delivery of the output of immediate operations requires no further computation or processing: the "Outcome Models" produced by the application of DTS Assertional Simulation produces, in these cases, the information required by the system users. Thus, in such instances, the results themselves constitute an analytic product and, in these and similar instances, Assertional Simulation functions as a complete and sufficient analysis tool. In such variations, these results may, for example, and by means of one or more DTS-provided or DTS-enabled user interface components, be rendered into graphical visualizations which may then be subject to visual inspection or display and didactical analysis.

The utilization possibilities for the results of Assertional Simulation are varied, however, and even in such cases where the immediate result-sets serve useful (and in some cases) definitive analytic end-points, elements of the simulation products (and in variations, the progenitorial model structures, as well, and, in other instances, sections thereof) may be subject to further DTS-based, DTS-enabled and non-DTS analytic processing. In such instances and in some implementations, DTS result-sets (and/or subsections thereof) may, in addition to composition by means of various Assertional Simulation techniques, be optionally re-formatted specifically to serve as input into one or more additional analytic processing resources, where such computational facilities may be enabled by, may be available to or may be integrated within DTS. Thus, in implementations, DTS results sets may constitute one (or one of several) input sources to one or more such processes, where, in some variations, other factors may optionally be included within these computations (where these input values may include, for example, DTS-originated or user-supplied or externally acquired information, or combinations thereof), but such that in these additional processing cases, the cumulative effect would produce one or more distinct analytical products, distinct that is, from the original results sets.

A simple initial example of a certain type of application of Assertional Simulation, one to be expanded throughout the following descriptions as illustrative of one variety of the host of possible applications of the present invention, suppose in a simple market transaction, a seller wishes to sell an item. ("Sellers" are called "seekers" in DTS parlance in order to permit its general applicability to many party-counterparty situations, but for the sake of simplicity in the present example, will be called "seller".) Suppose further that within this marketplace, there are groups of potentially interested buyers for this item. (Note again that in DTS phraseology, "buyers" are called "providers", where, as before, the term reflects the general applicability of DTS to counterparty situations—so that, in a simple instance, buyers are understood as "providing" money, but, as may be seen as this type of application evolves in the context of the following descriptions, could also effectuate a transaction by combinations of currency and other negotiable items such as services or future considerations.)

Continuing this example, the seller, of course, has an opinion about the market value of the item, but this is not always the sole determining factor in party-counterparty interactions. Suppose, therefore, that in this example, the seller has a belief which qualities he would like to see in the ideal counterparty. Thus, in this case, the seller wishes to know certain details about the buyers in order to assess such things as their honesty in other transactions, their histories and their stated intentions versus their actions. There are many possible reasons for this common desire to know more about a buyer: the seller may not wish to see his item re-sold to a competitor, for example, and since (in this case) the seller is unable to prohibit a resale, may wish to evaluate which buyers are most likely to do so. Thus, in addition to price, the seller will wish to evaluate the relative "fitness-as-buyer" for each prospective counterparty based upon on things like "resale likelihood" as well as other on other criteria. Note, therefore, that in this example, the seller may gather information from and about each buyer and assemble and organize such information into a structured informatic entity using DTS-based, (and DTS-enabled and DTS-accessible) methods and procedures, a structure that represents, as in the foregoing, the reference target associated with that buyer, but which is owned and controlled by the seller.

Employing capabilities within the DTS Platform, the seller may also construct an assertional structure in order to evaluate this collection of buyer-associated target references. These reference targets may contain a mixture of quantitative and qualitative information, so the seller may use DTS capabilities to apply not only formulaic and computational evaluations but to assign relative weight to these results as well as to certain "intangible" factors, such as, for example, the seller's opinions and judgements about the importance of certain transaction history and the likelihood of dishonest behavior. Thus, the seller now possesses a target reference for each buyer and an assertional structure by means of which to evaluate each such reference.

Note that for the sake of simplicity in the example, a large amount of the relevant information about buyers and sellers is available to and commonly shared within the exchange, perhaps in this example, as part of the terms within the market exchange, and perhaps, as well since it is public information.

Continuing the example, suppose further that each buyer will also use DTS-based, (and DTS-enabled and DTS-accessible) methods and procedures to construct a target reference applicable to the seller and then an assertion reflecting his views of the item, his priorities and other judgements unique to him. But note that since the buyer is on the opposite side of the transaction, the configuration of reference-assertion pairs will differ from that constructed by the seller, even while some of the same considerations and judgements may apply. In an example of reference-assertion pair differences, both buyers and sellers may have opinions (as expressed in each participant's assertional structure) about installation costs (a common value that is expressed in both participant's target reference); however, their opinions may be formed from different basis. In constructing his target reference, for example, (whose topic in this example is both the item and the seller), the buyer will wish to perform an evaluation of the value of an item, one that will, of course, differ from buyer-to-buyer based on any number of factors and motivations but which, in this example, may, in some instances be based not only upon the (perceived) intrinsic value but also upon other factors indirectly related to the item itself. There could be many reasons for this common occurrence: as with the seller, some buyers may have interests beyond the details germane to the item itself and the mechanics and motivations of the sale itself— namely, an interest in details about the seller: what are the motivations behind this sale, for example, what sort of transaction history (buying and selling) does this seller have, how well have other transactions gone, and so on. In most market environments, such evaluative issues assume relative degrees of importance to various buyers, and, in many markets and/or in many transactions may rise to a dispositive and determinative role in both the decision to engage with a seller and in setting a value for transacted item(s). Thus, as with the seller, buyers may create a reference target integrating information related to both the item and the seller, including, perhaps, quantitative (e.g., size and the like) as well as qualitative information (e.g., user ratings and the like) about the item itself, information related to the item (e.g., average installation costs and the like) and information about and related to the seller.

As with the sellers, the buyers may also create their own assertion structures to apply to the seller-associated reference structure, where such buyer-centric assertions may in concept be similar to those created by sellers (as described above) and may use some of the same DTS components but which may differ both in intention and objective. In addition to "hard" numerical evaluation, the buyer's opinion, judgements and experience about the value and relative importance of both "hard" and soft" factors are embedded in this structure as the buyer evaluates different aspects of the seller's associated reference target. But note that each buyer is applying their individual assertions to the same seller target. In DTS, this form of Assertional Simulation is called underwriting.

As may be seen in this simplified explanation, sellers and buyers may use the DTS Platform to execute Assertional Simulation, but each side in this party-counter-party arrangement uses the Platform in a different mode and from a different perspective and with different motivations. In this simplified example, the seller constructs a single assertion to evaluate a group of buyers each of which is assigned a collection of assembled reference (or target) information; the collection of buyers, on the other hand, use individually-created (and buyer-owned) assertions to evaluate a single reference associated with the seller. Note that in this example, a large portion of the information assigned to both target references of both buyers and sellers are shared within the exchange, it is also clear that even in this basic example, some additional information may be obtained by some buyers and not others. In this instance, some uniquely-held information may be embedded in a given buyer's uniquely owned assertion structure. This disparity in "intelligence" capability is not uncommon, and DTS Platform operations both permits and enable such eventualities. Thus, in party-counterparty applications, each side of the transaction has a completely different set of opinions and tasks: the seller wishes to evaluate and rank a number of buyers using a set of criteria, while a multiplicity of buyers seeks to evaluate both the item itself but, less tangibly, in many instances, the seller. This simple situation reveals one multi-modal application of Assertional Simulation: both parties are engaged in the same enterprise or "game" (to sell the item) but each side of the transaction deploys variations of the Assertional Simulation capabilities in a different mode and manner, each using different components, methods and procedures within (or enabled by or accessible to) the DTS Platform but with same objective: to instantiate a set of assertions and to project or cast or coerce that information upon reference target information.

Note, therefore, that since the seller may construct and embed a set of criteria within a single assertion and that this assertion is projected across many reference targets (e.g., buyers), each such Assertional Simulation yields a unique result, a collection of outcomes (e.g., one for each buyer). Employing a variety of DTS-based (or DTS-accessible or DTS-enabled) components, methods and procedures, each such result may be "ranked" against the others and subject to analysis and evaluation. The seller may wish to "tweak" or modify variables and elements within the assertion and re-run the simulation, thus producing a different set of outcomes. This competitive, comparative operation (one assertion applied to many reference targets to yield a field of outcomes) is a distinct mode within the DTS Platform and is based upon game-theoretic operations to produce a non-zero-sum outcome wherein each projection operation is a game instance but there are only relative winners—hence, the net result is relative ranking. In a practical sense, the seller is using DTS Assertional Simulation to run a private competition among buyers to evaluate the relative "fitness" of each buyer. In DTS parlance, this type of Assertional Simulation is called "ranking", typically (but not exclusively) deployed in party-counterparty application: in such applications, ranking is (in general but not exclusively) executed from a seller's point of view such that a single assertion is applied to a multiplicity of reference targets and the associated outcomes of the repeated simulation are ranked based upon the elements composed within the assertion cast across the reference target.

On the other side, in this present example, the buyers use a different mode within the DTS Platform, called "underwriting", also typically (but not exclusively) deployed in party-counterparty applications: where underwriting is (in general but not exclusively) executed from a buyer's point of view. In underwriting, in contrast to ranking, Assertional Simulation applies many assertions (each owned by a buyer or group of buyers) to a single reference target (the amalgamation of commonly-shared information about the seller), resulting in a unique buyer-owned outcome. In this example where there is a single item (and thus a single reference target), the results of underwriting are available for analysis and evaluation by the buyer. But suppose this example included multiple sellers of the same item or similar items (or items that may be dissimilar but sufficiently alike as to be associated in a market or section of a market). This change shifts the game-theoretic activity of the buyers to a non-zero-sum ranking game that is similar in structure to that executed by sellers where individual sellers and their associated items are underwritten, and the outcomes sorted by whatever criteria the buyers wishes.

Note that this example of Assertional Simulation is but one instance of the ways in which the DTS Platform may be utilized and illustrates, in a general way, multi-modal and "layered" game-theoretic operation provided by the Platform. In this instance, note that while each party is engaged in a non-zero-sum game in order to analyze and evaluate the transaction (sellers execute ranking of buyers and buyers execute underwriting of the sellers), the overall activity in DTS party-counterparty operations is zero-sum since, ultimately, there is single buyer who purchases the item. Thus, in embodiments, the competitive and collaborative environment within the DTS Platform facilitates a number of game-theoretic based operations that may be combined, repeated and layered within one another. In the present example, opposing parties produce outcomes based upon the results of Assertional Simulations and employ in non-zero-sum methods to evaluate and analyze the relative value of each entity, relative ordering based on each players judgement, intuition, application of expertise to objective quantifiable information and other subjective criteria. But this bi-partite game is a sub-game within a zero-sum, winner-take-all activity, where one buyer "wins". This layered and combinatorial feature suffuses the DTP platform and provides but one of the supporting enhancements to the methods and procedures of Assertion Projection.

This novel multi-modal and "layered" game-theoretic functionality is a unique characteristic of DTS, one executed within and by means of operations and interfaces throughout the DTS platform and in the varied application of Assertional Simulation and its results. This approach is not merely a framework but is tangibly evident within many operations and interfaces throughout DTS. A few examples of these capabilities implemented in embodiments of DTS include (but are not limited to): i) the layered and competitive algorithms within one or more looped recursive operations (discussed in subsequent paragraphs) which specifically reflect certain precepts and parameterization techniques derived from known game theory models; ii) the DTS-based (and/or DTS-enabled and/or DTS-accessible) methods and procedures and interfaces that implement, facilitate and provide supportive and ancillary services within the rubric of the competitive and collaborative capabilities, a foundational aspect of DTS wherein different Outcome Models may be compared systematically, by inspection and by internal and external processes; iii) in certain modalities in the execution of some types of Assertional Simulation wherein elements within a Reference Data Model may be apportioned in percentages (e.g., a non-zero-sum game) but evaluated against alternate apportionments in the context of a competition (as may be advocated by other users as in ii) above and/or as part of a looped optimization operation) where the selection of the "best" apportionment constitutes a zero-sum game; iv) in user- and system-accessible tools and user interfaces which, in embodiments, are functionally framed and labeled as "strategies and tactics" (reflecting certain game-theoretic models and principles) and constituted within certain modalities of competitive Assertional Simulation wherein users employ these tools to engage in both zero-sum and non-zero-sum competitions (for resources in an organization, for example or to secure the winning bid for a proposal).

In another example, suppose DTS Assertional Simulation is applied to a project management challenge. Here a DTS user wishes to simulate various organizational configurations, deploying Assertional Simulation to test and evaluate the efficacy of different proposed organizational schemata to be used to manage the deployment of, for example, volunteers in a charity event, and ultimately, to assist in calculating the respective resource costs and to assess efficiency under different deployment scenarios. By using various user interfaces available within the DTS platform, this DTS user may construct a variety of different personnel allocation schemas which may be centered, for example, around functional task-types, creating departments to which volunteers may be assigned, such as food vending or seating management. The result of creating these proposed departments and specifying personnel assignments may be rendered using Assertional Simulation and inspected through DTS-supplied (or DTS-enabled) visualization techniques. Applying a simple but commonly employed extension, assume further that the DTS user wishes to also allocate the time each volunteer should spend in each assigned department, so that a given volunteer may be assigned, for example, to work in one department 60% of the time and 40% of the time in another. In more sophisticated variations, but one that is not uncommon in certain applications, Assertional Simulation may be integrated with iterative or looped optimization techniques where the definition of optimal Outcome Models may be specified by the user (or by the system), and result-sets created by repeated simulations wherein modifications are made to simulation parameters, and the resulting Outcome Models compared to the synthetic ideals until a best-fit parameter group is found.

In this example, the DTS user possesses a point of view regarding the most efficacious deployment of volunteers within various departments and the best apportionment of their time, and, using DTS-based interfaces and procedures, parameterizes this arrangement. This user may then view, inspect and examine the DTS result-sets that reflect this proposed organizational schema and apportionment plan through graphical visualizations and analytic renderings. In this sense, as mentioned in the foregoing, the result-set itself constitutes the analytic product and the graphical rendering is simply a method to view the data. The Assertional Simulation results may be examined, inspected and deconstructed and compared manually and visually without the need for additional computational processing.

As a reflection of the competitive aspect of DTS, suppose further, however, that the DTS user serves as part of a committee that has been assigned to organize this event and that each member is also a DTS user. Each user could then construct their own view of the best plan for volunteer deployment and time apportionment, noting that each such result-set reflects not only a user's point of view but embedded biases and predispositions, as well. One committee member, for example, may view a certain volunteer as being particularly well-suited to a certain type of job in a certain department, while another user sees the volunteer as having skills. Even in cases where the previously-described optimization techniques are deployed, such algorithms generally require some initialization, input choices which may, in general, also reflect user bias. In this example, the committee may use DTS-provided or DTS-enabled visualization interfaces (or in some cases, analytic tools) to examine by inspection the relative merits of the views of each committee members and may then make choices concerning the best plan.

In another example, suppose a bibliophilic collector ("collector" or "bibliophile") possesses a large and diverse collection of documents, books, journals and audio and video media (in various formats and encodings), a diverse assemblage traversing a variety of topics and genres, but which includes both physical and virtual forms, such as bound books (paper and electronic), paper records, handwritten notes and files, newspaper clipping as well as e-books, web references and other electronic documents. This example (and others) will be cited throughout this disclosure and expanded in context as exemplary of the many aspects of DTS and Assertional Simulation.

In the initial portion of this example, let the collector be concerned only with a sub-section of his collection, bound books, and let the example focus upon of N instances of bound books—that is, at present, the bibliophile will be applying DTS Assertional Simulation only to the portion of his collection consisting of printed and bound books. Suppose further that the bibliophile wishes to organize this collection sub-section according to subjective preferences and point of view—that is, in a manner that comports with how the collector wishes to access and utilize this resource, but which also reflects their view of the optimal, most accurate and most efficacious representation of the topical composition of each element within the sub-collection. In other words, the schema reflects the collector's perception of ground truth. Finally, this example assumes that these ground truth opinions are based upon a high degree of familiarity with these books but also a particular set of predispositions and prejudices about the potential topical organization.

In this example of an application of Assertional Simulation, the bibliophile creates a list of the N titles (a data structure termed flat in DTS parlance). This list of book titles composes the DTS Target Data Structure. Based upon familiarity with the collection, the collector then constructs a categorization system composed of M categories which (initially) has the following rules: a) every title must be assigned to one of M categories; b) every book may be part of one and only category; and c) there are no sub-categories (and thus, this particular construct of categories is also flat in structure). Further, the collector assigns a binary inclusion factor to each title in the target list as viewed through the categorization structure, such that the binary inclusion factor value 100 denotes that a title is part of a category and 0 denotes that it is not.

But note that in this example, the collector permits a null designation by which he intends to convey that the so-designated title has no known category; note, as well, however, that DTS (in general but not in all cases) considers this designation a computational nullity, and that the categorization of null for that title would be undefined. Nullity will play a minor role in this present example, but is not a rhetorical or didactical conceit since, in variations, nullity provides operational functionality in certain DTS operations, and though it may not apply in all variations of Assertional Simulation, it may be included in other examples within this disclosure.

In the context of this example, the target data comprises an unordered set of N titles, a structure subsuming a set of N information nodes (though, other target data configurations and orderings are possible). Likewise, the categorization structure, another flat list of categories conceived by the collector represents the (current) perceived ground truth or point of view about the proper organization of this set of books, a schema the collector wishes to impose upon his collection. In this instance, each element in the categorization structure—that is, the collector-proposed schema of M elements—also possesses an associated but not-yet-assigned scaling metric used to category denote inclusion.

Using DTS user interfaces, the example bibliophile employs DTS Assertional Simulation to impose his categorization schema (the proposed assertion of a nominated version of ground truth regarding the best way to topically classify the books) such that the structure of the assertion is, in this case, applied to each instance in the list of titles (nodes within the target entity), coercively imposing each scaled element from the parametrized schema upon each node within the target. Thus, each category and its assigned metric (in this case 0 or 100) are applied to each title in the target list. But since, in this version of this example, a book may be relegated to one and only one category, the application of the scaled assertion upon each node results in a binary assignment status for each book, so that, comporting with the stated requirements, each title may be assigned to one category (and thus given a metric of 100 for this category) and is designated as not assigned to each other category (and is thus given a metric of 0 for each of these remaining categories). The result of this simple instance of Assertional Simulation is a derivative informatic entity, in this case, a 2-dimensional key-value structure.

This result exemplifies certain core aspects of DTS in a number of ways including without limitation: 1) the application of Assertional Simulation to two 1-dimensional structures (that is, to two flat lists) produces a 2-dimensional outcome structure, an axiomatic mathematical by-product of DTS projection which is usefully leveraged in other aspects of DTS; and 2) the outcome, as with other DTS projective operations, may be formatted for inspection in any number of ways, including for example, as a 2-column list of N rows of book titles where each such row references its category in an adjacent column. But the data may also be organized for visualization and inspection in any number of other ways, including, (again, in a non-limiting example) in a matrix presentation wherein each category is arranged as a column header and each row contains a title and is assigned either a moniker of 0 or 100, as described.

This example and the use of Assertional Simulation by the bibliophile to impose and refine a categorization system demonstrates one elemental method that DTS users may employ wherein Assertional Simulation may systematically project a particular view of a truth upon an independent collection of information. In this instance, the operational deployment of DTS interface structures effectuates the projection of a structured topical schema upon a collection of books via a node-by-node DTS Shannon entropic imposition of the user-nominated structured schema upon the target collection, the net operation reflecting the actuation of particular point of view or a ground truth about the composition of the target data.

In embodiments, DTS embodies improvement and systematic integration and actualization of techniques from disparate bodies of art that in the past have been applied piecemeal in business and professional situations featuring changeable and emergent requirements and/or that tend to involve different points of view among involved individuals, stakeholders or other entities. Since the integrated solution-set of DTS has not been previously constituted, an architecture, framework, methods and systems (collectively referred to as the System) are disclosed that encompasses components from distinct domains, with contextual improvement, refinement, enhancement and integration of such components and with unified operating principles that characterize DTS, its components, and its variants.

To illustrate but one example of the contextual refinement of a domain-specific operation, the terms coercion and DTS informatic convolution (and other forms of convolution) are used in this disclosure in connection with the application of an assertion to a target structure. These terms encompass meanings ascribed to them in computer science and mathematics, but are also used here to encompass, except where the context indicates otherwise, a broader range of transformations that may be applied, such as by applying one or more computations defined by an assertion, to one or more nodes in a target data structure. In embodiments, such as those involving bipartite discrete projection, such computations may be applied to every node in the target data structure. DTS projection does not always strictly convolve elements from the proposed schematic assertion with elements within the target structure, at least as convolve is commonly used in such fields as statistics, signal processing and computer vision (where, tangentially but not arbitrarily, DTS also has application). In those and other fields, convolution typically refers to the result produced by the application of a convolution operator between two parameterized functions to produce a third function which is (in general) applied to those parameters, such that this latter function composes a transformed version combining (in a domain-specific fashion) the first two functions and thus, upon application to the parameters, produces a new but hybrid-based result. While a DTS Assertional Simulation may use just such a convolution, as will be seen below, DTS projections may involve operations that produce a derivative data structure based on computations on a target without strictly (or simply) applying a convolution operator but rather may combine such unique operations with content-sensitive and content-responsive methods and procedures and interfaces sensitive to system context and user intentionality—again, a computational scenario referenced as DTS informatic convolution. But note that the term coercion typically refers in computer science to the explicit and forced conversion of one data type to another, a common operation that is often also called casting. In implementations and variations, DTS may involve such coercion or casting, such as at the code level within various DTS components, but DTS employs this term in references that are relevant to and which encompass the novel DTS-based re-referencing of the ontological underpinning of information in a target data structure, a characteristic of DTS discussed and illustrated in the following paragraphs.

In a simple use example, suppose the manager of a section within a retail operation (a local hardware store, for instance) advocates a markdown of certain items in his department as a type of loss leader, promoting his personal belief (which may be based on intuition or observation or direct experience) that such a strategy would enhance not only the profitability of his section but would provide opportunities for other sections, as well. DTS Assertional Simulation provides both tools and an operating environment by means of which users may create and manipulate unique analytic products that may be used to prove (or disprove) the veracity of these types of assertions but also novel means to manipulate, restructure and otherwise prepare such data its analytic products for application of other DTS-integrated and DTS-accessible analytic processes and techniques. The application of DTS and Assertional Simulation in such business and corporate environments will be explored in the following paragraphs, expanding this and other examples to illustrate the unique capabilities provided by DTS and its operational component.

The DTS operating environment supports extensions to and enhancements of the information processing and analytic capabilities characteristic of Assertional Simulation. In embodiments, DTS provides not only standard framework-like capabilities (such as API support and a variety of standard user interfaces) but additional capabilities, such as for example, without limit, specialized user interfaces, services, features, and extensions providing the means to the create, reconstitute, modify, enhance and otherwise manipulate assertion and Reference Data Models and elements thereof, and to similarly modify and parameterize Apportionment sub-Models; methods and procedures and interfaces that, in variations, enable DTS-based, DTS-enabled and system-external analytic computational activity of DTS models and elements thereof, of information that may be composed within DTS models and other analytic activities.

One such facility within the DTS framework is called the DTS Entity-Management Fabric. This is a collection of methods, procedures and interfaces that may be present throughout diverse segments of the DTS system. In some instances, the DTS Entity-Management Fabric may be instantiated as standalone procedural blocks and in others as integrated interface-accessible elements within other computational and procedural blocks, or in some cases in both forms. In all cases, the Entity-Management Fabric facility provides services (or contributes services) in support of the disposition and communication among and between three main entity-types in DTS: (i) users and groups of users; (ii) data elements and structures and groups and subsections thereof; and (iii) system methods and processes and groups and subsections thereof.

It is noteworthy that the methods and procedures composing the DTS environment and which support application of Assertional Simulation and its by-products interact with these main entities (users, data and processes) through the Entity-Management Fabric (E-MF) and in this sense, E-MF, in embodiments and variations, provides a type of interface for these managed entities. More relevant, however, is, that, as mentioned previously E-MF (and DTS) explicitly treats the entities as functionally but not necessarily compositionally equivalent. In many DTS-based and DTS-enabled applications and functions, there is little computational distinction between these entities, though there are required exceptions such as order of precedence and certain logical operations and conditional operations. Moreover, certain API's and user interface methods must, to one degree or another, process entities as compositionally distinct, and in some variations, there are other instances, but in general, the functional (and sometimes logical) equivalence of DTS entities (users, data and processes) is pervasive (though not absolute).

The nominal (and in many cases, actual) architectural and execution-level equivalence in DTS between the logical representations of these objectively distinct entities may be unusual in systems of this type, and certain practical limitations driven by real-world circumstances may be appreciated in light of the disclosure. Nevertheless, the manner in which users, data and processes are managed by the DTS Entity-Management Fabric may be premised on this equivalence, keeping in mind the many context-based exceptions that arise in functional practice. E-MF operates upon and in conjunction with these entity-types, by, for example integrating methods similar for each type. In general (but without implying limitation) E-MF supports interconnection of inter-process information-exchange between nominally disparate components, which, in variations, extends, enhances and facilitates DTS-based functionality. In some cases, such integrated control mechanisms may operate transparently to the user. In other cases, elements of E-MF may also be visible and explicit to system users, and internal and external processes through one or more interfaces and/or control mechanisms and semaphores, and in some cases, may additionally be subject to and/or may require user and/or system control and intervention.

There are at least three operational facets within the DTS Entity-Management Fabric, and while each address operations related to system entity-types, each facet addresses different operational considerations, providing distinct but often intersecting and inter-operational functionality. It is noteworthy that while the current description of the principles characterizes each as coexistent within the E-MF, each facet may be implemented without the other and may operate independently, and thus, in spite of the present pedagogical exposition, this rhetorical convenience should not imply functional interdependence. Nevertheless, for convenience, the current description presents these parallel systems as coexistent. These facets are Associational Process Management (APM), RAMS (Recombinant Access Mediation System) and Topical Capability Mediation (TCM).

The first facet of the DTS Entity-Management Fabric, RAMS (Recombinant Access Mediation System), executes and arbitrates informational and process security with respect to permitted activity between entities (data elements, procedures and users), constituting layered and customizable associational control schemata. In embodiments, this collective and in some variations, distributed functionality is subsumed within an integrated and interconnected control system. In implementations, RAMS is, in general (but not in all variations) event-triggered, executing control and resolution over object- and attribute-based access control with respect to permitted activity and information sharing, mediating collections of access and correlational parameters associated with system entities, where, in variations, these parameters (and elements thereof) may be fungible, transient and content- and context-sensitive. In its most general expression, RAMS facilitates, mediates and (occasionally) resolves disparate inter- and intra-entity association permissions, and provides a dynamic and adaptive computational fluidity woven within a customizable schema and control fabric but nonetheless implemented in concrete interfaces and protocols.

In implementations, RAMS-based control elements and embedded information may be composed within one or more dynamically constituted, dynamically maintained exchange units (such as certificates, in but one non-limiting example, or, in variations, modulated within distributed (and sometimes time-displaced) encodings that may be embedded within, referenced to, attached to, integrated within or comprised (all or in part) within or comprising one or more autonomous or semi-autonomous agents). However actuated, such exchange units generally function as informatic vehicles that deliver or may otherwise make available context-responsive control data within or between processes. Such context-responsive control is, in general but not exclusively relevant to and between target elements which are, in general, but not in all variations generally reflective of access and associational conditionals. In embodiments, such context-responsive control may apply to and between the entities directly and indirectly involved in one or more RAMS-qualified or RAMS-controlled events, process or sequence thereof.

The synthesis, creation, modification, distribution and manipulation of RAMS-based mediation and control information is, in general, but not exclusively, generated by or spawned in response to one or more computational events or groups of events or computational sequence or collections of logical and/or compositional conditions. Both the content and the delivery, and thus, the resultant mediation-result may, in part or in full, also be sensitive to, may be responsive to and may be adaptive in relation to some or any or all of the following non-limiting list of factors, conditions and circumstances which may occur in any combination and in any sequence and, in variations, at any time: (i) computational and execution-type and context; (ii) event and execution sequence; (iii) time or frequency factors (iv) compositional and content factors, which may, all or in part be independent of the foregoing or, which in some variations and in some contexts, may be conditionally or inexorably dependent on any or all of the foregoing; (v) the nature and current disposition of the relevant entities; (vi) the history, context or accumulated execution parameters associated with one or more subject entities.

In some variations of these methods and procedures, RAMS-based control exchange units and delivery techniques may be distributed or made available to subject entities by means of a variety of mechanisms or combination of mechanisms, including but not limited to: (i) global broadcast to subscribing (and registered) target entities where such broadcasts may, for example, emanate directly or indirectly from one or more centralized resources (where such resources may store, index, reference or contextually gather or harvest) the relevant information and deliver it on-demand or periodically according to a schedule or, in variations, based upon a control signal or one or more conditions originating from some other (that is, external) RAMS or non-RAMS resource; (ii) peer-based broadcast wherein entities directly (or in some instances, indirectly) exchange control elements (as in the foregoing) through peer-oriented interfaces; (iii) agent-based distribution, where any or all of the foregoing may be co-resident within a system and/or may, all or in part, be distributed across one or more sections within a network or other type of resource interconnection scheme or, in certain variations, within one or more mesh-like communication structures or networked geometries; (iv) ad-hoc associational schemes wherein control elements (as in the foregoing) may be distributed from a local but possibly transiently center where associated groups may or may not always be physically or logically or compositionally local but which affiliate according to any of all of the foregoing criteria.

Thus, RAMS supports, manages, maintains, executes and otherwise supports dynamic event-sensitive, event-triggered adaptive interposition, mediation and resolution of access, affiliation and execution rights between qualified entities and groups of entities, where such control may be distributed in a variety of methods, as in the foregoing, through (possibly dynamically spawned) combinations of global, local and peer-based techniques. RAMS-based exchange units may subsume or otherwise incorporate not only functional permission-related, security-related and conditionally-sensitive access, affiliation and execution information, such as, for example, entity-related access, rule-sets and functional execution parameters, but, in variations, cryptographic-based protections (in the form of secure signatures, for example).

The second facet within the DTS Entity-Management Fabric is called Associational Process Management (APM). As in the foregoing, APM may, in embodiments, co-exist with RAMS within the DTS Entity-Management Fabric, but, without loss of any functionality, both RAMS and APM (and elements thereof) may, in some implementations, operate independently, and may, in variations, operate in tandem conditionally in response to one or more internal or external conditions. Thus, RAMS and APM may, in some implementations, conditionally execute either mutual or one-way interoperability, as well as fully independent operation, functional dispositions that may, in variations, emerge at any time in response to any internal or external condition.

Associational Process Management (APM), like RAMS, centers about provisioning services that support operation, inter-operation and informational exchange and other types of interface involving System entities; in contrast to RAMS, however, APM primarily actuates, administers and manages the cross-binding or associational linkage between entities, entity-types and groups of entities, entity-types and between elements composed within such types and groups thereof. Note, therefore, that as mentioned, in some variations, both RAMS and APM may share functionality, but that in other variations, interoperability (and inter-dependence) and shared methods and interfaces may not exist.

Nevertheless, in implementations, there may be not only interoperability and operational overlap between RAMS and APM, in some variations, there may also be shared methods and procedures, especially in variations that deploy agent-based information delivery units within RAMS functionality. In most operational contexts, however, the lines defining the respective executable spheres are more pronounced: RAMS actively and dynamically (and in variations, on an event-motivated basis) delivers services that enforce (or release) numerous access-related, affiliation-related and information-sharing constraints, conditional and context-based and compositionally-based exceptions and contingencies, qualities that include, for example, without limit, permissible computational operations and sub-operations involving specific entities, allowable local and non-system entity associations, and operational and identity-based controls exerted upon input-output functionality. APM, in contrast, provides broadly-based, indexing and associational services that are, in general (though not in all variations and contexts) process-oriented, providing services that manage, for example and without limit, the creation, filtering, parametrization, augmentation, maintenance and permutation of DTS (and DTS-enabled) identity and identities, where such identities may be attached to, indexed to, associated with, entities and groups of entities, directly or indirectly and transiently or permanently.

Thus, as a component within the entity-management fabric, Associational Process Management (APM) in general, provides system-wide services that, in implementations, may be used by and within DTS methods and procedures (as well as by other non-DTS systems). In this sense, APM is similar to RAMS in that the methods and procedures and interfaces and the means and methods of its communication and information distribution and management may be fungible, and any or all of the foregoing descriptions associated with RAMS may in variations also be applied to APM.

Note, however, that in some embodiments, APM identity-centric and associational services, as reflected in user- and system-initiated conditions and configurations, provide one basis for execution of extended capabilities and features offered in conjunction with the basic operation of Assertional Simulation operations. By means of both centralized and distributed methods, procedures and interfaces, DTS entities (user, data and processes) may receive, be assigned or may be associated with one or more DTS-specific and system-based identities which are typically (but not exclusively) signified by or within one or more indices and/or encoded blocks which, in variations, may be optionally encoded, encrypted or otherwise obfuscated. Note, however, that APM indexing differs from, and in certain variations, complements logical address-based indexing and designations, such as those administered by an operating system or within pointer-based programs, where the latter typically references memory location or disposition of that entity or logical block.

Thus, in the operational context of Assertional Simulation, APM spawns and manages these (optionally encoded) indices while also dynamically maintaining the associational schema binding and relating such entities within (and in variations, outside) the DTS system. In general, but not exclusively, APM implements two or more operational or executable aspects: (i) the creation and management of one or more indices tied to and which defines an entity; and (ii) the creation and management of the association between entities and groups of entities as referenced by this index. Inter-entity association can, in implementations, be related to the existence (and in some instances, the maintenance) of the identity-conveying indices, and thus, these two properties may, in variations, have a bilateral functional dependency. If, for example, the index of an entity is changed or mutated, the association skein reflecting logical bindings attached to and with that entity may also change. Further, if the entities composing an associational skein change or mutate, so too may one or more of the indices referencing these elements. It is nonetheless also true that in implementations, such dependent mutation may be conditional or optional.

In any case, the collection of methods and procedures and interfaces that compose and execute the associational properties provided by APM may, in variations, integrate broad and flexible functionality by means of which the fabric may administer, manage, maintain and otherwise provide executional coherence to the dynamic, context-sensitive ownership properties within DTS, wherein one or more entities may be owned by, or may be bound to or may be associated with one or more other entities. Note, however, that DTS-based associational properties subsume broader functionality than, as one example, the direct and simple binding of a user to a data store, and the additional breadth of the functionality provided by APM components may, in variations of DTS, provide one basis for operational and functional extensions of DTS and Assertional Simulation.

APM-administered identities assigned to system entities may, in variations assume a number of forms, and these modalities (and methods attached to such modalities) may, in variations, be fungible and/or mutable in respect to computational context and entity-related properties, including but not limited to the composition, execution-based and nominal functionality, history, past and potential affiliations and logical, physical and geometric location and disposition of the entity. In implementations, such changeability may be conditional and/or transitory or permanent and may be based on various execution- and content-related conditions, including but not limited to: (i) one or more computational- and execution-state conditionals and context; (ii) properties inhered in or associated with one or more constituent elements within such computational and execution state contexts, where such subordinate (or constituent) properties may, in variations, be derived from or may be based upon or may be inferred from one or more aspects of the content contained within or referenced by or otherwise associated with the entity or by the geometric arrangement of that entity or based upon one or more informational elements that may be associated by reference, directly or indirectly with that entity. In variations, combinations of the foregoing conditions may be present but may, as in the foregoing be conditionally or transiently applied.

In implementations, properties that distinguish DTS-spawned entity identifiers may include (but may not in all variations be limited to) entities that may be: (i) singular but which possess a unique identity-type, such that this entity may not be grouped with any other entities (where examples of this exclusive singularity may include user-types unique within the system, such as an executive-level system administrator); (ii) singular, as in the foregoing, and which thus possesses a unique identity, but which in contrast, may, in some conditions and in variations, be aggregated with one or more other entities (of any type) in groupings but such that, when so-aggregated, may retain both its individual singular identity as well as designations conveying inclusion in its associated aggregations; (iii) generic or type wherein the entity may share a designated DTS identity with other entities but, as in the foregoing, where any such entity may, in variations, nonetheless also possess (or be assigned) other properties which confer a supplemental identity, including singularity as in (i) and (ii) in the foregoing, where such generic entities, in variations, may also optionally be additionally aggregated in other groupings and, as in the foregoing, when so-grouped, may optionally possess both its generic identity as well as designations conveying inclusion in one or more of the associated aggregations.

In some embodiments, combinations and permutations of the foregoing properties of these DTS entity identifiers may be present and, in variations, such options may be both flexible and adaptive so that any of the described properties and operational modalities may, for example, and without limit, be alternately static or contextually dynamic or either transiently or permanently fixed. In variations of these embodiments, such combinations and permutations may be responsive to characteristics as the composition, structure, content, domain or encoding type of the subject entity and/or associated entities.

The pervasive, flexible and dynamic inter-entity associational functions composed within APM provide one basis for additional features and functionality within the DTS platform, capabilities that enhance and extend Assertional Simulation. First and most generally, these services enhance operational functionality surrounding creation and manipulation of the elements composing the elements of Assertional Simulation, including results within Outcome Models elements composed within or referenced to such structures and which may contribute to the DTS-computational chain and to associated ancillary information. The capabilities provided by the identity management aspect of APM may be seen in many operational contexts, and are reflected throughout DTS implementations, but may be clearly seen in the services related to creation and manipulation of Assertion Models, Apportionment sub-Models and Reference Data Models.

Secondly, APM identity management services, in general but not exclusively, enhance and extend and, in variations, enable features and functionality associated with many DTS services in general and with Assertional Simulation in particular, functional enrichment that manifests in both DTS-based and DTS-enabled analytic and computational functionality. These APM methods and procedures and interfaces (as described previously but not in all cases limited to earlier descriptions) includes (but may not be limited to): (i) indexing capabilities that enable user- and system-driven experimental development and comparison of user- or system-composed results of Assertional Simulations (so-called what-if functionality), where such comparisons may utilize manual, automated and/or semi-automated mechanisms, techniques and interfaces; (ii) indexing capabilities that enable and enhance application of optimization techniques which may include, without limitation, evolutionary (and/or so-called genetic optimization), permutation-based and/or other experimentation-by-modulation-based procedures, wherein interim or intermediate or final results may be separately or associationally indexed and preserved, encoded or otherwise logged and which may also or instead be compared to and/or correlated against one or more similar or correlated or deliberately structured optimizations, prototypes, archetypes or intermediate or past results, where such comparisons may also or instead utilize manual, automated and/or semi-automated mechanisms, techniques and interfaces and inspection methods; (iii) indexing services that enhance or extend the application of permutational and transformational (as well as non-modifying) statistical and probabilistic computations and procedures which, in variations, may be executed in the context of any of the foregoing (and as may be applied using any user- or system-initiated procedure or in the context of any arbitrary aggregation of entities, also as described in the foregoing) in order, in a limiting example, to create, transform, mutate, manipulate or otherwise change entities that (in a non-limiting example) may embody forward-looking or backward-looking projections based upon such example computations as rolling averages, linear regression and other projective computations, where such synthesized objects comprise statistically-derived results based upon (or extracted from) one or more results typically embodied within one or more actual or synthetic entities (such as, for example, one or more Outcome Models) that may, in variations and in some contexts be arranged to compose one or more points in one or more time- or event-based progressions, and where (in another non-limiting example variation) such progressions of Outcome Models may be separately or associationally indexed and which may result from one or more permutations applied to the content or structure within one or more of the progenitorial models composing this progression of Outcome Models, and such that these permuted progressions (or any elements composing the progression or composed with such a progression) may be compared against other progressions using manual, automated and/or semi-automated mechanisms, techniques and interfaces and inspection techniques, and such that (in a non-limiting example) additional statistical and computational methods may be applied to these results (where these results may also be indexed), and/or where such results may be used within one or more overarching optimization procedures, as described in the foregoing, and wherein one or more elements within any of the entities may be systematically or arbitrarily modified, also as in the foregoing; (iv) indexing services that associate and correlate such ancillary and supplementary data and information with the procedures and processes from which they may be spawned, including but not limited to: computational by-products, system and user logs, and other information produced in the context of any of the foregoing, such that any or all such information may be accessed by methods and procedures and through DTS user interfaces.

Third, APM-based associational and indexing functionality (optionally executed in conjunction with using any or all of the methods, procedures and mechanisms described in the foregoing and with other methods and procedures that may not be explicitly mentioned but which may be appreciated in light of the disclosure), provides the means and basis for the extension of Assertional Simulation within the DTS-based collaborative and competitive environment. In implementations, DTS-based collaborative and competitive methods, procedures and interfaces enable one or more users (and, in variations, adjunctively with one or more system processes) to submit one or more entities (which are, in general, but not in all variations or instances, results of Assertional Simulation) to system-enabled competitive and collaborative comparative functionality which may include (but may not, in cases and in all implementations, be limited to): (i) selection or assignment of one or more ranking metrics to one or more members of a collection of such results, where the objective in such scenarios may include (but again may not be limited to) designation of a single winning Outcome Model, group of Outcome Models, or one or more time- or event-based progressions of Outcome Models, where such designation of a single winner may be typical in zero-sum game scenarios and such that these winning Outcome Models may be uniquely indexed as such; (ii) assignment of one or more ranking metrics to any of the foregoing whereby one or more Outcome Models (or groups of Outcome Models) may be arranged or ordered by ranking but also such that there is not a single winner but relative winners (as embodied within the ranking order) as may be typical in non-zero sum games, but such that, in variations, more than one ranking metric may be applied to determine the ordering, where such metrics may be weighted with a possible result that the Outcome Models (or groups of Outcome Models) may be ordered differently depending on metrics employed or the weighting applied, and such that each so-ranked Outcome Model may be uniquely indexed both contextually and in absolute ranking terms; (iii) alternative implementations of the foregoing wherein any or all of the foregoing normative techniques may be combined with these and other competitive algorithms where such choices may be made by user and/or system processes in pursuit of a variety of objectives, including continuing optimization and re-evaluation, and such that any or all indexing and associational functionality may also be applied, as in the foregoing.

Finally, as mentioned in the foregoing description of DTS entity ownership and inheritance, in embodiments, any or all of the information indexed to, related to or derived from and/or as may be associated with any APM-administered entity (or group of entities) may be inherited from or may be otherwise acquired from one or more other entities. Such inheritable or assignable properties may be optionally modulated or revised by users and/or system processes (subject to system as well as RAMS and TCM constraints) including those that may be used and modulated in various RAMS and TCM mediation functions. In general, therefore, in the absence of exceptions that may arise in embodiments and variations, and absent one or more conditional exemptions that, in contexts, may conditionally apply and/or may be conditionally applied by entities or by DTS-based (and/or DTS-enabled and/or DTS-accessible) methods and procedures and interfaces within a Platform 1000, DTS ownership and inheritance properties apply to any or all information aggregates that may be associated with an entity or groups of entities including (but limited to): i) one or more elements within or related or as may be derived from one or more associational and execution capabilities administered by RAMS and TCM; ii) ownership, cross-ownership and other descendant and inter-entity relations that may exist; iii) DTS entity "ancillary data" (properties and characteristics); iii) entity-centric or system-related ancillary information generated by or derived from any of the foregoing functionality (and from variations thereof); iv) entity-centric or system-related generated information that may be generated by or may be derived from the administration of RAMS and TCM capabilities; v) entity-centric or system-related generated information that may be generated by or derived from any DTS-based (and/or DTS-enabled and/or DTS-accessible) methods and procedures and interfaces; vi) entity-centric or system-related generated information that may be generated by or may be derived from non-DTS sources as may be obtained or accessed entities or other facilities within a Platform 1000.

Thus, the DTS-based (and/or DTS-enabled and/or DTS-accessible) methods and procedures and interfaces within or associated with APM manage the ownership skein so that when an entity owns or acquires ownership of another entity, however that relationship may be actuated, including, for example, explicit assignment of ownership of an entity (including itself) by an entity to another entity (where an exemplary case here would be when a user assigns ownership of an aggregation of information to another user), the "owned" entity assumes and is assigned (or "inherits") all of the foregoing information assigned to the entity which acquired it, though, as noted, in embodiments, certain information may be exempted from inheritance, and some may be optionally elided (by the system and/or by the user) from the inherited information. In the event that the "acquired" entity already possesses some or all information in the foregoing, DTS-based (and/or DTS-enabled and/or DTS-accessible) content-sensitive and content-responsive methods and procedures and interfaces within or associated with APM may execute a number of reconciliation options, including but not limited to: i) harmonization of one or more elements of the "new" information by, for example, combining or synthesizing certain information aggregates; ii) and/or eliminating one or more elements either from the "new" information or from the existing information to avoid contradiction; iii) and/or annexing or incorporating or otherwise including the new information. Note that in any of the foregoing options, APM may index, annotate, log and otherwise mark the "new" information and/or may generate (and optionally attach or reference) information about the "new" information, including the conditions, context and other details related to or surrounding the acquisition or assignment of the information.

Note, however, that since the APM ownership inheritance capability also imputes the connection between entities from an owner to an owner or acquired entity, the entity-centric, network-based affiliations of these ownership-threads may spawn and permute new relationships. These new connections may grow and permute combinatorically as different aspects of the Assertional Simulation execution chain (and associated methods) operate upon new and existing entities and generate additional information about such entities. Such interconnections may be incorporated in and used as input variables by a variety of DTS-based (and/or DTS-enabled and/or DTS-accessible) methods and procedures and interfaces that execute analytic, pattern detection, feature mapping and other AI-based routines and other advanced computational facilities which, in some applications, may provide unique analytic information that may be utilized by users but may be incorporated within DTS in-App activity metrics.

This aspect of APM reveals an extension of one feature of Assertional Simulation mentioned previously: that the Outcome Models and the associated progenitorial models and ancillary information themselves not only constitute a stand-alone analytic result, but that the additional capabilities provided by APM to restructure and scale information may be leveraged to prepare, format, restructure or precondition information for presentation to other analytic routines. But APM provides a deeper and more unique capability, as well: since APM optionally indexes all the entities that may directly or by association contribute to the creation of any element in the Assertional Simulation model-creation chain (including, for example, intermediate and transient entities), and since many other entities may be, or at one time or another may have been affiliated with a given or related Assertional Simulation model-creation chain, the breadth, depth and richness of information that can be made available to analytic computations is both extensive and unique. This system-wide preservation (even in encoded form) of the widely varied information spawned throughout the various execution chains invoked in modalities of Assertional Simulation (and related ancillary and supplemental operations) illustrates another instance wherein methods and procedures and interfaces within (or accessible to) a DTS Platform 1000 may increase the Shannon entropic richness of the information within a DTS Platform 1000 and may make that information available to both DT-based and non-DTS analytic components.

The previously cited project management example may be expanded to illustrate some of these capabilities and highlight the pivotal and enabling potentials provided by DTS APM in common business circumstances. Recall in this example that a committee of DTS users uses Assertional Simulation and tools within DTS to evaluate the relative efficacy of different organizational schemas to manage the deployment of volunteers in an event.

But suppose that after one round of simulations in which each member submits their outcomes, the committee is not satisfied with the results, and the members instead agree to not only split into groups and create group Outcome Models, but that each such group would run as many instances as they wish. This is a common type of mode of activity in many settings in which groups of individuals construct competing visions of the best course of action. DTS provide the means to formalize which Assertional Simulation and associated and ancillary processes, as described in the foregoing, provide methods and procedures and interfaces by means of which users may engage in such common competitive, game-theoretic exercises. But note that, as described throughout this disclosure, the novel combinations of methods and procedures and interfaces that constitute embodiments of DTS enhance and extend these prior capabilities.

In the current context of this example, note that as described in the foregoing, methods and procedures and interfaces within the APM fabric manage, annotate, index and otherwise administer not only the individual identities of each member but both the (presumably temporary) association-spawned identity of the group as well as its composition. Moreover, as described, as each group constructs, edits, modifies and refines its Assertional-Apportion Model pairs, APM manages the indexing of each these and associated objects. Note further that the recombinant nature of the RAMS permission and access mediation system described elsewhere herein accommodates these transient associations, and its methods and procedures and interfaces interpose or relax restrictions in the event and to the degree security issues may emerge in these contexts. Finally, each user and each groups of users "owns" and controls all of the information created by their separate operations and may use specific user interfaces to pursue strategies to gain advantage in the position of their assertions over others. One such strategy is called "selective reveal" wherein the owner of an informatic structure leverages the RAMS capabilities that proceed from that ownership to regulate who may view (or act upon) any part of such "owned" information, where "selective" may mean that only designated parts of the information are revealed to one or more users who otherwise have no such rights and/or it may mean that selected users may see such designated information. The selective reveal strategy is but one example of the game-theoretic and strategy-based functionality that in embodiments pervades DTS, wherein the broad and unique functionality provided by APM and RAMS enables a systematic management of common activities in new and novel ways that extend and enhance system and user capabilities.

In the context of this example, it may be seen how DTS tools may be employed to enable, enrich and facilitate the process of creating effective Outcome Models. As but one example of the deployment of these enhancement capabilities (as cited in the foregoing), users may employ a variety of iterative optimization routines (which may either be integrated with or may be made available to DTS) where such routines may, in variations, be configured in a variety of ways, including (but not limited to): (i) fully automated optimization looping in which an Outcome Model would be compared to or analyzed against some set of parameters, and such that Assertion-Apportionment Model parameters would be adjusted until some optimization criteria is met; (ii) one or more user-assisted iterative automation routines looped iteration is employed as in the foregoing but such that there may be a greater degree of parametrization and in-process adjustment; (iii) variations of the foregoing wherein both DTS-based and DTS-enabled statistical or other normative analytic techniques may be applied to achieve optimal results.

In these contexts, APM may, in implementations, be configured to annotate and manage the associational indexing of any or all relevant parameters which animate, and which may proceed from such optimization loops, including user and group-generated notes, logs and time-stamps. Note that in embodiments, such information is retained and factored into the comprehensive suite of in-app metrics by means of which methods and procedures and interfaces may not only provide feedback and other information to users and system-operators but which may also provide parameterization (and additional variables) to the continuing evolution of the content-sensitive and content-responsive methods and procedures and interfaces used throughout the platform, capabilities described in subsequent paragraphs. In most instances and in embodiments, such detailed record-keeping may not always be invoked but APM nonetheless minimally preserves the associational aspects of the Outcome Models and their precursors, regardless of their etiology. Thus, even in less complex, inspection-based, human-only optimization—wherein, in the present example, committee members would simply inspect each Outcome Model and visually analyze the results—the associational and indexing capabilities provided within APM provides the means to preserve information related to the provenance, ownership association and progenitors and ancillary data of each potential deployment schema generated by the committee members.

Continuing the current example, in general, a winning Outcome Model would be chosen and thus, the event committee would examine the various organizational and deployment allocation submissions and through some agreed upon mechanism, would select a winning formulation (called the Cardinal Outcome Model). In DTS terms, the creation and comparison and, ultimately, the selection of a single winner reflect the use of DTS-fostered zero-sum competition of Assertional Simulation Outcome Models, wherein the set of Models that produce this Outcome Model are collectively referred to as the Cardinal Models. Note, however, that DTS also supports many other end-point types of game-theoretic and competitive scenarios, such as, for example, non-zero-sum competitive analysis wherein relative winners would rank from groups of various Outcome Models according to mutually agreed upon criteria.

There are many ways in which DTS users (and system processes) may select Cardinal Outcome Models, but in the context of the current example, suppose, the event organizers have a subjective belief that the same event was better organized two years ago than three years ago or last year—that is, they have a non-evidenced-based point of view of a certain ground truth but that they either cannot articulate why this is true (exactly) or, as a group, cannot agree upon the reasons. But suppose further that the data is available for all 3 years and that this data contains the implicit information that the year in question (two years ago) incorporated a particular proposal model/apportionment model structure that was different from both the other years. Note, of course, that this example illustrates one reason that DTS users invoke the information-rich APM indexing and associational capabilities, as described.

Thus, continuing this example, suppose that the APM-managed notes, logs and other information preserved via APM from two years prior (believed to be the best year), reveal that within those Cardinal Outcome Models, an experienced volunteer supervisor was designated for every 10 volunteers and that for every 5 of these supervisors, a company-employed leader was assigned. On inspection, the committee discovers that this schema was not present in either of the Cardinal Outcome Models of the other (less successful) years. Thus, the members decide to use this organization scheme.

But suppose instead that the facts above are not evident by inspection. That is, suppose that there was consensus that the subject Cardinal Outcome Model from 2 years previous was indeed best but that there is not enough human-readable detail in the APM-indexed information to reveal the reasons why this scheme worked so well. Thus, the event organizers would like to replicate the most successful approach but do not know how to do so because they cannot pinpoint (or agree) what made that event successful.

In this example, users (and system processes) may invoke a combination of APM-enabled indexing and associational capabilities in combination together with DTS-based (and/or DTS-enabled and/or DTS-accessible) methods and procedures and interfaces that permit users to prepare Assertional Simulation data for a wide range of analysis using a variety of techniques which, in embodiments may be available within or accessible to a DTS platform. Such preparatory capabilities may include, for example, without limit, invocation of any or all DTS-based (and/or DTS-enabled and/or DTS-accessible) content-sensitive and content-responsive methods and procedures and interfaces that may be employed to dynamically restructure and/or reformat and/or recompose the relevant information (as described in the foregoing and as further expanded in subsequent paragraphs). Thus, in this example, users may select a number of Outcome Models from a number of years and may include all or part of the set of progenitorial models within (or related to) their genetic chains as well as all or part of any related informatic elements associated with their creation and evolution, and, as described, process such information for presentation to and application of DTS-integrated or DTS-enabled analytic tools (including, for example, some combination of user-inspection, pattern recognition-based programs, statistical analysis packages and even external metadata) to discover the hidden characteristics embedded within the agreed-upon optimal Outcome Model. In this case, the happy result is that the analytic techniques surfaced the previously hidden information about the optimal organization as described previously.

Note that those skilled in the art may see how the activities within this example may be extended to also include cost and resource-deployment factors where, in non-limiting examples, such data could be extracted from one or more accounting systems, time management systems, user and customer survey results and which may then be correlated with one or more organizational results, and may even include other related data such as previous-year supervisor notes and communications (which may be evaluated by users with DTS-provided "intangible measures" and/or with normative results from natural language processing and/or from correlative methods applied to keyword search) as well as spreadsheets that might provide such seemingly unrelated detail as decoration costs and counts of cups and napkins. In some instances, the selection of the optimal organization could be chosen by consensus derived as described or by automated methods or some combination wherein the agreed-upon "ground truth" could be objectively verified through actual evidence using the novel extended capabilities of DTS APM, the platform competitive environment and the many methods available to prepare and execute analysis of all types and complexity.

While the volunteer example demonstrates the deployment and application of certain novel capabilities within embodiments of DTS and as provided by modalities of Assertional Simulation, the activities described in that example (and others) are extremely common in business and even in social and non-professional environments, and the various combinations of DTS-based (and/or DTS-enabled and/or DTS-accessible) interfaces, methods and procedures associated with and which support and enhance Assertional Simulation (and ancillary operations) provide a wide range of unique capabilities to assist in these and other activities. In particular, this example reveals that the methods, procedures and interfaces comprising the co-existing APM and RAMS control rubrics provide a broad and enabling substrate upon which common transactional activity may take place and, with the plethora tools and interfaces available to users within DTS, these activities may be extended and enhanced. The sort of internal deliberation that is evident in this example is a common occurrence in organizations across the professional spectrum: managers compete for resources but also advocate particular views of ground truth and put forward opinions about how the interests of the organization (or their part of it) may be pushed forward by selecting one proposal or another.

The role of user-to-data (as well as data-to-data indexing and process-to-user indexing and process to data-indexing) and the seminal role APM plays in practical usage of both simple and advanced functionality in implementations of DTS may also be demonstrated by returning to and extending the previously cited book collection example. First, recall, as described, the bibliophile has run the described DTS simulation to apply a categorization system to the bound book portion of his mixed media collection with the results as previously presented. Now, let a nominally satisfactory instance of this simulation (as actualized within the coincident Outcome Model) be labeled by the bibliophile Book Cat v1 (shorthand for "book categorization version 1"). In implementations, a user would be able, through various DTS interfaces, to assign and edit this type of name for whatever reason. As within all such DTS scenarios, the specific Outcome Model referenced by Book Cat v1 is uniquely defined for the particular set of categories and (in this case) the binary (or null) assignments embedded within a particular Assertion-Apportionment Model pair as these models had been applied to a specific set of books comprising that particular Reference Data Model. It will be appreciated in light of the disclosure that a change in any of the progenitorial elements may result in a different Outcome Model, one different than that referenced as Book Cat v1. (Noting, of course, the previously-cited exception (invoked in this example for pedagogical purposes) wherein null values within the Apportionment sub-Model assigned to newly inserted Assertion Model elements render the Assertion-Apportionment Model pair unchanged.)

In the present example, however, suppose that, upon reflection, the bibliophile decides to add new categories to his declaration (the Assertion Model), a decision indicating, for example a change in his subjective view of the fidelity of his first attempt to represent the topical variegation within his collection (as embodied within the Outcome Model Book Cat v1). The bibliophile may copy and edit the copy of the original Assertion Model, Assertion-Apportionment Model pair and the like.

In DTS terms, this alternate view of ground truth would entail changes in either the Assertion Model or associated Apportionment sub-Model or in both. Note that in these instances, where a user may wish to make changes to already-composed Models, DTS methods and interfaces may, in implementations, optionally permit a user to retain the original Assertion-Apportionment Model pair as constituted, thus preserving not only an operating system-spawned logical index of the execution instance thereof, but other DTS-created associations and other information possibly assigned to that instance, while also permitting the user to make the desired changes in a duplicated and newly indexed version. Methods and procedures within the APM identity fabric implement these types of associational preservations. This example exemplifies what in implementations is a commonly deployed DTS feature sometimes referenced as a clone and modify operation. In variations, there may be similar but possibly more complicated cross-model instances of these operations. A number of variations and enhancements of these capabilities are available within other Assertional Simulation operations, and in some embodiments and in other contexts, DTS entity permutation processes enable functional enhancements that may be applied to Assertional Simulation and its results and byproducts.

In the context of the current example, suppose the bibliophilic collector decides to retain the results of the first simulation (Book Cat v1) but, using one or more aspects of the DTS clone and modify facility, creates a duplicate copy of the original Assertion-Apportionment Model pair but decides to add 3 new categories to this new model set. (While the current example cites addition of new elements, in variations, any number of other modifications may be made, including, but not limited to deletion, filtering and reorganization of the structure of elements). Let the entries within the Apportionment Model corresponding to the new categories in this duplicated Model be assigned a null value, while the other values remain the same. Let the resulting Outcome Model be called Book Cat v2. Thus, given with the previous stipulation regarding nullity, from the DTS standpoint, the result-set, Book Cat v2 (and the Models composing its computational chain) is functionally identical to the previous Outcome Model (Book Cat v1) despite the presence of additional categories, again, since, as stipulated in this (non-limiting) example, a nullity attached to a title as a category value entails that the associated title has no category.

Despite this functional equivalence with the previously rendered Simulation product (Outcome Model Book Cat v2), this new version with additional but "null-valued" categories (Outcome Model Book Cat v2) and the associated progenitorial models constitute a new instance with respect to the Entity-Management Fabric and, in variations, one or more APM methods and procedures within that control skein may assign newly generated indices, not simply to the models but, in variations, to all the information that may be, may have been (or may have become) associated with those entities, which, in other variations and in certain operational contexts, may have been duplicated, as well, in addition to such ancillary information that may have been generated during the genesis of this new instance. But as with the operations the user engaged to effectuate the clone and modify operations for Outcome Model Book Cat v1, APM methods, procedures and interfaces also permit and facilitate the modification, augmentation and even deletion of any or all or part of such duplicated associated information, where such revisions may, in variations, be executed through and in conjunction with system and user interfaces such that specific choices may be user driven and/or user assisted and/or fully automated. This associated information can, in variations, include (but may not be limited to): time-stamps, event markers, system and user generated annotations such as comments, execution logs, and user created notes.

In some implementations, however, as may be seen in the context of the current example, the cloned version of the original model-set (Outcome Model Book Cat v2) and its progenitors as well as any part of or all the information associated with any of the foregoing elements may remain associated with the original user (the collector), but, deploying one or more procedures and interfaces within APM, may also or instead be assigned—that is, to have ownership of one or more elements in the foregoing imputed to another user or a group of users. This is an element of the identity management aspect of APM wherein, using user interfaces, ownership properties of any entity may be changed or edited or otherwise modified. APM facilities may also, in variations, facilitate and manage assignment of co-ownership amongst two or more entities, such that changes to one or more elements composing and/or associated with any of the models, any set of progenitors of such models and/or to any aspects within the collection of ancillary information associated with any such elements may, in variations, be executed exclusively (that is, with respect to one or more co-owners but not to others) or conjunctively (that is, with respect to all co-owners), but such that any such changes may be subject to conditions and/or constraints managed within the RAMS facilities.

As may be seen, the current example illustrates how various and (in some embodiments) diverse DTS methods and procedures may, through a variety of interfaces and integrated methods implement a close binding of user ownership with system entities and that these associational properties are managed and administered by the APM control fabric. The APM identity overlay permits, in implementations, operational infusion of additional informational depth and complexity to even seemingly-simple operations such as duplication of previously rendered results, and the enablement of such Shannon entropic extensions and alterations also provides one basis for permitting DTS and DTS-enabled systems to provide additional enhancements of and extensions to the seminal notions of Assertional Simulation.

The role of APM associational properties may be evident in the current example as new, succeeding Outcome Model instances are created by the bibliophile. Newly spawned Outcome Models and the newly minted contributory models and associated information, however generated and irrespective of the composition of any such instance, are collectively (and, in some variations, individually) assigned new and unique APM identities, one or more new monikers (optionally provided by a user through interfaces) and are newly indexed to one or more (possibly new) users (or system processes). The breadth of this informational genesis may be seen even in the case where a duplicated model is functionally identical as referenced in the foregoing, but the relevance and utility of the APM identity management may assume a different relevance when successive versions embed new or different information—that is, when the differences between versions are truly permuted in a computationally meaningful way, and thus, wherein the differences reflected in distinct identities are tangible.

Returning to the current example, suppose the bibliophile initiates another iteration of his Assertional Simulation categorization project and decides to substitute non-null values for the null values previously assigned to the new categories. He can do this by editing a copy of the Assertion-Apportionment pair that was used to produce Outcome Model Book Cat v2 and initiating an Assertional Simulation to produce an altogether new, alternately parametrized Outcome Model. Alternatively, he can merely edit the existing Assertion-Apportionment pair. Though in this case, no user ownership characteristics have been changed, a new index and required revised moniker of the Assertion-Apportionment pair may change. Also, one or more elements within affiliated information may indeed change, including, for example, any or all of the logs, system annotations, and user generated notes. The new Outcome Model may optionally be re-named, but for pedagogical convenience, let its name remain Outcome Model Book Cat v2.

Suppose, however, that the user instead wishes to retain the original Outcome Model Book Cat v2 (with null assignments to the new categories). In this case, DTS, in variations, may provide a number of options: the collector could have opted to clone and modify Outcome Model Book Cat v2 before making the foregoing changes thereby creating another version called Outcome Model Book Cat v3 which is also functionally identical to the original version, Outcome Model Book Cat v1, and then make the previously described changes to either of the cloned Outcome Models. Alternately, Outcome Model Book Cat v3 may be created from the initial version (with fewer categories) and then modified to conform with another Outcome Model. In either case, there would be 3 versions of Outcome Models (and 3 Assertional Simulation chains, each with its unique progenitors and associated information) but since, depending on the choice of parentage, the ancestry will differ, the specific elements within the associated information will differ, including, at the very least, for example, references to the progenitorial models, though other elements may change, as well.

This example of DTS-fostered creation and mutation of elements composing Assertional Simulation illustrates the deep integration of the APM identity and associational services within methods and procedures throughout the system. Any or all of the previously cited APM modalities and modes of operation may be deployed in these and similar operations. But as may be seen in the current, relatively simple example, the methods and procedures and interfaces composing APM (and more generally DTS) enable users to create and maintain detailed records of the genesis and, in some contexts, the progressive mutation of versions of the elements composing an Assertional Simulation. In variations, of course, the depth and degree of detail and even the type of information preserved within and provided as a result of such record-keeping operations may differ depending, for example, on context, user input, and preference.

One consequence of the integrated preservation of granular and detailed progenitorial data and information is that users, groups of users and system processes may optionally initiate and manage, document and, in variations, modify and/or augment a variety of creation related records indexed not only to the created elements but to the associated users, groups of users and/or system processes. These capabilities may be useful in a variety of DTS applications where the integrity of data—what could be called chain-of-custody validity such as may be used or required in audit trails or forensic accounting—related to such information may be important. In less stringently regulated implementations, minimal creation and modification records such as user-generated and user-maintained change logs and system moderated date-stamps may be useful.

Note, however, that in many applications, DTS users often create multiple Outcome Models and the optional APM fostered preservation of the precursor models and other elements in these Assertional Simulation chains of Outcome Models through one or more of the cited optimization techniques and, as shown in these examples and in the foregoing example techniques (and in other applicable procedures which, in variations, may be optionally invoked as an ongoing or piecewise-ongoing process) reveals an aspect provided within Assertional Simulation and the supporting DTS-based tools in general, but through the permutational and identity tracking aspects embodied within APM and, in variations, other DTS-based services, in particular. Specifically, application of these techniques may, in many applications, inherently enhance the breadth, variety, density and referential scope of the information distributed throughout the array of previous generations of models, their elements and their by-products. In this manner, each such iteration may, in variations, increase the Shannon entropy embodied within this historical collection by injecting new, often but not necessarily in all variations, uncorrelated information.

The increase in the Shannon entropic richness derived from the specific manner in which DTS-based and APM related methods manage the iterative progression of generations of model chains (as cited in the foregoing and other parts of this disclosure) is important. In variations, DTS-based and other non-DTS but system accessible analytic techniques may be applied to specifically leverage this Shannon entropic enrichment, including (in a non-limiting example) methods that may be executed in the context of (for example) one or more layered recursive optimization routines which may contextually and selectively harvest certain information elements embedded in these collections, and may calculate or infer additional information that may be directly derived from this embedded information or which may be extracted from one more other sources (such as, for instance, from some representational ideal related to one or more elements in the Outcome Models), and may then inject this new, possibly uncorrelated information into one or more elements within the current model chain, thereby possibly producing augmentation of the results on the optimization curve. In other example cases, this information and other analytic capabilities may be made available to DTS users, through one or more selection and reorganization interfaces, so that skilled users may manually inspect and mine the information in pursuit of some objective.

The relevance of this inherent increase in Shannon entropic richness may be seen throughout the operations of the DTS platform and within cited examples. The final part of the volunteer example highlights the potential use of APM fostered preservation of information as shown when the committee members leverage APM managed information preservation; using methods and procedures and interfaces drawn from DTS-based (and/or DTS-enabled and/or DTS-accessible) data structuring interfaces to format and/or transform or otherwise manipulate or prepare data to be presented to statistical analysis and pattern detection facilities, the user may invoke a variety of analytic and pattern detection techniques to discover undetected characteristics that may have contributed to the creation of a consensus-accepted successful Outcome Model from the past. This example points to a common problem in some real-world environments, however, one which comprises an important factor in the successful construction of optimal Cardinal Outcome Models: the role of hidden information in the optimization of Assertion-Apportionment Models and in the selection of Cardinal Outcome Models. The book collection example describes the role of the APM fabric in the enablement and support of DTS-based permutational variations, DTS-based clone and modify techniques and other DTS information generation methods, including, for example, preservation of intermediate and/or transient results within optimization loops. A DTS Platform provides methods and procedures and interfaces that provide users and system processes broad capability to prepare and present structured (and restructured) information to advanced techniques both integral to or accessible to a DTS Platform designed to discover otherwise undetected information that may be relevant in decision making processes.

Thus, as discussed in the foregoing, Assertional Simulation not only produces an analytic product in the form of Outcome Models (in that these are structures that embody the application of structured and parametrized assertions to commonly-accessible reference data which embodies an analysis that reflects a view of "ground truth"), but also, in variations and in some contexts, provides techniques that may be used to additionally (or alternately) present Outcome Models (and in embodiments, any aspects of the antecedent Assertional-Apportionment Model pairs) to other types of analytical procedures, including (but not limited to) those non-limiting examples cited in the volunteer example (statistical analysis programs and pattern detection techniques). But note that the effectiveness of these non-limiting example analytic processes (and others that may be relevant) deployed in the context of DTS processes that increase the Shannon entropic richness of information surrounding and related to Assertional Simulation (as cited in the foregoing and elsewhere in this document) enhances and extends the variety and efficacy of such analytic products. This example exemplifies one way in which DTS methods, procedures and interfaces provide capabilities that magnify processes and procedures common in many business applications.

These capabilities may be seen in the application of DTS to common business problems. Suppose a manager responsible for Profit Center A configures a series of budget forecasts covering the following year by using the previously described clone and modify facility (described in the foregoing), and by using a group of Cardinal Outcome Models from previous years as the basis upon which to compose a final proposed next year projection. In this series of forward projections, the manager uses DTS interfaces to not only make changes to certain values within the associated Assertion-Apportionment Model pairs but creates scaled versions of previous year Reference Data Models to form the basis of the cost and revenue aspects of the budgetary projection. After producing Outcome Models using these parameters, by projecting the cloned and modified Assertion-Apportionment Model pairs upon the cloned and modified Reference Data Models, the manager is pleased to note that there are tangible improvements in the results for profit center A but suspects that further optimization may be possible but does not know exactly how this might be achieved.

Suppose, moreover that this manager employs the DTS-based capability described in the volunteer example to prepare and format data from previous years (as in the previous example) for submission to both DTS-based and DTS-accessible analytical and pattern detection programs. The objective in this case is not to validate the veracity of the changes already proposed by this manager (this has been reflected and proven in the improved results shown in the already produced forward projections) but to execute a type of blind pattern detection to find whether further optimizations might be made if the currently proposed changes had been made in the past. One underlying notion in this example is that the manager wishes to leverage DTS and Assertional Simulation capabilities, and most important, to attempt to take advantage of the depth and breadth of the Shannon entropic enhancement engendered by repeated cycles of APM supported Assertional Simulation over time, as described previously. The manager's suspicion is that analysis of past years may uncover hidden relations which might be used to improve performance, changes that the manager hopes will be possible given the additions advocated (and verified) in the just-executed forward projection.

In pursuit of this objective, using DTS methods and procedures, the manager selects, clones, modifies, and formats a series of Cardinal Outcome Models and their progenitorial Models from past years, making certain that the modified Assertion-Apportionment Model pairs reflect their proposed result. In this case, however, the manager submits not only the Cardinal Outcome Models from past years and the associated progenitorial models and any related ancillary information but also Outcome Models (and related contributory models) that were not selected as the Cardinal Outcome Model sets—that is, the manager also includes all the DTS-named Candidate Assertion-Apportionment pairs and the related Reference Data Models and Outcome Models.

Note, therefore, that this manager is seeking to advocate a ground truth verified, in their estimation, by projecting into the future existing Outcome Models using statistical techniques (such as linear regression). But, having validated this assertion (to their satisfaction), the manager may then create a series of backward-looking "what-if" projections by first inserting the "now-proven" set of changes into cloned but modified Cardinal Assertion-Apportionment Model pairs and projecting these changes upon unmodified versions of past Cardinal Reference Data Models, thereby seeking hidden information that may reveal additional benefits given the value of the proven changes. Note, however, that as with the earlier example describing the DTS-based analysis invoked by the volunteer organization, wherein the indexing and preservation capabilities of APM were leveraged as input to execute various types of analysis, in this instance, such richness and depth and variety of information may, for example, be included to modify one or more elements of the Assertion-Apportionment pairs, to influence or modify even the assumptions guiding the parameters applied to the functions executing forward projection of cloned Reference Data Models as well as employed in other evaluative and normative aspects of the evaluative process.

Based upon methods and procedures described in the foregoing, and leveraging the Shannon entropic richness fostered by the APM identity management capabilities, as described, suppose that the analysis and optimization routines reveal in the resulting backward-looking and re-calculated Outcome Models that, if the proposed changes had been in place, the average profitability of Profit Center A would have been additionally maximized if the cost (and allocation proportions) of two chart of accounts items were reduced. But in this example, these items seem, at least in the mind of this manager to be utterly unrelated and are located in very different parts of the chart of accounts hierarchy. Upon repeated invocation of this backward-looking projection, more detail emerges, and the manager discovers that profit center A would have increased its profitability 3.2% in previous years by increasing the cost of the two chart of accounts items at a certain ratio but only if the total new expense does not exceed a certain amount of their respective parent node totals.

Using the tools provided within DTS and applying Assertional Simulation and various methods and procedures and interfaces described in the foregoing, the manager implements the newly discovered ground truth by cloning the parameters within now proven Assertion-Apportionment Model pairs and projecting these Outcome Models upon the previously used forward-looking Reference Data Models.

These examples demonstrate the utility of the novel capabilities within DTS and the manner in which inherent qualities within the Assertional Simulation that formalize user expertise and experience-based judgements in a systematic, multi-faceted computational environment to uniquely address complex and practical real-world problems in many professional and social contexts.

The final element in the DTS Entity-Management Fabric is called DTS Topical Capability Mediation (TCM). TCM is a broadly-based operational component providing functionality related to and, in instances and embodiments, interconnected with the operational functionality within and associated with RAMS and APM. In some operational modalities, TCM may re-purpose and utilize some RAMS capabilities as instantiated in the relevant methods and procedures and interfaces but may also employ unique-TCM computational components. In addition, like RAMS, TCM may, in embodiments, utilize, access, leverage and share one or more elements of the entity identity-related services and methods and procedures and interfaces provisioned within APM, including any or all capabilities and variations cited in and implied this disclosure but those that may be instantiated in embodiments and those that may be variations and derivatives. But note that, as with the interoperability APM and RAMS (referenced in the foregoing descriptions and in other parts of this disclosure and as instantiated in concrete implementations), one or more computational components of TCM may, in embodiments, also deliver some or all of its described series and functionality in a standalone fashion, fully or partially instantiated within or associated with non-DTS systems and/or environments and thus, may operate independently of either a DTS Platform 1000 and/or in conjunction with either DTS- and non-DTS-based APM and/or RAMS instantiations, noting, of course, that in such instances, one or more computational elements from APM and/or RAMS may be present within an independent TCM instance.

On this basis, therefore, note that while TCM may interoperate with and may share one or more methods and procedures and interfaces with both APM and RAMS and may re-purpose others), TCM differs from RAMS in that RAMS functionality (in the most general sense) is configured to administer execution of system-based processes and TCM is configured to administer entity engagement with various topics, including without limitation system-defined topics. Thus, from at least one perspective, RAMS, as described in this disclosure may be seen, in embodiments, as a novel instantiation of an extended, multi-layered, context-responsive and event-triggered access and process execution mediation mechanism, while TCM provides, without limitation a topical mediation mechanism applied to the subject entities where its intermediation mechanisms administer whether (and under what conditions) the respective subject entities may associate with respect to or in the context of one or more discrete topics, such as system-defined topics or subjects—or, using DTS terminology, in respect to DTS Transactions. Note, however, that the term "DTS Transaction" may optionally refer to system operations involving the exchange of units but rather, refers more generally to interactions of any type centered about one or more topics, such as system-defined "topics" and the like. Therefore, RAMS may administer entity capabilities and actions with respect to execution of system operations while TCM may administer actions and capabilities of entities to associate in respect to a given topical context, such as a system-defined topical context.

Thus, in DTS, an entity may have at least two modalities of associational, access and execution capability, each administered by methods and procedures and interfaces associated with or subsumed within the operational and execution schemata of RAMS or TCM or other such mediation facilities: 1) RAMS-administered System Capabilities (or simply System Capabilities) and TCM-mediated Topical Capabilities (or simply Topical Capabilities). An entity may, for example, have a suite of associational and execution rights RAMS-based System Capabilities with respect to a collection of other entities but may have a different set of Topical Capabilities with respect to those same entities. These associational, execution and other system activity rights and capabilities represent the combined functionality of the DTS-based (and/or DTS-enabled and/or DTS-accessible) methods and procedures and interfaces within or associated with the constituents within the previously referenced DTS entity-management fabric, APM, RAMS and TCM.

In a simplified example of RAMS-administered System Capabilities and TCM-mediated Topical Capabilities, suppose an entity 1 ($E_1$) possesses a set of System Capabilities ($SC_1$) and entity 2 ($E_2$) possesses another set of System Capabilities ($SC_2$) and that, through RAMS mediation (as described in detail in later sections of this disclosure), $E_1$ and $E_2$ possess a set of system associational rights reposed within a data store $SC^A_{1-2}$, where the superscript "A" signifies that this information aggregate deals with system-related associational rights only (and not execution rights) and the subscript "1-2" signifies that this associational data applies to entities $E_1$ and $E_2$. Assume further that data store $SC^A_{1-2}$ contains the RAMS-generated mediation information that unconditionally permits entities $E_1$ and $E_2$ to associate with one another with respect to certain system operations enumerated (or referenced) within data store $SC^A_{1-2}$, a capability that, as stated is, in this example, merely associational and does not reference or enable execution of any specific operations by entities $E_1$ and $E_2$, in embodiments, a separately mediated capability, also administered by RAMS. But in this simplified example, let $T_S$ refer to a system-defined subject or topic and let $E_1$ and $E_2$ possess a set of topical associational rights reposed within $TC^S_{1-2}$, where TC refers to Topical Control, as administered by methods and procedures and interfaces within or associated with TCM and where, as before the superscript "S" signifies that this information aggregate deals with topic-related associational rights defined for $T_S$ only (and not other potential rights) and the subscript "1-2" signifies that this topical associational data applies with respect to entities $E_1$ and $E_2$. For simplicity, assume that the topical associational capability within data store $TC^S_{1-2}$ fully enumerates the associational capabilities of entities $E_1$ and $E_2$ with respect to topic $T_S$ and further, that there are no other topics defined in or constrained by the TCM system apart from $T_S$. In this example, therefore, absent changes in the associational data store $SC^A_{1-2}$, entities $E_1$ and $E_2$ may associate unconditionally, irrespective of any system-defined topical context and may seek to initiate and/or execute any system activity, subject to the RAMS-administered, event-triggered mediation that may apply to those activities, except with respect any association executed that involves (or, in embodiments) is related to topic $T_S$. In this case, the topical associational rights reposed within data store data store $TC^S_{1-2}$, as instantiated and maintained by methods and procedures and interfaces within or associated with the TCM system (and, in some contexts and in embodiments, in association with methods and procedures and interfaces within or associated with APM or other such components) provide the parameters by means of which TCM (and, in embodiments, other system components) execute the topic-based, entity-referenced associational mediation action for entities $E_1$ and $E_2$ with respect to topic $T_S$. The results of these collective actions, the decision as to whether entities $E_1$ and $E_2$ may associate in the context of topic $T_S$, depends upon factors that include (but are not limited to) such consideration as the specific constraints and conditionals that may be enumerated within $TC^S_{1-2}$, the nature and composition of topic $T_S$, and other system and entity-related considerations, considerations mediated within and in connection with the enumerated capabilities reposed within associational data store $TC^S_{1-2}$ as well as other relevant information $E_1$ and $E_2$.

As those familiar with these and related practices may see, the combined capabilities of TCM in conjunction with those provided by RAMS and APM, both in the context of deployment and operation within a DTS (or DTS-accessible) Platform 1000 and in non-DTS environments, provide a broadly-based and versatile suite of context and content-sensitive and content-responsive access and execution control options that, in embodiments may be exerted upon users, data and system processes. These multi-leveled, multi-variate and variegated control schemes include highly-tunable conditionally-applicable regulatory mechanisms that, in embodiments and at user and system option, may include (in some cases within the same instantiation of a Platform 1000) lightly-administered mediation involving broadly-defined system-related and topically-defined rights and capabilities applied to and upon grossly-differentiated and broadly-grouped entities as well as tightly controlled mediation with very finely closely defined topics and exerted applied to and upon highly-differentiated entity groupings. In addition, such a range of variability may not only coexist within the same DTS Platform but may also be conditionally and with contextually- and/or user- and/or system-meditation be applied flexibility even upon and amongst the same topics and entities.

FIGS. 1-4 and their elements provide a high-level illustration of an architecture and organization, plus the interaction of various components, systems, processes, interfaces, functional blocks, control signals, data streams, data elements, and the like, for a DTS Platform 1000 for Assertional Simulation. The DTS Platform 1000 is referred to in some cases herein as a "DTS Assertional Simulation" Platform, the DTS System, or simply as "DTS," and each such term should be understood to encompass a system that uses one or more embodiments described herein, including the various elements depicted in connection with FIGS. 1 through 4 and their parts as well as with other figures and descriptions within this disclosure. These and other figures (and the relevant descriptions) depict but one embodiment (or sets of embodiments) of a DTS Platform 1000 architecture, noting that other architectural choices may be made in alternative embodiments and that variations in implementation of operational characteristics composing the teachings embodied in the DTS Platform 1000 as may be understood by those skilled in the relevant arts. as well as various.

Note, of course, that in the same sense, these (and other) diagrams and accompanying and related descriptions are illustrative and intended to exemplify the principal teachings embodied in the Platform 1000. As such, these depictions are intended to encompass alternative configurations and implementations as would be understood by one of skill in the art in light of this disclosure.

Further, since the following paragraphs reference graphical representations of details of possible implementations of various systems, subsystems, components and other functionality that may comprise, integrate with, incorporate, use and/or interact within and/or upon the DTS Platform 1000, including a wide range of embodiments, combinations and variations that are enabled by novel aspects of the DTS Platform 1000, some depictions of various control and data interconnection mechanisms and characteristics related to and/or accessible to and/or from constituents within DTS Platform 1000 may be either generalized and/or combined (except where context discourages such representational simplification). These choices are made for both graphical as well as pedagogical purposes and should not be inferred as limiting or excluding alternate implementations. Such elements include but are not in all cases limited to any or all of the following: command-type control; informatics-based control (which may, for example, provide input to conditional logic and/or variable values to formulae); user-facing and/or user-based and/or user interface control mechanisms and information; data, certificates, cryptographic strings and signatures as may be related to (among other things) limitation or governance of permissible operations and/or access; and/or reference to data elements within or accessible to one or more sections within platform-based or platform-enabled methods and procedures. References to control and data interconnection elements throughout this disclosure and in the attendant figures should be understood to optionally use or encompass any or all of these capabilities as well as others that may be inferred as applicable, except where the context indicates otherwise. These mechanisms are outlined in general in the following paragraphs, and references throughout the disclosure should be understood to encompass any of these capabilities, as well as other capabilities that are presented elsewhere in this disclosure, except where the context indicates otherwise.

Referring to FIG. 1, DTS Platform 1000 is illustrated as organized into three primary architectural operating blocks, described as integrated compound functional blocks, shown (in no particular order of precedence) as DTS Control Mechanisms and Operating Interfaces 1101; Assertional Simulation Parameterization 1102; and DTS Assertional Simulation Operations 1103. Note again that, as stated in the foregoing, in implementations and variations of a DTS Platform, this aggregation and its constituents may (without limit) be arranged, reorganized, reordered or presented in other alternate but functionally equivalent (or similar) configurations and thus, the present illustration (and others) does not limit the applicability of such alternative graphical representations to these and further descriptions.

Figure 2:
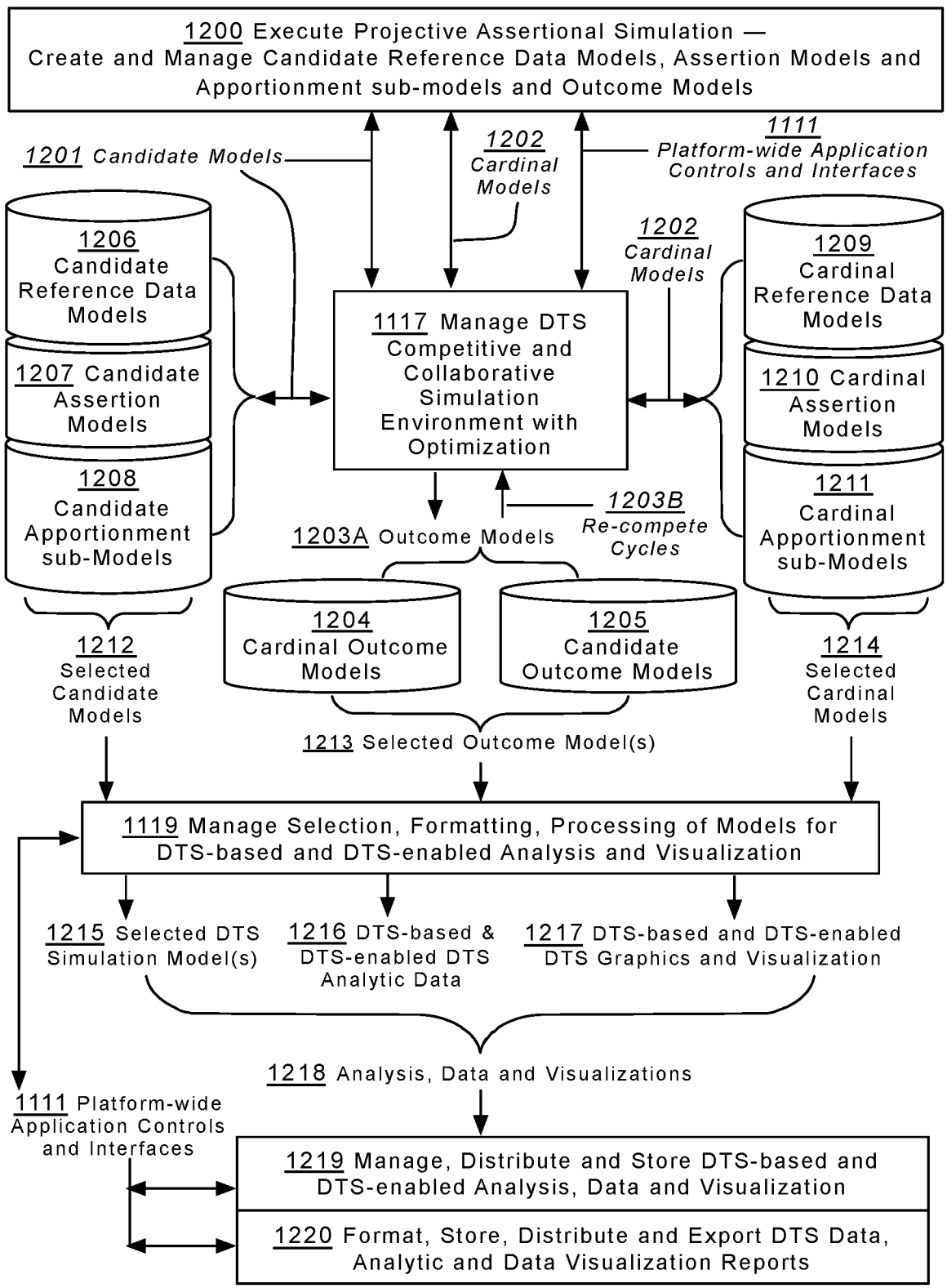
FIG. 2 illustrates an assembly and an execution flow in the competitive evaluation of Outcome Models from DTS Assertional Simulation.
Figure 3:
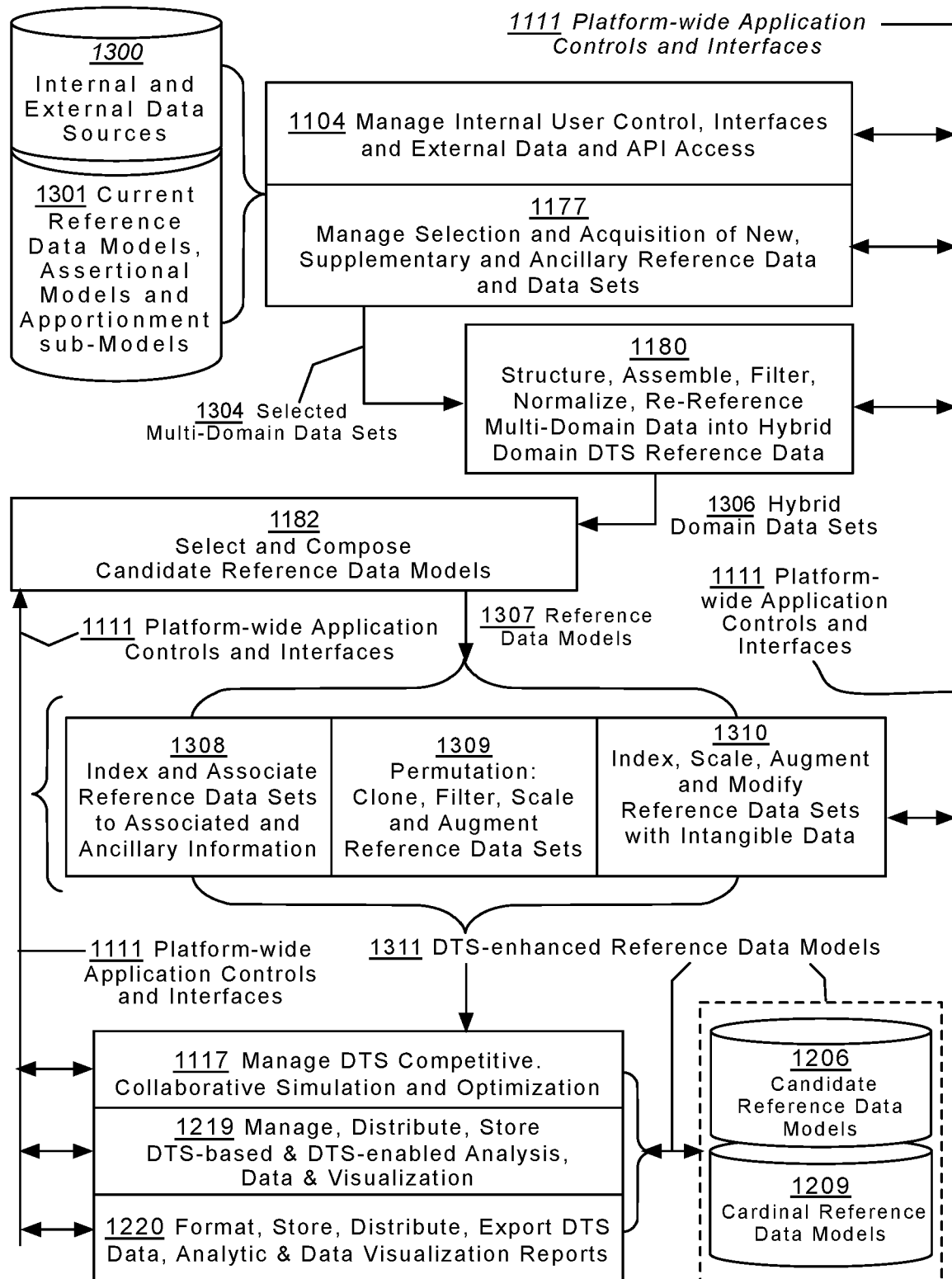
FIG. 3 illustrates an assembly and an execution flow of components that enhance Reference Data Models used in DTS Assertional Simulation with supplementary information.
Figure 4:
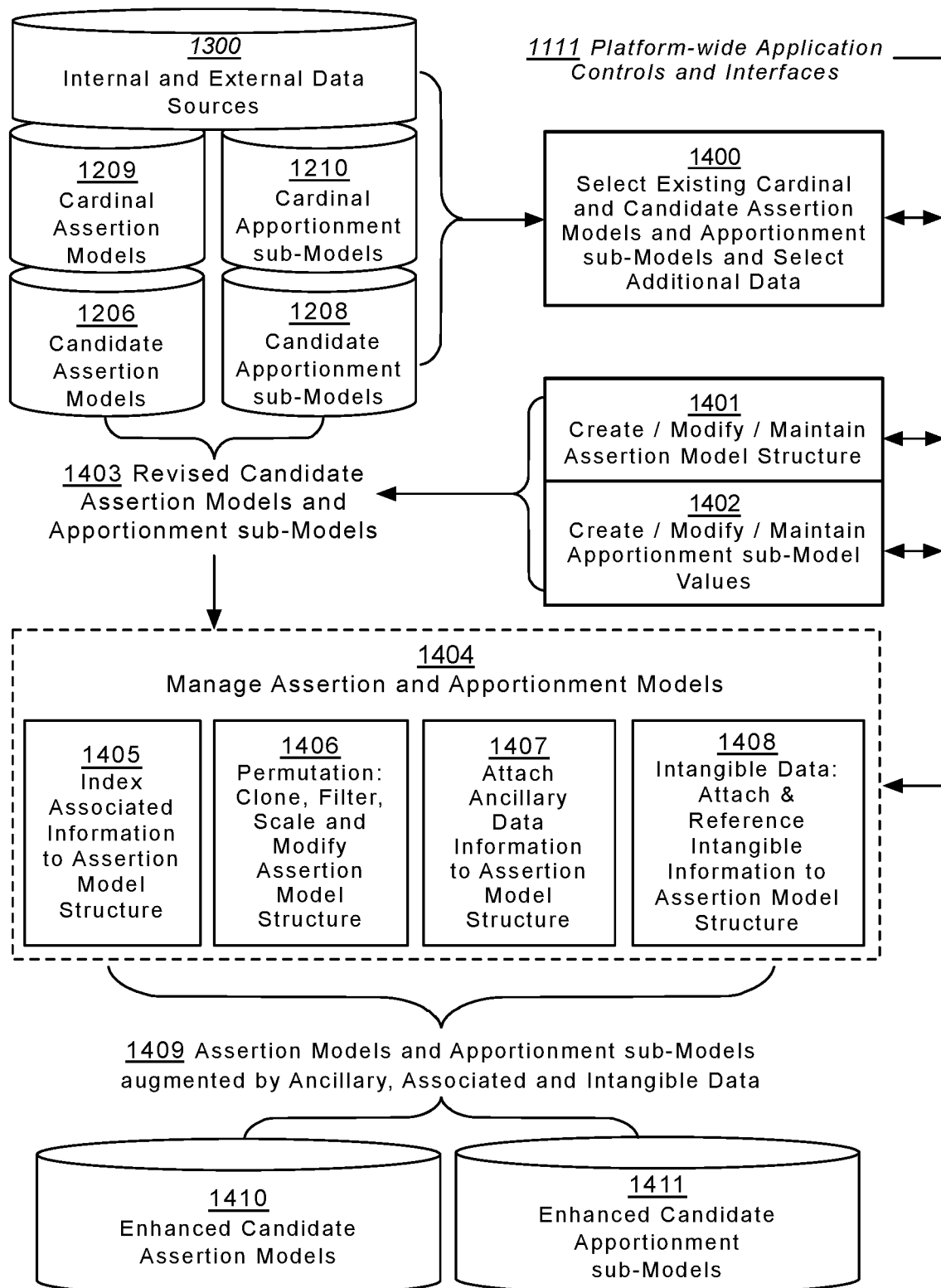
FIG. 4 illustrates an assembly and an execution flow that enhances Assertion-Apportionment pairs used in DTS Assertional Simulation with supplementary information deploying looped optimization.

While FIG. 1 subsumes constituent functional elements explicitly, FIGS. 2-4 (and related figures) expand these representations, revealing more detail regarding implementation functionality within a DTS Platform 1000. Thus, FIGS. 2-4 (and related figures) remove the explicit functional groupings (1101, 1102 and 1103) but essentially retain the nominal (but not determinative but rather expository and illuminative) architectural geometry represented in FIG. 1. As may be seen, for example, in FIG. 2, a more detailed but still high-level representation of the operational aspects of Assertional Simulation within a DTS Platform 1000, functional block Manage Selection, Formatting, Processing of Models for DTS-based/DTS-enabled Analysis and Visualization 1119 is retained from FIG. 1 but placed in a more detailed operational context.

This approach is utilized throughout the presentation of the following figures and descriptions together with the generalization and combination of system-wide functionality of such pervasive elements as control signal/data flow elements, as mentioned in the foregoing. Most relevant in this connection is the composite control signal/data flow Platform-wide Controls and Interfaces 1111. This functionality is shown in FIG. 1 (and in the following figures) as representing a composite of related but discrete control signal/data flows (1108A, 1108B, 1109 and 1110) when in practice and in variations these (and other sub-elements within these signals) may not contextually combined (or presented adjacently) as shown here. This multi-layered composition of compound information aggregation is, as in the functional groupings mentioned in the foregoing, presented for graphical and pedagogical and illustrative purposes as may be understood by those versed in the relevant arts, and should not be understood to represent a required association.

Returning to FIG. 1, and bearing in mind the foregoing, composite blocks 1101, 1102 and 1103 group collections of aggregated computational, control and interface functionalities which, in turn, contain representations of functional components also arranged by general topical functionality, noting again, that the depicted arrangement should be understood as accurate but primarily pedagogical and thus illustrative in order to convey the functional role of these components and should not be interpreted as consequential to any requirement or operation within a DTS Platform 1000.

Integrated compound functional block DTS Control Mechanisms and Operating Interfaces 1101 groups certain functional blocks mainly but not exclusively depicting low-level System operations such as (without limitation) control information, status information, initialization and routing control data. The items included in 1101 represent functionality, interface components and executable elements that are, in general (but not exclusively) present and available to many other functional elements that may be present within and/or available throughout Platform 1000. This functionality includes (without limitation and in no particular order of precedence) compound function blocks Manage Internal User Control, Interfaces and External Data and API Access 1104; Manage Looped, Iterative and Recursive Operations 1105; Manage Recombinant Access (RAMS) and Topical Capability Mediation (TCM) (RAMS) 1106; Manage Activity Logs and Metrics 1107. Integrated compound function block 1101 is shown as providing outputs signal (1108A, 1108B, 1109, 1110), control flows that, as in the foregoing, represent composite information aggregated as described. Note, however, that some or all constituent flows subsumed within these signals may be bi-directional in nature but since they represent composite functionality may not flow in both directions in all cases. In any case, for reasons outlined previously, 1108A, 1108B, 1109, 1110 are shown flowing in one direction. Note this convention will be followed in other figures except where context requires bidirectionality. Note further that, in general, but not exclusively, a control flow may be placed beneath but not connected to an associated functional block subsidiary within 1101, a graphical depiction shared in 1102 and 1103. This representation has been chosen for graphical and informative purposes in order to convey that the referenced control/data flow signal may also connect to and provide data and control (and other information) to and from blocks within the same enclosure. Thus, for example, User and System Control 1108A is shown beneath Manage Internal User Control, Interfaces and External Data and API Access 1104 but clearly user control is required for the other blocks within 1101.

Compound function block Manage Internal User Control, Interfaces and External Data and API Access 1104 represents a collection of methods and procedures that manage and control user-centric functionality including but not limited to user identity, user profile and status, where such functional elements may be present and utilized throughout Platform 1000 and which may permit users to execute such example functions (without limitation) as methods to interact with the System, methods to parameterize Assertional Simulations and the elements within those operations; interfaces and control mechanisms between system elements that effectuate the interconnection of the elements of Assertional Simulation; such other user-based, user-related and system-driven control mechanisms that may include, without limitation, any or all of the following: user activity related to the primary aspects of parameterizing, modifying and otherwise interacting with any of all of the aspects related to Assertional Simulations and ancillary operations as described here; user-facing interfaces and interactive components that communicate information to and from users for nearly every aspect of system operation; positive-input and fully user-based interaction (such as enabled by any number of graphical interfaces) wherein the user may make and instantiate control selections and decisions; process-assisted control types such that control parameters may be initialized and/or modified by system processes, but also such that the control exerted by a user or a process may be assisted by and/or modified by a process (which may be a separate process in the case of assisting a process); user-assisted control types such that control parameters may be initialized and/or modified by other users, such that the control exerted by one user or by a process may be assisted by and/or modified by a user; semi-automated processes wherein users may (optionally, depending on context) monitor any execution progress (at various intervals) and may optionally inspect, intervene and adjust operations, but such that in certain operating conditions (such as normal operations) a user does not need to do so; and fully automated processes wherein, regardless of how a process may be initialized, its execution is system driven with little or no user intervention.

Included in functional block 1104 are methods and procedures and interfaces by means of which external data to and from information sources and computational functionality to and from remote facilities (that is, facilities separate from Platform 1000 itself) may connect to, interface with or may otherwise be made available to or from the Platform by means of one or more (optionally) bi-directional API's wherein additional/and/or adjunctive (and/or even redundant) computational capability, data or other information and other functionality may be made available to any or all computational aspect and executable blocks within Platform 1000, where such API's may provide Platform 1000 (or may be supplied by Platform 1000) with services and/or data as in the foregoing and without limitation continuously, intermittently, on-demand, implicitly (as within a collection of distributed capabilities and subsequent demand) and/or explicitly (under implicit and explicit user and/or programed control).

Information flow that may be related to and/or which may be generated or otherwise transformed or changed by but which may not be exclusively accessible to Manage Internal User Control, Interfaces and External Data and API Access 1104 (and others not listed or shown) are shown in FIG. 1 and in other depictions as composited within control signal/data flow User and System Control 1108A. Signal 1108A primarily but not exclusively subsumes control signal and data flow related to information generated or processed within 1104 (as in the foregoing), but as mentioned, information embedded therein may also be available to any other blocks within 1101 (even those not explicit but related), and indeed, unless otherwise indicated and otherwise contextually prohibited or infeasible (as one versed in such arts may see), such functionality may, in implementations, be present and embedded within other functional and composite blocks and should assumed to be present even when not explicit. Moreover, as described, 1108A is subsumed within control signal/data flow Platform-wide Controls and Interfaces 1111 by means of which the foregoing functionality as well as others not mentioned are shown to be and understood as available throughout the system.

Continuing to examine integrated compound function block 1101, block Manage Looped, Iterative and Recursive Operations 1105 an architectural feature that may be optionally integrated in implementations of operational aspects of a Platform 1000. Block 1105 is closely but not exclusively bound to control signal/data flow 1108B, where its specific graphical placement is so-chosen as described previously. 1108B is a variegated and complex instance of this type of data transformational data/control signal and is often integrated with or connected to (and in instances) may enable and control advanced functionality provided within a DTS Platform 1000. In one simple example, a comparison-based optimization routine may be deployed as a part of or integrated within certain normalization routines (as may be present in embodiments of Platform 1000), wherein target data is recursively modified in a looping operation and compared to a different parametrized instance of that target data such that the looped modification continues to compare and modify the target data until the target data converges to the closest approximation to the parametrized instance. The previous example is, of course, an elementary instance of routines of this sort and are the simplest representation of this class of algorithms which include, for example, generic and competitive technologies and other complex AI-based evolutionary routines. In embodiments and within variations, Platform 1000 utilizes a variety of such programs and utilities.

Note, however, that here and in other instances in this description, the generic term "optimization" may refer, in general but not exclusively to recursive or self-modifying techniques but may also (and/or instead) be used interchangeably with the term "iterative/recursive looping". Note further, however, that the functionality of the Platform 1000 is not dependent upon such optimization nor upon recursive or self-modifying techniques. While recursion features can enable various useful capabilities in embodiments and implementations of a DTS System 1000, there are implementations of DTS where few (if any) operations involve recursion techniques. Thus, to the degree that recursion techniques are present, they may be employed in various alternative ways to the manner in which they are depicted in the present description, such as, in non-limiting examples, in server-side database access routines and pattern detection algorithms.

The presence of control signal/data flow Optimization Control 1108B (which may optionally be included within Platform-wide Controls and Interfaces 1111 or shown explicitly) conveys the optional presence of this capability within and availability to elements composing a DTS Platform 1000, where such integration may be system-wide or within particular components. Operations that may be included or accessible to such signal/data flows include (but are not limited to): iterative, looping and recursive revision methods involving feedback-driven (and in some cases, feed-forward-driven) modification of data, informational elements and in some instances, parameters used by and within methods and procedures; revision and adjustment of the structure and operations of those procedures themselves, based fully or in part on the result of these earlier operations in such a manner that the output collection of one or more computational procedures composes and/or is integrated with other information to form the input to a loop-based repetition by and/or within methods and procedures.

Thus, Platform 1000 may include, in embodiments, system-wide embedding of recursion-based modification of system elements in various modeling and simulation subsystems, including in an overarching Assertional Simulation modality. Moreover, embodiments of 1105 and 1108B may include not only recursion-based revision, but other related methods and forms of information modification, including but limited to: context- and content-derived self-modification of data; revision of method and procedure and interface structure; changes in and/or modulation of execution parameters.

In this connection, therefore, the descriptions and diagrams in this description may make repeated references to such self-modifying and/or self-referencing revision-based operations where such (generally) looped techniques may be based upon and/or may include parameters related to (but may not be limited to) any or all of the following: results obtained from (and/or which may be inferred from) one or more content-based and/or content-derived technique; and/or results obtained from (and/or which may be inferred from) one or more context-based and/or context-related revision techniques.

Note again, however, that 1108B may be shown as a component within Platform-wide Controls and Interfaces 1111 and thus, when 1111 is signified, implementations may include any or all such capability and attendant control signals. Note also that any or all of the functional components (and the subsidiary methods, procedures and interfaces) as well as the data that may be related to or derived from or inferred from such executable elements may implement and/or may participate in and/or may contribute to such iterative and recursive techniques (which may change or revise any of all of the elements outlined in the foregoing description) using any number of known techniques and may also (in addition or instead in variations) deploy such techniques.

The functional aspects captured within such computational or transformative processes as may participate (or may be able to do so), as in the foregoing, and referred to here as receiving and responding to Optimization Control 1108B may be also referenced as being engaged in "looped refinement", a DTS-engendered term. DTS looped refinement may exhibit (but may not in all cases be limited to) any or all of the following features, execution structures and configurations: a) intrinsic looped refinement wherein some or all of a loop-based revision is a feature of one or more procedures or methods within a functional block; b) extrinsic looped refinement wherein some or all of a loop-based revision is embodied by one or more mechanisms subsumed within the composite functional box may interact with Manage Looped, Iterative and Recursive Operations 1105 including composite/control signal User and System Control 1108A such that 1108B in this context may be derived from (one or more) external parameters (Manage Internal User Control, Interfaces and External Data and API Access 1104) supplied (or otherwise made available) to DTS (or DTS-enabled) methods and procedures from external systems (such as via industry-typical system interfaces, such as API's) and/or other elements within which (in this context) refers to one or more parameters that may have been pre-set globally and/or conditionally on a per-instance basis by system users or groups of users and/or which may have been obtained from and/or produced by and/or otherwise derived from one or more DTS-based (and/or DTS-enabled) processes, methods and procedures, where any or all of the foregoing methods may be executed in combination.

Note further that any or all of the foregoing aspects of DTS-embedded looped refinement and the related functional block Manage Looped, Iterative and Recursive Operations 1105 (and the control signal Optimization Control 1108B may be executed in a number of ways, including but not limited to: within and/or between methods, procedures and processes that may be subsumed within (and/or referenced by and/or indexed to) a composite functional box where the control stream Optimization Control 1108B may be connected; within and/or between other functional boxes—that is, between the composite boxes themselves but also within and/or between elements within the boxes respectively composing (one or more) nested or enclosed looped refinement arrangements and optionally featuring one or more inner loops and one or more outer loops such that the informatic domain(s) within (one or more) such inner and outer looped refinement cycles may take place and/or may be either related or unrelated.

But note as well that any or all of the foregoing may be conditionally executed for any of the reasons outlined in previous descriptions, including those related to content-derived and context-related information. Such aspects and capabilities and operations within or accessible to (and/or as may be made accessible to external systems) by the DTS System 1000 may be enabled, controlled, initiated or otherwise computationally related to information embedded within (or related to) composite data and control stream Optimization Control 1108B, elements of which may be employed in various embodiments described herein as would be understood by one of ordinary skill in the art. As may be contextually appropriate, additional details relating to particular embodiments of looped refinement (and related operations) may be provided throughout this disclosure and in concrete implementations of one or more components of a DTS Platform 1000, but, where not explicitly shown or cited, should be understood as possible or implied, conclusions that may be achievable by those versed in such operations. For compactness without loss of general applicability, references to data and control stream Optimization Control 1108B should be assumed to entail any or all of the foregoing (without limit) depending on implementations and variations appropriate for various embodiments.

Continuing within compound block 1101, composite functional block RAMS and TCM Control 1109 and control signal/data flow RAMS and TCM Control 1109 provide functionality that may permeate any or all elements within embodiments of a DTS Platform 1000 in a manner similar to previously described 1104, 1105, 1108A and 1108B. In this case, however, the potential prevalence of 1106 and 1109 may be more pronounced and ubiquitous since the functionality represented within these blocks and signal flow may, in embodiments, impact not only system operations but data and user identity, as well, impacting execution and access in both mundane and complex operations.

RAMS is a DTS-originated acronym for Recombinant Access Mediation System and is a generalized reference to a collection of functionality that in embodiments, implements a layered and multi-mode real-time permission and access control and capability mediation system optionally embedded within a DTS Platform 1000. RAMS and its constituent elements encompass an event-driven, object-oriented, context- and content-derived data, process and user access control and execution access and capability infrastructure which asserts a variegated and contextual control fabric over many aspects of the operation of a DTS System 1000. Note that details on the operation and functionality of RAMS 1106 and the activity of signal 1109 are provided in further sections of this disclosure.

In the present context, however, and as with the other control signals described in the foregoing, functional block Manage Recombinant Access (RAMS) and Topical Capability Mediation (TCM) 1106, irrespective of its nominal complexity and ubiquity, may be considered a low-level platform operation, though in many instances, elements related to the operation and execution of its control fabric may become evident to, accessible to and controllable by users and other higher level entities. Thus, both 1106 and signal 1109 are depicted in block 1101 with other "building block" elements though its functionality may be more varied and far-reaching than others.

As with the other components of compound block 1101, control signal/data flow RAMS and TCM Control 1109 is shown as placed underneath block 1106 but, as before, the functionality composited within 1109 may be available to and may act upon any of the elements within 1101, as indeed, as it may with any functional elements within Platform 1000. Moreover, 1109 is shown as optionally embedded within Platform-wide Controls and Interfaces 1111, and with the other control signal described in the foregoing in this connection, may be considered present when 1111 is shown, although, it should be noted that one or more elements of 1109 may be present throughout a Platform 1000 and its lack of explicit presentation should not imply its potential presence or applicability. While the following diagrams and related text may make repeated reference to the presence of RAMS 1106 functionality and operations and to the presence of data and control information depicted by 1109, to the degree that there may be context-based differences within a given application, those differences will be noted in connection with particular embodiments.

Completing compound function block 1101, function block Manage Activity Logs and in-App Metrics 1107 and control/data flow In-app Metrics/Logs 1110 provide system-wide operational monitoring, compilation and logging capability. As with RAMS functionality subsumed within compound box 1106 and RAMS data/signal flow 1109 (as, indeed, may be case with other elements related to Platform 1000 that are depicted in composite block 1101), the operations of executed by and provided within functional block 1107 and data/signal flow 1110 are generally present throughout embodiments of Platform 1000 and may be described in operational context elsewhere in this description. And, as described in the foregoing text with respect to other control signal/data flows related to 1101, the bidirectional signal depicted In-app Metrics/Logs 1110 is shown as subsumed within Platform-wide Controls and Interfaces 1111 and may also be assumed as present when 1111 is shown or implied.

The platform-wide DTS In-App activity resource subsumes and may interface with and utilize the capabilities from a variable and dynamically and conditionally assembled context-sensitive collection of content-sensitive and content-responsive activity and execution monitoring resources. This diverse computational and analytic polyglot, in embodiments, may gather, filter, interpret, transform, compile, combine and otherwise manipulate information that may be directly provided and/or elicited, which may be inferred from other information and/or past and present operating conditions and/or which may be derived or otherwise extracted from any or all of the above and upon which it may apply extensive computational capability to potentially disjoint, discontinuous and cross-domain information The next composite grouping is shown in integrated compound function block Assertional Simulation Parameterization 1102. As shown, 1102 contains an aggregation of functional blocks: Assemble and Parameterize and Select Candidate Reference Data Model(s) 1112, Assemble and Parameterize and Select Candidate Assertion Model(s) 1113, Assemble and Parameterize and Select Candidate Apportionment sub-Model(s) 1114). As with other high-level groupings of functional blocks, this particular assemblage is mainly illustrative and pedagogic, although, in this case, the composite functionality represented by these blocks may, in embodiments and in some contexts, be more contextually and operationally (but not always functionally) related than other such collections. Thus, blocks 1112, 1113 and 1114 may have a greater degree of topical and operational connection and, in context, may be more often contemporaneously executed than other groupings in FIG. 1 where, in embodiments, such interoperability is manifested in both commonly accessible computational blocks as well as in interfaces between executable components. The differences, however, are underscored by the nomenclature depicted within block 1102: each constituent block 1112, 1113 and 1114 is labeled as responsible for the "assembly", "parameterization" and "selection" of the respective primary (but not the only) distinct informatic structures within Assertional Simulation operations. But, while these composite function blocks are shown to share common terminology and predicates, the operations executed by methods and procedures and interfaces within each block possess, in embodiments, distinct and in general, specialized components germane to their respective roles in the DTS Platform 1000 and the role each play in execution of the diverse modes of Assertional Simulation.

Note, therefore, that while compound function box Assertional Simulation Parameterization 1102 illustrates aggregated high-level functionality, this particular graphical composition also depicts the centrality of the methods and procedures and interfaces related to, supporting and surrounding operations related to the primary informatic entities and related ancillary components. On this basis, compound box 1102 should be contextually understood as depicting the most basic representation of the elements composing Assertional Simulation operations, one intended to establish its aggregated system context without (yet) conveying too much of its variegated detail. Such detail is presented elsewhere in this description and within other figures and explanatory text.

Despite the fact that the elements comprising compound function box 1102 may operate at a higher and more visible functional level than those depicted within compound function box 1101, much of the same explanation for choices regarding the graphical representation laid out for 1101 apply to 1102, as well. Note, for example, the compound function box representation of composite control signal Platform-wide Controls and Interfaces 1111 as an input/output to 1102 but also that, as in foregoing description regarding interconnection within 1101, the presence of 1111 indicates that any or all of the signals subsumed within 1111 may be accessible or otherwise available to any of the elements within any of the blocks shown in 1102.

While operating upon different informatic edifices, compound blocks 1112, 1113 and 1114 provide the similar functionality executed by means of a variety of user and/or system interfaces. The assembly, parametrization and selection operations executed within these functional blocks may, in embodiments utilize unique variations of the same basic user interface components since the subject information is definitionally and functionally different. More detail and context about such operations may be supplied later in this document but at the high-level explanation conveyed in FIG. 1, it is sufficient to graphically convey that the main data structures that compose Assertional Simulation Reference Data Models are distinct but categorically related.

As shown in FIG. 1, the composite output signal flow Selected Candidate Models 1115 connects compound function blocks 1102 and 1103, where the latter (DTS Assertional Simulation Operations 1103) represents aggregation of the main operational aspects of the DTS Platform 1000 while the former represents aggregation of the main operations related to creation, manipulation and selection (and, in embodiments, preparation) of the depicted informatic entities, where the latter are shown as input for the operational execution blocks within 1103. In embodiments, these structural distinctions may be evident but in practice, these elements (and the plethora sub-elements and layered functionality) may, in certain implementations, be more closely bound since the actual interconnection is more nuanced and, in most instances, less sequential. Thus, the intention of the high-level depiction within FIG. 1 in representing this interconnect in this manner is to provide a representation of both the functional role of the main elements in an execution chain of an Assertional Simulation operation within an embodiment Platform 1000 and the interconnection between these elements.

Thus, as will be discussed in greater detail in other figures and text, blocks 1112, 1113 and 1114, utilizing one or more capabilities that may be in general but not always integral to (nor in all cases required within) Platform 1000 (as may be embodied in (but not limited to) one or more elements in bi-directional control signal/data flow 1111), provide collections of methods and procedures and interfaces within a managed (and in embodiments and in some contexts, system-guided) possibly sequential workflow (but sometimes non-linear workflow) by means of which one or more users and system processes may create, parameterize and otherwise manipulate and ultimately provide one or more Candidate Data Reference Models, Candidate Assertion Models and (optional) Candidate Apportionment sub-Model(s).

As noted, the operations subsumed within integrated compound function block 1102 (1112, 1113 and 1114) represent basic elements in one or more execution-chain(s) that, in embodiments, may be used to create or manipulate or otherwise engage in operations within Platform 1000 main (but not exclusively) related to Assertional Simulation and related ancillary operations. The referenced "assembly, parametrization and selection" processes represent aggregated general capability that, in embodiments, may be deployed respectively to assist users and/or system processes in both simple and complex execution of important tasks related to pivotal informatic entities and ancillary informatic and functional components such as (but not limited to Assertion Models, Apportionment sub-Models, Reference Data Models and Outcome Models).

In embodiments, these structural and/or compositional configurations may be selected by means of any number of mechanisms supplied by and/or supported by and/or otherwise impelled by the results of operation(s) executed by elements with Platform 1000, such as (without limitations) any or all of the following in any combination or sequence: (i) direct or indirect user interface-based selection which may be based upon many diverse factors (including (without limitation) positive-directed user choice and/or preference and/or intuition); (ii) based upon or inferred or otherwise derived from one or more internal parameters supplied by other components within a Platform 1000 and/or from one or more external parameters where any of the foregoing may be supplied and/or may be processed through and/or otherwise prepared, modified or otherwise transformed by means of one or more internal or external parameters; computational resources or elements within previously described composite box Manage Internal User Control, Interfaces and External Data and API Access 1104; (iii) direct or indirect results or other parameters that may be supplied by and/or generated as a result of and/or inferred from any operations associated (partially or in full) with one or more elements subsumed within composite box Manage Looped, Iterative and Recursive Operations 1105, where such functionality may, in embodiments, be provisioned as an integral functionality within DTS Platform 1000 and/or may be (fully or partially) external to Platform 1000 but which may be enabled, affiliated or otherwise accessible as may be required using, without limitations any or all of the elements composed within Manage Looped, Iterative and Recursive Operations 1105 where example recursive or iterative operations of this type have been described in the foregoing. Note that such interconnection between the lower-level elements represented within 1101 may be subsumed within one or more elements within the bidirectional composite control flow Platform-wide Controls and Interfaces 1111.

Compound function blocks 1102 and 1103 are also connected by the optional bi-directional composite control signal/data flow Optimization/Re-Competition 1120. Note that this signal has two aspects as implied in its nomenclature: optimization and re-competition. As discussed in the foregoing, the term (and the concept-cluster) "optimization" refers in general (but not exclusively) in DTS-related literature to operations related to various types of looped refinement operations (as outlined previously). As may be evident to those versed in these arts, however, optimization may also be related to and integral to the competitive, collaborative and comparative elements which may be present and operational within embodiments of a DTS Platform 1000. In this sense, optimization, therefore, may also encompass DTS operations wherein one or more users (possibly assisted by related manual and/or semi-automated or automated processes) may invoke and supervise (without program-driven supervision) comparison and competitive analysis and exercises involving various Outcome Models (and the progenitorial informatic elements from which they are spawned), optimization operations that may in some cases involve (without limitation) manual and/or program-assisted and/or fully automatic iterations. One aspect in these "manual optimization" operations enabled within a DTS Platform 1000 involves explicit (though sometimes program-assisted) manual direction by one or more users and interpolative inspection in directed efforts intended to achieve one or more goals within one or elements within the subject Models, goals that may (or may not in all cases) be evident but which may be discovered during such exercises.

Thus, while optimization operations may, within a DTS System 1000 in general, encompass the previously described program-centric transformative iterative maximization of one or aspects of any of the participating Models (based upon one or more static and/or dynamic or contextually-derived criteria such that one result may be submission or selection of one or more Cardinal Outcomes (and the progenitorial Cardinal Models from which they were created)), optimization in a DTS embodiment may also and/or instead refer to the human-centric and mainly user-interface-driven selection of one or more Cardinal Outcomes. The Cardinality of Models and their selection from various Candidate Models and the components, methods and procedures as well as system resources with a DTS Platform were referenced in earlier discussions and examples where the competitive and collaborative capabilities within embodiments of elements within a DTS Platform were discussed, and further explication of these aspects are presented in this description in connection to a number of operational contexts.

For the present purposes of detailing the elements within the high-level representations in FIG. 1, note that bi-directional control signal/data flow Optimization/Re-Competition 1120 represents both aspects of DTS-fostered optimization and subsumes the requisite composite of data, information and control elements to support such operations. Moreover, as in the foregoing with respect to compound function blocks 1101 and 1102, control signal/data flow 1120 (and its constituents) are available without limitation to any or all of the composite functional blocks (and their integrated constituents) within compound function block DTS Assertional Simulation Operations 1103. Finally, note that control signal/data flow 1120 not only "feeds back" to the functions within 1102 (such that elements within that control signal/data flow may be used by any or all of the blocks within 1103, without limitation) but that 1120 also connects to the output of 1102, control signal/data flow Selected Candidate Models 1115, a composite output described in the foregoing text. In this manner, FIG. 1 depicts the high-level interconnection and interoperability of these elements and functionality to which they are connected which, in practical terms, means that the embedded functionality within these composite boxes may be accessed in any number of ways through embedded interfaces within the collection methods and procedures.

Figure 5:
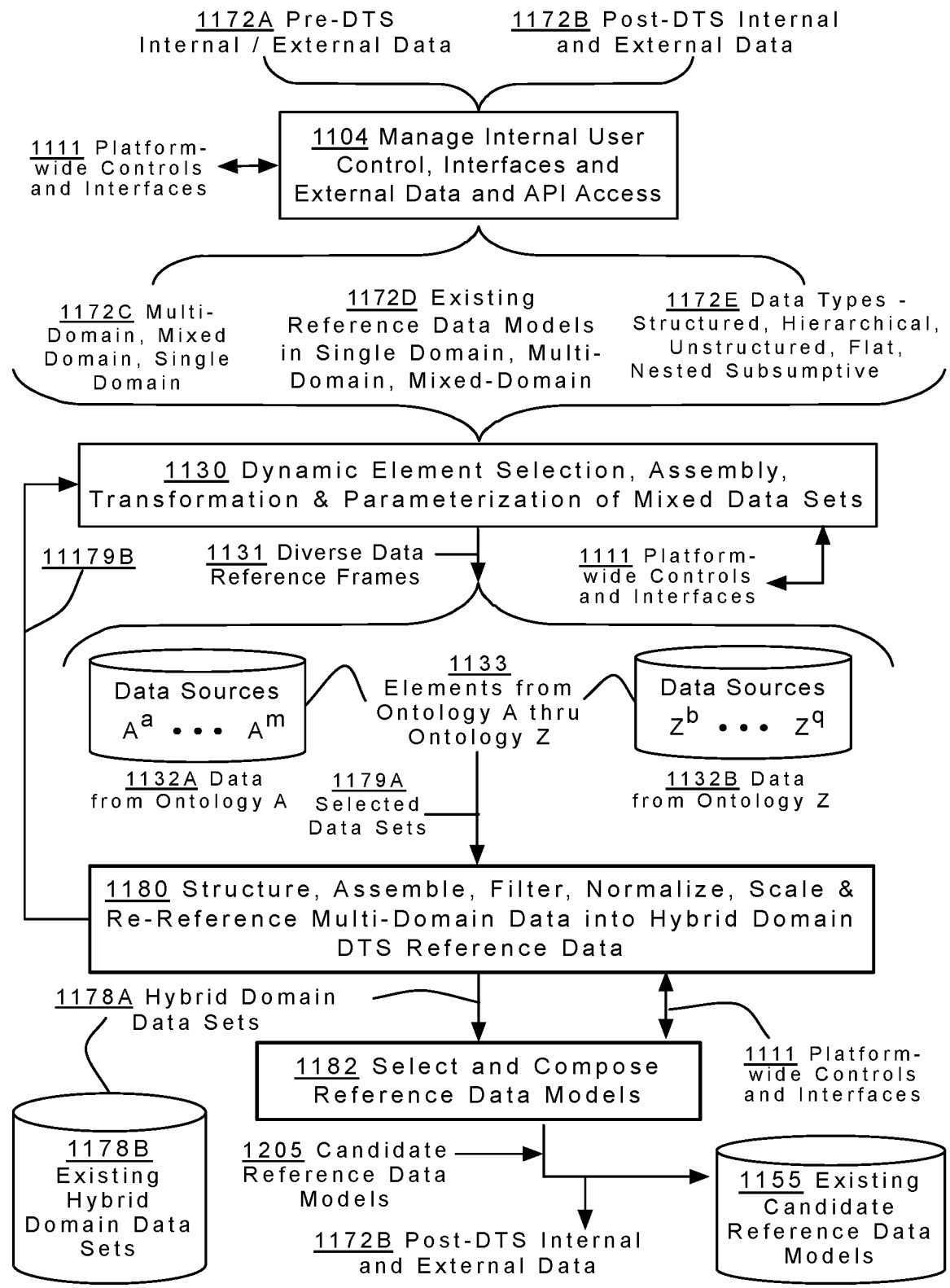
FIG. 5 illustrates an assembly and an execution flow in the construction and revision of Reference Data Models used in DTS Assertional Simulation from disparate information sources.

FIG. 5 (and related figures and descriptions) depicts example workflows, data and information flows as well as methods, procedures and interfaces associated with the creation, assembly, and maintenance of Reference Data Models. This combined functionality is represented at a high level in FIG. 1 through the depiction of composite functional block Assemble and Parameterize and Select Candidate Reference Data Model(s) 1112, wherein a suite of methods and procedures and interfaces are shown as subsumed within integrated compound function block Assertional Simulation Parameterization 1102.

Reference Data Models are created, assembled, initialized, modulated, manipulated and otherwise operated upon by users and system processes, and are used broadly throughout a Platform 1000. These aggregations of information (and sub-sections of these aggregations) are directly and indirectly employed, accessed and otherwise referenced by and within multiple areas within a DTS Platform 1000, and may be utilized in various forms, in various stages of development and parameterization as well as in various configurations and modalities (as outlined in this disclosure). In this sense, Reference Data Models and various supportive and ancillary functions may be considered a central aspect within the overall functionality provided by embodiments of a DTS Platform 1000, involved in a variety of operations that include (but are not limited to): parameterization and execution of various types and modalities of Assertional Simulation and related activities; user—and system process-driven activities throughout the DTS competitive and collaborative environment; parameterization, formatting and execution of varieties of analysis and visualization of data directly and indirectly germane to Reference Data Models using DTS-based (and/or DTS-enabled and/or DTS-accessible) methods and procedures; metering and analysis of user- and system-engendered activity including functionality related to DTS in-app user- and system-performance and feature utilization, activity profiling and resource access measurement (as cited, for example, in FIG. 1 in relation to data/control flow In-app Metrics/Logs 1110 and as described in this disclosure).

Reference Data Models, therefore, occupy a central place in many operational facets throughout a DTS system, and across these modalities, ancillary and supportive methods and procedures and interfaces may be deployed by users and system processes to enhance and extend its utility and application. Thus, for example, a Platform 1000 may provide an array of DTS-based (and/or DTS-enabled and/or DTS-accessible) tools and procedures enabling analysis, measurement and statistical and mathematical processing as well as graphical visualization techniques to be applied to and upon Reference Data Models (and other such edifices) in a variety of DTS operational contexts. Among these capabilities are methods and computational techniques adapted from data mining, business analytics and performance evaluation and measurement systems but which in embodiments of a Platform 1000, may be additionally (or instead) be augmented, supplemented and contextualized within DTS-based and/or DTS-enabled and/or DTS-accessible methods and procedures and interfaces. Thus, in embodiments, a Platform 1000 may employ a spectrum of methods and procedures and interfaces providing or facilitating these types of diverse and specialized analytic tools, technologies drawn and adapted from a variety of industries and applications that may, in context, be applied directly or indirectly, in part or in full to the range of operations related to and supporting the life-cycle of Reference Data Models (as well as to informatic entities (such as, for example, Assertion Models, Apportionment sub-Models and Outcome Models and associated ancillary entities and other informational structures) but also to related ancillary and support operations, where such diverse analytic procedures may optionally and contextually be reconfigured and redeployed, recast and repurposed within the operating context of a Platform 1000.

Thus, DTS Platforms 1000 may incorporate, utilize or otherwise make available to methods and procedures and interfaces that utilize or construct or otherwise operate upon Reference Data Models computation techniques that may include (but may not be limited to): (i) initialization, parameterization, manipulation and execution of analytic and visualization techniques and related mathematical and logical precursory processes; (ii) recursive and looped optimizations and other transformative operations (as illustrated within but not limited to those modalities cited in the foregoing); (iii) machine learning technologies (in a variety of modalities including (but not limited to) supervised and unsupervised training, reward-based optimization that may be based upon or which may utilize pattern detection and training capabilities derived from deployment of various types and configurations of neural nets and similar techniques; (iv) content-emergent evaluation and normalization techniques as well as forms of reward-based optimization and content-derived goal seeking; (v) pattern detection and recognition and feature map extraction technologies; and (vi) heuristics-based expert algorithms that may be used for data manipulation, transformation, filtering, optimization and/or management.

Note, however that, while the process and execution flows and functionality depicted in FIG. 5 and the descriptions and exemplification of capabilities and operations described in the previous paragraphs and subsequent descriptions may have been centered upon Reference Data Models, in embodiments, the same functionality and process and data flows may also, without limitation, be applied to other DTS-based (and/or DTS-enabled and/or DTS-accessible) informatic entities (such as, for example, Assertion Models, Apportionment sub-Models and Outcome Models and associated ancillary entities and other informational structures). Thus, unless otherwise noted, it may be assumed that that any or all of the methods and procedures described here may also apply in other contexts and to other informatic entities.

FIG. 5 and related figures and descriptions describe methods and procedures centered about the creation, assembly, modification and other transformational operations that, in embodiments, may be routinely executed by users and system processes upon primordial (or existing) Reference Data Models which may be in various states of assembly and development, including full completion. Note therefore, that while the functionality and example methods and process and execution flows in previous and subsequent paragraphs and figures may encompass an example of the potential life-cycle of a Reference Data Model, such cycles may not, in all cases and implementations, be executed in linear, step-wise operations resulting, for example, in a direct-line creation of a completed instance. In embodiments, DTS-based (and/or DTS-enabled and/or DTS-accessible) methods and procedures and interfaces within a Platform 1000 may access, extract and operate upon any section or sub-section of any Reference Data Model in any state of development (as my be permitted by APM-mediated ownership, as described in the foregoing, and as subject to RAMS access mediation and other access considerations) and may interpolate into any of the depicted process flows to accomplish one or more tasks. Examples of such DTS-provided capabilities include (but are not limited to): i) DTS-engendered clone-and-modify and permutational capabilities (where, for example, one or more aspects of a Reference Data Model containing financial and accounting information for a given period may be replicated and elements manually or programmatically changed, thus creating a new instance of that Reference Data Model upon which one or more Assertional Simulations may be run, a capability described and documented in various contexts in this disclosure and in concrete implementations of one or more components of a DTS Platform 1000 and as depicted in blocks 1306 and 1406 in FIGS. 3 and 4, respectively); and ii) DTS-provided competitive/collaborative functionality (as shown in FIG. 1) subsumed within example composite functional block Manage DTS Competitive and Collaborative Simulation Environment with Optimization 1117 (where, for example, some methods and procedures and interfaces enable a variety of modes for selection of Cardinal Models from Candidate Models). Details and descriptions of the process and execution flows depicted in these figures, as well as discussion of the functional and execution-level aspects are detailed in the following paragraphs.

FIG. 5 also highlights a novel teaching advanced within the present invention, one which represents an extension to and improvement upon current methods related to the exchange and processing of information between disparate systems. This contribution to the art is generally applicable to many non-DTS systems and operations and, in embodiments of Platform 1000, is broadly present in DTS-based (and/or DTS-enabled and/or DTS-accessible) components and has particular relevance within one or more aspects of the computational chain of execution in certain modalities of Assertional Simulation and related activities. Specifically, certain types of information that are processed and operated upon within a DTS Platform 1000 can be explicitly disconnected (or, in DTS terminology, "de-referenced") from its native ontological reference frames and consequent semantical underpinnings, stripping from the subject information both the general and specific informatic context which had provided its definitional and relational unity. In some contexts, and some modalities, DTS-based (and/or DTS-enabled and/or DTS-accessible) methods and procedures and interfaces may optionally permit this informatic disconnection to be reversed (or, in DTS terminology. the information may be "re-referenced"). The elements within a subject information aggregate that may be disconnected from its source context include (but are not comprehensively described by): i) the semantical definitions (as framed by one or more ontological reference frames) which are contextually applied to (and in some cases, inherent within) individual elements; and ii) relations between elements reposed both within and outside the aggregation. Thus, DTS-engendered disconnection may be applied contextually to semantical relations that provide both contextual "meaning" (and degrees of meaning) for an element as a standalone informatic unit but which also define and circumscribe the nature and degree of any connective relationships between one or more such discrete defined elements, including instances where relationships may exist between defined aspects within the subject information and aspects within information external to the subject information. In embodiments, methods and procedures and interfaces within a DTS Platform 1000 (and/or DTS-enabled and/or DTS-accessible capabilities) provide instances of computational processes by means of which the lexicon and/or grammar and/or structural rules within all or part the subject information may be systematically and selectively subjected to this disconnection and may thereby be fully or partially re-defined and recast (contextually and, in instances, temporarily) within one or more new DTS-based frames of reference. This new ontological frame(s) provides the basis for the semantical reference upon which certain methods and procedures and interfaces may then operate upon this fully or partially recast information, a basis from which the resultant computational product (and/or any of its constituents) may also be optionally re-referenced or re-connected back to the original or native frames of reference.

The coerced disconnection and re-definition of the semantic and contextual interconnection within and between nodes of information is called in DTS terminology "semantic de-referencing". DTS semantic de-referencing reflects a practical and tangible application of the synthesis of elements drawn from information science with principles and techniques drawn from disparate mathematical disciplines not typically employed in these contexts such as, for example, Category and Representation Theory. Without foreclosing general applicability to other systems, the theoretical and practical application of DTS semantic de-referencing and the concrete consequences of its application serves both as a predicate enabling execution of some methods and procedures and interfaces within a Platform 1000 (especially but not exclusively those involved in Assertional Simulation), but also provides a computational and execution framework defining those and other information-centric computational, organizational and analytic operations.

DTS semantic de-referencing directly and comprehensively addresses increasingly common and complex problems that arise when information management systems operate upon information drawn from disparate informatic domains. DTS semantic de-referencing introduces a comprehensive set of solutions to solve these problems in a manner prior systems and sub-systems cannot or do not, providing a suite of methods and procedures and interfaces widely applicable in many operational contexts. In general, information management systems of this type may be found in many types of systems but are commonly encountered in the broadly-defined Business Intelligence and Analytics (BI) arena where components that process information to and from data sources are often collected within the sometimes-amorphic group of operations called ETL (Extract, Transform and Load). ETL is a common term applied across many data processing platforms of all varieties, and each system applies different specific meanings, at least with respect to the goals of the system and the methods that implement the processing. But note that the variety, breadth and complexity of information sources has been and continues to increase rapidly and this expansion has engendered a concomitant surge in the incidence of disjointedness between information sets that may now be obtained from growingly disparate sources and domains. This increased "unconnected-ness" within and between information sets limits the types of computational and analytic operations that may be effectively performed on such ontologically disjoint information sets and current ETL systems using traditional, established methods have not kept pace with these demands to precondition the information for such downstream processing. This failure is partly due to the fact that the problem-domain addressed by traditional ETL subsystems, in general, differs from that addressed by DTS semantic de-referencing. In many cases, it is not possible or even desirable for an ETL system to coerce such informatic disconnection. This may be due not only to the nature and goals of the computational operations that an ETL subsystem supports but also because of the inherent complexity of the ontological underpinnings that define and circumscribe aggregates of information. Even simple aggregates of information are defined by detailed semantical subtleties and interconnections which are defined by domain-bound and domain-defined frame(s) of reference, ontological foundations which provide definition and delimitation for the meanings attached to or implied by elements within one or more source lexicons (vocabularies) and which posit rules governing lexical usage (grammar), deep, multi-layered and highly interconnected semantical schemata that provide a foundation upon which information may be operated upon and understood.

These definitional aspects of information are only a few of the elements that may be addressed and manipulated in the importation of information from disparate sources and domains, and methods and procedures and interfaces within DTS-based (and/or DTS-enabled and/or DTS-accessible) that enable, facilitate and control DTS semantic de-referencing provide systematic means to do so. Thus, current ETL systems and methods do not provide systematic capability to selectively disconnect elements and properties within such source information from the original ontological frames of reference that underpin, define and circumscribe the relevant internal and semantical definitions. One consequence is that in current environments, certain types of operations upon disjoint data may not be possible or, to the degree that such computations may be executed by downstream processes, ETL systems must be revised with often ad hoc, domain-specific pre-processing methods that are unsystematic and non-generalizable to other information sets and which, in many instances, do not fully address the full depth and breadth of the semantical skein that suffuses even simple data. Such compromises result in a variety of problems in other systems, including, for example, a linear increase in programmatic complexity as the variety, complexity and disjointedness of various data sets increases, but in such cases where incomplete solutions have been applied, there is often an attendant decrease in accuracy and precision of the results produced by the applicable downstream operations.

The methods and procedures and interfaces composing and related to DTS semantic de-referencing, therefore, represent a novel addition to the art serving the broad purposes addressed in Business Intelligence and other information-centric systems, including ETL and the attendant analytic subsystems. In embodiments, this granular capability, as outlined and described in the following paragraphs and figures, comprises a unique extension and improvement to existing methods, a new suite of capabilities that may be operated independently and/or selectively as an adjunct to such prior methods.

Note, however that one way that DTS semantic de-referencing differs from existing technologies is that non-DTS systems do not, for many reasons, currently require the same degree of harmonization of informatic disjunction that may exist within and between elements composed within information sets which they access, extract and upon which they operate. That is, other systems that manage information transfer do not require (or in some instances can ignore) such Shannon entropic discontinuities as it is expressed and deconstructed in the ontology-based approach within the methods and procedures and interfaces forming DTS semantic de-referencing. This difference is in part due to the nature of the downstream processing executed by DTS Platforms 1000 and other systems: in prior systems and in earlier, less variegated data-intensive environments, there has been no need to integrate the complexities of a broad suite of capabilities that manipulate the deep intricacies involved in management of semantic disharmony since such partial or complete informatic discontinuities either do not matter for the operations to be performed downstream or the disjunction itself is inherent within, required by or ignored by the operations to be executed.

In one example of these differences in the required capabilities between the tasks in a Platform 1000 and other non-DTS systems (and the attendant ETL pre-processing subsystems), DTS semantic de-referencing provides both a comprehensive, systematized suite of capabilities and mechanisms that, in certain DTS modalities, frame and enable one or more elements within the core functionality of DTS Assertional Simulation, functionality that is itself unique to DTS. This distinction is most evident in one execution mode of Assertional Simulation which coerces a mathematical composition upon and between otherwise (fully or partially) unconnected information aggregates, where this disjunction may exist, for example, in degrees, in different modalities and contexts but such that, to the degree that such Shannon entropic discontinuity exists, all or part of the respective aggregates may be fully or partially disjoint, DTS semantic de-referencing provides a novel combination of dynamically-invoked, content-responsive and context-sensitive methods and procedures and interfaces that may be contextually combined to produce meaningful and accurate (that is, Turing-complete) results across a wide spectrum of data types, formats and from many different domains. This distinction is also evident in some modalities of Assertional Simulation (and in some parts of its execution chain), which may optionally execute this mathematical functional composition by composing (or, as cited in the foregoing, by invoking a type of node-by-node DTS informatic convolution as defined previously) one or more elements within an Assertion-Apportionment pair upon one or more elements within a Reference Data Model, producing, as described, a jointly derivative Outcome Model. In some modalities and in certain commonly encountered contexts, however, one or more elements composed within information constituting the Assertion-Apportionment pair has no objective ontological connection to one or more elements composed within the Reference Data Model. Moreover, as described in the following paragraphs, to the degree that an objective relation may exist (in some fashion), the relation may have degrees and intensity (as well as other modulating factors) and such connections may change in different contexts. In DTS terms, such disparity describes information sources that are derived from and which are defined fully or partially within partially or fully disjoint domains.

In information transfer cases that current (non-DTS) systems manage, these types of adaptive capabilities that ultimately provide the means to harmonize disjoint informatic aggregates are either not required or may be required but are not addressed (thus potentially yielding less-than-optimal results) or may be required and present but which are implemented in a limited non-systematic way and thus, in current systems, comparable mechanisms are not available as independent computational capabilities. But note that while many tasks and computational and operational contexts executed by and within a DTS Platform 1000 (and/or by adjunctive DTS-enabled and/or DTS-accessible systems) may likewise execute operations that do not require the broad and systematic application of one or more elements within DTS semantic de-referencing capabilities, many of the core and distinguishing functions within DTS (namely, certain modalities of Assertional Simulation and other elements within its ancillary and support operations) indeed benefit from these capabilities. Thus, any or all the DTS-based (and/or DTS-enabled and/or DTS-accessible) methods and procedures and interfaces constituting DTS semantic de-referencing capabilities may, in embodiments, coexist with any combination of other existing and prior ETL capabilities, a wide array of capabilities that should be understood here as constituting non-DTS semantic de-referencing capabilities, as described. This is possible for many reasons, but at least because DTS semantic de-referencing and ETL are designed with different outcomes in mind and produce vastly different results; therefore, DTS semantic de-referencing should be understood being capable of operating as a novel extension of the broadly defined existing ETL approaches, one that is adjunctive to such functionality.

One example of such a functional composition of disparate information may be seen in even the most basic Assertional Simulation operation where the Assertion Model may be constructed using a lexicon that is based upon meanings that are not present or defined in the Reference Data Model. In modalities of Assertional Simulation, such disjointedness between Assertional and Reference frames of reference are common but in general (but not exclusively) define the Assertion Model coercively projected upon the Reference Data Model. In embodiments, a real-world example may be seen in handling accounting data where, in an aggregation of sourced accounting information, groups of accounting entries are delimited within and separated into, for example, calendar monthly buckets, a typical and often compulsory accounting time-based construct that supports conventional calendar month-to-month reporting. This calendar monthly grouping provides a form of temporal definition to the accounting data in the accounting system domain. Through DTS semantic de-referencing, allocation of the accounting data over a six-week period, a concept not inherently present in the month-based periodicity within accounting domain, may be coerced independently of any calendar-based time events that may exist or may be mandatory in the native (that is, the accounting) domain. This simple example is meant to convey, among other things, that while the data in an accounting domain may be associated with a given month, by applying DTS semantic de-referencing, the relevant portions of the data from the accounting system can be redefined in another time-based understanding, here a six-week period. Also, note in this non-limiting example, that while the accounting data is de-referenced from its definitional calendar month, some semantic and/or structural aspects of the original data may be retained, such as the notion of which particular data is associated with (e.g., defined by an association with) a calendar week. The ability to systematically and accurately manage such disparate multiple time base references is a native capability and system-provided feature throughout a DTS Platform 1000 and the capability to selectively disconnect the native time-base and harmonize such dissonance is provided to users (and to system processes) in a variety of scenarios, as in the current example, within the execution chain of Assertional Simulation (and its ancillary and supporting operations) and the capabilities inhered within DTS semantic de-referencing.

But note that time-base and informatic periodicity (irrespective of any particular symmetry or even localized eccentric temporal behavior) is often an important organizational premise within information aggregates compiled within Reference Data Models, and such properties are derived from the underlying domain-bound, semantically-defined intentionality that determines the intervals (and any aperiodicity) of a governing time base. In the present example, one which has general applicability to many other cases that arise across the spectrum of information processing, network operation and other computational applications, the domain of accounting operates upon a strictly defined time base, featuring (typically) monthly, quarterly and yearly intervals which provide delimiting definitional inflection points, an accepted temporal arrangement that reflects the intentions and domain-specific goals of accounting systems. Yet, in the current scenario (and in many similar commonly occurring situations), the "ground truth" perception a user wishes to infuse into their Assertion Model (and impose upon the accounting system-derived Reference Data Model) may not comport with the periodicity and end-point monthly intervals, as described above. Indeed, extending the example, assume that the user-formulated assertion that extended over the example six-week interval is supplemented by a series of aperiodic sequences of daily, bi-weekly and even longer and even fewer regular periods, any or all of which may regularly traverse accounting periods. Examples of such sequences include expenses associated with preparation for, staging of and return from marketing and promotional events (such as conventions and trade shows) as well as instigation of special projects that may vary in the intensity of the required organizational resources over time.

Such common situations are both difficult and infeasible to manage in accounting systems but also, in general, current ETL capabilities do not adequately or systematically address such temporal complexities. In the present example, DTS semantic de-referencing provides both the theoretic basis and practical mechanisms that execute the disconnection of the determinative and immutable definition of time base present in accounting data (where in its native domain the regimentation of information by time interval is a grammar-based imperative) from the information composed within one or more Reference Data Models, permitting the imposition of Assertion-Apportionment pairs upon the now-de-referenced time-based regimentation such that one or more aspects of one or more Assertion Models may comport with different time bases and/or which may be aperiodic, stipulating a new framework of time-correlated changes that, in the native domain of the accounting would appear as random, sporadic internodal and interaggregate aperiodicity and interval discontinuity but which in traditional ETL would represent a significant computational challenge. Note that such time-base diversity can sometimes be accommodated in accounting systems (and in other information-centric and ETL-based systems) but such existing approaches are non-systematic (and sometimes even manual), but in all cases, are implemented at the cost of greater complexity and with an attendant increased risk of inaccuracy.

In contrast, and in a further exemplification of the novel contribution of DTS Assertional Simulation, DTS semantical re-referencing (and ancillary and supportive methods and procedures and interfaces) and other Platform 1000 capabilities (such as APM and RAMS functionality) systematically address even far more complex instances of multivariate time- and frequency-based disharmony (such as may be encountered in mesh communication networks, distributed computation environments and certain AI and machine learning applications) are routinely addressed the systematic application of DTS-based (and/or DTS-enabled and/or DTS-accessible) content-sensitive and content-responsive methods and procedures and interfaces.

Note, however, that DTS semantic de-referencing is especially useful in time-base eccentricity in general. This may be seen in the fact that time-base variability may exist in many modalities throughout the array of subject information aggregates including within any or all of the (non-limiting examples: i) the existence of disjoint periodicity as well as stochastic aperiodicity within and between informatic aggregates that may be assembled within one or more Reference Data Models (where each such composition may be understood within the definitions broader context of DTS semantic de-referencing); ii) such temporal dysconnectivity as in i) above that may also exist within and between elements reposed within any set of Assertion-Apportionment pairs; and iii) between such Assertion-Apportionment pairs and the Reference Data Models, as described in the previous examples. But note that time base variability may surface by virtue of the user- or system-driven invocation of Assertional Simulation instances at some arbitrary and (potentially) variable frequency. The timing and of interval of such execution points may be controlled by or motivated by or mandated in any number of ways and from any number of sources: by users, by both DTS and non-DTS algorithms, by requirements mandated by external rules or rules related to other systems or by some combination of the foregoing.

But note also that such asynchronicity and temporal variability (including differences between the periodicity of the Reference Data Model Data and the execution frequency of the compilation of the Assertion Model) is available to be leveraged by users, by DTS algorithms and by adjunctive and supplementary systems (some of which may co-exist with the DTS system, some of which may be integral to DTS while others may be external), where such user-driven and system-based functionality may execute a wide variety of statistical and mathematical processing, as well as applying such varied procedures as pattern recognition and machine learning techniques. In a simple example, suppose, that a series of Outcome Models are concatenated along a timeline where the rate of occurrence (or equivalently, the duration) of any Outcome result may range from a maximum frequency F1 and a minimum of F2.

In embodiments, therefore, DTS semantic de-referencing and Assertional Simulation (and other elements within or accessible to a DTS Platform 1000) provide a novel and widely-applicable systematic solution to such temporal discontinuities by deploying combinations of methods and procedures and interfaces described here and which may be inferred as applicable by those skilled in these matters. As one example among many of this broad applicability, a variety of signal processing and statistical routines may be applied to such eccentric timelines to identify, for example, clusters of unusual variations, analytic procedures routinely applied in such fields as computer vision, network optimization operations and inventory and supply chain management as well as in machine learning environments required to adapt to time-based stochastic periodicity. Methods for analysis and processing and solution integration based upon information defined by (or which contain) such irregular, eccentric or peculiar (but generally well-behaved) temporal functions are well-known in many theoretical and practical arts, but such advanced analysis is extended and enhanced by the application of DTS information products to such procedures, a novel contribution to those applications made possible by the unique and integrated systematic functionality provided by DTS semantic de-referencing and Assertional Simulation and ancillary and supportive functionality.

Another example of DTS semantic de-referencing may be seen in the previously cited example involving the bibliophile who uses Assertional Simulation to create a categorization system for his library. As described in prior sections, in simple and increasingly complex use-cases, the Assertion Model comprises a structured representation of this person's point of view about the nature of the subject matter, where the representation may be expressed as simply as a one-dimensional list, but which may also be as complex as a multi-leveled taxonomic hierarchy. In any case, as explained in the descriptions of these examples of a DTS deployment, the bibliophile invokes DTS Assertional Simulation by first stipulating the Reference Data Model as the list of titles within the subject collection that (in the simple case) includes books but which in the more complex latter examples include other information-laden media such as journals, newspaper clippings and references and so on. Then, using methods and procedures and interfaces within a Platform 1000, he posits the Assertional Model. But note that even in the simple case of a books-only Reference Data Model where information within the reference is from one media domain (printed and bound books), the terms within the Assertion Model may not (and likely do not) share objectively common definition (or domain-bound shared lexicon, one defined within a common frame of reference defined within a shared ontology that is circumscribed within an enclosing domain). That is, there is no objective or mathematical manner in which a classification term in the Assertion Model may be related to the material in the Reference Data Model, even where such terms are nominally similar or even identical. In other terms, the Reference Data Model and Assertion Model occupy two subspaces that may not have an overlapping or region of intersection.

Thus, in the present example (one that exemplifies many other situations routinely addressed by DTS semantic de-referencing), the Assertion Model may include a user-chosen term such as "Science Fiction" which has no compulsory, determinative, objective relationship to any term in Reference Data Model, even in the event that such a string occurs within the Reference Data and has some internal and/or relational relevance to other identical, similar or implied terms. Such occurrences cannot be equated to those which may occur in a user-nominated Assertion Model, irrespective of any apparent or perceived identity relationship. Thus, the user-supplied list that composes the Assertion Model occupies a different sub-space than that spanned by the Reference Data Model, where these spaces are definitionally disjoint, having no common overlap.

But note that Reference Data Model in this example is composed of a list of discrete topical resources drawn from many domains, such as, for example, various areas of natural and social science, mathematics and engineering but also selections from the Western literary canon, including novels, poetry and philosophical works as well as modern works of fiction and non-fiction. Thus, the creation and imposition of even a simple user-perception-based Assertion Model which imposes a taxonomic paradigm upon this diversity is based upon that user's perceived "ground truth" as to the best way to impose an order upon this assortment. In order to do so, the semantical relationship between the semantical content within and surrounding informatic nodes within these various works should be divorced from representation embodied within the Reference Data Model since user-nominated (and effectively subjective) terms in the Assertion Model, such as "Science Fiction" or "Statistics", cannot be guaranteed to have a semantical correspondence in any consistently provable way to the semantical composition of the subject data. The creation of the Assertion-Apportionment pair coerces a connection between these disjoint spaces, and the projection of its joint composition and structure upon the Reference Data Model using methods and procedures and interfaces within the Assertional Simulation execution chain coerces a new semantical connection, an operation facilitated, enhanced and improved by application of DTS semantic de-referencing.

Thus, as may be seen in these and other examples, the theoretic and practical application of DTS semantic de-referencing improves upon prior approaches by providing the same abilities as other systems but with additional capability able to uniquely address and manipulate one or more of the elements that define information. In embodiments, the underlying theory of DTS semantic de-referencing as well as the DTS-based (and/or DTS-enabled and/or DTS-accessible) methods and procedures and interfaces which permit its practical application provide a full range of solutions to semantical as well as temporal discontinuity, and this novel type of informatic coercion permits wide application of many elements within a DTS Platform 1000.

Thus, given the novel and complex application and implementation of DTS semantic de-referencing within methods and procedures and interfaces throughout a Platform 1000, as discussed in the numerous figures and explanatory text, note, therefore, that it may be applied to information throughout a Platform 1000 in multiple non-exclusionary ways and may be invoked by users or system processes for any number of reasons, including for example, in the context of procedures intended to optimize and/or combine disparate information for one or more DTS-based (and/or DTS-enabled and/or DTS-accessible) methods or processes. Such processes may include (in a non-limiting example) parameterization and/or preparation of information used or accessed or otherwise referenced within any or all the aspects, varieties and modalities of Assertional Simulation and ancillary and support operations, where the latter may include (but are not limited to) analysis of results, optimizations and permutations, deconstruction and recombination of combined or compound information, and other data-centric operations within a DTS Platform 1000.

These example modalities of DTS semantic de-referencing are distinct, however, from the transformative operations that may be prominent within and which distinguish existing ETL systems in that such transformations are often simply translative in that such operations interpret and reformat data values of disparate origin into alternative but mathematically (and semantically) equivalent representations in order to serve as input variables to commonly understood analytic operations such as, for example, statistical packages that execute correlation, regression and predictive operations (to name but a few), data mining-based pattern detection procedures and so on. But note that while these extracted and translated values must, in most cases, be translated or mathematically transformed into a specific and shared mathematical format in order to be computed they nevertheless must retain their domain-of-origin "meaning" in order for the analytic operations to provide the information required by the user or the subject system. That is, for example, if a system executes a correlative analysis between data set A and data set B (where A and B are from different domains, such as, for example, an inventory system and an accounting system, respectively), while the specific data points might from A and B be translated (transformed) into a common mathematical format, the correlation operation still communicates to the user (or the system) the manner in which A correlates to B, a result that is only meaningful (and accurate) if and only if A and B retain their respective semantical relation to their disparate ontological frames-of-references. Thus, given heterogenous information nodes (such that they originate from disparate ontological frames) these transformations do not and cannot explicitly disconnect the possibly-translated values from the semantic meaning they carry from their domain-of-origin but may (if necessary) merely transform the mode and form of expression from one state to an equivalent other state in order to be processed in a meaningful and accurate manner. Even in the event that such transforms may inflict some degree of insertion loss of Shannon entropy, the precision of the information may be diminished, not its semantical meaning in the original frame of reference.

By definition, therefore, both translative and organizational transformation operations within ETL operations that usually serve as a pre-processing stage for downstream analysis operations executed upon heterogeneous information nodes must maintain the original semantic basis—the "meaning" or semantic context—of a given information node or set of nodes despite what may be highly accurately re-formatting and/or translation of such information. Note, however, that even in non-DTS environments where downstream operations that may operate upon post-ETL information without the requirement that survival of the semantic definition provided by the frames-of-origin of that information, this information cannot be and is not subject to some modalities and certain types of properties executed by and within Assertional Simulation and related operations, as described here. This is due to the novel basic nature of Assertional Simulation: the content-sensitive and content-responsive methods and procedures and interfaces projection of the Assertion Model upon a Reference Data Model to produce an Outcome Model that reflects the coercion of the Assertion upon the Reference Data Model. Such coercive projection often (but not in all cases) is enabled at least in part through DTS sematic de-referencing, such as when one or more of the subject Models are assembled from heterogeneous data sets.

In addition, in embodiments, the modalities and types of DTS semantic de-referencing may include (but may not be limited to) any combination of the following: (i) de-referencing by severing (or replacing, as in the foregoing) one or more aspects of the contextual meaning of information contained within one or more nodes, where in this case, "contextual meaning" refers to not only implicit and explicit definitions, connective and correlative relationships and other semantical bases but to logical functionality that may be subsumed within or implied by or linked to the subject information as any of all of the foregoing may be defined by and within the original frame of reference or ontological frame; (ii) de-referencing by severing (or replacing, as in the foregoing) one or more connective, relational or correlative associations or any other logical interconnections that may exist between two or more such nodes of information, severing (or replacing), as well, any contextual meaning (as in the (i) above) that may exist or may be implied or otherwise imputed by such relationships, associations or interconnections, whether or not such nodes are themselves de-referenced as in the (i) above; (iii) de-referencing by executing any or all of the above within a single aggregation of data where such aggregations are defined within DTS in specific manner and described in the following; (iv) de-referencing by executing any or all aspects of (ii) above between nodes of information within a subject aggregate and those within one or more other separate aggregates.

While in some modalities, DTS semantic de-referencing may remove (or replace or modify) one or more relationships and/or dependencies that may exist between nodes and groups of nodes of information as may have existed in its native domain, these subject nodes are referred to in DTS as reposed within one or more "discrete assemblies or discrete collections or discrete structures", terms that may be used variously and interchangeably both within the present disclosure and in other DTS-related contexts and in concrete implementations of one or more components of a DTS Platform 1000). But note that these terms may have multiple and contextually-modulated definitions. Any of these terms may refer, for example, to nodes of information that are simply logically addressable as a unit (or series of units) by a means of one or more definitional (or definition-inputting) access modalities (such as may be accomplished, for example, with one or more SQL statements where the specific syntactical structure of the query that enables access to information implicitly defines and circumscribes an instance of a collection of discrete nodes). Such collections of information are logically contiguous (though, not necessarily physically contiguous or even physically co-located) by virtue of an encompassing addressability (using SQL queries and the like), a unifying property which (in general but not exclusively) includes the capacity to be extracted and assembled (subject, of course, to contextual and security considerations).

Note, therefore, that by virtue of such syntactically-specific statement(s) that enable addressability (and thus access), such collections are thus subsumed within at least one (possibly transient) ontological framework or frame of reference, one defined by and embedded within the lexical composition of the access statement (its grammar-determined arrangement of vocabulary-based terms) where the choice of terms reflects the intentionality of the process. In many cases, this user- and/or system process-driven intentionality (which defines the frame of reference for the access query and which requires grammar and vocabulary defined within the current domain) is explicit only as long as the statement exists in an execution flow—that is, it exists only for the period in which the information node are accessed (and presumably gathered)—and thus, in practice, the reference frame may be understood as transient. Such transience is relevant to some methods of DTS de-referencing where methods from a Platform submit such transient queries to another disjoint domain: such submission are not only ephemeral (as in the above) but may be submitted "blindly" without actually knowing the semantical relevance of the vocabulary-based terms employed in the query. The deployment of such transient constructs within a DTS Platform 1000 to access (and possibly acquire) inter-domain and/or inter-system information is another distinguishing aspect DTS semantic de-referencing.

In other instances, the terms "discrete assemblies, collections or structures" may also (or instead) refer to one or more nodes of information which are not singly addressable by a series encompassing definitional access modalities, but which may nonetheless be obtained or extracted from one or more internal or external sources using DTS-based (and/or DTS-enabled and/or DTS-accessible) methods and procedures and interfaces. This latter case is distinguished by the fact in some operational contexts there may not be a single frame of reference that enables construction of programmatic (or systematic) access and procurement (by means of one or more SQL statements, for example, as in the foregoing), and, in some instances, there may be no existing frame of reference at all for some or all such information. In such cases, for whatever reason programmatic or syntax-based access may not be successful, users and or system processes may employ other methods such as (in a non-limiting example) manual or AI-based (or AI-assisted) identification, labeling and extraction. In all such cases, however, the cumulative activity of employing any mode of addressing, obtaining and possibly assembling what may be, in instances, unconnected or semantically disjoint information confers a reference frame upon what may be otherwise nominally unconnected (or at least possibly un-addressable) elements, thereby implicitly permitting such compilations to fall within the DTS definition of discrete assemblies, collections or structures.

Another variation of the type of information that may be operated upon by DTS semantic de-referencing methods and procedures and interfaces includes discrete or even contiguous aggregates of information that are categorically non-specific, or using DTS terminology, "non-specific, inchoate". The means of access and the varieties of the disposition of information obtained in this modality include (but may not be limited to) any or all of the following: the information i) may not unified by either an inclusive lexical composition of an access statement; ii) to the degree that such access capability exists, it may not be fully inclusive, consistent or may be discontinuous across the subject information; iii) may be assembled in an ad hoc manner from multiple domains without an explicit unifying intentionality. Such non-specific, inchoate access to information within a Platform 1000 may or may not be transient (as in the foregoing) but is, in any case, fully or partially devoid of specific reference to domain-bound and domain-defined vocabularies of the native domain, and thus to the semantical meaning of the subject information within its native domain. This type of non-specificity may be addressed by the unique capabilities of the content-sensitive and content-responsive methods and procedures and interfaces subsumed within and associated with and available to DTS semantic de-referencing.

In this context, note that it is general property throughout methods and procedures and interfaces within a DTS Platform that the structure of information and the meaning of the information within that structure may, in some contexts and modalities, be treated as linearly independent. Specifically, (in one non-limiting example), the computational activities executed within (or associated with) Assertional Simulation (as may be seen, in one non-limiting example discussed in the foregoing, where the mathematical composition of an Assertion Model upon a Reference Data Model to produce an Outcome Model), may operate upon either the structure or the composition of these entities independently of the other across the range and degree of possible computations even if, in their native state, dependencies (in some aspect) may exist between form and content. This coercion of linear independence upon the form and structure of the constituent Models of Assertional Simulation is a variant of DTS semantic de-referencing and one that provides the relevant methods and procedures and interfaces with a novel and unusual premise but one that has a deep impact upon the computational execution of Assertional Simulation and across many types of DTS-based (and/or DTS-enabled and/or DTS-accessible) operations including (for example), simple computations, reorganizations of both separate or connected information nodes and other types of transformational processes. Thus, in DTS operations, the logical (but not always the semantic) connection between discrete (and non-decomposable) information nodes (generally referred to here as "structure") may, in context, be coerced to be computationally separable from and may be treated as independent from the domain and ontological frame of reference of the information within a node (referred to as generically as "content"). The independence of structure and content suffuses operations throughout a DTS Platform 1000 but is most evident in the execution of Assertional Simulation, its types, variations and modalities and adjunctive and ancillary operations, a property of a Platform 1000 that centers the creation and manipulation of Reference Data Models (but which, as discussed, may also be applied to other informatic entities).

There are additional examples that illustrate the utility and, in instances, the desirability and the requirement for DTS semantic de-referencing of collections of information within a Platform 1000, and in particular, within the execution chain of Assertional Simulation. One group of examples involves the creation of Reference Data Models as described in the present context of the construction of DTS and depicted in FIG. 5. The example process flow throughout FIG. 5 illustrates not only the tangible real-world realities that underscore the need for DTS semantic de-referencing, but also provides examples of the execution of the disconnection and redefinition of information clusters within and by means of methods and procedures and interfaces throughout a Platform 1000.

Referencing FIG. 5, note that specific operational aspects of the example process and execution flows and the elements that compose the functional blocks in this example are described in more detail in the following paragraphs, but in the current context highlighting the novel characteristics of DTS semantic de-referencing and its prevalence within and in conjunction with methods and procedures and interfaces throughout a Platform 1000, these and subsequent figures and descriptions provide useful illustrations. In FIG. 5, an examination of the data flows 1172C through 1172E indicates the breadth and scope of the possible diversity of the information that may be integrated within both existing and primordial and embryonic Reference Data Models. In embodiments, such information may be obtained and assembled from internal or external sources as shown by data flows 1172A and 1172B which serve as inputs to functional block 1104 discussed in the previous descriptions of FIG. 1. Such information may include (but may not be limited to): (i) information that may be heterogenous, distributed, incomplete and fractured; (ii) information that may be drawn from multiple and disparate and possibly discordant and disjoint domains; (iii) information which may be configured in any number of structural and compositional modalities; (iv) information has been defined within multiple and/or dissimilar and/or disjoint frames of reference (or ontologies).

While details of the methods and procedures and interfaces within functional blocks 1130 and 1180 are described in more detail in the following paragraphs, in the present connection, note that, in the specific (and non-limiting) example depicted in FIG. 5, functional block 1130 may in variations serve as a primary (but not necessarily exclusive) point of execution of DTS semantic de-referencing: any or all of the types and modalities of DTS semantic disconnection described in the foregoing may, in embodiments, be executed by one or more methods and procedures and interfaces within functional block 1130. Note, however, that in the present example, functional block 1180 may also provide and/or execute additional or supplemental functionality that may assist methods and procedures and interfaces within block 1130 in execution of DTS semantic de-referencing, where such functionality may include (but may not limited to) application of organizational, transformational and translational computations to subject information structures (this interconnection is shown by bi-directional data flow 1179B). In embodiments, this contextual or conditional feedback of information is characteristic of a configuration described by the DTS-engendered term "intermediate recasting", a method of processing information with a DTS Platform 1000 that may be related to (but may not in all cases integrated within) looped recursive operations described elsewhere in this disclosure.

The actual computational processes and order of execution which may be employed within functional block 1130 may vary depending on the execution context and the type of information being processed—this is one reason the label on functional block 1130 is phrased Dynamic Element Selection, Assembly, Transformation & Parameterization of Mixed Data Sets. In particular, in this collection of methods and procedures and interfaces and in other methods and procedures and interfaces executed within any DTS-based (and/or DTS-enabled and/or DTS-accessible) executable environment, specific processes and order of execution (and other algorithmic considerations) may be context- and content-sensitive and responsive. This adaptive invocation and execution is a native and distinguishing characteristic within and throughout DTS Platforms 1000, as described here and elsewhere in this disclosure, and as implemented within various embodiments. Note, as well that the results of operations exerted by block 1130 to produce the resultant data source, Diverse Data Reference Frames 1131, (and as controlled and initialized by means of integrated control signal Platform-wide Controls and Interfaces 1111), which result in data flow Selected Data Sets 1179A, discussed below. Note as well, that in the example representation of this functionality depicted in FIG. 5, control block Structure Assemble, Filter, Normalize, Scale & Re-Reference Multi-Domain Data into Hybrid Domain DTS Reference Data 1180, discussed through this description (see FIGS. 5, 7, 8 and 9, for example), may provide a feedback data source 11179B back to composite block 1130.

Thus, in the current context of DTS semantic de-referencing, example processes that may be dynamically or contextually invoked (implementing one or more types and/or modalities of DTS semantic de-referencing) may include (but may not be limited to): (i) methods and procedures and interfaces that induce or coerce re-combinations, re-orderings and/or re-labelings upon and within collections of information, upon and within and between one or more sub-sections within collections of information (where such sub-sections comprise groups of information nodes that may be further decomposed) and/or upon and within non-decomposable nodes within a collection—such that in all cases, the operations sever geometric and textual relationships and interconnections that may have been defined within the information by means of and relative to the native ontology (where examples may include deconstruction of linked lists, reordering of tree structures and collapse of taxonomic structures); (ii) transformative mathematical operations executed upon certain data types (such as vector quantities) or structural configurations (such as matrices and arrays) which may maintain the value of the data (at least within its native frame of reference) but which removes its contextual and relational connection to other information (that may be defined within or connected to that original frame of reference), thereby severing or transforming or otherwise changing the original contextual meaning imputed by the connection (where examples may include transformation of spatial information to a different coordinate system but in so doing adding or extending dimensionality, coercing nodal (or value) independence by removing the linear relationship one or more nodes (or values) may have with other nodes or values, thereby removing (and implicitly) re-defining the mathematical meaning of each node).

Continuing the present example, the dynamically assembled methods and procedures and interfaces within functional block 1130 produce output data flow Diverse Data Reference Frames 1131, a compound data flow consisting of collections of information that have been de-referenced from their original frame of reference within functional block 1130, but which, in this example implementation, are reassembled into new collections of information with different ontological bases (in which the collection is assembled upon the basis of its new reference frame) and placed within an array or collection of data stores. Note that the present example reveals a variation of the previously cited "intermediate recasting", a characteristic within variations of Reference Data Model construction (and in similar modalities within a DTS Platform 1000 as well as in modalities invoking DTS semantic de-referencing) wherein results of computations that are subsumed with functional block 1180 may be returned back to functional block 1130 as part of one more operations applying changes to one or more parameters or variables (as, for example, may be executed in an iterative DTS semantic de-referencing operation) within collections of information (where, in this non-limiting example, such results may have included information or results originating from anywhere in the processes flow depicted in FIG. 5).

In this example implementation, functional block 1130 outputs data flow 1131 which subsumes de-referenced collections of information that have been cast, using any or all non-limiting example methods in the foregoing, into one or more new ontological states (as indicated by callout reference Elements from Ontology A thru Ontology Z 1133) which details components of data flow 1131 as shown within bracketed data stores, 1132A and 1132B). In the absence of further processing (by means, for example, of application "intermediate recasting" as described above) these newly-minted and de-referenced collections of information (or sub-sections or nodes, as described in the foregoing) may be selected and, in variations, combined with other such information from other ontologies (some of which may be similarly newly-minted but in variations may also (or instead) be drawn from non-dereferenced sources, a variation of "intermediate recasting", previously cited). Data flow 1179A depicts the results of the dynamic and content-sensitive and context-responsive selection of this information by methods and procedures and interfaces within blocks 1130 (and conjunctively, within block 1180), information that may be subjected to further processing but which, in any case (in the present example) may then be included in a new (or reformatted or otherwise changed) Candidate Reference Data Model. The elements within this information structure have been de-referenced from its original source (in any or the modalities described above) but is now defined within a DTS-engendered ontological reference frame, one which is optimized for the particular DTS-based (and/or DTS-enabled and/or DTS-accessible) processes and procedures selected by the user or system process or required by one or more operations within or conditions that may be present in a Platform 1000.

FIGS. 7, 8, 9 and 10 provide non-limiting examples of DTS-based (and/or DTS-enabled and/or DTS-accessible) methods and procedures and interfaces that implement process and execution flows for variations of DTS semantic de-referencing, examples presented without foreclosing alternative implementations. Note, however, that in embodiments, these examples may also reference other aspects of DTS functionality and may be equally germane to any aspect of Assertional Simulation and its ancillary and supplemental operations. These example process and execution flows further illustrate the differences between DTS semantic de-referencing and existing ETL capabilities and systems.

Figure 7:
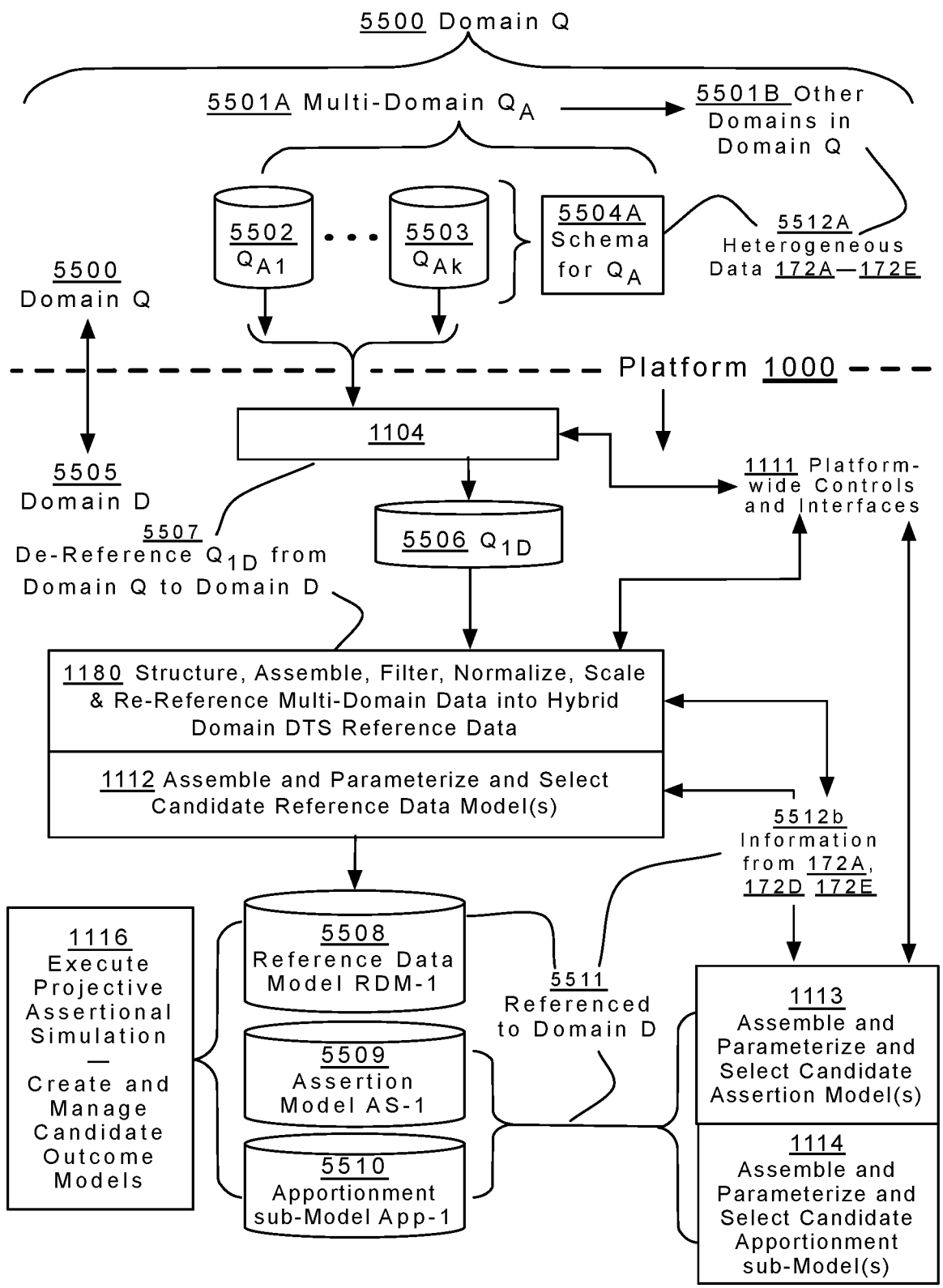
FIG. 7 illustrates an assembly and an execution flow in the construction and revision of Reference Data Models and Assertion-Apportionment pairs from disparate information sources using semantic disconnection techniques to execute DTS Assertional Simulation.
Figure 8:
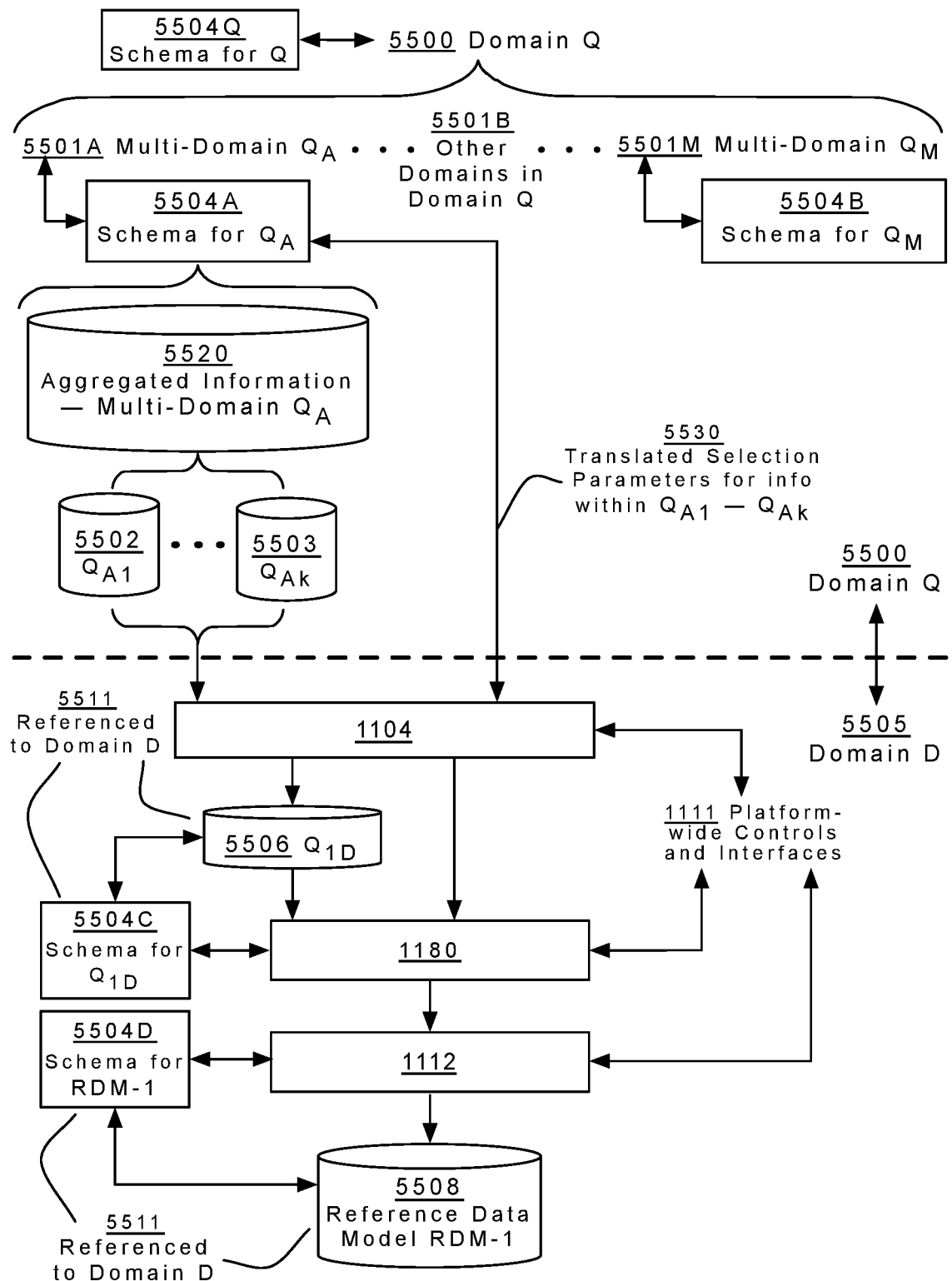
FIG. 8 illustrates an assembly and an execution flow in the reconciliation of disparate information sources using semantic disconnection techniques to execute DTS Assertional Simulation.
Figure 9:
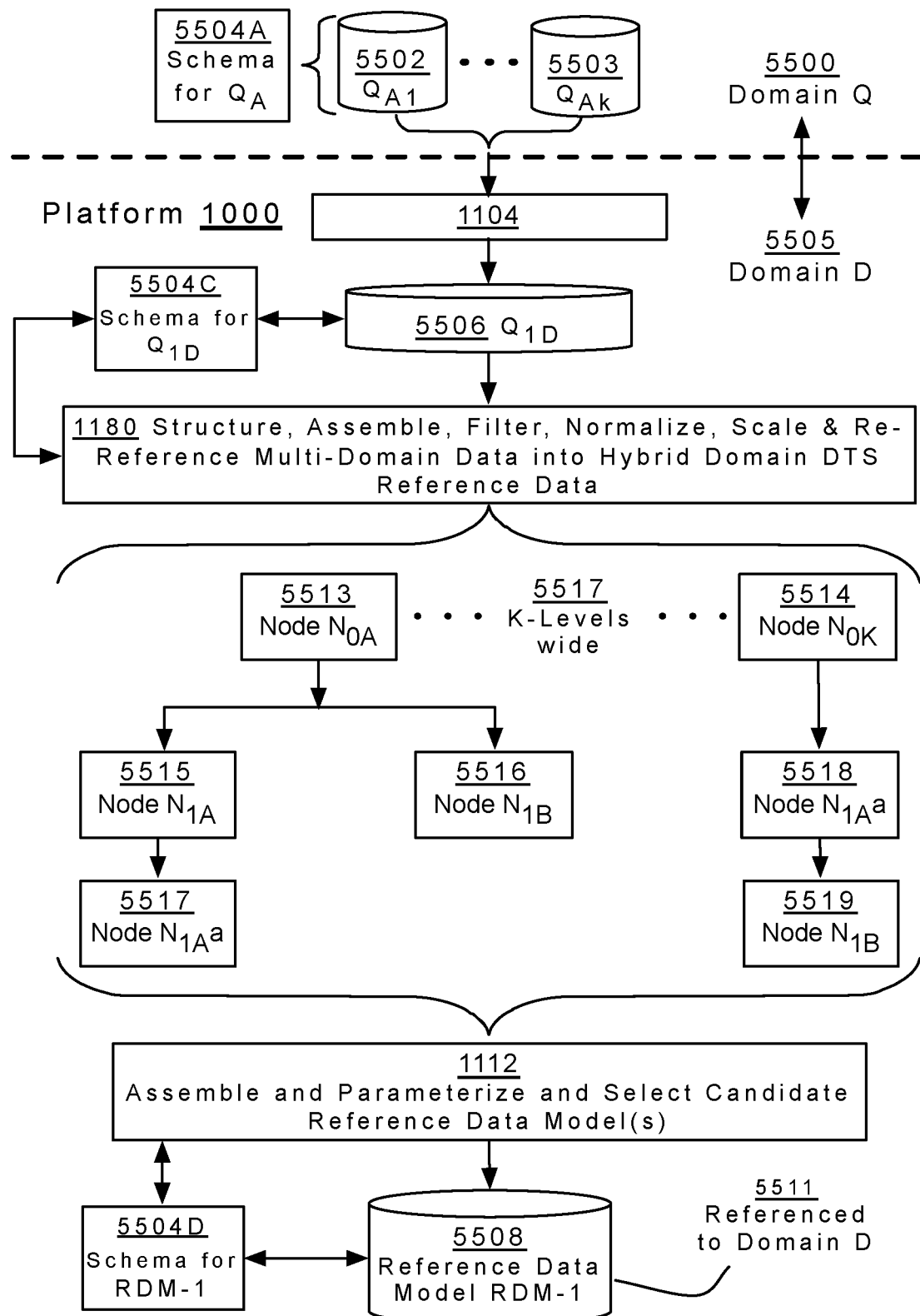
FIG. 9 illustrates an assembly and an execution flow, and an example data structure used in the construction and revision of Reference Data Models using semantic disconnection techniques.
Figure 10:
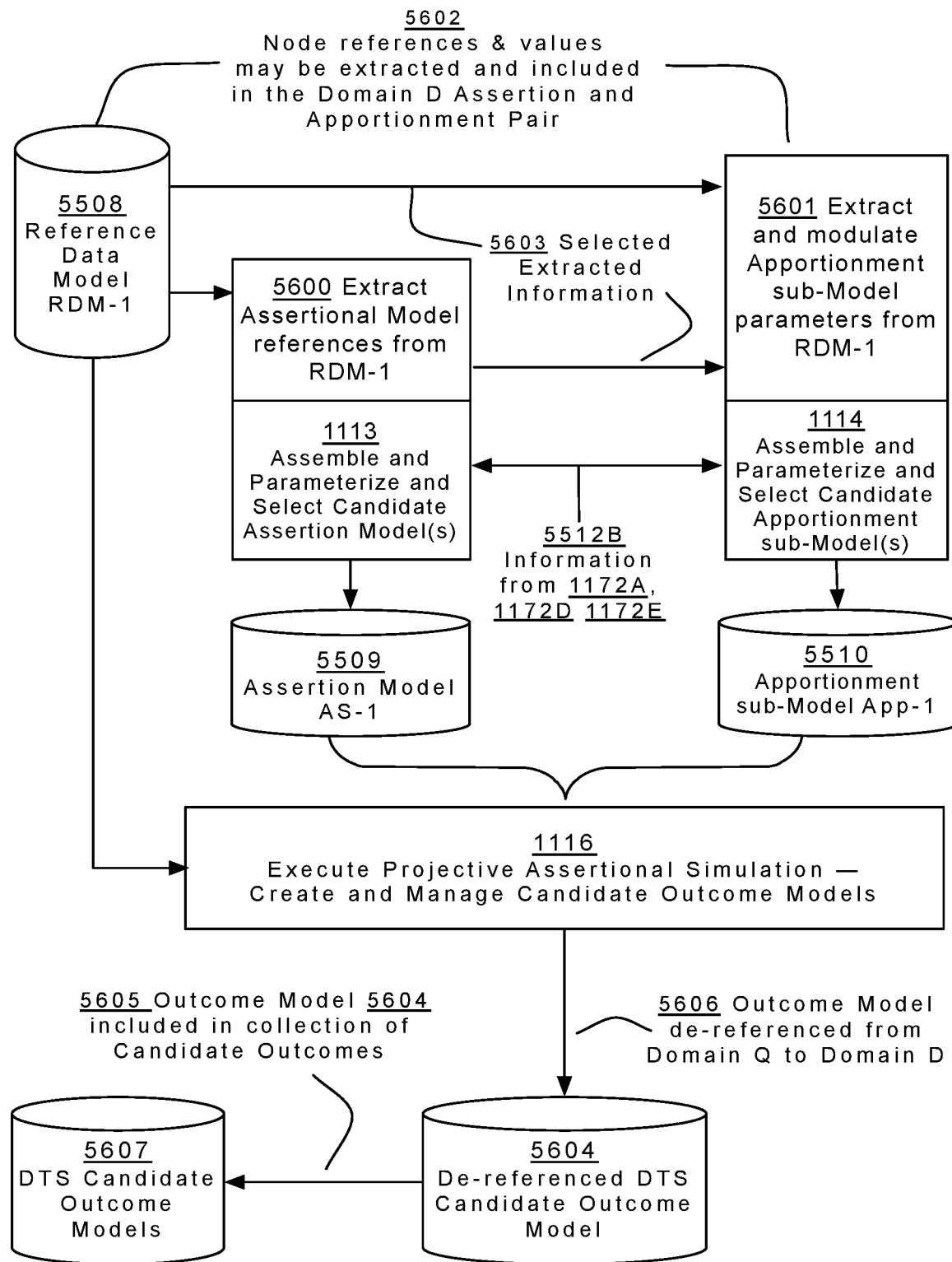
FIG. 10 illustrates an assembly and an execution flow used in the construction and revision of Assertion-Apportionment pair using content-emergent extraction techniques.

FIG. 7 illustrates an example of DTS semantic de-referencing methods and procedures and interfaces deployed to assemble a Reference Data Model, 5508 Reference Data Model RDM-1 from heterogeneous information obtained from multiple (possibly disjoint) domains within an enclosing domain 5500 Domain Q where domain Q is disjoint to the domain occupied by the DTS environment (5505 Domain D). FIG. 8 expands upon the functionality implemented by (and within) example elements that may be deployed in DTS de-referencing operations and illustrates example variations of this DTS novelty. FIG. 9 provides an example data structure subject to variations of these operations. Finally, FIG. 10 illustrates how fully- or partially-de-referenced Reference Data Models maybe used to construct or modify other elements in the Assertional Simulation chain, including Assertional Models and Apportionment sub-Models (also referenced as Assertion-Apportionment Model Pairs) and thus used in an Assertional Simulation to produce a Candidate Outcome Model, 5604 De-referenced DTS Candidate Outcome Model.

Referencing FIG. 7, methods and procedures and various information stores resident within a Platform 1000 are designated as occupying an enclosing categoric domain Domain D 5505. A second disjoint enclosing domain Domain Q 5500 spans information contained within and/or referenced by and/or otherwise accessible to one or more physical systems confederated within enclosing domain 5500 Domain Q, where such systems may, in some situations, be fully or partially physically and/or logically disjoint from one another but which may also include one or more operational components residing within one or more DTS-based (and/or DTS-enabled) systems, any of which may be logically or physically continuous to the subject Platform 1000, but where in the latter case, such elements are entirely subsumed within Domain Q 5500 and thus definitionally disjoint from Domain D 5505. As shown in FIG. 7, regardless of the physical and logical location (and system context) of the information spanned by enclosing domain Domain Q 5500, such information is depicted as residing across multiple possibly (but not necessarily) disjoint domains as depicted by callout 5501B Other Domains in Q, a commonly encountered situation.

The current example (and related FIGS. 7-10) centers upon information within a specific domain within enclosing domain Domain Q 5500-Multi-Domain $Q_A$ 5501A which, in FIG. 7 is depicted as composed of information and associated methods distributed within a collection of domains designated as $Q_{A1}$ through $Q_{Ak}$. For illustrative purposes, these elements are shown as subsumed within data stores 5502 $Q_{A1}$ and 5503 $Q_{Ak}$ respectively. Note, of course, that such a one-to-one storage method is not in any way a physical or logical requirement or even a functional necessity but rather illustrates an important aspect of the current example: namely, that the information passed to the Platform 1000 in this example (designated as 5502 $Q_{A1}$ and 5503 $Q_A$k) is obtained from enclosing Domain Q5500 but defined within the enclosed construct Multi-Domain $Q_A$ 5501A. Note, as well, that callout Heterogeneous Data from 1172A-1172E 5512A indicates the wide structural and compositional variegation of information throughout both enclosing domain Domain Q 5500 and Multi-Domain $Q_A$ 5501A, as described in the foregoing and elsewhere in this disclosure, where this variety is not a requirement but is rather one of a variety of commonly-encountered broadening conditions which the functional elements within the current example (and the methods and procedures and interfaces provisioned within DTS semantic de-referencing capabilities) must accommodate.

In this connection, note that in the current example, Multi-Domain $Q_A$ 5501A is specified as defined by a reference frame (implicitly or explicitly) contained within composite functional block Schema for $Q_A$ 5504A. In this example (and in others), block Schema for $Q_A$ 5504A is representative of such blocks that depict a collective functionality provided by (possibly diverse) collections of resources which define and cohere one or more elements of the ontological definitions within a domain and which, in these instances, serve as a functional repository for both such organizational information as well as the associated computational components to support other capabilities that may need to access such information. Thus, in variations, and in the present example, block Schema for $Q_A$ 5504A represents a composite functionality of DTS-based (and/or DTS-enabled and/or DTS-accessible) methods and procedures and interfaces as may be required by executing functionality associated with DTS semantic de-referencing with known and common computational and support elements, subsuming, for example, methods and interfaces as well as informatic mappings, definitional documents and references. In embodiments, example composite block Schema for $Q_A$ 5501A may include or may otherwise reference or access any or all of the following non-limiting example computational and reference functional elements: structural and/or compositional schemata defining information relevant to the subject domain (in this example case, Multi-Domain $Q_A$ 5501A), content- and context-compliant (and compatible) data dictionaries (which may be fully or partially translated, re-compiled or modified dynamically and in context), glossaries and translation tables and other such interpretive vehicles, as well as methods and procedures and interfaces that may be employed to create, maintain and execute any or all of the foregoing organizational, functional and access-enablement information.

In the context of DTS de-referencing (and with respect to data management in general within a Platform 1000), such composite schemata structures (in whatever form they may take in variations both within and outside of a Platform 1000) serve as discriminatory reference foci between and within domains, implementing domain-defining (and domain-bound) mapping resources and information that express, circumscribe and contextualize the semantical and lexical nature of "things" within a domain. Those fluent in these arts will note that this definition is broader than is typically used in database design and implementation as well as in prior, traditional ETL systems since it spans the information and associated creative and execution capabilities applied to information and representations of information within a domain rather than simply the organization and relationship of tables within databases. Rather, in the context of DTS, these schemata structures (such as Schema for $Q_A$ 5504A in FIGS. 7 and others) should be understood as a broader operational ontological construct, one used to define, for example, what "things" within a domain mean, how and why "things" are connected to other "things" within (and in some cases, outside) a domain as well as where and why such "things" may be located and, in important ways, why certain "things" are so defined and located within a domain in contrast to other definitions, locations and relations associated with other "things".

In concrete terms, in embodiments (including in implementations of a Platform 1000), as one example of this functionality, Schema for $Q_A$ 5504A may include (but may not simply be limited to) such standard functionality as functions and classes within or referenced by data access-enabling Models (as in a Model-View-Controller (MVC) framework such as .NET), collections of one or more SQL-formatted database tables dynamically connected using various formatted access modalities (such as variations of SQL statements either statically contained within or dynamically and transiently assembled within or by one or more Model within an MVC-based system), and one or more instances of reference mapping schemata that may be memorialized in one or more documents or reference or cross tables but which may in any case provide (or provided the means to compute) the unifying organizational principles and mappings defining Multi-Domain $Q_A$ 5501A. But note that such standard functionality is augmented, extended and enhanced and in some instances transformed by the methods and procedures and interfaces as described here and which may be functionally associated with DTS semantic de-referencing (and any ancillary operations) and thus, to any operations related processing and execution chains within Assertional Simulation.

In embodiments of a Platform 1000, there may be any number of methods and procedures and interfaces by means of which information nodes from such disparate sources and domains may be accessed, selected and assembled. In FIG. 7, these industry-standard capabilities are subsumed within or otherwise associated with composite functional box Manage Internal User Control, Interfaces and External Data and API Access 1104 as depicted within and described in relation to FIG. 5. Thus, note that Platform 1000 may include one or more one instances of composite functional box 1104 (or its equivalent or a suite of equivalent functionality distributed but nonetheless fully or partially inter-accessible amongst other such functional blocks), and through this collection of methods, in this non-limiting example, a collection of information from 5502 $Q_{A1}$ and 5503 $Q_{Ak}$ is obtained from 5501A Multi-Domain $Q_A$ and stored in data store 5506 $Q_{ID}$. Callouts 5500 and 5505 and the thick dotted line above block 1104 provide a graphical reinforcement of the distinction between Domain Q 5500 and Domain D 5505, emphasizing again that operations performed within Platform 1000 upon information obtained from (in this example) 5500 Domain Q (and specifically from Multi-Domain $Q_A$ 5501A) are explicitly executed within a disjoint reference frame defining Domain D 5505, a point further emphasized by callout 5507 De-Reference $Q_{ID}$ from Domain Q to Domain D.

This functionality is illustrated at a high level in FIG. 7 where composite functional box 1104 represents one manner in which the information collection within data store 5506 $Q_{ID}$ is de-referenced: by virtue of the fact that no aspect of the organizing information defined within composite functional block 5504A Schema for $Q_A$ nor any method of execution of such schemata are included within or referenced by information collection within data store 5506 $Q_{ID}$. Thus, apart from the information required by composite block 1104 to access, select and obtain this collection of information, no other definition required. In embodiments, and as discussed in subsequent discussions of depictions within FIGS. 8-10 (as well as in other representations of these teachings) such "full-de-referencing" may be optionally partially or fully rebuilt, reconstructed or reconstituted within the enclosing domain spanning one or more elements of the subject Platform 1000. But, as noted, in embodiments, a Platform 1000 may execute de-referencing across a spectrum, so that in instances, one or more components of its compositional meaning and context and/or any internal (or even externally referenced) structural relationships inhered within (or otherwise referenced by) the subject information may be de-referenced in any combination and reconstituted as and when required for use in DTS-based (and/or DTS-enabled and/or DTS-accessible) computational operations, including within any or all of those cited in the foregoing and in other descriptions within this disclosure.

Continuing through the process and execution flow depicted in FIG. 7, the elements within data store $Q_{ID}$ 5506 are, in this example, presented to composite functional block Structure Assemble, Filter, Normalize, Scale & Re-Reference Multi-Domain Data into Hybrid Domain DTS Reference Data 1180 (as described in FIG. 5) and to compound functional block Assemble and Parameterize and Select Candidate Reference Data Model(s) 1112 (as described in FIG. 1 and expanded upon within FIG. 5). The functionality represented in block 1104, and blocks 1180 and 1112 integrates content-sensitive and content-responsive methods and procedures and interfaces that may be used to analyze, structure, translate and otherwise operate upon information within data store $Q_{ID}$ 5506. Note that in this and in other computational contexts within a Platform 1000, such content-responsive, content-emergent and context-sensitive functionality may be invoked within or in conjunction with any or all methods and procedures and interfaces DTS-based (and/or DTS-enabled and/or DTS-accessible). This fundamental feature is part of the novel adaptivity provided throughout a Platform 1000 and, in context, refers to the manner in which specific tasks are executed upon information depending upon the composition (and in some cases the structure) of the subject information itself (as well as any other requirements determined by or provided as part of a broader system or user-driven context). A simple example of such content-responsiveness is the context-based detection of vector quantities in one or more nodes (detecting these values as an ordered list of scalars) so that such quantities may be processed differently, for example, as scalar quantities.

In the present example, blocks 1104, 1180 and 1112 (and their constituent methods and procedures and interfaces) combine to reflect the broader system and/or user intentionality and requirements entailed in processing the information obtained from Multi-Domain $Q_A$ 5501A as contained within data store $Q_{ID}$ 5506. As mentioned, the specific methods depend upon both this intentionality and requirement skein but also considering and responding and adapting to the composition and structure of the information itself as well as to the nature of the source domains. In this example, as stated, block 1104 obtains the data from data stores $Q_{A1}$ 5502 and $Q_{Ak}$ 5503 drawn from Multi-Domain $Q_A$ 5501A, but no elements from Schema for $Q_A$ 5504A are included within data store $Q_{ID}$ 5506. Thus, the adaptive and responsive interfaces within 1180 and 1112 and content- and content-relevant methods and procedures and interfaces process this received data to format, filter, parameterize execute other operations to instantiate Reference Data Model RDM-1 5508 (and in implementations, to create, extract or otherwise construct Schema for QRDM-1 5504D). As shown, Reference Data Model RDM-1 5508 is thus not only fully referenced to Domain Q 5500 within this example instance of Platform 1000 but may be used to execute an Assertional Simulation in conjunction with appropriately parameterized Assertion Model AS-1 5509 and Apportionment sub-Model App-1 5510, structures that, in this example are formed adaptively and responsively by means of content- and context-responsive methods and procedures and interfaces within Assemble and Parameterize and Select Candidate Assertion Model(s) 1113 and Assemble and Parameterize and Select Candidate Apportionment sub-Model(s) 1114. As in the foregoing, the constituents Models within Assertional Simulation may then be presented to composite block Execute Assertional Simulation—Create and Manage Candidate Outcome Models 1116 and to other downstream functionality depicted in FIG. 1 and other drawings and descriptions.

Note, again, however, the multiple callouts within FIG. 7 that these operations are referenced to Domain Q 5500 (see FIG. 7 callouts De-Reference $Q_{ID}$ from Domain Q to Domain D 5507 and Referenced to Domain D 5511). These callouts emphasize the fact that, in this example, (as mentioned in the foregoing), the entire semantic frame of reference, the relationship between nodes and the compositional meaning within such nodes (to the degree that such information may be inferred) was required to be extracted and inferred from the information within data store $Q_{ID}$ 5506 and not from a direct access to or importation from Schema for $Q_A$ 5504A by means of dynamically assembled methods and procedures and interfaces within (or accessible to) blocks 1180 and 1112. Since Schema for $Q_A$ 5504A was not included in the information provided, this is an example of "full de-referencing", as mentioned. As mentioned, such full de-referencing and the variations that involve less-than-full de-referencing provide an important predicate and execution framework for execution of many types of Assertional Simulation.

Continuing the present example, assume that the governing schemata within Schema for $Q_A$ 5504A for the information contained within Multi-Domain $Q_A$ 5501A thus defines, in the manner outlined in the foregoing, both the composition as well as the inter-nodal structure within the collection of information drawn from 5502 $Q_{A1}$ and 5503 $Q_{Ak}$ and that, in the present example, the structure of the assembled aggregation, as reflected in the relevant schemata within 5504A Schema for $Q_A$ is a taxonomic hierarchy. Note again, however, that the governing schema itself is bounded by and defined with the ontological frame of reference within enclosing domain Multi-Domain $Q_A$ 5501A which includes a complex of definitions and relationships as embedded within a governing grammar and vocabulary as well as the methods for creating, maintaining, organizing, accessing and performing other operations upon and with this information. Recall, as well, that the terms "governing grammar and vocabulary" are defined in connection with DTS not in the colloquial sense but rather in the category theoretic sense, and so, in this case, these domain-defining and circumscribing functions should be understood as effectively similar: the frame of reference bounded by enclosing domain Multi-Domain $Q_A$ 5501A defines the semantical meaning of its subsumed (or referenced) information nodes with terms and rules for the use of collections of terms (grammar or lexicon) where such terms and rules are, in turn, circumscribed by those proceeding from enclosing domain Domain Q 5500. In this manner, the organization of nodes within the collection of information from $Q_{A1}$ 5502 and $Q_{Ak}$ 5503 is determined by one or more defining heuristic or definitional concepts framed in terms expressed through the domain-defined vocabulary and grammar and rendered within and executed through methods and procedures within Schema for $Q_A$ 5504A, as described previously.

Thus, in the present example, assume that there are two modes of semantical characterization that apply to the definition of each information node in this hierarchy, aspects that may be nominally independent but which are nonetheless related when included in an aggregation: 1) the "internal-standalone" meaning of the node, as defined by its association with and binding to at least one term in the domain-bound vocabulary, as in the foregoing; and 2) the "structure-placement" meaning of the node which is defined by the choice of its relative position within an information aggregate. Therefore, the "meaning" of a node may be derived from any or all of a number of aspects within these two modes including (but not limited to): i) the domain-bound definition of the information within each node wherein the definition is related to or reflective one or more vocabulary-defined terms external to the structure but where some such terms may make reference to or may have a lexical relation with one or more clustered groups of terms which may apply by degree based on context and which may, in turn, imply other terms, but which, for the present purposes remain within the domain-bound vocabulary; ii) given i) above and based upon any or all aspects of the internal definitions, the specific of the place of this node in the hierarchy; iii) given i) and ii) above, the relation of nodes to one another; and iv) the overall structure of the hierarchy and sections within it. All of these aspects of the compositional and structural aspects contribute to semantic definition of a node in this context of this taxonomic aggregation.

In this example, as discussed, assume all the elements comprising the compositional and structural meaning of a node as described above and the structure (and the subsection(s)) within which they are contained be described and implemented by means of the execution of the governing schema within functional block Schema for $Q_A$ 5504A. Thus, in the present example, the user- or system-process-defined "reasoning" or intentionality is reflected in the specific choice to include the node in the structure and its specific placement within a structure, and this purpose is constituted and reflected within the governing schema within functional block Schema for $Q_A$ 5504A and executed by means of associated methods and procedures and interfaces.

In this specific example, without foreclosing the applicability of these methods to other possible compositional and structural configurations, assume that each node in this taxonomic hierarchy (an aggregation constructed from the collection of information from $Q_{A1}$ 5502 and $Q_{Ak}$ 5503) is connected to its surrounding nodes by virtue of the schema-defined two-dimensional geometry such that nodes may be connected by (optionally) possessing a parent-child relationship and/or may be connected by (optionally) having one or more sibling relationships (where siblings are defined as two or more nodes that share at least one parent) but such that each node must possess either at least one parent or at least one child. Further, assume that all nodes contain a Real-valued scalar and that no such value may be undefined or null, and that each node also contains a label (or metadata) independent of its associated scalar by means of which it may be identified in one or more aspects within the Schema for $Q_A$ 5504A. In general, this pairing is called a key-value structure where a value serves as a unique identifier for its associated value. But in the current example, let Schema for $Q_A$ 5504A stipulate that an index label (or key) is not unique, and thus, the scalar value held within a given node may not, in some cases, be identifiable only by its label, but must be specified conjunctively by its relative geometric position. This instance occurs when a label (key) is assigned to more than one node (and thus may refer to more than one value). In light of this, and in the present example, let the key-value relationship of a node be called "label/key-value" for clarity and in order to distinguish this case from others where a key is unique to its nodal instance.

Continuing the current example, the schema-defined semantical definition of a node reflects the previously cited compositional and structural modalities, and in this context has at least three levels of semantical relevance reflecting items i) through iv) in the foregoing: 1) the "meaning" of its label outside the structure as defined by the frame of reference-bound vocabulary (as in the item (i) in the foregoing); 2) its connective relationship to adjacent nodes (its parent(s) and/or its children or its siblings) (also as described in the foregoing as well as in as in items ii) and iii)); and 3) its connection to non-adjacent nodes wherein such connection (in this schema) are conveyed by commonly-shared labels, as in the foregoing items ii) through iv)).

Continuing the example process and execution flow shown in FIG. 7, FIG. 8 reveals not only more detail from FIG. 7 but shows the additional variation wherein several DTS-based schemata (as defined as in the foregoing with respect to Schema for $Q_A$ 5504A) are constructed and operated upon in relation to their respective associated data stores. In FIG. 8, Domain Q 5500 (depicted in FIG. 7 and described in the foregoing and in subsequent example implementations) is shown as having native schema Schema for Q 5504Q. The functionality described in FIG. 8 also depicts Domain Q 5500 comprising Other Domains in Q 5501B and elements from Domain Q 5500 designated as 5501M Multi-Domain QM with associated schema Schema for $Q_M$ 5504B. Note, therefore, in the top section of FIG. 8, that Schema for $Q_A$ 5504A (within Domain Q 5500) is shown as providing bi-directional functionality directly within and in conjunction with Multi-Domain $Q_A$ 5501A, resulting (among possible things not shown in here) in a data store labeled Aggregated Information-Multi-Domain $Q_A$ 5520. This depiction provides a representation notwithstanding the many other arrangements that may be possible since such data stores may indeed be physically and logically distributed in any number of ways and may be accessed and administered by many other components within Domain Q 5500 not shown here. In any case, data store 5520 as well as the sub-sets $Q_{A1}$ 5502 and $Q_{Ak}$ 5503 previously depicted and described, remain, as in those instances, governed by Schema for $Q_A$ 5504A. But note that, in this case, block 1104 is connected bi-directionally to Schema for $Q_A$ 5504A as noted with the callout Translated Selection Parameters for info within $Q_{A1}$-$Q_{Ak}$ 5530. Thus, in this variation, the information in data stores $Q_{A1}$ 5502 and $Q_{Ak}$ 5503 is selected by means of one or more access modalities that are translated to-and-from Domain Q 5500 and Domain D 5505. This variation permits a number of connections to be made between the respective domains, including but not limited to and or all of the de-referencing modalities previously cited.

On this basis, it may be evident to those fluent in these matters that methods and procedures and interfaces within a Platform 1000 (and thus within one or more domains within Domain D 5505) may create one or more schemata structures as described in Domain Q 5000 in connection with FIG. 7. Thus, in FIG. 8, Schema for $Q_D$ 5504C may be generated, created and/or modified or otherwise instantiated in one of two modes or in both interactively, such that the elements composing Schema for $Q_D$ 5504C may be constructed to or otherwise configured to i) comport with the contents of obtained data store $Q_{ID}$ 5506; and/or ii) to condition, reorganize or otherwise modify the contents of data store $Q_{ID}$ 5506 to comport requirements necessitated by one or more elements within (or accessible to) Schema for $Q_D$ 5504C. As shown, this construct is bi-directionally connected as well with composite box 1180 thereby depicting possible invocation of any or all of the described DTS-based (and/or DTS-enabled and/or DTS-accessible) context-responsive, content-sensitive and content-responsive methods and procedures and interfaces as well as any or all looped recursive and iterative operations (as represented in composite box 1106 in FIG. 1 and other figures). Thus, note that this current example embraces the full gamut of DTS semantic de-referencing since the Schema for $Q_D$ 5504C contains no compositional or structural references (as in the first example) or to the degree that such elements are present, exists only in partial and incomplete form, as described in the previous discussions.

A specific instance within this example is depicted in FIG. 9. As shown in FIGS. 7 and 8, compound functional box 1104 assembles information from within $Q_{A1}$ 5502 and $Q_{Ak}$ 5503, (which are extracted from and assembled by enclosing domains by means of Schema for $Q_A$ 5504A, as described in the foregoing). In FIG. 8, the callout Translated Selection Parameters for info within $Q_{A1}$-$Q_{Ak}$ 5530 depicts an implementation wherein compound functional box 1104 may access one or elements within and/or referenced by Schema for $Q_A$ 5504A. As described, there are several modalities of DTS semantic de-referencing that may be invoked, including, for example, full de-compositional and de-structural de-referencing wherein both the external references defining the meaning of a nodal label are de-coupled as well as the inter-nodal connections, but where, in general (but not in all cases), these meanings may be rebuilt by means of methods and procedures and interfaces within the new domain, in the present case, Domain D 5505. In this modality, note again that the frame of reference and the attendant elements of the ontology (vocabulary and both compositional and structural meanings as described previously), embodied within Schema for QA 5504A are unambiguously not included in any manner when compound functional box 1104 retrieves the information, other than in the structure of the data itself. Thus, though the access modality invoked by methods and procedures and interfaces within compound functional box 1104 may, in some cases and modalities of de-referencing, include one or more references derived or extracted from the governing schema in Schema for QA 5504A, in the current case, such semantic schemata are not conveyed in the syntax of the collection of access and selection commands and thus the methods and procedures and interfaces within 1104 are uninformed beyond the bare minimum of "get information nodes that live within these boundaries". In concrete terms, this may be an SQL statement executed through one or more API wrappers that simply specifies boundaries but not a terminological-based command defined within the Schema for QA 5504A. In other modalities, as described, one or more elements subsumed within Schema for QA 5504A may be included and/or referenced in some manner either within the delivered information and/or may be included in the access and selection modality (such as for example, formatted SQL statements), thereby supplying one or more translation mechanisms by means of which one or more aspects of the external and structural of meaning one or more nodes may be transferred into Domain D 5505 from Domain Q 5500.

The current example illustrated in FIG. 9, however, deals with the first modality and thus involves complete decoupling between source domain(s) and Platform 1000, and examples of such an instance are illustrated in FIGS. 8 and 9 which respectively show variations in this modality. Note that this example is presented without loss of general application of its principles to other variations using alternative methods which may not depicted here but which may implied, and further, that those skilled in these arts may see that the principles that inform and parameterize and otherwise frame methods and procedures and interfaces described in connection to this example may be applied to other variations and to other modalities of DTS semantic de-referencing.

Thus, in FIG. 9, composite functional box 1104, as described previously, obtains information and embeds the retrieved result in data store $Q_{ID}$ 5506. But this information is processed by composite functional block 1180 such that content- and context-responsive methods and procedures and interfaces are, in this example, applied to the information within $Q_{ID}$ 5506. As shown within the brackets, after such processing, this information may be seen as comprising a collection of nodes which are connected in a particular fashion such that there are structural relationships between nodes but, prior to presentation to block 1180, such relationships are not explicit since these relationships are not specified in another document—as stated previously, there is no such ancillary document in this case—but nor is there any "linkage" information embedded within the data itself (such as, for example, within information pointing one node to the location of another as in a linked list). Note that such data-containing linkages, while not present in this case, may be present in other DTS de-referencing modalities, and the specific aspects of Platform 1000 described here apply without loss of generality to those and other cases, as well.

In the present example, let the nodes be organized by Schema for QA 5504A and conveyed to composite function box 1104 as nodes aggregated within a series of rows and columns and that this organization is the only information about these nodes that is passed into Domain D 5505. But as described previously, this example pertains to a taxonomic hierarchy with a few rules regarding key value pairs, and yet this structure and attendant rules are not described independently in the transfer of the information—indeed, this is a part of the modality of re-referencing explained in this example. Thus, in this instance, the taxonomic structure and the key-value rules are implicit in the structure itself and must be discovered by methods and procedures and interfaces within the Platform 1000 and, as a consequence, will thus be referenced to Domain D 5505 and not to the domain(s)-of-origin. In embodiments and in the example depicted in FIG. 9, this aggregation is discovered (by context-driven application of adaptive, content-sensitive methods and procedures and interfaces within (or accessible to) block 1180) to be a k-level by 3 tree (as revealed in this drawing by group call out 5520 K-Levels wide and the depth of the node $N_{OK}$ 5514 branch).

In a similar manner, this decoupling and re-discovery may be extended further as exemplified in this example: assume that a node labeled $N_{OA}$ (node $N_{OA}$ 5513 in the FIG. 5502) is organized as a label/key-value pair (as defined above) and let this node contain a value of $x_k$. Recall, however, that in the current de-referencing modality, while label/keys are defined by a governing vocabulary and grammar within the frame of reference circumscribed within the hybrid domain spanning $Q_{A1}$ 5502 and $Q_{Ak}$ 5503 and defined within the schemata Schema for QA 5504A and that, moreover, "$N_{OA}$" has a specific meaning in the context of enclosing domain Multi-Domain $Q_A$ 5501A which is also reflected Schema for QA in 5504A, that meaning is explicitly not included here. In concrete terms, "$N_{OA}$" may refer to a specific object (called, for example, "thing 1A") but this specific linkage between "$N_{OA}$" and "thing A" is confined to the governing Schema for QA 5504A and the attendant vocabularies, and thus "thing 1A" has no explicit objective meaning within 5505 Domain D. But on the same basis, the external meaning of the scalar value $x_k$ (the value associated with node $N_{OA}$ 5513) is also undefined, though at least one element of its implicit meaning is conveyed by its association with its label/key ($N_{OA}$) and by whatever connective relationships may exist between node $N_{OA}$ and other co-resident nodes. That is, since scalar value $x_k$ is only defined in Domain D 5505 as the value attached to node $N_{OA}$ 551 and the meaning of the label/key $N_{OA}$ is, as stated, is no longer associated with "thing A", whatever meaning scalar value $x_k$ in Multi-Domain $Q_A$5501A no longer exists. Thus, while it is possible that the meaning of $x_k$ when associated with label/key $N_{OA}$ refers to some quality of "thing A" (its magnitude, for example), in this instance, this semantic definition of $x_k$ is no longer valid.

Note, however, that the relationship between label/key and an attached value not only survives this "complete" de-referencing modality—the value, after all, is ascribed to its label/key in the data itself—but that to the degree that this relationship (and/or any other relationship) within the information aggregate now contained in data store Om 5506) does not survive explicitly, such relationships are implicit in the data itself and are thus discoverable within the new domain (Domain D 5505). This content-derived discoverability (executed in the example by methods and procedures and interfaces within or associated with block 1180) leads to the specific knowledge within Domain D 5505 that the subject information aggregate is indeed a k x 3 tree by virtue of the arrangement in columns and rows in data store Om 5506. This implicit information permits methods and procedures and interfaces within block 1180 (and with, in embodiments, in conjunction with and by means of additional assistance from other DTS-based (and/or DTS-enabled and/or DTS-accessible) processes and/or user input) to create the Domain D 5505-based paradigm resulting in the arrangement of the subject aggregation of nodes according to the previously stated rules—that is, as a taxonomic arrangement connecting parent and child nodes. This example of the "content-emergent discovery" capabilities within Platform 1000 (as well as other content-driven configurations of this type) represents one concrete example implementation of the mechanisms of DTS sematic de-referencing. This "discovery" of de-referenced correspondent and geometric relations within an aggregated structure is one execution element within many modalities of DTS semantic de-referencing.

Continuing this example (and referring again to FIG. 9), node $N_{1A}$ 5515 is depicted as a child of node $N_{0A}$ 5513 and let this node contain value x, where the previous descriptions and properties of node $N_{1A}$ 5515 apply to node $N_{0A}$ 5513 (and to other nodes depicted within FIG. 5502). Thus, let node $N_{1B}$ 5516 containing value $x_n$ be a sibling of node $N_{1A}$ 5515 and thus, nodes node $N_{1A}$ 5515 and node $N_{1B}$ 5516 share at least one parent node $N_{0A}$ 5513. Once again, since these relations are not explicit in the information obtained for the subject aggregate from Schema for QA 5504A, this relationship must be inferred (or discovered) by application of the example methods described in the foregoing. As depicted, node $N_{1A}$ 5515 has a child, node $N_{1A}{}^a$ 5517 which contains value $x_q$. Examining this tree further, however, note that the child of node NOK 5514 is node $N_{1A}{}^a$ 5518 and contains a value $x_{m+3}$. This label/key string is the same as the child of node $N_{1A}$ 5515 (labeled 5517) but each contains different values, $x_q$ and $x_{m+1}$, respectively. Thus, as described previously, label/keys strings in this instance, may be shared and thus must be further defined by their position in the inferred tree structure and by their relation to other like-named nodes. Likewise, the child of node $N_{1A}{}^a$ 5518 (in turn the child of node $N_{0K}$ 5514) is node $N_{1B}$ 5519, a node with a value of $x_n$ but that in this case, both the label/key and the associated values are shared between distinct nodes, distinct, that is, by virtue of their surrounding relations. Thus, in this example, as described, these "lost" relationships are recovered by the previously described methods and procedures and interfaces within blocks, permitting invocation of previously described composite block 1112 to produce 5508 Reference Data Model RDM-1.

FIG. 10 expands upon the previous example further illustrating the content-emergent "discovery" capabilities provided within the DTS-based (and/or DTS-enabled and/or DTS-accessible) content-sensitive and content-responsive methods and procedures and interfaces surrounding and related to DTS semantic de-referencing. This non-limiting representation exemplifies process and execution flows that may be invoked within modalities of DTS semantic de-referencing and DTS-centric processing of information involved in the creation and maintenance of DTS Models and other Platform 1000 operations that provide direct and indirect support for Assertional Simulation as well as other ancillary and support functionalities. The collection of methods which execute such operations are referred to, in DTS-terminology, as "blind semantic extraction and reconstitution" procedures and may, in embodiments have broader application than in DTS semantic de-referencing as in the present example, having additional utility in other analytic aspects throughout a Platform 1000, including, for example, within the computations related to in-App activity measurement and metrics. The application of DTS blind semantic extraction and reconstitution operations in contexts related to DTS semantic de-referencing provides further points of differentiation of the methods and goals and capabilities of DTS semantic de-referencing from traditional ETL systems, as well as provides another indication of the additional capability it makes possible. These elements underscore and extends the novel contribution to the art provided by this DTS capability.

As discussed in earlier examples, the "discovery" operations seek to reconstitute all or part of a "foreign" (that is, non-DTS, as described in the foregoing) semantical and structural schemata embedded within a de-referenced Reference Data Model within a new reference frame using such example techniques as induction-based, content-centric feature mapping as well as other methods typically used to induce information about data and data structures in the absence of definitional information as may be found in schemata (such as, from example, Schema for QA 5504A, as described in previous examples). In such "discovery" operations, one or more aspects of the lexical and grammatical skein that defines a de-referenced informatic aggregation (in this case, a Reference Data Model) may be accessed, extracted, inferred, interpreted or otherwise obtained and optionally transformed and then employed within DTS-resident processes to integrate the de-referenced informatic structures within the local (and possibly new and possibly transformed) ontological frame. In this example, such embedded definitional information may be assumed to have originated from a non-DTS domain (such as, for example, from Domain Q 5500, though this is not a required condition) and may be obtained through any of the means described in previous examples and illustrations (noting that in such operations, the target aggregation is often acquired in the "inchoate" access modality, as described above) and without any governing schemata (also as described in the foregoing). Note, however, that the execution and process flows depicted in FIG. 10 (and as described in the accompanying text and examples) may be generalized, as mentioned in earlier contexts, so that any or all of the content-sensitive and content-responsive methods and procedures and interfaces that may be invoked in such "discovery" processes may seek partial recovery (of any degree) of such defining information and thus, this example of semantic extraction and reconstitution may be generally applied to any DTS semantic de-referencing environment.

In such instances, DTS-based (and/or DTS-enabled and/or DTS-accessible) content-sensitive and content-responsive methods and procedures and interfaces may be employed by user and/or system processes to first extract one or more such lexical and/or grammar-related and/or structural informatic elements to then transform, extend, translate, re-define, supplement or otherwise modulate such information in ordered to instantiate such elements within the one or more local ontological frames of references bounded by the DTS domain. FIG. 10 exemplifies a type of operation within the various execution modalities of DTS semantic de-referencing wherein this re-orientation and coerced semantical re-casting is not merely transformative upon the target informatic structure (as described in the foregoing) but which results in a number of states and modalities upon the basis of which different operations may be executed. Such outcomes include but are not limited to: i) creation or synthesis of a new ontologically-complete frame of reference wherein this new reference frame may remain discrete but which may (in a non-exhaustive enumeration) either share one or more lexical and/or grammar characteristics with one or more such frames that currently exist within the Platform 1000 where such pre-existing reference frames may have any etiology, or may be fully unique with respect to those pre-existing frames, having no common semantical elements; ii) inclusion of one more elements within one or more existing frames, thus extending or supplementing or transforming the newly-expanded existing frame; iii) any combination of i) and ii) above such that a new, discrete (and indexed) frame is spawned but one or more elements are also interwoven in to existing frames. Note that in variations, such semantical information may, in the course of any such operation be transformed by any number of means using previously referenced bi-directional transformative operations but may also (and/or instead) be fully re-defined by number of means. In addition, any or all such lexical and grammatical elements in any of the foregoing modalities may also (and/or instead) be extended, enhanced or supplemented with additional semantical properties, including but not limited to: new definitions and shades of meaning; newly posited interrelationships with newly encountered terms; weakened or transformed relationships with new and existing terms; imposition of conditionals and heuristic structures across any or all such elements.

Referencing FIG. 10, this example shows how lexical, grammatical and structural information may be extracted from an information aggregate to form a new DTS-based frame of reference where the extracted semantical information is coerced upon other (in this instance) DTS-native aggregates (noting that the native-DTS origination of the coerced aggregated may not be required in other contexts) In this example, the information is extracted from a Reference Data Model from earlier figures and examples (data store 5508, entitled RDM-1) and coerced upon an Assertion Model and an associated Apportionment sub-model. In variations, these coerced-upon models may already exist, but in the current example, assume that the operations depicted result in a newly-synthetized new Assertion-Apportionment pair. Moreover, for simplicity, assume that the semantical elements thus induced form a new discrete frame of reference with no common or shared semantical basis with existing frames.

Composite functional blocks 5600 and 5601 (entitled "Extract Assertional Model references from RDM-1" and "Extract and modulate Apportionment sub-Model parameters from RDM-1 5601", respectively subsume DTS-based (and/or DTS-enabled and/or DTS-accessible) content-sensitive and content-responsive methods and procedures and interfaces as described in the foregoing that permit (possibly looped and recursive) examination of RDM-1 5508, using context and structure discovery methods to develop now-DTS-based schemata (not shown in FIG. 10 but implied as shown in FIG. 8 and as described there). Note that callout 5602 ("Node references & values may be extracted and included in the Domain D Assertion and Apportionment Pair 5502"), summarizes the overall operations here while callout 5603 ("Selected Extracted Information 5603") references the control/data flow from RDM-1 to blocks 5600 and 5601, containing the semantical information extracted from RDM-1) and the output from block 5600 that is presented to block 5601. The previously referenced composite functional blocks 1113 and 1114 (cited and described in FIG. 1, FIG. 6 and other figures) are depicted as adjacent and thus highly interconnected to blocks 5600 and 5601, respectively, though in implementations, all the methods subsumed in these functional blocks may be engaged in looped, recursive and highly interlocked computation cycles. As shown by the callout 5512B, ("5512B Information from 1172A, 1172D 1172E") any or all information cited in earlier Model assembly examples may also be used by any of the DTS-based (and/or DTS-enabled and/or DTS-accessible) content-sensitive and content-responsive methods and procedures and interfaces within or accessible to these blocks. As may be expected, the end results of such operations are reposed within data stores 5509 and 5510 ("Assertion Model AS-1 5509" and "Apportionment sub-Model App-1 5510", respectively) and presented to block 1116 together with Reference Data Model RDM-1 5508 which executes an Assertional Simulation upon RDM-1 5508 using the extracted and newly-synthesized Assertion-Apportionment pair, 5509 and 5510, noting, of course, the implied step of parametrizing the Apportionment sub-Model (as may be provided by one or users or system processes). The resultant Outcome Model, shown within data store 5604 ("De-referenced DTS Candidate Outcome Model 5604") is designated as product of DTS blind semantic extraction and reconstitution operations by callout 5506 ("Outcome Model de-referenced from Domain Q to Domain D 5606"). Note, as well, that this sequence may be repeated any number of times for many reasons, including but not limited to operations: that seek to discover one or more optimizations against one or more inferred or nominated criteria as may be executed within looped, recursive operations of any variety, as described throughout this disclosure wherein, for example, different inferred schemata may be created and tested and possibly modified; and/or that test or instantiate results based upon different parametrizations imputed to Assertion-Apportionment pairs; other such conditional and non-conditional looped or simple repetitions impelled by user and/or system inputs. Finally, note that any or all such Outcome Models, may optionally be made available through the control/data flow designated by callout 5605 ("Outcome Model 5604 included in collection of Candidate Outcome 5605") to other operations through inclusion in the collections of possible Outcome Models represented by data store 5607, ("DTS Candidate Outcome Models").

A simple example of this blind semantic extraction and reconstitution in the context of DTS semantic de-referencing may be seen in an expansion of an earlier example wherein within accounting-extracted data was de-referenced from its inherent monthly time base to accommodate the eccentric and irregular non-monthly time base within various Assertion-Apportionment pairs. In this case, assume the same conditions as in the earlier example, especially that governing schemata was not conveyed with the information that now composes the Reference Data Model. In the present example, the user wishes to execute Assertional Simulation to allocate indirect expenses to different profit centers, as described in other examples. But here, upon invoking and parametrizing one or more of the content-sensitive and content-responsive methods and procedures and interfaces associated with blind semantic extraction and reconstitution operations, the user discovers that in this extracted information, say for the hypothetical month of May, a new item has appeared that was not present in the earlier months. The frame of reference defining the current Assertion-Apportionment pairs cannot process this term as it is currently undefined. In this instance, the user may invoke a user interface mechanism through which the term may be categorized as another instance of other terms, terms that were similarly de-referenced from the native ontology (accounting) and then integrated within the new reference frame and imbued with new semantic relevance (within DTS). The DTS-based (and/or DTS-enabled and/or DTS-accessible) methods and procedures and interfaces that execute this operation (and other instances of blind semantic extraction and reconstitution) requires not only context-responsiveness but the ability to distinguish new term and relations from those already re-constituted. There are many known ways to accomplish this, including, for example, methods that compile and maintain one or more dictionaries and ingestation logs, procedures that may examine newly ingested information for such anomalies and may then invoke any ameliorative action.

In addition to the operations and functionality surrounding DTS semantic de-referencing as described in the foregoing, in embodiments and in certain contexts, DTS-based (and/or DTS-enabled and/or DTS-accessible) methods and procedures and interfaces implement another novel computational approach to the construction and manipulation of both Reference Data Models (as well as other informatic entities, as described in the foregoing). These procedures may treat the structure and the composition of nodal elements within a Reference Data Model (and other data edifices) as linearly independent properties of that entity. Note that this unique approach is another variation of coercive manipulation of information (as previously described and as may be provisioned and executed by means of methods associated with DTS semantic de-referencing), but in this case, the coercion manifests in the fact that there may indeed be a mathematical and logical dependence between structure and composition within the subject aggregation, but that each aspect may be operated upon as if no such dependency exists. Such operations may be executed in certain contexts and may be invoked upon aggregates that are in a transient state within a broader execution context.

As a consequence, in the operations executed upon those entities, both the structure and the domain of nodal elements within a Reference Data Model (that is, the properties reflected in the inter-nodal structure and composition of nodes within a Reference Data Model) and the way in which these now-independent properties are combined impacts the modality, variety and execution of Assertional Simulation (and other ancillary operations) in number of ways, in some cases creating optional modalities that may be presented to users or system processes. Such alternatives may reflect potential choices as to one or more aspects of the type, variety and modality of an Assertional Simulation but also contribute to the selection of the computational means by which one or more aspects of the selected Assertional Simulation may be executed.

Note, however, that this coercion exists within the broader content-responsive, context-sensitive and content-emergent properties that, in embodiments, provide a multi-leveled adaptivity present throughout DTS-based (and/or DTS-enabled and/or DTS-accessible methods and procedures and interfaces within a Platform 1000. Thus, the functional and execution blocks and the process and execution flows depicted within FIG. 1, FIG. 5 and other figures and descriptions illustrate non-limiting examples of implementations of both the novel content- and context-responsive characteristics native within a DTS Platform 1000 (as such modalities may apply to various component services and functionality) but, in another unique extension to the art, where such adaptivity may also be responsive independently to the coerced separation of information structure and its composition. In embodiments, such operations of this broadly-based and versatile adaptivity and responsiveness to both context and content as well as system- and user-engendered conditions and intentionality fall into several general but non-exclusive categories, including but not limited to: (i) "content-static" procedures (a DTS-spawned term) where such methods (and/or collection of methods) are specifically applicable to prescribed array of structural and/or compositional data types; ii) content-responsive, context-responsive and content-emergent procedures (another DTS-spawned term) of which a few variations include (but are not limited to): a) methods that may be assembled for execution upon certain types of content (where, for example, text-based information incorporated within a larger hybrid aggregate of information may be evaluated or processed with natural language processing techniques, keyword search or with user-elicited parameters); b) methods that may be assembled to operate upon certain types of numeric representations (where certain computation routines may be applied to scalar values and others applied to vector quantities); c) methods that may be assembled as in a) and b) above to extract information from an information aggregate and which may then select (using system-driven or system-provided and/or user-supplied parameters which may include, in non-limiting examples, system or execution context and/or interpreted intentionality and/or solicited user input where any or all such parameters may reference, for example, lookup tables and other indicia reflecting such conditions) and invoke content-appropriate methods upon these extracts (in some instances in combination with other information conditionally extracted from the same subject aggregate and/or from other aggregates), and where in some instances, the results may be incorporated within the subject aggregate and/or may be reposed within other aggregates but which may also provide further parameterization for selection and sequencing of other additionally applied methods (which may also be applied to the current aggregate and/or to other aggregates); methods that may be assembled as in a), b) and c) (in any combination) to be executed within any or all looped recursive operations, as described in the foregoing and in other examples within this disclosure.

Thus, in embodiments, this DTS-provisioned content- and context-sensitivity and adaptivity is multi-faceted and multi-staged and present across the spectrum of methods and procedures and interfaces within a Platform 1000 but note that it is most often included in interfaces attached to and which interconnect execution blocks. Such functionality is present, for example, in the composite blocks 1130 and 1180 shown in FIG. 1 and FIG. 5 (and in other figures) but is integral in other execution blocks, as well, so that in embodiments, these interfaces may be understood as pervasively available to any execution block. This integration of these versatile capabilities within these computation structures provide repeatable mechanisms by means of which one or more elements may contextually adapt to both system- and user-engendered conditions and intentionality but also to the nature of the information being operated upon, so that such considerations as (for example) the specific type and sequence these of procedural invocations may be dynamically adapted to, derived from and parameterized by numerous mechanisms related not only to system-based parameters and criteria but also, in context, to the state of the structure and the content of information being processed. This pervasive operational adaptivity has numerous modalities, some conditional, and may, in embodiments, be provisionally and even transiently applied (that is, applied in one instance and not in another and/or within one or more possibly non-contiguous cycles inside one or more looped recursive operations (as in the foregoing) and not in others). Examples of these mechanisms include (but may not be limited to) any or all of the following operations or combinations of operations where such methods and procedures and interfaces may contextually and, in instances, transiently adapt to: (i) the structural characteristics (where, in a non-limiting example, certain procedures that parse or decompose elements within a taxonomic hierarchical structure may be required to be executed differently from those applied to a flat or unstructured list): ii) the composition of the subject content (where, for example, application of specific methods may be required depending on the composition of the target elements in this decomposition, where, for example, certain arithmetic operations would be applied to scalar value but more complex vector-based computations applied in the instance where the subject node is multi-dimensional—or both; iii) conditions in i) and/or ii) above where the selection and application of specific methods may depend both on the composition of the target elements as well as its structural state after (or during) a decomposition operation (as in i) above; conditions in iii) above where the selection and application of specific methods applied to one or more aspects of the structural state after (or during) operations that operate upon the composition of the target elements. In addition, in embodiments, methods and procedures and interfaces may be contextually and, in instances, transiently and/or conditionally responsive and adaptive to numerous system-based circumstances (such as, for example, as may occur in the context of a recursive operation upon a suite of nodes within a Reference Data Models such that certain procedures may be applied optionally and conditionally at either user or system option, or both).

Figure 6:
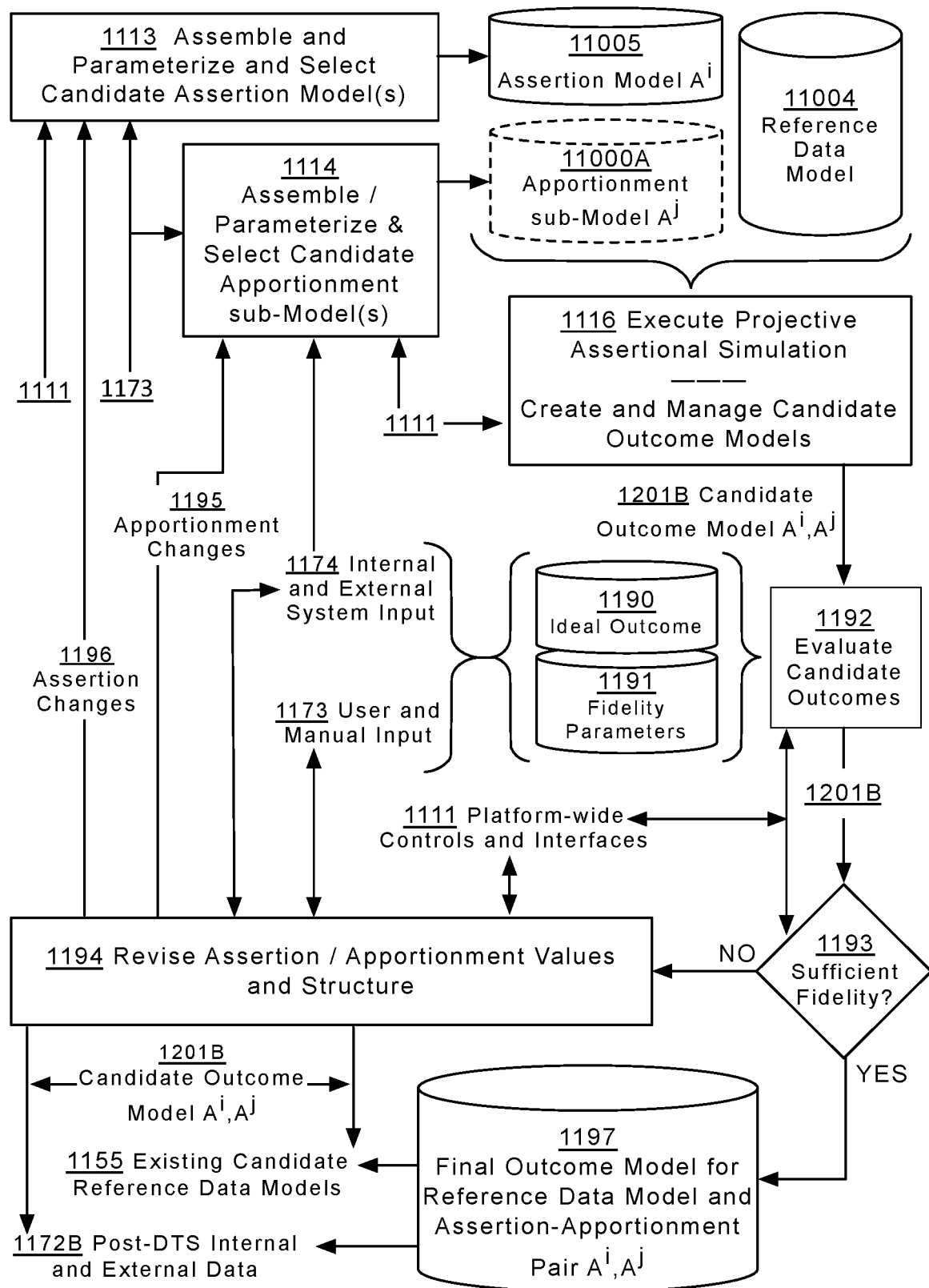
FIG. 6 illustrates an assembly and an execution flow in the construction and revision of Assertion-Apportionment pairs used in DTS Assertional Simulation using a looping optimization, competitive algorithm.

One example of this combination of content-responsiveness and coerced structural and compositional dichotomy may be seen in the depiction of the methods and procedures and interfaces in FIG. 5 and FIG. 6. These figures illustrate example mechanisms related to the creation (and maintenance) of Reference Data Models and Assertion Models/Apportionment sub-Models, respectively, but, as in previous descriptions, such methods and variations may also be employed in other operations and in relation to other information aggregates. As shown in the upper portion of FIG. 5 (and as discussed previously and throughout this disclosure), Reference Data Models (and other aggregates) may (without limit) incorporate information drawn from many different and often disparate sources and domains and, in embodiments and in some modalities, may also include, incorporate, integrate, combine or otherwise utilize or reference user- and/or system-generated information. The extensive scope of these sources and versatile and dynamic modes of creation and integration is a novel feature within a DTS Platform 1000, and these capabilities are executed by a suite of transformational capabilities integral to the wide-ranging applications of Assertional Simulation and related, derivative and ancillary activities. Thus, the content-sensitive and content-responsive methods and procedures and interfaces within a DTS Platform 1000 systematically and dynamically address potentially problematic heterogeneity by integrating and exploiting this diversity, an approach that exemplifies how DTS leverages such challenges with novel combinations of computational components to enable and enhance and extend the varied forms and applications of Assertional Simulation and related, derivative and ancillary activities. FIGS. 5 and 6 (and subsequent figures and associated descriptions) provides a representative example of this systemization through depiction of DTS-based (and/or DTS-enabled and/or DTS-accessible) operations that, in embodiments, may be employed to manage and execute creation, manipulation and modification of Reference Data Models.

Reference Data Models may also contain and integrate informational components defined within a variety of ontological reference frames, may contain (or be referenced to) information drawn from multiple time bases, may integrate or combine or otherwise utilize (without limit) textual, symbolic, graphical, scalar or multi-dimensional data and may thus exhibit many other types of informational diversity. Further, methods and procedures and interfaces within a DTS Platform 1000 enable users and system processes (without limit) to create and maintain and preserve versions, variations and generations of Reference Data Models (and/or discrete elements contained therein) through application of diverse combinatorial, evolutionary and permutational operations (as indicated by functional blocks 1309 and 1409 in FIGS. 3 and 4, respectively). In embodiments (deploying, for example, methods and procedures and interfaces associated with one or more aspects of the APM fabric as described in the foregoing), users and system processes may access, utilize and operate upon any or all such versions and any subsumed discrete elements.

As shown at the top of FIG. 5, data sources Pre-DTS Internal/External Data 1172A and Post-DTS Internal and External Data 1172B refer to data and information accessible to various functional aspects within a Platform 1000 (and to the related methods and procedures and interfaces) as well as to Platform 1000 users where such capabilities may, in embodiments, be DTS-based (and/or DTS-enabled and/or DTS-accessible). In DTS terminology, "pre-DTS" reference in annotation 1172A (which also may appear in other contexts and references and should carry the same connotation, unless otherwise) means that information within data store 1172A has not been (fully or partially) processed by elements within (or accessible to) Platform 1000 into one or more DTS-compliant Reference Data Model structure(s), though, in embodiments, other processing may be or may have been executed. Likewise, the term "internal data" (as contained, for example, in annotations 1172A and 1172B, but which may appear in other contexts and references as well with, unless otherwise noted, the same meaning) should be understood to refer to collections of information (composed in one or more DTS-based (and/or DTS-enabled and/or DTS-accessible) data stores) which are (in general) logically (if not physically) co-located within or otherwise natively accessible (and addressable) within a DTS Platform 1000 (or other executable environments accessible to a Platform 1000 (including via one or more data networks)) where such data may not, in embodiments, always require deployment of an external interface. And, of course, external data (within the same annotations) refers to information that is not internal, as in the foregoing; that is, it refers to data that is not logically associated with the DTS infrastructure but may nonetheless become accessible by means of one or more industry-typical methods such as API's and other data exchange methods.

The types, structures and varieties of data represented within data stores 1172A and 1172B, and thus available to be processed within one or more elements within or associated with a Platform 1000, may be diverse, and, in practice, there are few practical limits on inclusion. Note, however, that some information may need additional processing and/or application of methods and procedures and interfaces that may not be shown in these illustrations, but which may be assumed without loss of its applicability to embodiments of the functionality described here or as may be inferred by those skilled in these practices.

The general categories of the structure of data referenced in data sources 1172A and 1172B (as well as in other references and contexts within or implied by this disclosure) include but are not limited to: structured, unstructured, flat, hierarchical in many forms including nested subsumptive containment structures, as well as any other organizational schemata which may be presented to and in the broad computational contexts detailed in this disclosure. Noting that such references to data formats, types and structures within this (and other figures) and the accompanying text and other descriptions throughout this disclosure are not intended to be exhaustive but rather, to be explicative of the present teachings, and should not limit their general applicability nor foreclose compatibility with alternatives not explicitly shown.

Thus, with this in mind, note that domains and distinctions between domains should be interpreted here in formal information-theoretic terms, such that, in general (but not in all cases), information subsumed within a given domain (such as, for example, domains a through m as defined within ontological frame A referenced in Data from Ontology A 1132A in FIG. 5) should be understood to convey a continuous, discrete but (in variations possibly) divisible ontological space such that certain (but not all) qualities within this space, including but limited to compositional and relational semantics as well as inter-nodal and structural relationships (however granular and at whatever level of aggregation) may be defined (implicitly or explicitly) by one or more organizing principles (sometimes called a vocabulary in information theoretic connections). Such vocabularies (and any consequent structural requirements that may inhere from the space, if any) should be understood in these informatic contexts as inclusively defined within this discrete ontological space and, in this sense, may span all or part of the entire space, noting, however, that such vocabularies, while required, may take many forms and may also themselves be (fully or in part) implicit and/or may be derived from and/or may be referenced to other (possibly external) structures. Finally, these discrete domains may contain mixed data types and various encodings and symbolic representations, optionally including, as well (as in the foregoing), mixed and/or multiple domain information, encodings and other types of representations.

In this light, it is evident that DTS-eligible data (that is, pre-DTS data, as described previously) may be drawn and/or assembled from many domains (or group of domains), including but not limited to (what may be defined in some reference frames) as data source amalgams and references drawn from non-contiguous as well as integrated sources derived from mixed domain, multi-domain, and single domain information sources as well as other forms as data source references. Such diversity is referenced in FIG. 5 as an output of block 1104: Multi-Domain, Mixed Domain, Single Domain 1172C, Existing Reference Data Models in Single Domain, Multi-Domain, Mixed-Domain 1172D and Data Types-Structured, Hierarchical, Unstructured, Flat, Nested Subsumptive Containment 1172E, where, as stated, these designations are not intended as all-inclusive, and noting that in embodiments, any or all such information types and structures may be integrated within and processed by a Platform 1000 (or computational resources available to or accessible to an embodiment of Platform 1000). Thus, most generally, the data sources and type/structure representations shown in FIG. 5 (and in other figures and descriptions) shown as both input and output to previously referenced composite functional box Manage Internal User Control, Interfaces and External Data and API Access 1104 may, in embodiments, possess any composition (as in the foregoing) where in some instances, diverse (that is, compositionally different) informational representations and distinct types of encodings may be combined into a single domain and may be optionally co-located, internally or externally to a Platform 1000 installation. And, as noted previously, to the extent that any such composed information source may not be (explicitly) represented in the present illustrations, a Platform 1000 is unambiguously designed (by means of interfaces and extensible procedures) to be expandable to encompass (or otherwise access) information in this manner and is thus able (by design and architecture) to ingest, manage, process and otherwise modify such information for inclusion within any constituent processes or operations without limitation. After all, new data types and formats proliferate at a rapid pace, and these illustrations should not in any way constitute or imply limitations to the general applicability of these teachings.

Returning to the top section of FIG. 5, the information stores Pre-DTS Internal/External Data 1172A, Post-DTS Internal and External Data 1172B are made available to the composite block Manage Internal User Control, Interfaces and External Data and API Access 1104, where these inputs may include any of all of the foregoing information types and varieties, in all the cited forms, at any time and in any context and subject to the previously described strictures and other requirements within Platform-wide Controls and Interfaces 1111.

Note, further, that, as mentioned in the foregoing, Post-DTS Internal and External Data 1172B may also include any internal or external data store (or section therein) accessible to a Platform 1000 that has, definitionally, been subjected to DTS-based (and/or DTS-enabled and/or DTS-accessible) processing, yielding informatic entities compatible with methods and procedures and interfaces within a Platform 1000). Such previously-processed informatic entities may include one or more sections within any Candidate or Cardinal Reference Data Models, Assertion Models, Apportionment sub-Model Outcome Models as well as any ancillary or otherwise referenced information (as may be available or accessible to a Platform 1000) and which may have been created, modified, generated (fully or in part) by one or more users and/or system processes. In addition to structures explicitly created by means of direct user control and/or positive intentionality, any Post-DTS informatic structures (or parts thereof) may also (and/or instead) be spawned or modified fully and/or partially as the result of application of one or more aspects of the previously-referenced looped refinement functionality (as described in connection with and as may be related to or enabled by or subsumed within block Manage Looped, Iterative and Recursive Operations 1105, an optionally pervasive functionality that, in embodiments, may be made available throughout a Platform 1000 which is shown in FIG. 5 as embedded within and made available by means of control signal/data flow Optimization Control 1108B within Platform-wide Controls and Interfaces 1111).

Note, however, that these previously-created (or modified) Models (and sections thereof) would, in general, be subject to constraints and conditions exerted by and made relevant by virtue of the presence of one or more user-referenced, process-referenced, and data-referenced control elements that may, in embodiments, be contained within the interfaces and procedures embedded within or associated with both the APM and the RAMS and TCM Control 1109 ownership indexing, access control and event mediation fabric (as referenced throughout this disclosure). Nevertheless, the present context is illustrative of a core strength and novelty of DTS Platforms and its constituent elements: its general and pervasive flexibility and adaptability of both Platform 1000 as well as Assertional Simulation in general (including its ancillary and supplemental and extensible capabilities) but the adaptive and contextually-conformable, event-driven and context-sensitive nature of RAMS 1109 and the flexibility inhered in its real-time, instance-based mediation of (possibly) re-purposed information.

The representation of information described in the foregoing as input to block 1104 (within stores 1172A and B) and the described representations of the form and composition of such data depicted as 1172C through 1172E are denoted collectively as example input to composite functional block Dynamic Element Selection, Assembly, Transformation & Parameterization of Mixed Data Sets 1130. In general, Block 1130 subsumes a variety methods and procedures and interfaces primarily but not exclusively centered about formatting and interpretative methods and techniques which individually or in combination may responsively and adaptively interpret and traverse and facilitate (or provide) access to the previously described variegated (and possibly far-flung) information stores as described in the foregoing. But note that, as mentioned in the foregoing, any or all of the content-sensitive and content-responsive methods and procedures and interfaces may be subsumed within or associated with any execution functionality represented within block 1130 (or equivalent blocks)

Thus, block 1130 comprises a collection of methods and procedures and interfaces within a Platform 1000 that permit users and/or system processes to employ, in embodiments, dynamically and contextually (as described in the foregoing) selectable domain-appropriate computational and processing methods by means of which these assorted and (potentially varied) inputs may be combined and/or converted or otherwise modified into (possibly) mixed but connected data sets. While structural and compositional disjointedness is not required nor is a necessarily deterministically consequence of antecedent processes nor inherent to the input information stores themselves, in embodiments, such data sets may indeed compose structural and compositional variety that may be entropically disjoint.

Thus, irrespective of the etiology of the information, of the possibly diverse (and even nominally) incompatible structure and composition, and even of constraints that may survive its re-integration as input to Platform 1000 processes, the collection of methods and procedures and interfaces within block 1130 provides the means by which users and/or system processes may select and assemble such information into nominally connected structures and may optionally operate upon such information though application of both manual as well as program-assisted or fully programmatically-automated structural and compositional manipulations, interventions that may include but may not be limited to: restructurings, reorganization, recasting, selective and discrete scaling and frame transformations, translation, substitutions and additions of all types. In embodiments, these supplementary and accretional results may be instantiated with, enabled by and/or assisted or otherwise facilitated by methods and procedures and interfaces that may include (but may not be limited to) those that: i) infer information from the content itself and/or from references attached or affiliated with the content; ii) those that may instill changes or additions using rule-based techniques; iii) those that may provide such augmentation as a result application of one or more instances (internal or external) learning and/or content-adaptive operations; iv) those that may be statistically-assisted and/or which may include or reference other mathematically-based and/or information-theoretic transformations.

In embodiments, the foregoing methods and procedures composed and otherwise associated with block 1130 may (as with many components with a Platform 1000) integrate or otherwise interoperate with one or more aspects of the previously-described DTS looped refinement and optimization functionality (shown in FIG. 5 as embedded within and made available by means of control signal/data flow Optimization Control 1108B within Platform-wide Controls and Interfaces 1111). These selection, assembly and other operations (including but not limited to those described in the preceding sections) may employ a variety of such techniques including but not limited to: i) looped optimization (as in the foregoing descriptions and in other sections of this disclosure); ii) comparative and self-modifying routines (as described in the foregoing and in other sections of this disclosure) where such content- and structurally-adaptive processes may include (but may not be limited to) compositional and structural modification routines (which may optionally include but may not be limited to self-modifying and/or self-transformational routines) where any or all such methods may be based (completely or partially) upon parameters that may be obtained by means of any or all of the foregoing methods but which may additionally include (but may not be limited to) any or all of the following methods and techniques): (a) external (in full or in part) to the current data (including parameters and/or operating parameters and/or rules that may be obtained from local and global data stores); (b) harvested (in full or in part) from the user input; (c) content-derived, content-adaptive, context-sensitive optionally based upon information that may be associated with the current data and/or upon and/or which may be related, referenced by or inferred from to any other data within or accessible to the system, where such information may be progressively modified in successive iterations, but such that any or all such parameter acquisition may (optionally, at any time in the execution process) operate autonomously and/or under full or partial user and/or system process control by means of interfaces, methods and procedures referenced in the foregoing.

FIG. 5 depicts (without loss of general applicability to other implementations) the results of such collective processing (and possibly repeated) operations as a composite output data stream Diverse Data Reference Frames 1131. This potentially variegated information flow, as may result from any or all of the foregoing methods and procedures and interfaces and other enumerated and implied capabilities, includes assembled collections of data elements that may, as described, be drawn from diverse and possibly divergent ontological frames as well as distinct domains within such frames. FIG. 5 provides a graphical representation of this diversity wherein the reference Elements from Ontology A thru Ontology Z 1133, a data collection reference subsuming representative data sources Data from Ontology A 1132A and Data from Ontology Z 1132B. For clarity, 1132A and 1132B are associate with data stores labeled Data Sources $A_a \ldots A_m$ and Data Sources Data Sources $Z_b \ldots Z_q$ where subscripts "a-m" represent domains defined within Ontology A and subscripts "b-q" represent domains defined within Ontology Z. As those fluent in these arts may see, this representation provides a non-limiting example of the composition of output information stream Diverse Data Reference Frames 1131. As shown, this data flow is ultimately depicted for convenience as data flow Selected Data Sets 1179A and presented as input to composite functional block Structure, Assemble, Filter, Normalize, Scale & Re-Reference Multi-Domain Data into Hybrid Domain DTS Reference Data 1180.

Block 1180 (in FIG. 5 and other figures) composes a collection of methods and procedures and interfaces that, in embodiments, provide methods by means of which users and system processes may integrate (potentially) diverse data (as described previously) into formats that are DTS-compatible, and which may be integrated within DTS Assertional Simulation Simulations and related operations. Thus, assisted by interfaces and procedures (as may be provided within control signal/data flow Platform-wide Controls and Interfaces 1111), users (and system processes) may invoke a variety of procedures including (but not in all cases limited to) those by means of which these possibly multi-domain input data sets within (or referenced by) Selected Data Sets 1179A may be rationalized, assembled, structured, filtered, normalized to one or more standard measurements or criteria. In this sense, data sets from across the system, including (but not limited to) one or more elements from data stream selected multi-domain data sets 1179A (as previously described) but also, in embodiments, one or more elements from existing Candidate Reference Data Models 159, existing Cardinal Reference Data Models 1155, as also previously described.

Note that any or all execution modalities and variations related to DTS content-sensitive and content-responsive methods and procedures and interfaces described in the foregoing may be incorporated within or accessed by any of the elements within block 1180 or similar functional collections. Further, as mentioned in previous contexts, any or all of the methods associated with Block 1180 may be supplemented, augmented and otherwise integrated with the DTS looped refinement and optimization techniques involving any of the data sources and structures described previously, as described previously, such that, in addition to any or all of the recasting operations described as optionally embedded and available within Block 1130, additional transformations may be invoked through the pervasive available optimization and looped refinement capabilities outlined in the foregoing. Such supplemental augmentation or refinement may result in deep and fundamental changes to the structure and composition of subject information such that the net functionality produces a derivative new or hybrid domain with new compositional and structural relationships.

Note further, however that, depending on the specific operations and context (as well as the structure and composition of the subject data), the methods and procedures and interfaces within Block 1180 and other DTS-based data related to and supporting such assembly operations are designed and conceived (in general) to provoke as little Shannon entropic loss as possible but rather, methods and procedures and interfaces involved in such operations (and others implied but not shown or depicted here) are, in embodiments, specifically constructed to preserve Shannon entropy by such (example) techniques wherein ontologically disparate and disjoint information may be redefined and re-referenced into one or more new and derivative hybrid domains thus creating a new but (nonetheless) derivative frame, rather than, for example, preserving a previous domain by eliminating new or transformed or by altering or otherwise reorienting that information for back-compatibility with an existing domain. In general, these derivative hybrid domains remain related to information from which they emerged due, in such cases, to a number of factors including but not limited to the content-centric nature of the (previously cited) re-organizational techniques. This ontological conversion should be understood in the context of the information-theoretic definitions and their practical application presented in the foregoing such that, in embodiments, the new reference frame may be synthesized based primarily (but not always exclusively) upon the content itself with (implicit or explicit) definitional structures composed within an (implied or explicit) vocabulary.

The results of such related to Block 1130 is output data stream Hybrid Domain Data Sets 1178A. These elements may be constructed as described using any of all of the foregoing functional blocks and the methods and procedures and interfaces and other elements composed therein, but, in embodiments, other such techniques may accomplish similar results, as those skilled in these arts may see. In all cases, any or all elements that may be composited within data flow 1178A may be stored by users (or system processes) for future use and/or recycling into such stored data repositories as Post-DTS Internal and External Data 1172B but may also be used as input in one or more optimization loops as described in the foregoing.

FIG. 5, however, depicts an example nominal and exemplary workflow wherein data flow Hybrid Domain Data Sets 1178A is presented to composite block Select and Compose Reference Data Models 1182, a selection stage subsuming a variety of methods and procedures by means of which users and processes (through interfaces referenced within control signal Platform-wide Controls and Interfaces 1111). The methods and procedures and interfaces subsumed within this functional block produce DTS-compliant Reference Data Models which in the general case are referred to within Candidate Reference Data Models 1205 depicted as the output of Block 1182 and subsequently reposed within eponymously named data store Candidate Reference Data Models 1206.

Note that in the previous statement that output 1205 from Block Select and Compose Reference Data Models 1182 provides "DTS-compliant Reference Data Models" but that, in embodiments, there may not be exact structural and compositional definitions for "DTS-compliance". These structures have no single definition but are largely defined by context and may be highly variable.

In any case, however, in a manner consistent with the free-flow of data and information within a DTS Platform 1000 architecture described here (a transparency subject to one or more access and/or computational constraints mediated by elements within and related to RAMS 1109), the constituents within data flow Hybrid Domain Data Sets 1178A is also saved to data store Existing Hybrid Domain Data Sets 1178B and is thereby made available for possible reuse in further steps in a current process or within additional assembly processes initiated and executed as described above (where this informatic structure and its constituent elements are subject, as usual, to the strictures mandated by RAMS and TCM Control 1109). Similarly, data flow Candidate Reference Data Models 1205 is both reposed within data store Candidate Reference Data Models 1155 but is also returned (or otherwise referenced within) data store Post-DTS Internal and External Data 1172B, again for potential reuse as in the foregoing.

Note that in embodiments of a Platform 1000 and the various forms of Assertional Simulation, any or all of the methods and procedures and interfaces depicted within FIG. 5 that relate to the creation and manipulation of Reference Data Models may also apply in contexts related to operations upon and related to any Assertion Model and to any Apportionment sub-Model. In this sense, the depicted arrangement, functionality and interconnection of computational, control and data storage elements in FIG. 5 (and the related explanatory text) represents but one possible approach by means of which embodiments of a Platform 1000 may be configured to assemble, parametrize and manipulate the structure and the composition of information embedded within any Models (and any ancillary information) as may be used in and by any of the various modes of Assertional Simulation. In this sense, therefore, while FIG. 5 depicts operations related to Reference Data Models, such operations may, without limit and in any context, be applied to other Models in a Platform 1000.

Thus, returning to FIG. 1, the other functional elements within composite block 1102 that focus upon Model creation and manipulation (Block 1113 and Block 1114) may likewise, in embodiments, utilize any or all of the processes depicted and described in connection with the example Reference Data Model functionality in FIG. 5, noting that such utility may be applied to those elements without limit (unless otherwise noted) and without loss of general applicability as a result of such functional and sequential variations and even of additional and/or adjunctive functionality, alternatives and augmentations that may be achievable by those fluent in these and related fields. Therefore, without limit, users and processes may also (and/or instead) apply similar (and/or additional but related) methods as have been represented and previously described in FIG. 5 to the creation and manipulation of Candidate Assertion Models and Candidate Apportionment sub-Models and any ancillary structures.

In general, however, Assertion Models and Apportionment sub-Models play distinctly different roles in various Assertional Simulation modes, and thus, users and system processes may not always use the same collection of methods and procedures and interfaces depicted in FIGS. 1 and 2 in the same manner and modalities when processing Assertion Models and Apportionment sub-Models as may be (and as may have been) employed for operations centered about and upon Reference Data Models. In the first case, in embodiments, Assertion Models and Apportionment sub-Models typically (but not always) evidence less diverse etiology, and thus, the resultant structural and ontological variegation and domain variability may be less prevalent than in some Reference Data Models if not explicitly more homogeneous.

Moreover, in embodiments and in certain applications of Assertional Simulation (and ancillary operations), Reference Data Models may (in some cases) tend to be manipulated less often than other Model types, irrespective of complexity and dimensionality, though in general, changes to Reference Data Models may tend (in some cases) to be more intricate and may tend (again, in some cases) to inhere more cross-domain and hybrid structures and compositions. Thus, in embodiments, and notwithstanding the potential intricacy of the associated operations (and although the methods and procedures and interfaces outlined in FIG. 5 (and others that may follow) apply to all Models and affiliated and ancillary elements), certain executable aspects may, in some operational contexts, tend to be more suited to Assertion Models and Apportionment sub-Models, especially certain types of construction and modification operations. In general, in embodiments of a Platform 1000, such differences may be at least partially addressed as a UX consideration (that is, as a human factor/functionality comprehension issue) as well as a UI problem (that is, as a graphical issue within a user interface). Note, however, that such seeming preferential application may be bound with context and instance, but that such non-limiting statements of modality-related preferential application are by no means definitive, though largely true, and in any case, certainly do not apply not in all variations within a Platform 1000 deployment.

There may be many such commonly applicable but context-sensitive operational aspects within Platform 1000, but one illustration of this tendency may be seen in processes associated with assembly of Hybrid Domain Data Sets 1178A (FIG. 5). While applicable to all Models, deployment of this collected functionality may, in some embodiments and in some contexts, entail less complexity for Assertion Models and Apportionment sub-Models than for similar operations related to Reference Data Models. While such variability reflects differences in the respective roles played by each Model in an Assertional Simulation, it also points to the fact that, while elements depicted in FIG. 1 apply to all Models, some functional modes may be more useful to users specifically engaged in tasks related the structure and composition of Assertion Models and Apportionment sub-Models. But note also that the previously described content-sensitive and content-responsive methods and procedures and interfaces which provide dynamic adaptivity in the disposition, execution and computation of information aggregated in such Models play a role in execution of this and related functionality, as well.

Another variation of this varied application of resources is depicted in FIG. 6 (and described in the associated text) and illustrates one manner in which contextual intentionality may be determinate in deployment and application of certain types of methods and procedures and interfaces in a Platform 1000. More specifically, FIG. 6 illustrates the elements involved in an example application of a type of looped refinement (as described in detail in the foregoing), one wherein users and system processes may employ a variety of methods and procedures and interfaces to create and evaluate successive versions Outcome Models based upon a single Reference Data Model. This is, of course, a commonly-encountered scenario but this non-limiting example illustrates execution of this seemingly basic application of Assertional Simulation by deploying a certain type of looped optimization. Forms of this operational configuration are embedded within the broadly-based and pervasive functionality depicted within block Manage Looped, Iterative and Recursive Operations 1105 and as disseminated by means of related control signal/data flow Optimization Control 1108B in FIG. 1 (and included within composite control flow Platform-wide Controls and Interfaces 1111). The operations included within this umbrella collection of methods may, as noted, entail complex, layered and multi-faceted computations, but in the present context, aptly qualify as exemplary of certain essential points in the current discussion since, in embodiments, such operations, regardless of potential complexity and irrespective of potential requirement of domain or analytical expertise, may also be executed by non-experts users in more basic operational modalities, but moreover, are applicable to all Model types and in many operational scenarios.

FIG. 6 illustrates a collection of methods and procedures and interfaces within the previously cited optimization operational rubric which permits users and system processes to engage one or more looped refinement optimization patterns by applying an Assertion-Apportionment pair (depicted as Assertion Model $A^i$ 11005, and (optional) Apportionment sub-Model Aj 11000A) to Reference Data Model 11004 and then invoking an instance of Assertional Simulation by presenting these Models as input to composite functional box Execute Assertional Simulation—Create and Manage Candidate Outcome Models 1116. The collection of methods and procedures within 1116 executes Assertional Simulation upon the subject models and produces as resultant output the data flow Candidate Outcome Model $A^i$, $A^j$ 1201B. Note that data flow 1201B is the current Outcome Model, where "current" in this context denotes that this edifice is the Outcome Model produced and operated upon within the currently executing cycle within a series of repeated (or looped) operations—though it should be noted that there may, in the limit, be only one cycle through the loop. Data flow 1201B reflects the results of the executed version of these particular structural and compositional configurations upon the Reference Data model, configurations embedded within the constituents of the current Assertion-Apportionment pair, where this structural and compositional form is designated as the $i^{th}$ and $j^{th}$ parameter-set applied to and reflected within Assertion Model A and Apportionment sub-Model A, respectively, where i and j represent integers denoting the index of a set of parameters by which means of which each Model (respectively) may be configured, reconfigured, adjusted or otherwise modified. Thus, upon execution of an Assertional Simulation by Block 1116 upon Reference Data Model 11004 using Assertion Model $A^i$ 11005 and (optional) Apportionment sub-Model Aj 11000A, the consequent output (Candidate Outcome Model $A^i$, $A^j$ 1201B) embodies a unique composite and derivative informatic structure which is the direct result of the parameterization of the progenitorial Models, an informatic edifice composing one potential form of an Outcome Model for this set of Assertional Simulations.

In the present non-limiting example, FIG. 6 shows that each successive Outcome Model (Candidate Outcome Model $A^i$, $A^j$ 1201B) may be evaluated by methods, procedures and interfaces within functional block Evaluate Candidate Outcomes 1192, where in this instance, there are two sources for parameter-types that are employed in the evaluative process, where these parameter-types are depicted in FIG. 6 as subsumed within input data stores Ideal Outcome 1190 and Fidelity Parameters 1191. As shown in the illustration, the sources for this information are denoted User and Manual Input 1173 and Internal and External System Input 1174. Inputs 1173 and 1174 may be understood, in embodiments, as related to and/or derived from functional elements composed within compound functional box 1101 in FIG. 1, and in particular, from composite blocks Manage Internal User Control, Interfaces and External Data and API Access 1104 and Manage Looped, Iterative and Recursive Operations 1105 (also in FIG. 1) where the control and data components may be constituted within one or more elements within control signal User and System Control 1108A and Optimization Control 1108B. In embodiments, control signals 1173 and 1174 (and other mechanisms of this type) may be dynamically and/or interactively configured and/or may be preset and/or may be derived from one or more internal or external control states (or sequence of states) and/or may be derived from and/or inferred based upon one or more computation resources (which may internal or external, as described in the foregoing), but, in context and in embodiments may also result from static and/or interactive user input, where in either case, such computational and control elements may actively monitor one or more elements the form and composition of any of the subject Models, the manner and means by which the looped revision of associated modification parameters or any constituent components may be applied or executed.

Note however, that while in this simple example, only two basic evaluative parameter fields are depicted, even in a modest illustrative case, parameter fields 1190 and 1191 may, in embodiments and in certain domain- and content-related (and other) contexts, contain (or require) potentially complex variables, dynamic content- and context-sensitive data and other abstracted criteria as well as conditional logic and other variables, data and executables, including (without limit) methods and procedures that may be adaptive to and/or may be otherwise responsive to any number of contextual stimuli including (for example) parameters related to the form and/or content of the subject Output Model 1201B. Moreover, in embodiments, degrees of computational depth, complexity and variety may be also be embedded within one or more pre-formed routines, where such aggregations may in, implementations, be included within a Platform 1000 as groups of one or more pre-configured functional components that may (without limit) be conditionally and/or selectively invoked, edited, disassembled and/or reorganized by one or more users and/or by system processes, while other instantiations may (without limit) also (and/or instead) permit users (or system processes) to originate and assemble such functionality. Note that, in embodiments, and in context such potential complexities may be invoked or applied or otherwise included for an number of reasons and modalities, including but not limited to: (i) permanently required (or conditionally accessible) depending upon user and/or system intentionality but possibly invoked conditionally (fully or in part) due to any reason, including without limit system state; results that may be embedded within (or implied by) one or more loop-dependent parameters, by one or more content-based or structural characteristics within one of more Models or related entities; (ii) transiently included within an arbitrarily occurring loop cycle such that the operations are configured in an otherwise basic modality but which may transition to invoke additional complexities based upon any or all of the reasons or conditions described in the foregoing but such that the relevant operations may be applied at user or system process option.

In addition, in embodiments of a Platform 1000, functional box Evaluate Candidate Outcomes 1192 and the related elements depicted in FIG. 6 may also (and/or instead) implement, support, access and/or expand to invoke more advanced optimization and related routines (that may be quite sophisticated) where such modalities may not be explicit in FIG. 6 but which may, in the context of the potential sophistication of DTS-embedded looped refined and optimization techniques may be appropriate and possible and, moreover, may be implied as appropriate or as alternatives (as those skilled in this type of optimization may see). In such enhanced contexts, the number and variety of applicable evaluative procedures may integrate, for instance (without limit) multi-variate, time-varying and dimensional parameters and conditionals (and subsume associated calculation mechanisms) and may produce and utilize complex and layered analytic components and dynamic mechanisms, where such variations may include (but may not be limited to): (i) application of such processing and analytic evaluation to and/or between one or more current Outcome Models and/or elements therein; (ii) to and/or between one or more earlier iterations of Outcome Models and/or elements therein; (iii) to and/or between one or more current Outcome Models and/or elements therein and/or between one or more earlier iterations of Outcome Models and/or elements therein; (iv) calculations and results-engendered modifications to any the aspect of the form or content of any of the constituent Models and elements therein, in all the modes expressed in the foregoing (including within the parameters themselves), where any calculations entailed within any of the foregoing computational modalities may result from computational focus upon only certain elements within and/or between groups of subject Outcome Models and other constituent elements as in the foregoing. Note, however, that while such optional additional complexity has been cited in the foregoing text as related to elements provided by and/or within composite block Manage Looped, Iterative and Recursive Operations 1105 in FIG. 1, further examples of such operations will be explored elsewhere in this disclosure.

In the present example in FIG. 6, however, the evaluative process executed by functional block Evaluate Candidate Outcomes 1192 consists of comparing the form and composition composed within Candidate Outcome Model $A^i$, $A^j$ 1201B to a synthetic archetype of its idealized (that is, its desired) form and composition. This archetype is shown as contained within data store Ideal Outcome 1190, an informatic structure based upon, received from or otherwise obtained from within one or more parameters and data elements delivered by means of input signals 1174 and 1173 as described previously. Note, however, that this "ideal" may not in all cases be formalized and stored in this manner but may, instead, exist in the mind or imagination of the user.

The parameters in 1190 are combined with parameters and criteria contained within data store Fidelity Parameters 1191 which, as in 1190 may be partially or fully initialized by the same input signals as in the foregoing (1173 and 1174). In this non-limiting example, these criteria provide the means by which functional block Evaluate Candidate Outcomes 1192 executes evaluation of the "fitness" of Candidate Outcome Model $A^i$, $A^j$ 1201B in conjunction with conditional block Sufficient Fidelity? 1193. Thus, one or more elements related to the form and/or composition within data store Ideal Outcome 1190 are evaluatively compared with those contained in Candidate Outcome Model $A^i$, $A^j$ 1201B based upon (but always limited to) both the previously described criteria on the one side and upon the degree of conformance to this "ideal" on the other (as obtained from data store Fidelity Parameters 1191 and as supplied by (but not limited to) any or all of the mechanisms described previously). The functional block that executes these measurement (Evaluate Candidate Outcomes 1192) signals the corresponding conditional Sufficient Fidelity? 1193 (shown here as separate though it may indeed be integral) and, if the current Outcome Model 1201B is adjudged to meet the "best" fit criteria of "ideality", it is routed to data store Final Outcome Model for Reference Data Model and Assertion-Apportionment Pair $A^i$, $A^j$ 1197, or alternatively, the Candidate Outcome Model $A^i$, $A^j$ 1201B is presented to composite functional block Revise Assertion/Apportionment Values and Structure 1194. In this latter case, one or both criteria within Assertion Model $A^i$ and (optional) Apportionment sub-Model Aj 11000A may be modified, changed or otherwise manipulated and the process is repeated until a best-fit is found or, in case of direct user interaction, as shown by control signals Apportionment Changes 1195 and Assertion Changes 1196, until the user (or group of users) are satisfied with the Outcome Model 1197 and/or one or more criteria in 1190 and/or 1191 are satisfied.

As shown in FIG. 6, whether or not the current Candidate Outcome Model 1201B is accepted as sufficiently apposite in form and composition to the user- or system-supplied "ideal", that version of 1201B and the associated Assertion Model $A^i$ 11005 and (optional) Apportionment sub-Model Aj 11000A are routed to and added to both the collection of Candidate Reference Data Models 1155 and to Post-DTS Internal and External Data 1172B.

Continuing with the high-level depiction in FIG. 1, composite block Compound function block DTS Assertional Simulation Operations 1103 also groups high-level representations of the main operational components, methods and procedures and interfaces by means of which a DTS Platform 1000 may execute the various aspects of Assertional Simulation and the related ancillary and enhancement operations applied to and upon the elements composing these Simulations. These operating elements include (in no particular or mandatory order of execution, computational sequence or precedence) the composite function blocks Execute Assertional Simulation—Create and Manage Candidate Outcome Models 1116; Manage DTS Competitive and Collaborative Simulation Environment with Optimization 1117; Select and Store Cardinal and Candidate Assertional Simulation Outcome Models 1118; and Manage Selection, Formatting, Processing of Models for DTS-based/DTS-enabled Analysis and Visualization 1119. As outlined in previous discussions of the pedagogical intent of FIG. 1 (and as may likewise applied to other high-level figures and depictions), the choices involved in communication of the particular aggregation and the nomenclature employed in the labels of the composite function blocks are non-limiting with respect to other arrangements and grouping but are nonetheless consistent with and correctly descriptive of an operational arrangement within an embodiment of a DTS Platform 1000. Thus, as in the foregoing, the arrangement within integrated function block 1103 is not the only possible combination, aggregation or grouping of the features and capabilities conveyed by functional blocks 1116, 1117, 1118, and 1119 (and the constituent elements within these boxes), and those versed in these arts may see alternative arrangements which may accomplish the same or similar operational goals. Further, as in previous (and subsequent descriptions) the present graphical depiction should not imply specificity or requirements with respect to execution order, sequence, priority, dependence or any other particular computational arrangement; nor should this depiction imply that any functional block is required but may, in general, be optional in some embodiments, except as otherwise noted.

The first composite functional block within 1103 (Execute Assertional Simulation Create and Manage Candidate Outcome Models 1116) subsumes the main methods and procedures and interfaces and other execution functionality related to Assertional Simulation. The components that compose composite functional block 1116 are expanded and discussed in subsequent descriptions and in accompanying drawings in this disclosure. Note, however, that control signal/data flow Selected Candidate Models 1115 depicts the data flow input that the collection of methods and procedures within 1103 (and the respective subsidiary elements) may receive from various Model creation, manipulation and parameterization stages in 1102 (and in variations and alternate depictions, from other sources). Note further that this depiction should not imply that only a single Reference Data Model and single Assertion Model (and optional Apportionment sub-Model) may be submitted in a DTS Assertional Simulation or related execution flow. In variations, and in operational contexts, multiple instances of these progenitors may be presented and/or accessed by 1116 or any other collection of one or more methods and procedures which may operate upon these elements (which may also be contained in other functional blocks both with 1103 and in aspects of the DTS Platform 1000). The specific number of such elements and the order of execution of any referenced functionality may, in embodiments, be determined and/or optionally inferred by multiple factors, including (but not limited to) any combination (without limitation) of the following: (i) user-mandated requirements as may be presented (non-exclusively) by means of one or more elements within functional block 1104 and control flow 1108A; (ii) system-mandated requirements as may be present or implied or otherwise impelled or conditionally mandated by information or control data that may (fully or in part) originate from within API-related functionality (as shown in functional block 1104 and control flow 1108A); (iii) and/or such system-driven requirements as may be derived from, as may be pursuant to or as may be otherwise involved with the execution of one or more aspects of subject Assertional Simulation(s) or otherwise related to information, data or control subsumed with Manage Looped, Iterative and Recursive Operations 1105 (as may be required by one or more operational elements to which 1108B may provide or receive input from the grouped functionality within 1103).

In addition, note that any or all of the informatic structures (and ancillary data or references) composed within control signal/data flow Selected Candidate Models 1115 (however constituted, as in the foregoing) may also be presented (or other made available through embedded or accessible interface structure) to any other operational block within a DTS Platform 1000, for any operational and contextual reason and not necessarily as a consequence of any particular computation or execution within or related functional blocks that simply produce Outcome Models and/or execute Assertional Simulations and related outputs, as may be contained with 1116 or any affiliated functions.

One example of such an alternative inter-process flow involves composite block Manage DTS Competitive and Collaborative Simulation Environment with Optimization 1117. In implementations, this block subsumes a collection of methods, procedures and interfaces primarily (but not exclusively) related to both competitive, collaborative and comparative operations but to the various optimization operations, including (but not limited to) the manual, automated and semi-automated contexts referenced in foregoing discussions and as outlined throughout this disclosure. Thus, Candidate and/or Cardinal Models of all types (Reference Data Model(s), Assertion Model(s) and optional Apportionment sub-Model(s)) from any generation, from any user and in any format or form may be presented to this collection of functions in this manner (subject to the mediated access control flow as executed by the control fabric depicted here as RAMS and TCM Control 1109 as may be non-exclusively mandated by Manage Recombinant Access (RAMS) and Topical Capability Mediation (TCM) (RAMS) 1106).

As may be noted by those familiar with and skilled in these and related arts, such interoperative flexibilities wherein capabilities and computational tasks and results within workflows may not always be single-purpose-directed nor simply directed to specific goals, at least not always directly. The integration of such workflow elasticity, variegation and combinatorial functionality in the context of the extended analytic capabilities and represent important extensions and enhancements to the relevant arts, but which are routinely provided within embodiments of DTS Platform 1000. User and system processes are able to execute many types of operations, in some contexts employing a wide variety of analytic and representational tools. Such capability illustrates the content-sensitive, content-responsive and context-sensitivity built within and fundamental to embodiments of Platform 1000, as discussed in the foregoing and as depicted in numerous figures and descriptions.

Continuing examination of composite block 1103, compound function block Execute Assertional Simulation—Create and Manage Candidate Outcome Models 1116 is shown here as both subsuming operations that execute Assertional Simulation upon Candidate Reference, Assertion Models and apportionment sub-Models to produce Candidate Outcome Models, but also as containing methods and procedure and interfaces that manage the storage and disposition of such entities. The choice to combine these discrete but related functionalities is mainly a graphical and pedagogic convenience in FIG. 1, one employed to convey the net activity of creation and management and, ultimately storage as embodied within implementations of a Platform 1000 and throughout the various modalities within and related Assertional Simulation. Various methods and procedures and interfaces that may be deployed in a Platform 1000 and others that may be involved in execution of these respective and other (possibly) related functions are presented and described in other figures and the accompanying text.

Given the interoperability between these representative blocks within composite block 1103, the primary focus of the functionality and the methods and procedures and interfaces depicted as grouped with grouped within functional block 1116 reveal an exemplary but not exhaustive collection of combinatorial modalities arising from various configurations of Assertional Simulations which ultimately result in creation of Outcome Models. Thus, block 1116 is aptly titled Execute Projective Assertional Simulation—Create and Manage Candidate Outcome Models, a moniker that conveys the overall functionality contained therein. FIGS. 11-14 illustrate variations on combinations of the constituent Models (and associated aggregations) may be selectively and non-sequentially invoked by users and system processes to execute Assertional Simulations of different types.

Note that for graphical and pedagogic purposes, in FIGS. 11-14 and in other figures which depict the arrangement and action of the progenitorial Models that contribute, in variations, to the consequent Outcome Models by means of execution of modalities of Assertional Simulation, the depictions include the Models themselves (and other functional blocks) but may not also show the plethora ancillary, supplemental and associated information aggregates that such operations may generate and which may accumulate over the course of an execution sequences, as well as such additional information as user and system notes, annotations, activity logs tags and other information that may be (or may have been) collected and/or harvested in any or all of the creative and constructive and modification activities associated with the creation of these informatic structures. Example depictions of such Model-associated information may be found in FIG. 3 (see composite functional blocks 1308, 1309, 1310) and in FIG. 4 (see composite functional blocks 1405, 1406, 1406 and 1408) and in the associated descriptions. Thus, in these and other relevant figures (and descriptions) where such ancillary information may not be explicit, in the absence of explicit statements and indications to the contrary, it may be assumed that these attached aggregations are included within the depicted operations and may be used as factors within any of the associated methods and procedures and interfaces.

FIGS. 11-14 reveal a novel extension within the teachings embodied within present invention, one that provides unique new capabilities to such varied technology-driven applications as modeling-simulation systems, business, operational, financial and mathematical analysis systems, adaptive communication systems, financial transaction mediation systems as well as the broad data management arena, to name but a few. In embodiments, a DTS Platform provides the systematic capability for users and system processes to initiate permutations of combinatorial, branched, conditional and/or sequenced modes of execution of Assertional Simulation upon optionally versioned Assertion-Apportionment pairs and Reference Data Models. In these modalities and computational configurations, users and system processes may invoke DTS-based (and/or DTS-enabled and/or DTS-accessible) methods and procedures and interfaces to apply one or more elements within the projective execution chain of Assertional Simulation between collections of one or more discrete and (usually but not exclusively) fully-formed Assertion-Apportionment pairs and collections of one or more discrete (and also typically but not exclusively) fully-constituted Reference Data Models to produce collections of Outcome Models, where each element within this results collection is associated with and reflective of an Assertional Simulation of a particular progenitorial Assertion-Apportionment pair upon a particular Reference Data Model. The combinatorial and/or sequential execution of Assertional Simulation using combinations of Models composed within these collections may be executed in a number of distinct possibly overlapping and, in variations, combined modalities, functional variations of a Platform 1000 that have broad application in application across a spectrum of markets.

Note that while FIGS. 11-14 reveal example variations of these modalities, others may be possible, and the exemplars depicted within (and others referenced by) these illustrations as well the accompanying text (and other relevant descriptions) are presented without foreclosing the general applicability to and within other configurations and capabilities and computational environments. Moreover, note, that, unless specifically noted, the operations depicted in FIGS. 11-14 (as in the foregoing) assume general and unconditional applicability of any or all of the DTS-based (and/or DTS-enabled and/or DTS-accessible) methods and procedures and interfaces described in this disclosure, including (but not limited to) those germane to and which may be applied to and which were cited in the context of the creation, assembly, manipulation of any variations of Reference Data Models, Assertion Models, and Apportionment sub-Models or any associated ancillary structures. In addition, the example embodiments described here share the applicability and utility of other methods and procedures and interfaces related to any or all of the content-sensitive and content-responsive, content- and context-adaptive methods and procedures and interfaces described in example implementations and example use-cases, as well as other execution and computational modalities associated with the mathematical composition of Models upon one another (as well as any other mathematical operations in such contexts) as may be utilized in the execution of variations of Assertional Simulation, including (but not limited to) those associated with any or all of the looped recursive optimization operations previously described.

In embodiments, therefore, the application of varieties of combinatorial "churn" to any or all of the elements constituting the aforementioned collections of constituent and progenitorial Models and the dynamic application of selected (and content-variable) modalities of Assertion Simulation may also be supplemented by the dynamic assembly (and in variations, in-context manipulation and modification and re-parametrization, as in the foregoing) of such combinations, though, as with other computational aspects within a Platform 1000, despite the many areas of commonality and the capabilities that permit conditional application of shared methods and procedures and interfaces, the divergent roles of Assertion-Apportionment pairs relative to Reference Data Models give rise to differences in the specific computational components and the order in which they be may be applied. Where applicable, such differences may be noted but may be achievable by those skilled in these arts.

Figure 11:
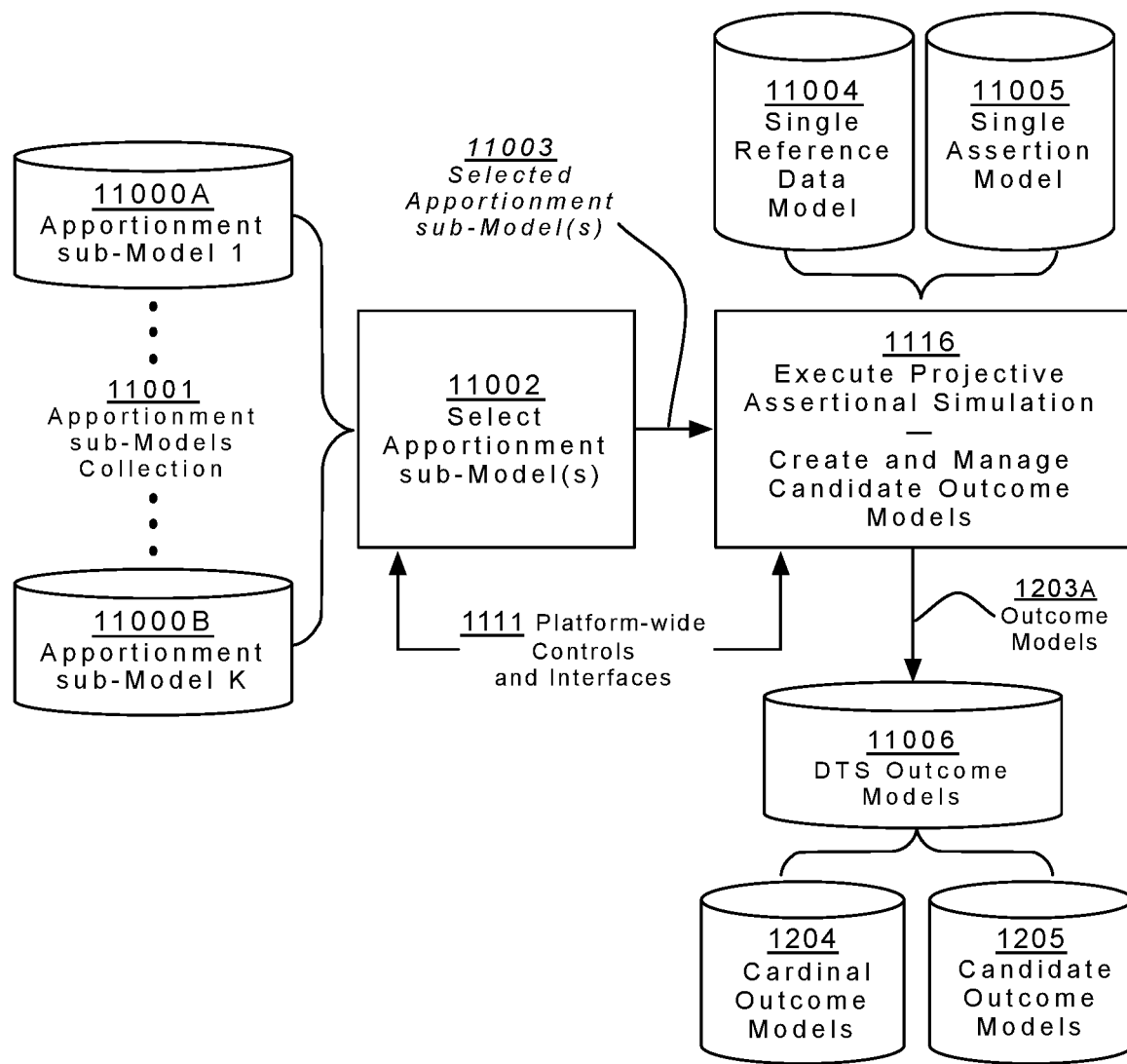
FIG. 11 illustrates the "single-Assertion-single-Reference" modality of DTS Assertional Simulation.
Figure 12:
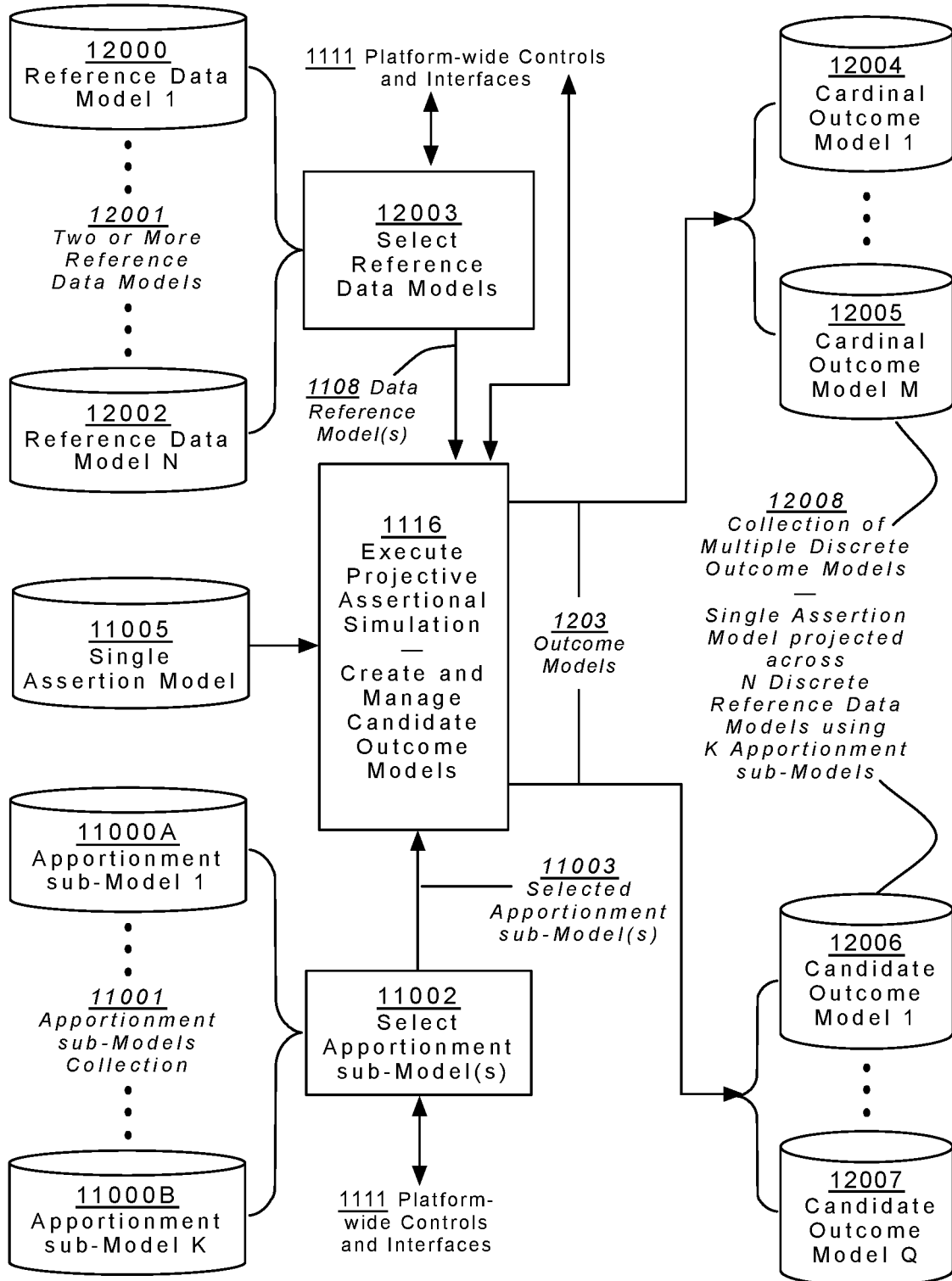
FIG. 12 illustrates the "single-Assertion-multiple-Reference" modality of DTS Assertional Simulation.
Figure 13:
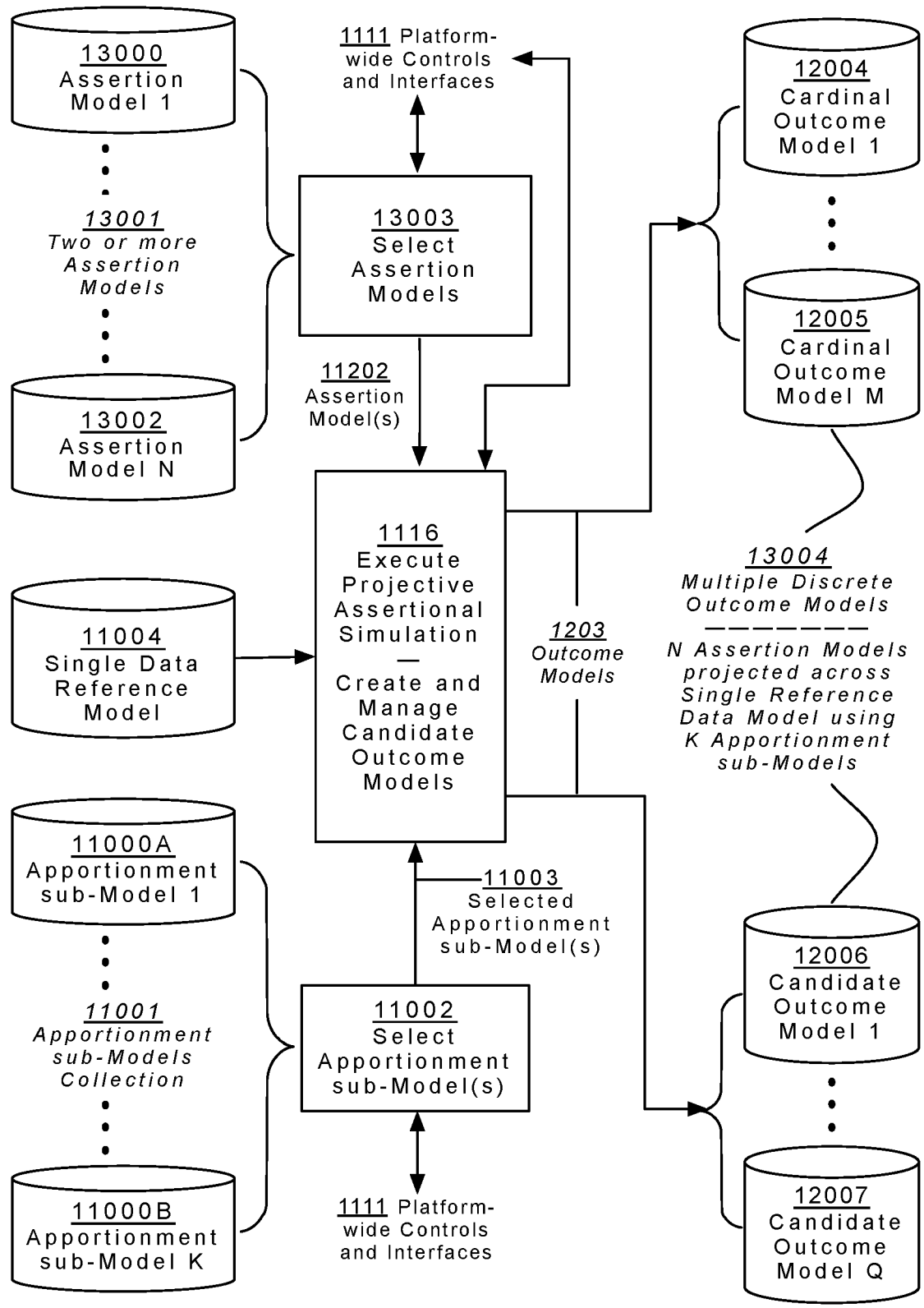
FIG. 13 illustrates the "multiple-Assertion-single-Reference" modality of DTS Assertional Simulation.
Figure 14:
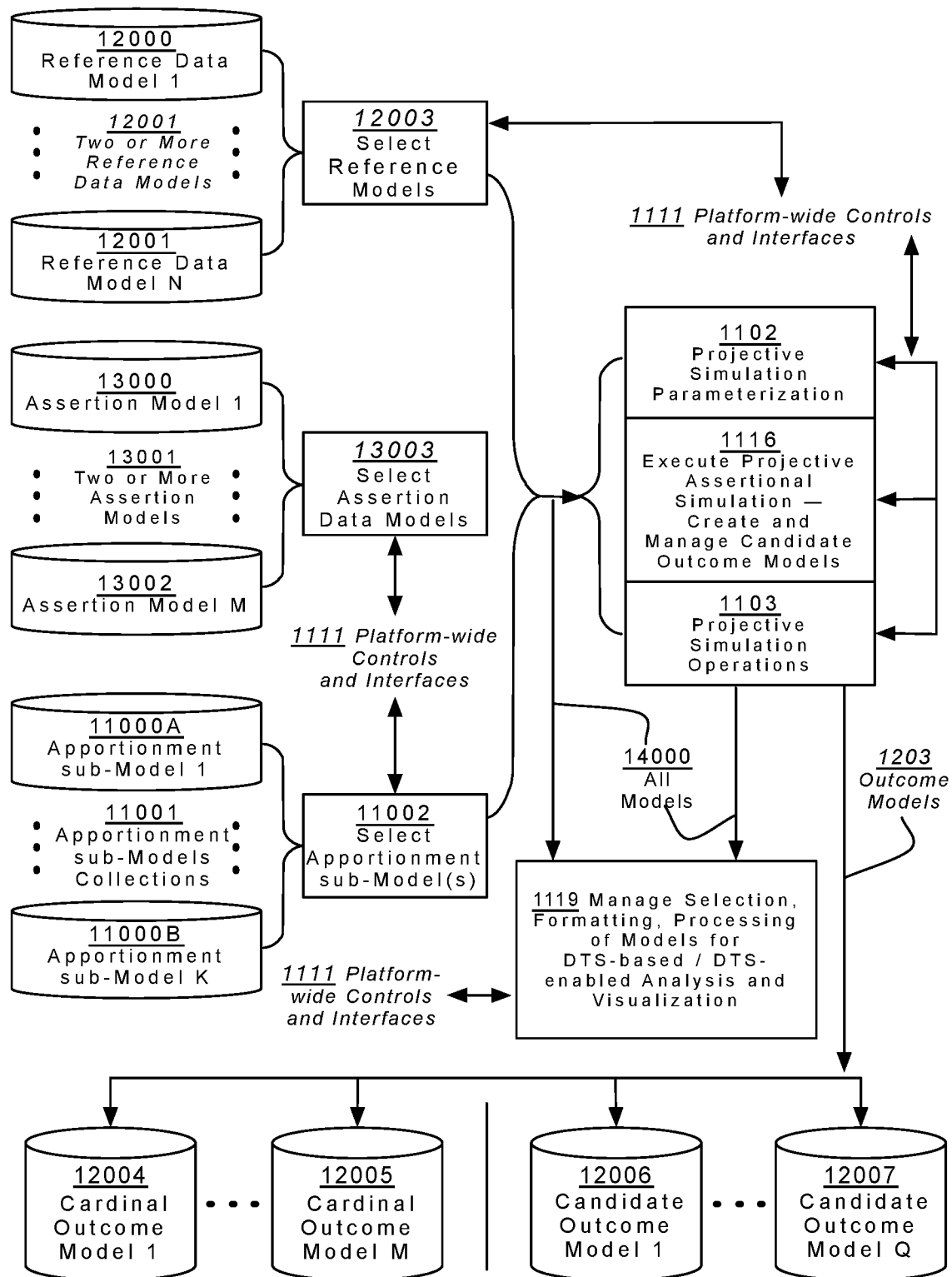
FIG. 14 illustrates the "multiple-Assertion-multiple-Reference" modality of DTS Assertional Simulation.

Referencing FIG. 11, the functional blocks and data stores (representing the progenitorial elements in an Assertional Simulation and its fundamental results) represent a basic and exemplary configuration of Assertional Simulation, one referenced directly and indirectly throughout the figures and descriptions within this disclosure and in various concrete implementations of a DTS Platform 1000 and which, in embodiments, serves as both a common configuration for Assertional Simulation but which also provides one foundation upon which other widely-varied and multiplicious modalities of Assertional Simulation may be built. Further, variations of Assertional Simulation described in other modalities as depicted in FIGS. 12-14 (as well as in other contexts, example and applications) may, in embodiments and some executional modalities contain one or more applications of the instance illustrated in FIG. 11. This relation does not diminish the utility, the breadth nor the novelty of those applications and configurations of the elements composing Assertional Simulation, since they are only optionally and partially derivative from the example elucidated in FIG. 11, with successor variations extending and enhancing that example instance-case.

FIG. 11 illustrates a modality of Assertional Simulation wherein there is one Assertion Model (Single Assertion Model 11005) projected upon a single Reference Data Model (Single Reference Data Model 11004) but where there may be a collection of one or more Apportionment sub-Models associated with and utilized in conjunction with the Single Assertion Model 11005, though, such associations occur as discrete one-to-one pairings in a given instance of an Assertional Simulation. As shown, users and/or system processes may select an Apportionment sub-Model though functional block Select Apportionment sub-Model(s) 11002, where, as with other descriptions and example implementations and modalities, the pervasive compound control/data flow Platform-wide Controls and Interfaces 1111 provides the required selection interfaces and parameterization information and capabilities as well as interface and functionality to previously-described platform-wide services such as, for example, APM and RAM mediation and the variety of methods and procedures and interfaces that harvest, store and compute in-app activity metrics and compile and maintain related logs. As depicted in FIG. 11, the collection of K Apportionment sub-Models from which a given instance of Apportionment may be chosen is illustrated as composed of instances Apportionment sub-Model 1 11000A through Apportionment sub-Model K 11000B where this collection is designated by callout Apportionment sub-Models Collection 11001.

The output of functional block 11002, a data flow labeled Selected Apportionment sub-Model(s) 11003 provides the input to functional block Execute Projective Assertional Simulation—Create and Manage Candidate Outcome Models 1116, the collection of DTS-based (and/or DTS-enabled and/or DTS-accessible) methods and procedures and interfaces described in foregoing as well as in subsequent figures and texts. In conjunction with the Models 11004 and 11005 (the previously cited single-instance Reference Data Model and Assertion Model, respectively), block 1116 generates the associated Outcome Model associated with the application of Assertional Simulation to the particular instances of Models 11004 and 11005 using the currently selected Apportionment sub-Model. This result, labeled data flow Outcome Models 2103B is placed within a general data store DTS Outcome Models 11006. As discussed in other contexts within this disclosure and in various concrete implementations of a DTS Platform 1000 (see FIG. 2, for example, and related discussions and subsequent examples and explanatory text related to composite functional block 1117 titled "Manage DTS Competitive and Collaborative Simulation Environment with Optimization 1117"), in this non-limiting example, Cardinal Outcome Models 1204 and Candidate Outcome Models 1205 may be selected from a data store such as 11006, noting again that the DTS-based (and/or DTS-enabled and/or DTS-accessible) methods and procedures and interfaces that execute such selections occur in many modalities and in many computational contexts in a Platform 1000 and that many alternate and functionally equivalent implementations may be used.

This mode of Assertional Simulation (referenced in DTS-terminology as "single Assertion-single-Reference" (noting the optional application of varied Apportionment sub-Models)) has many subtle variations and wide utility across a diverse range of applications, including, as noted, in non-DTS systems. This wide-ranging versatility is evident even in this most elemental form but note that there are a number of variants of this modality, extensions that are largely (but not exclusively) derived from several premises. These premises or stipulations influence and, in some cases, determine a variety of structural and algorithmic arrangements and combinations in associated execution chains. Note that the stipulations in the following paragraphs (and in other sections of this disclosure) are presented in the context of an explanation of the various modalities of Assertional Simulation and, in this connection (or others), are not intended to be exhaustive; nor do they encompass all other operating principles that may apply (in contexts and by degree) within embodiments of a Platform 1000, noting that such operating principles may not in all cases be explicitly described in the example implementations within this disclosure but may nonetheless be evident in various concrete implementations of a DTS Platform 1000 and may be present or achievable by those fluent in these arts.

Recall, however, that, as explained in previous descriptions of certain qualities of DTS models, in embodiments, the relationship between an Assertion Model and its associated Apportionment sub-Model implements a variant of logical association known as a hypostasis (or subjectal abstraction). The novel application and extension of this principle in DTS (called DTS Subjectal Coercion) is manifested in the fact that the nominal user- and/or system-supplied values associated with informatic nodes within an Apportionment sub-Model supply "ground truth" values (or "perceived-as-true" values) to corresponding elements within a "governing" model (where, in the present example, this "governing model" is an Assertion Model). The application of these principles (aptly described and often utilized in Category Theory) in concrete form is the basis of the DTS-based nomenclature that designates Apportionment structures as "sub-Models" in that sub-Models implement such a subjectal coercion (as described) and are thus definitionally reflective of its associated "governing" Model, where, as stated, for convenience, in these and other examples, the associated "governing" Model refers to the Assertion Model but which may, in variations, refer to other informatic structures such as, for example, a Reference Data Model.

Note, however, that in the novel application of DTS Subjectal Coercion, in embodiments and in some contexts, the time base within a given instance of the Assertion-Apportionment pair governed by the deterministic relational principles outlined here may exhibit any or all of the previously described eccentricities, asymmetries and discontinuities (and other time- and alternate-dimensional-related non-periodicities) where such irregularities may be asymmetric and disjoint in relation to the explicit or inherent time-or-alternate dimension-based delimitations within one or more Reference Data Models. Further, note that such eccentricities (or all types) may result from and/or may be derived from one or more properties within either the sub-Model or the governing Model or within both. Thus, in embodiments, any and all of the previously described time- and alternate-dimensional-base functionality may be applied in these instances and the variations cited and implied in this disclosure.

Thus, in view of both the foregoing considerations and the non-limiting presentational convenience of designating the Assertion Model as the governing entity for the relation mediation coerced by DTS hypostatic abstracted upon Apportionments sub-Models (noting, as well, that, in practice, the pairing of Apportionment sub-Models with Assertional Models is more common), it may be seen that the structure of informatic nodes within an Apportionment sub-Model reflects the form and structure defining the associated Assertion Model, either directly or, in variations, in equivalent forms which may, for example, result from application of one or more provably bi-directional lossless transformational operations, noting again that, in some variations, the DTS-specific application of DTS Subjectal Coercion may instead reflect the form of one or more Reference Data Models or other informatic aggregates.

The first premise or stipulation is that each instance of this type of Assertional Simulation ("single Assertion-single-Reference") represents a discrete execution event where the unique end-point produced by these computational operations is a particular instance of an Outcome Model resulting from the application of the unique-to-that-instance Assertion-Apportionment pair upon a given instance of a Reference Data Model. But note that the uniqueness of this Outcome Model is based not only on the singular computational association of the particular Assertion-Apportionment pair with that particular Reference Data Model but that the Outcome Model may also be distinguished by the composition, sequence and parametrization (and other factors) of the content-sensitive and content-responsive methods and procedures and interfaces selected and applied, as described in the foregoing. Thus, Outcome Models are bound not only to the precedential Assertion-Apportionment and Reference Data Model instances from which they are produced but also to the computational and execution context and algorithmic structures, conditions, sequences and internal parameters by means of which the simulation was executed.

This first premise leads to a second but largely derivative stipulation wherein both the parameters within the Apportionment sub-Model and the particular set of content-sensitive and content-responsive methods and procedures and interfaces in any given Assertional Simulation jointly provide the point of distinction differentiating each such execution instance from other such instances but that the singularity of this Apportionment sub-Model instance applies only with respect to those particular Assertion and Reference Data Models and the means by which the Outcome Model is produced. Thus, an Apportionment sub-Model need not be identically unique across all instances of Assertional Simulations. These stipulations are illustrated by the fact that the Outcome Model produced by a particular parametrization within an Apportionment sub-Model and applied to a given Assertional Model-Reference Data Model pair using a particular suite and sequence of methods (and parameterization uniquely spawned or harvested for this instance) is unique and distinct from an Outcome Model produced by application of an identically configured (and even duplicate) Apportionment sub-Model using either a different Assertion Model or a different Reference Data Model (or both) and/or a different assembly and/or parameterization of execution mechanisms, even in the event that the respective Outcomes may be nominally identical in all respects.

Among the consequences of these stipulations is a further provision that the instance-unique constituent Models and the instance-unique collection and sequence of parameterized execution mechanisms assembled for a given execution instance combine to produce a member within a collection of Outcome Models that binds these progenitorial or, in DTS-terminology, "ancestral" Models and associated procedures, parameters and execution sequences in an identity-unique association. In conjunction with the antecedent stipulations, this associational imperative provides one set of pervasive and foundational operating principles and contexts within which and by means of which DTS-based (and/or DTS-enabled and/or DTS-accessible) methods and procedures and interfaces systematically instantiate the various applications and modalities of Assertional Simulation (and associated and ancillary operations).

These foundational operating principles apply, in embodiments, across the entire range of functionality and services provided by and within a Platform 1000. One tangible example result may be seen within embodiments of the previously described Associational Process Management (APM) skein wherein these stipulations may confer a variety of organizational and algorithmic mandates as well as parameters for operating variables upon the DTS-based (and/or DTS-enabled and/or DTS-accessible) methods and procedures and interfaces that provide and maintain indexing and identity management for the elements that compose such instances. Such mandates and variables may, in embodiments, also be conditionally applied by degree based upon one or more system and/or user-mandated conditions as well as upon elements that may be derived from or required by or within the current application or execution context. These conditionally applied services include maintenance of one or more aspects that define the binding of constituent Models and procedures as described above but which also maintain and apply such system-mandated and platform-wide capabilities as RAMS-mediated access and execution capabilities and the skein of entity ownership that may apply to any of the elements within such Models as well as to the applied methods and parameters. The execution-driven (or event-derived) associations mandated in the third stipulation, for example, may be integrated within and mediated by not only the APM-mediated ownership indexing capabilities (as described previously) and the previously-cited RAMS capabilities but may also impel RAMS and other capabilities to spawn entity association certificates (or the equivalent), as described in this disclosure including (but not limited to) user-to-process, process-to-process, process-to-data and data-to-data association certificates which may be integrated within the DTS certificate-interconnection and certificate-enchainment schema, as described in subsequent paragraphs.

In a further example, while the associative details described in the preceding paragraphs may, in variations, be preserved in one or more associational certificates spawned and maintained within the APM and RAMS system access mediation system, all of the foregoing may be executed in the context of and in association with the previously described looped, iterative and recursive operations and made available through composite functional box 1105 (see FIG. 1) and distributed within the system-wide control/data flow 1108B (titled "Optimization Control", also in FIG. 1) illustrated in the figures and descriptions within this disclosure and in various concrete implementations of a DTS Platform 1000 as subsumed within control/data flow 1111 ("Platform-wide Controls and Interfaces 1111"). Note that in such contexts, any or all information created or derived as a result of the platform-wide mandates and variables described in the foregoing may be preserved and indexed, a DTS feature that, as mentioned in prior discussions, comprises functional increases in the Shannon entropic richness, depth and density of probabilities associated with representations of this information. Such enrichment may be utilized by DTS-based (and/or DTS-enabled and/or DTS-accessible) methods and procedures and interfaces which may apply a variety of mathematical and algorithmic and analytic and transformation techniques, including (but not limited to) statistical analysis, pattern detection, feature extraction, content- and context-derived parameters that may be applied to machine learning and adaptive mechanisms. Note finally, that any or all of the information derived from or related to any of the foregoing, including the association of assembled processes and Models (and the users and other entities involved in such execution instances) may be included within the previously described platform-wide in-App metric capabilities where such additional information may then be used in any or all of the responsive capabilities provided within a Platform 1000, providing a suite of self-reinforcing content- and activity- and context-derived feedback mechanisms, as described in other parts of this disclosure.

In the current context of FIG. 11 and the explanation of the "single Assertion-single-Reference" modality of Assertional Simulation, let a collection of instances of Single Assertion Model 11005 be called $AS_{A\text{-}thru\text{-}M}$ and let a collection of instances of Reference Data Model 11004 be called $RDM_{A\text{-}thru\text{-}Q}$ where "A" represents 1) an index of an instance of an Assertion Model within M possible instances; and 2) an index of an instance of within "Q" possible instances of Reference Data Model. Let a user (and/or system process) create Assertion Model $AS_A$ and assembles $RDM_A$ (using any or all of the previously described DTS-based (and/or DTS-enabled and/or DTS-accessible) methods and procedures and interfaces). Then, using the capabilities provided by block 11002, let the user select an instance from Apportionment sub-Models Collection 11001, in this case Apportionment sub-Model 1 11000A (called here $APP_1$). Finally, let DTS-based (and/or DTS-enabled and/or DTS-accessible) methods and procedures and interfaces select a sequenced composition and parametrization of content-sensitive and content-responsive methods and procedures and interfaces (as described in the foregoing) called $E_{A\text{-}A\text{-}1\text{-}X}$ where the subscript A-A-1-X designates the execution of Assertional Simulation using configuration X of composition and parametrization arrangement E (where X represents an instance drawn from the combinatorial total of Z possible configuration arrangements). Thus, upon invocation of block 1116, this combination produces Outcome Model$_{A-A-1-X}$. Referencing FIG. 11, note again, however, that, in this case, there is only one Outcome Model, so the Cardinal and Candidate Outcome Models 1204 and 1205 are identical, though, in embodiments, as noted, methods and procedures and interfaces within the APM indexing schema may instantiate two copies of this associational collection (where one would be designated Cardinal and one Candidate) or may annotate the elements as comprising execution collection $E_{A-A-1-X}$ as well as the progenitorial Models as associated with both a Cardinal and Candidate Outcome Model.

Finally, note that under user- and/or program-based control (as described in the connection with FIG. 6 or other variation of iterative and recursive operations), this procedure (and any of its many variants) may be repeated with successive application of instances from the collection 11001 (Apportionment sub-Models Collection 11001) against the same instances of Assertion Model $AS_A$ and Reference Data Model $RDM_A$, where each Apportionment sub-Model may be modified and re-parameterized (using any or all methods as described), thereby producing a collection of Outcome Models, indexed as Outcome Model$_{A-A-1-X}$ through Outcome Model$_{A-A-K-X}$. Thus, in the first combinatorial case, where only the Apportionment sub-Models are successively applied in the execution sequence, users and/or system processes may select a Cardinal Outcome. But note that, again, under algorithmic or user control (or a combination), the execution configurations X-Z may be applied successively against each such instance, creating a superset of the collection of previously referenced Apportionment sub-Model-only Outcome Models (and the associated progenitors, as described), which in this example may be indexed as a collection of Outcome Model$_{A-A-1-X}$ through Outcome Model$_{A-A-K-Z}$. Further, in variations, the Reference Data Models may also be adjusted, and the combinatorial sequence re-executed, yielding another superset encompassing Outcome Model$_{A-A-1-X}$ through Outcome Model$_{A-Q-K-Z}$, where, as before, all of the progenitorial Models and each execution configuration and parameterization may be preserved. Finally, the Assertion Models may also be changed, but this may result in a large increase in the combinatorial complexity due to changes that may be required in each associated Apportionment sub-Model as a result of structural changes in the Assertion Model, a consequence of the previously referenced relation-mediating DTS Subjectal Coercion coerced between these informatic structures. Thus, for each change in Assertion Model, there may be a full set of execution cycles for each variation for each parameter in the associated Apportionment sub-Model. Thus, in the limit, there may be M variations of the Assertion Model which would mean that there would be M instances of each of the K Apportionment sub-Models which must be applied in Z execution parameterized configurations against Q instances of Reference Data Model, where again, in embodiments all the antecedent Models and execution configurations (as well as any ancillary, supportive and other related information) may be preserved and indexed as described previously and may be subject to and/or included within any or all of the optimization, APM, RAMS and in-App activity measurement facilities available within a Platform 1000.

Note that, in the limit, this example can, in some situations, yield a large number of Outcome Models (and ancillary information, as in the foregoing). Using combinatorial math, in this example case, if there are 5 instances of each variable, these operations would yield 27,405 separate instances of Outcome Models. In the context of certain types of Assertional Simulation, such combinatorial results are not unusual and efficiencies in computation and storage may be implemented and optimized but illustrate one manner in which one or more elements within the previously described platform-wide capabilities may be applied. Additional and increasingly complex variations may be easily seen wherein, in a non-limiting example among many possibilities, an Outcome Model may be dynamically substituted as a Reference Data Model in the context of any such operation and an entirely new branch of the layered looping sequence may be created. This one example of how the layered combinatorial looping in this modality may substantially increase the array of Outcome Models and the associational bindings, and, in embodiments, DTS-based (and/or DTS-enabled and/or DTS-accessible) methods and procedures and interfaces may be supplied which specifically address not only ways to accommodate and manipulate such growing amounts of computations and information but which may be used to aid in realization of one or more of the goals of the execution, including those outlined in subsequent paragraphs (and elsewhere in this disclosure) such as for example, selection of Cardinal and Candidate Outcome Models 1204 and 1205 (in FIG. 11 and other figures).

Note as well, however, such combinatorial enrichment of information may result from another common mode of execution of Assertional Simulation wherein, given any or all of the above combinations, separately parametrized Apportionment sub-Models may be applied with a given Assertion Model not only upon the entire Reference Data Model (as described in the preceding paragraphs and in examples throughout this disclosure) but also (or instead) upon one or more nodes within a given Reference Data Model. This variation is discussed in more detail in reference to FIG. 12 in subsequent paragraphs, but in the present connection, such additional and/or supplemental computations may be contextually invoked either in a standalone sequence or within the context of any variation of the combinatorial operations in the present example (as well as within looped recursive optimizations, as referenced). The criteria for selecting methods as well as the types and variety of parameterizations within the selected Apportionment sub-Models as well as which Assertion Model is selected (which in turn will change the type of Assertional sub-Model and the relevant parameterizations) may be determined or influenced or otherwise modulated, directly or indirectly, by such factors including (but not limited to): user- and system-provided input; compositional and structural context and parameters as may be derived or inferred by means of content-sensitive and content-responsive methods and procedures and interfaces (as in the foregoing); and any of the other products or results that may be derived from or inferred from any of computational instruments described in examples and descriptions throughout this disclosure. Note as well that application of this variation may, in the present combinatorial example, increase the number of possible Outcome Models but also may increase the diversity and richness within this collection, further contributing to the overall increase to the Shannon entopic richness, as described throughout this disclosure as a pervasive feature in implementations of DTS Platforms. Finally, as discussed, any and all such information (and derivatives of such information) may be gathered and included within other related and non-related calculations including those connected to the computation on in-App activity metrics and the system-wide adaptivity, as described in the foregoing.

Note, however, that these predicates reference, highlight and exemplify another novel aspect of the DTS Platform: the multi-factor, multi-layered and dynamic and evolving adaptivity that pervades its constituent methods and procedures and interfaces. This may be seen in many examples through this disclosure and in concrete implementations of one or more components of a DTS Platform 1000, but in the present context, note that since each execution sequence that results in an Outcome Model is produced as a result of a unique-to-that-instance association of certain data and parameterized and sequenced processes (association that in some in some cases, include one or more users) and since this association is tied to an end-point (the Outcome Model) which has or may be given or assigned a normative disposition by users and/or system processes (where one such example is the designation of one Outcome Model as Cardinal over other Candidates or the ordering of a collection of Outcome Models by any number of user- and/or system-supplied criteria this yielding a normative ranking of the Outcomes) and since the details composing this association-skein-to-end-point are now indexed as such a set (and which, in embodiments, may be also be memorialized or preserved within one or more RAMS-administered associational and/or event certificates or the equivalent), DTS-based (and/or DTS-enabled and/or DTS-accessible) methods and procedures and interfaces within the in-App activity measurement and metric capabilities, as described, may integrate all or part of this information or derivatives thereof, providing variables and parameters that may be used by users and processes throughout a Platform 1000, including, for example, by pattern detection and recognition techniques and facilities. Such capabilities and results may, in embodiments, be utilized in many aspects of the system but in the present exposition of the DTS-unique adaptive capability may be employed to dynamically modify, reparametrize, adjust, prioritize or otherwise modulate any of all of the operations within any DTS-based (and/or DTS-enabled and/or DTS-accessible) methods and procedures and interfaces. In embodiments, therefore, such widely-based closed-loop adaptivity (and other variations in which such activity and results harvesting may be utilized) may also evolve over time and/or based upon usage and, in variations, may be based upon or may integrate factors derived from other instantiations of DTS Platforms 1000. Moreover, such evolving functionality may integrate many types of ancillary information and processing capabilities, such as, for example, direct and topical user input and inferred information that may be derived from many variations of statistical analysis, AI and machine learning system expert-systems.

The variations of multi-layered concatenation and combinatorial substitution and iterative and recursive looping that may be applied in both simple and complex configurations within the "single-Assertion-single-Reference" modality of Assertional Simulation is a common operational mode within activities in a Platform 1000. While at the limits, in embodiments and contexts, especially as may be deployed in machine learning and recursive derivation of Outcome Models (variations of which are explored in connection with Assertional Simulations illustrated in FIG. 14 and in other examples and descriptions of DTS throughout this disclosure), applications and associational-contexts, users and system processes may also be engaged in simpler forms where, for example, users (or system processes) may seek to select Cardinal and Candidate Outcome Models 1204 and 1205 (in FIG. 11 and other figures). Note, however, that, in embodiments and some contexts, there are numerous modalities within which the 1204 and 1205 may be selected, and in some instances, the means and mechanisms that animate such selection are related to not only the context within which the instances of Assertional Simulation(s) are executed but also to both user- and system-driven intentionality, but also based upon or derived from factors embodied in the nature, structure and composition of the respective Models.

In one non-limiting example, in embodiments, the structure and composition of Models and the execution modalities may be explicitly configured to reflect a context-derived and/or a user- or system-driven intentionality (harvested or derived implicitly or explicitly) that requires selection of a single Outcome Model as Cardinal while any other example instances that have been spawned within such a goal-oriented cycle are designated as Candidate Models. As discussed, this comprises the zero-sum game case (one winner) and, in embodiments, user interfaces and system modalities may be conformed to assist in the configuration and execution and optimization of this type of result, or, stated differently, for modalities (sometimes optionally) configured to produce a zero-sum outcome.

In other modalities, Assertional Simulation may be configured in other game-theoretic modalities, and, as in the zero-sum case, relevant user and system interfaces may optionally (and even dynamically) accommodate and facilitate such activity. Thus, in embodiments and in certain operational contexts, any or all of the foregoing methods to evaluate Outcome Models (as well as others that may contribute to such evaluative processes) may be contextually or statically configured to yield comparative results rather than zero-sum winners of losers, the so-called non-zero-sum case wherein instances of Outcome Models within collections of such Models may be ranked or evaluated relative to other such instances (within and/or outside the collection) based directly or indirectly upon any or all of the following non-limiting cases in any combination: i) relative to one-another based upon one or more factors within and/or external to the Outcome Model instances, yielding one or more ordered lists; ii) relative to one-another in relation one or more user- or system-supplied-criteria or derivations of such criteria; iii) relative to one or more aspects internal to or derived from or otherwise related to one or more aspects within other instances as in i) and ii) above; iv) relative to one-another as i)-ii) above but additionally on the basis of information which may be inferred from or which may be based within one or more synthetic or idealized instances of Outcome Models where, in embodiments, such idealized instances may be selected and/or created and/or modulated and/or otherwise instantiated by users and/or system processes from prior Outcome Models (using one or more aspects in i)-iii) in the foregoing) and/or by other means and based upon information extracted from, derived from or otherwise contained directly or indirectly from or within any of the foregoing including but not limited to: a) from any or all of the elements within or associated with the relevant progenitorial Models; b) and/or from any collection of associationally-bound parameterized, sequenced methods; c) and/or from one or more elements within or which may be derived or inferred from such parameterized, sequenced methods; d) and/or from any combination of a)-c) above of inter-instance progenitorial Models and/or parameterized, sequenced methods. But note, as well, that in embodiments, such operations may also optionally and dynamically include all or part of any of the foregoing from one or more sources outside the subject instance of a DTS Platform 1000, including from other separate (but possibly related) instances of DTS Platform 1000.

Thus, in embodiments, the evaluation criteria in these non-limiting examples may be used in the context of a wide variety of DTS-managed non-zero-sum game states and conditions and may be employed in a variety of applications of Assertional Simulation, including cases involving evaluation of business initiatives, the apportionment of resources within levels of a taxonomic tree and in transaction facilitation environments. The game theoretic aspect of functionality, elements and components throughout a Platform 1000 as instantiated in DTS-based (and/or DTS-enabled and/or DTS-accessible) methods and procedures and interfaces is discussed in numerous contexts and example implementations within this disclosure, in general but not always in connection with composite functional block 1117 ("Manage DTS Competitive and Collaborative Simulation Environment with Optimization 1117") in FIG. 1 and other figures.

FIG. 12 illustrates an example configuration of the modality of Assertional Simulation that encompasses certain applications and variations of the "single-Assertion-single-Reference-Model" modality. These cases fall within a collection of execution chains within a Platform 1000 called the "single-Assertion-multiple-Reference-Model" modality of Assertional Simulation. In certain respects, it may appear that this modality is a subset set of the previously described combinatorial variation within the "single-Assertion-single-Reference Model" modality, and in some ways, at least in principle and in some execution details, this may be true since, in some variations of the previous case, a single Assertion Model may be composed upon successive instances of Reference Data Models using any or all instances of variously parameterized Apportionment sub-Models. But the "single-Assertion-multiple-Reference-Model" modality in FIG. 12 depicts this specific instance in more detail in a non-limiting example form, and is indicative of the fact that, in embodiments, not only is this is a common mode within and available to numerous applications in various execution modalities and contexts of Assertional Simulation but that, as in other cases, specific user interfaces and user- and system-driven capabilities may be optionally and dynamically or statically provided to facilitate and enhance this modality.

Moreover, the "single-Assertion-multiple-Reference-Model" modality differs from the earlier instances in that in many such cases, the collection of Reference Data Models may not be permutationally spawned as may be done in many (but not all) instances in the context of the previously described layered looping execution chain. Rather, in this modality, the subject Reference Data Models may already be pre-formed and designated previously as either Candidate or Cardinal Reference Data Models, noting that any or all elements within these Reference Data Models may have been developed or generated or manipulated or otherwise transformed previously (or, in variations, in the context of one or more executions cycles in the present example) by means of any or all of the methods and procedures and interfaces described in the foregoing. In any case, one aspect (but as may be seen, not the only aspect) that distinguishes the example configuration of Assertional Simulation depicted in FIG. 11 from the current modality is this delimitation in combinatorial possibilities.

Finally, in this modality, a common execution mode, referenced in the previous example, allows users and/or system processes to create one or more Outcome Models as a result of the application of a series of separately parametrized Apportionment sub-Models (with a Single Assertion Model) upon one or more discrete elements within the subject Reference Data Model rather than upon its entirety. This variation produces a type of variegated Reference Data Model wherein a variety of parameterizations within various Apportionment sub-Models are coerced throughout the Model, a variation of mathematical composition and, in some contexts, of the DTS informatic convolution described in the foregoing. Though this variation of Assertional Simulation was briefly referenced in descriptions of the previous modality, in the present configuration ("single-Assertion-multiple-Reference-Models"), this modality, in certain embodiments and application in such embodiments, may be more common and may, indeed, constitute a prominent feature of this type of Assertional Simulation, a possibility that may be evident in example applications of the capabilities and functionality provided by and within a Platform 1000 illustrated throughout this disclosure.

Note as well, however, that, in embodiments, any or all of the previously described capabilities and interconnected platform capabilities that may be applied in the "single-Assertion-single-Reference-Model" apply as well in this "single-Assertion-multiple-Reference Model" modality, including but not limited to: APM indexing, RAMS capability mediation, systematic harvesting of in-App activities, adaptivity and evolution of methods and procedures based (at least in part) upon configurations and results, as well as the various modes of game-theoretic competition. In cases where any such capabilities may not apply, or if other non-cited and additional capabilities may be applicable, such instances may be noted.

Referencing FIG. 12, a collection of N Reference Data Models is stipulated and referenced by group callout Two or More Reference Data Models 12001 composed of data stores containing Reference Data Model 1 12000 through Reference Data Model N 12002. Using methods and procedures and interfaces within or available to composite functional block Select Reference Data Models 12003, a Reference Data Model from collection 12001 may be selected using any or all of the means described in the foregoing example in FIG. 11 relative to block Select Apportionment sub-Model(s) 11002 (including, for example, content-sensitive and content-responsive methods and procedures and interfaces and other platform-supplied capabilities, as described). Note that block 11002 and the collection of K Apportionment Models within Apportionment sub-Models Collection 11001 is also depicted and operates as described in the previous examples in FIG. 11. Finally, the data flow outputs of blocks 12003 and 11002 are indicated by callouts Data Reference Models 1108 and Selected Apportionment sub-Model(s) 11003 and presented to block 1116 (entitled "block Execute Projective Assertional Simulation Create and Manage Candidate Outcome Models"), the composite functional block present in numerous figures and described in associated descriptions and examples within a variety of contexts and variations. In the current example illustration, the output of block 1116 is the bifurcated data flow referenced by callout Outcome Models 1203 (shown in FIG. 2 and other figures) where one component of this data flow contains a Cardinal Outcome Model and the other contains a Candidate Outcome Model. These Outcome Models are shown as composed within a sorted and indexed collection of Outcome Models referenced by callout 12008 ("Collection of Multiple Discrete Outcome Models—Single Assertion Model projected across N Discrete Reference Data Models using K Apportionment sub-Models 12008") where the M Candidate Outcome Models are stored within data stores Candidate Outcome Model 1 12004 through Candidate Outcome Model M 12005 and the Q Cardinal Outcome Models are stored within data stores Cardinal Outcome Model 1 12006 through Cardinal Outcome Model Q 12007.

As mentioned, while the configuration in FIG. 12 may be seen as a variation within the previously-presented examples of "single-Assertion-single-Reference-Model" Assertional Simulation, as noted, in embodiments and in applications of this modality, the present "single-Assertion-multiple-Reference-Model" modality may be implemented as a standalone execution modality or may constitute a primary execution nexus for many users. The central role of this configuration of Assertional Simulation in certain applications may be seen in a non-limiting but exemplary example of its use in profit center optimization, an expansion of previously-cited examples. Recalling an earlier example of this type, a manager responsible for Profit Center A is engaged in a budgeting exercise using the tools of Assertional Simulation as described in that example. But note that, in this case, the manager derives and manipulates a set of Apportionment sub-Model parametrizations using (in this instance) a single Assertion Model (a list of Profit Centers in this case which may, in variations be a taxonomic hierarchy) and applies this collection of Apportionment sub-Model parametrizations to a collection of selected Reference Data Models. The various Apportionment sub-Model parametrizations associated with this Assertion Model are, in this case, the user and/or system-nominated allocation of indirect expenses to actual profit centers within the Company where the form and structure of these profit centers are contained within the Assertion Model (described in the above as one-dimensional list or as a hierarchy) and initialized either by one or more users and/or through system-facilitated extraction from the Reference Data Model or by other means, a structure that is coerced upon the Apportionment sub-Models through the previously described DTS Subjectal Coercion. Note that in such scenarios, DTS semantic de-referencing is commonly invoked (implicitly or explicitly) to disconnect the information within the Reference Data Model from its accounting system ontology, requiring, in those instances that the terms within the Assertion Model that also appear within the Reference Data model be reconciled and correlated.

Further, the multi-layered nature of the game-theoretic basis of many of the executional modalities and user and system interfaces, previously referenced and described, may also be seen here. In the context of the application of Assertional Simulation to accounting information reposed within a Reference Data Model, note that the taxonomic structure of the Chart of Accounts (the typical Reference Data Model used in these scenarios) requires that the value of a parent node not exceed the arithmetic sum of its children. This stipulation upon a nested structure is described by the DTS-nominated term "DTS rule of descendant summation", a term derived in the course of the development of implementations of various modalities of Assertional Simulation in Platforms 1000 for applications typically but not exclusively related to accounting-based environments. In these environments, the Reference Data Model is natively structured within the accounting domain to comport with the requirements of the lexical and grammar derived from the constraints of that ontology. As such, it is known as an instance of a nested subsumptive hierarchy (or a nested partially ordered set or nested poset) but with the additional native-ontologically-spawned stipulation of the DTS rule of descendant summation, a grammar-based rule that is preserved in this instance during the application of DTS semantic de-referencing. Apart from the particular algorithmic and computational requirements and execution implications of compiling information within such a structure with the mandates of DTS rule of descendant summation, in this connection, note that since each set of children has one and only one parent (this is a consequence of the nested subsumptive property of the structure), a given parent must divide the sum of the values of its children among the Profit Centers within the Assertion Model. This is a mathematical consequence of the node-by-node coercion of the Assertion Model upon this Reference Data Model hierarchy as executed in this modality of Assertional Simulation and the rules imposed on the structure. Thus, since the value attached to a parent node must be the sum of the children (due to the DTS rule of descendant summation) and there is only one such parent (due to the nested subsumptive property of the hierarchy), in the coercion of the Assertion Model upon this collection, the value of each child must be allocated on a percentage basis to each profit center, a percentage that is provided by the Apportionment sub-Model, the structure of which is identical to the Assertion Model due to the application of DTS subjectal Coercion. As mentioned, if the Assertion Model is structured as a one-dimensional list, the coercion of this structure Assertion-Apportionment pair upon the collection of children of a given parent yields a 3-dimensional informatic entity where the third dimension (the parameterized Assertion-Apportionment pair) is linearly independent of the structure upon which it is projected. Thus, in embodiments, the Apportionment sub-Model may reflect this requirement by supplying a percentage mapped to each profit center in the Assertion Model to each node, where the total, of course, cannot exceed 100%.

Note, however, that the allocation of percentages of costs to profit centers is actually an example of a variation of a non-zero-sum game wherein the profit centers within the Assertion Model are all relative winners due to the division of the total among its constituents, and there is no overall "victor" as there must be in a zero-sum game wherein there is a single winner and the remaining non-victorious sibling nodes would be relegated as "losers". Of course, a manager in this example may view the assignment of a smaller relative percentage of a given total cost (represented by Chart of Accounts entry) as a victory, this is purely subjective for many reasons and the fact remains that definitionally, such percentage-based divisions (in the absence of other game rules) is a non-zero-sum game. Note also that this fact remains true even if a node is allocated 100% of the available resource (thereby forcing its siblings to 0).

Thus, this common use-case provides another example of the novel multi-modal, game-theoretic nature of imbued within modalities of Assertional Simulation (qualities present, as well, as in other functional components within a DTS Platform 1000): an Outcome Model in this situation is composed of a set of discrete non-zero-sum games instantiated among each collection of child nodes of each parent wherein each element within the governing Assertion Model (the structured enumeration of a collection of profit centers) "competes" for Apportionment sub-Model-supplied percentages as applied to each child of the current parent but such that these percentages divide the available total among the sibling children. This process is repeated upon every set of child nodes, from the terminal nodes of each branch of the tree through its apex.

As mentioned, however, in many environments, the elements within the Assertion Model—in this instance, profit centers within an organization—are not abstractions, though in many cases, even in this modality, some such elements in the Assertion Model may indeed be synthetic, constructed for the purpose, for example, of running "what-if" scenarios, a strategy illustrated and discussed throughout this disclosure and as implemented in concrete form in operating instances of Platforms 1000. Rather, the profit centers in this example represent real entities with actual personnel responsible for their performance and profitability. In the present example, another manager, called manager B may be responsible for a different set of profit centers than manager A and thus, in the course of budgetary negotiation, would have his own view of the appropriate percentages within the Apportionment sub-Model, one that, in general, would differ from manager A. This means each manager would create their own Outcome Model wherein the Assertional Simulation coerces a commonly-shared Assertion Model upon the commonly-shared Reference Data Model using unique-to-that-manager (or to the instance a manager runs in pursuit of that manager's view of the optimal formulation) parametrizations of the associated Apportionment sub-Model. Thus, each manager has applied their own collection of discrete non-zero-sum construct that reflects their view of the "ground truth", or their view of what the "ground truth should be.

The collection of discrete non-zero-sum competitions embodied within Outcome Models executed within the application of the Assertion-Apportionment pairs reflects an actual situation common in many organizations where managers responsible for such units compete for finite resources—in this instance, for greater percentages of the allocations applied to their units within a given Chart of Accounts item (the resource) as contained within the Apportionment sub-Model. Thus, each manager would formulate their own Outcome Model which, as mentioned, in this instance and in this modality of Assertional Simulation, is composed of a structured and enumerated collection of non-zero-sum outcomes. But in the end, in general, whether by fiat or by consensus, a single set of Apportionment sub-Models prevails, thus nominating and designating the Cardinal Outcome Model, a zero-sum result conferred upon a collection of non-zero-sum results wherein other competing instantiations are now called Candidate Reference Data Models, as shown in FIG. 12 and illustrated by callout 12008 referencing the M Candidate Outcome Models and the Q Cardinal Outcome Models.

In this sense, the non-limiting example in FIG. 12 reflects and exemplifies a novel instantiation of the DTS-engendered layered application of game theoretic constructs, expressed in this instance within a modality of Assertional Simulation and which, in embodiments, are composed within operational and user-facing components of a Platform 1000, a unique contribution within the teachings advocated in this disclosure.

This accounting-based example (and the many variations that may be inferred by those skilled in these matters) illustrates one use of Assertional Simulation (and the variety of services and functionality provided by and within a Platform 1000) to produce a set of variegated Outcome Models by application of a view of "ground truth" structured and parametrized within a series of Assertion-Apportionment pairs, a formalized set of judgements coerced upon a elements within a succession of Reference Data Models. As may be seen, however, any or all of the variations and DTS-based (and/or DTS-enabled and/or DTS-accessible) methods and procedures and interfaces described in the previous modalities of Assertional Simulation may be applied here, revealing the rich detail that may result from such invocations. As discussed, application of these previously combinatorial and, in embodiments, application of looped and optimization-directed methods and procedures and interfaces serve many purposes within a DTS Platform 1000 and as may be supplied to internal and external non-DTS computational and processing facilities, as described in the previous paragraphs and throughout this disclosure.

Note that a DTS-platform may facilitate access to accounting and other time-based data that provides views thereof for time periods (e.g., odd count of weeks) that business operational and intelligence access mechanisms may not provide. One aspect of a DTS-platform that may facilitate such access is the use of de-referencing that, as described more fully herein, releases content of a data system, such as an accounting system, from constraints imposed by the system, such as monthly accounting and the like. By applying capabilities of a DTS platform, such as Assertional Simulation and the like, a user may redefine accounting data from being accessed in monthly time-units to any other time unit, such as weekly, and the like. Through configuration of an Assertion Model, a user may take de-referenced accounting data and produce a view of the data for a given six-week period, such as, for example, defining a six-week window of time that captures accounting data from a Reference Data Model that was configured through, among other things, de-referencing source accounting data from at least one accounting data source. The application of multiple Assertion Models that each provides a specific view of the accounting data (de-referenced) using Assertional Simulation may facilitate identifying an impact on portions of a business that could not be done without such capabilities. In an example, a resource, such as a conference room of a corporation may be deemed in the source accounting system to be an asset that is equally shared among all departments. Therefore, each month each department is charged for an equal share of the charges for the room. Through use of a DTS platform, Assertion Model(s) may be configured that take information from, for example, a conference room reservation system to determine, through application of the Model to the de-referenced accounting system data using Assertional Simulation a time-usage-based allocation of charges for the conference room. A result of such Assertional Simulation may be an outcome model that represents impacts on each department's cost accounting that reflects their scheduled use rather than a general flat distribution of costs. Further, this time usage-based accounting may be applied outside of the department structure to capture, for example, charges of use of the conference room that should be applied to a specific project or other business activity. As an example, a six-week contract to perform a service may be awarded to a company. The company may choose to co-locate the team for this service in a shared facility, such as a conference room for the contract duration. Costs of the conference room the team, and the like for this six-week period may be determined, through use of the methods and systems of Assertional Simulation as described herein by casting an Assertion Model that facilitates identifying the resources consumed by this project over the six-week contract period. Further in this example, employee expenses, such as indirect expenses, for this six-week period may be distinguished and allocated to either the project or to the employee's base department on terms applied in the Assertion Model. If an employee assigned to the project takes a vacation during this project, salary and other expenses of the employee during their vacation may be optionally allocated to the cost of accounting of the employee's base department rather than to the project.

The principles outlined in the preceding examples are further illustrated in FIG. 13 which depicts another variation of a modality within Assertional Simulation called "multiple-Assertion-single-Reference-Model". As in the previous example, this modality may, in principle, be executed as a variation within the "single-Assertion-single-Reference-Model" modality but, in a similar fashion to the "single-Assertion-multiple-Reference-Model" case, the "multiple-Assertion-single-Reference-Model" modality exemplifies certain common applications within a Platform 1000 and in tangible instances of its deployment. As in the previous example, therefore, in embodiments, certain user interface and system capabilities may be optionally and/or conditionally optimized and/or oriented to accommodate and amplify certain functionality and operational modalities provided within and appropriate for this type of Assertional Simulation.

FIG. 13 shows N instances of Assertion Models represented in data stores Assertion Model 1 13000 through Assertion Model N 13002 designated by callout Two or More Assertion Models 13001. As in the previous examples in FIGS. 11 and 12, the collection of K Apportionment Models within Apportionment sub-Models Collection 11001 is also depicted in FIG. 13 and operates as characterized in the accompanying descriptions. In the current illustration, in a manner that exemplifies and uses the full breadth of capabilities similar to those described in FIGS. 11 and 12 and in other figures, examples and descriptions in other contexts, the methods and procedures and interfaces within or available to composite functional block Select Assertion Models 13003, permit users and/or system processes to select an Assertion Model from collection 13001. Likewise, block 11002 with similar functionality as depicted and described in the previous examples in FIGS. 11 and 12 permits selection of an Apportionment sub-Model from the collection of K Apportionment sub-Models 11001. Thus, an Assertion-Apportionment pair is routed as an input data flow to block 1116 (entitled "block Execute Projective Assertional Simulation—Create and Manage Candidate Outcome Models") along with Single Reference Data Model 11004 depicted in and described in connection with FIG. 1, FIG. 11, 12 and other figures.

Note, however, that in a fashion consistent with the operation of DTS Subjectal Coercion, the selection and parametrization of an Apportionment sub-Model is executed by users or system processes such that the selected sub-Model either comports with the current Assertion Model (as in the foregoing description DTS Subjectal Coercion) or may coerce its structure upon a newly-spawned Assertion Model which would be instantiated in the event that no current Apportionment sub-Model is compliant with any of the existing Assertion Models. This operational characteristic is implicit within and required by the bi-directional nature of DTS Subjectal Coercion (as revealed in the underlying Category Theoretic mathematics from which it is derived and permuted) and is illustrated in the previous and subsequent examples describing the association defining an Assertion-Apportionment pair. Note that methods and procedures and interfaces attendant to such operations may, in variations, employ one or more components of the DTS-based (and/or DTS-enabled and/or DTS-accessible) content-sensitive and content-responsive methods and that such "reverse synthesis" may be executed in many contexts. Thus, while in the previous examples and modalities, admittedly more common in practice, the Assertion Model is coerced upon the Apportionment sub-Model (with the latter supplying value to the former), this process may be inverted at user and/or system option (or for any other reason that may arise in the relevant context), effectively requiring the creation of a new Assertion Model based upon the structure of a selected Apportionment sub-Model.

Continuing to reference FIG. 13, composite functional block 1116, the pervasive collection of composite functionalities present in numerous figures and described in associated descriptions and examples within a variety of contexts and variations, receives inputs as designated by callouts Assertion Model(s) 11202 (an Assertion Model drawn from the collection of N Assertion Model 13001), 11004 (a Reference Data Model) and an Apportionment sub-Model from the collection of K Apportionment sub-Models 11001. As in previous figures, the output of block 1116 is shown as composed within a sorted and indexed collection of Outcome Models referenced by callout 11304 ("Multiple Discrete Outcome Models—N Assertion Models projected across Single Reference Data Model using K Apportionment sub-Models") where the M Candidate Outcome Models are stored within data stores Candidate Outcome Model 1 12004 through Candidate Outcome Model M 12005 and the Q Cardinal Outcome Models are stored within data stores Cardinal Outcome Model 1 12006 through Cardinal Outcome Model Q 12007.

As explained in connection with FIG. 12, the execution chain depicted in FIG. 13 may exist as a variation of the "single-Assertion-single-Reference-Model" modality of Assertional Simulation, but as was the case in the "single-Assertion-multiple-Reference-Model" modality, in the present case (the "multiple-Assertion-single-Reference-Model" modality) this execution environment and in embodiments and contexts, the "single-Assertion-multiple-Reference-Model" modality may also, in embodiments, be implemented as a standalone execution modality or may be presented to users (or system processes) as a type of discrete execution choice or as an element within one or more larger execution sequences.

One example of the manner in which the "multiple-Assertion-single-Reference-Model" modality may be applied is exemplified by the application of Assertional Simulation (and the supporting elements within a Platform 1000) to the evaluation of initiatives of all types in professional and business and government environments as well as in other instances, as cited in examples within this disclosure (including, for example, the use-case variations centered about the bibliophile and even those illustrating the use of Assertional Simulation by the volunteer organization). Note, however, that there may be other instances and circumstances and contexts in which the "multiple-Assertion-single-Reference-Model" modality may be applied. In embodiments, for example, this modality may be parameterized and invoked within the execution context of a different modality of Assertional Simulation, as a type of conditional or looped branch, which, in embodiments, may produce one or more results and/or byproducts (spawned in the process of the derivation of these results) which may be used for: i) "standalone" evaluation and examination or analysis and/or; ii) which may be employed as variables (for example) within the context in which it was invoked and/or; iii) may be defined as an informatic aggregate bounded by (and optionally associated with) the context in which it was invoked (using for example, one or more aspects of the APM indexing capabilities) and which may then be provided to and/or within any of the enumerated DTS-based (and/or DTS-enabled and/or DTS-accessible) methods and procedures and interfaces cited in this disclosure.

To illustrate how the "multiple-Assertion-single-Reference-Model" modality may be used in the evaluation or ranking of initiatives by a user or group of users, recall the previously described example wherein a manager tested his views of efficacious deployment and allocation of resources (his view of "ground truth") by assembling an Assertion Model (as described through this disclosure) and parametrizing instances of the Apportionment sub-Model using DTS Subjectal Coercion and applying this collection to a selected Cardinal Reference Data Model, as outlined in the previous example related to FIG. 12. But as noted in the earlier example, this manager used various mechanisms within DTS-based (and/or DTS-enabled and/or DTS-accessible) methods and procedures and interfaces to "perfect" the parametrizations within his collection of Apportionment sub-Models and these methods, so far, embody an example of the deployment of the "single-Assertion-single-Reference-Model" modality since these optimizations were derived based upon a single Cardinal Reference Data Model. But, as in the original example, suppose the manager wishes to examine and analyze a number of new initiatives to his current business, initiatives that require adding one or more new profit centers. This proposition, in this non-limiting example, includes adding such things as new employees, additional equipment and increased indirect expenses but also new revenue. Among the ways to accomplish this in a DTS Platform 1000 and to apply the analytic and predicative aspects of Assertional Simulation (as was briefly referenced in the earlier example), DTS-based (and/or DTS-enabled and/or DTS-accessible) methods and procedures and interfaces may be used to initiate an instance of the previously described "what-if" strategy where, in this case, the "what-if" procedure involves creating an alternate version of the Cardinal "ground truth" as embodied in a selected Cardinal Outcome Model and the attendant Cardinal Assertion-Apportionment pairs. The new and additional elements that composed these initiatives (or, in this case, the costs and revenues associated with new profit centers) may be integrated within a new version of the Cardinal Outcome Model and within the elements that would produce such an Outcome Model, including the Assertion-Apportionment pairs, which would be re-structured and re-parametrized. DTS provides systematic means to do this type of analysis, a contribution to the current art that simplifies and improves current practices.

In this example, suppose the manager uses a "clone-and-modify" strategy wherein the manager selects a particular Cardinal Reference Data Model based upon common acceptance that this particular Outcome Model is sufficiently representative of the current consensus view of ground truth in the organization. The manager may make and rename a copy of not only the Cardinal Reference Data Model but of the collection of information aggregates from which it was derived, including the antecedent Assertion-Apportionment pairs, as outlined in the foregoing. To inject the new initiative, the manager may invoke another variant of the DTS "clone-and-modify" strategy using DTS-based (and/or DTS-enabled and/or DTS-accessible) methods and procedures and interfaces to select an existing profit center within the now-cloned-and-renamed Outcome Model and may duplicate this subset of interconnected nodes, may rename and re-parameterize the elements within the aggregation which, of course, consists of the accounting-based elements associated with that profit center.

Specifically, in an expansion and in further detail of the earlier example, the manager, using DTS-based (and/or DTS-enabled and/or DTS-accessible) methods and procedures and interfaces, may identify existing groups of one or more informatic nodes within (one or more) an informatic aggregation(s) (in this case, a single aggregate, the now-cloned-and-re-named single Reference Data Model) that are related to and which define, in the native ontology of the accounting system (or in variations, as may be extracted using content-emergent analytic and extraction techniques, as described in the foregoing) the constitution of a profit center (as defined and embodied in this instance within the now-cloned Reference Data Model). This aggregation may include such items as revenue, direct and indirect expenses, employees and other factors related to the operation of the organization. Using content-sensitive and content-responsive methods and procedures and interfaces, this distributed aggregation of nodes may be duplicated and renamed, and new values may be associated with each node, an aggregate-wide re-parametrization that reflects a version of the manager's vision of this new initiative. Note that in embodiments, employees may be separately selected and cloned that may not be associated with the currently selected to-be-cloned profit center. Thus, for example, if that existing ("real") profit center does not have an engineer of a certain type, one can be selected from elsewhere, cloned, re-named and re-parametrized, Moreover, in variations, a DTS Platform may provide a library of employee-types that may be based upon the organization's current employee spectrum, from which such additional employees may be selected and re-parametrized. In further variations, users and/or system processes may produce such synthetic entities using a number of mechanisms, including operations that may be invoked to "make another version of John Smith and name her Jane Smith". Note that, as discussed within this disclosure, any or all such nodes may have attached ancillary information and these attached informatic structures may be optionally cloned and modified, as well.

This newly-spawned aggregation representing the new profit center may then be included within the existing clone of the cloned Reference Data Model using one or more DTS-based (and/or DTS-enabled and/or DTS-accessible) and, in variations, dynamically and contextually-assembled assembled content-appropriate, content-sensitive and content-responsive methods and procedures and interfaces to integrate the now-changed information throughout the cloned-and-renamed, and thus modified Reference Data Model. Using this new Reference Data Model, the manager may now create and parametrize a new set of Assertion-Apportionment pairs and invoke the "single-Assertion-single-Reference-Model" modality to produce an Outcome Model based on this version of the "what-if "scenario in which his envisioned initiative is actualized and embodied with existing information. embodied. In the "multiple-Assertion-single-Reference-Model" modality, this process may be repeated with different re-parameterizations of the Apportionment sub-Models until the Outcome Model produced using this cloned and modified Reference Data Model comports with the manager's goals and thus reflects his view of an appropriate "ground truth".

The manager may compare and contrast each Outcome Model through invocation of any number of DTS-based (and/or DTS-enabled and/or DTS-accessible) methods and procedures and interfaces available within a Platform 1000, including simple inspection using special two- and three-dimensional inspection tools, deployment of analytic and statistical routines as well as any other technique used for comparing and optimizing elements within discrete data sets. In embodiments, such optimizations may be executed using any of all of the looped iterative and recursive optimization methods described and implied in this disclosure and other techniques not explicitly detailed here but have utility in such applications.

But note that at any time (or upon realization of an optimized parameterization of a set of Apportionment sub- Models), the manager may retain these versions and repeat the entire exercise by, for example, adding several profit centers or by changing any relevant values within the cloned-and-renamed Reference Data Models. Thus, in this example, not only might the manager invoke the "multiple-Assertion-single-Reference-Model" modality of Assertional Simulation but may do so repeatedly. Note further, that, as in the earlier example, using statistical and analytic tools within DTS-based (and/or DTS-enabled and/or DTS-accessible) methods and procedures and interfaces, the manager may project any of these Outcome Models forward and backward, producing a time series of concatenated but synthetic representations of the resources within an organization.

This example of the "multiple-Assertion-single-Reference-Model" modality of Assertional Simulation shows another example variation of the DTS-engendered layered and multi-modal zero-sum/non-zero-sum competition, as outlined in previous examples. Note, however that in this instance, the user sets up competing versions of Apportionment sub-Model parameterizations as coerced upon a synthetic Reference Data Model that may be projected forward and backward and evaluated, as described. By selecting a particular version of the Outcome Model from the synthesized collection as optimal (and thus, the antecedent Assertion-Apportionment pairs and other information), this Outcome Model wins the zero-sum competition, the overarching game which subsumes the stacked series of non-zero-sum competitions. But in a further variation of this example, the manager may indeed create a time sequence of projected Outcome Models, but using DTS-based (and/or DTS-enabled and/or DTS-accessible) content-sensitive and content-responsive methods and procedures and interfaces may additionally synthesize new Assertion-Apportionment pairs that associate with these derived Outcomes and may change all or part of the parameterizations within these Assertion-Apportionment pairs. In advanced variations, such re-parameterizations may be conditioned to reflect conditions that may have been present or which may have influenced original or "real" Assertion-Apportionment pairs, such as, for example, weather-related or seasonal factors.

Note that many of these aspects in this modality of Assertional Simulation as with the other modalities, and as with many other elements of the services and functionality provided within a Platform 1000, are cast within the overall context of the competitive, collaborative and comparative environment that suffuses the DTS Platform. This pervasive presence is depicted in multiple figures, descriptions and examples and is exemplified by composite block 1117 (entitled "Manage DTS Competitive and Collaborative Simulation Environment with Optimization") in FIG. 1 and in various forms in other figures, as well. In the current example, apart from internal layering of zero-sum/non-zero-sum competitions, this competitive aspect may be seen by including earlier examples wherein groups of managers compete for resources. In this instance, groups of managers may competitively submit their views of which initiatives should be pursued and the relative merits of different resource allocations that should be associated with such pursuit. Thus, each manager may create and nominate their own Outcome Models based on either alternate initiatives or their view of the same agreed-upon and shared set of initiatives (that is, initiatives that are agreed by the group to represent the best possibilities). In the latter case, managers inject their judgement of an optimal version of what the "ground truth" ought to be based given the inclusion of the initiative(s). Their submitted Outcome Models reflect their views of the configuration of the new profit centers, including such things as how many new employees and of what type should be added, what types and at what cost of capital equipment might be required, as well as other details involved in a new initiative as well as the proper re-parametrizations of the newly structured Assertion-Apportionment pairs. Each manager may create and submit and prepare analysis of their alternate versions of the same initiative-laden Outcome Model, and the selected "winner" may be designated as Cardinal to be used in pursuit of the initiative (called in DTS-terminology the "Cardinal Paradigm Outcome Model") and indexed to the associated Assertion-Apportionment pairs).

Note, however, that this Cardinal Paradigm Outcome Model (and all of the parameters within the associated Assertion-Apportionment pairs) may be preserved and compared to the actual real-life outcomes, as with other instances of Assertional Simulation, thus spawning a variety of differential and correlative analytic byproducts and opportunities, any or all of which may be integrated and used in the creation and maintenance of any or all elements in any of modalities of Assertional Simulation. In embodiments, such differentials may be used in one or more elements within the DTS-based (and/or DTS-enabled and/or DTS-accessible) methods and procedures and interfaces represented within the in-App metrics functionality (as represented in composite functional block 1107 in FIG. 1 and other figures), capabilities that, in embodiments, pervade a Platform 1000. In this example, the differentials maybe compiled as a type of "predicted-versus-actual" analysis within which plethora statistical routines may tease out factors which may be used by managers to improve their predictive abilities. Moreover, since all the Candidate Paradigm Outcome Models (and their progenitorial Assertion-Apportionment pairs as well as ancillary and supplemental information generated in the creation and analysis process) produced by the manager may be preserved, such information may be included in the ongoing analysis, providing not only additional insight and data points but which may also serve as one measurement of a manager's performance. This is another example of the use of Assertional Simulation as a predictive analytic.

Another example of the utility of these modalities of Assertional Simulation may be seen in application of DTS-based (and/or DTS-enabled and/or DTS-accessible) methods and procedures and interfaces to the evaluation of external sales opportunities. In many environments, there are multiple such opportunities (various new clients for a consulting firm, for example) and, in embodiments, a DTS Platform 1000 may provide capabilities by means of which a potentially large number of such opportunities (a common problem in these environments) may be reduced by applying one or more modalities of Assertional Simulation in conjunction with ancillary DTS-based (and/or DTS-enabled and/or DTS-accessible) methods and procedures. As in the case of the integration and utilization within DTS Platforms 1000 of such commonly available tools such as, for example, analytic and data mining capabilities, other methods commonly employed in sales-oriented environments may also supplement and/or augment the capabilities of Assertional Simulation and may be employed in conjunction with any or all of the DTS-based (and/or DTS-enabled and/or DTS-accessible) methods and procedures and interfaces and/or any or all of the extensions enumerated with examples and descriptions within this disclosure and in various concrete implementations of a DTS Platform 1000 and those which may be inferred by those experienced and skilled in these and related arts.

One problem commonly encountered in this arena is determining which set of potential targets among a large group represents the best use of the limited resources any organization may expend on new business development. In DTS-terminology, this problem is addressed by a novel construct implemented, in embodiments, as a multi-staged process that has three optionally non-sequential components: a pre-qualification stage, called "DTS Prospecting", a middle stage called DTS Culling and a final stage called DTS Initiative. The large number of potential opportunities are addressed by the combination of DTS Prospecting (the pre-qualification stage) and DTS Culling (the intermediate stage) and ends with DTS Initiative. In embodiments, DTS Initiative entails the application of one or more modalities of Assertional Simulation in which one or more users create one or more ordered lists which reflect that user's particular view of the relative value of each instance, each representative of the judgements of different business and sales development personnel, though in variations, Assertional Simulation maybe applied throughout the other stages. The assertion of the relative efficacy and value of each opportunity is, of course, a version of the seminal principle of "perceived ground truth" in that each ranking represents not only a judgment-based evaluation of each opportunity but implicitly defines the user-based perception of the broader situation or context as it is or as it should be.

In embodiments, opportunities in DTS Prospecting (the pre-qualification stage) may be statically, conditionally and/or transiently segregated into one or more categories, according to many possible criteria including properties that may be contained within the initiatives themselves (such as business type or various measures of magnitude) or by the degree of completeness of information according to one or more applicable templates, or any other reason the managers may choose. The selection of the applicable criteria, the parameterization of such criteria and the creation and maintenance of the templates as well as other elements that, in context may be related to, derived from and which may contribute to one or more results that ultimately cause potential initiatives being placed into "bins" may, in embodiments, use any or all of the standard and known methods applied to such schemes, but may also include any of the described DTS-based (and/or DTS-enabled and/or DTS-accessible) methods and procedures and interfaces. DTS Prospecting may additionally and in a supplemental manner apply one or more elements within any of the various modalities of Assertional Simulation to determine which potential initiatives should be in which bins, and further which may be of highest interest. The combination of standard information categorization techniques with the novel modalities of Assertional Simulations (and ancillary, related and supportive operations) is called in DTS-terminology "DTS Culling", an intermediate stage in DTS Prospecting, typically but not exclusively applied to fewer numbers of possible solutions.

In variations of DTS Culling, users and or/system processes may employ strategies (either as group or individually, effectively in competition) by means of which potential initiatives may first be sorted into category bins (as in the foregoing) and may then be subject to the formalized view or "ground truth" held by a user (or group of users) of the relative value of each initiative. But since not all targets have the same amount of information in the same format from the same domain, any of the DTS-based (and/or DTS-enabled and/or DTS-accessible) content-sensitive and content-responsive methods and procedures and interfaces described in the foregoing as may be applied to disjoint and non-continuous informatic structures as well as the methods and techniques associated with DTS semantic de-referencing (and other methodologies outlined in this disclosure) may be applied to harmonize these randomly and possibly variably disjoint and eccentric aggregates. Such operations may be supplemented by practices such as subtractive filtering (in order to eliminate (or delay evaluation of) targets that possess less than acceptable degrees of complete information), pattern matching as well as system-based, system-enabled and human-based information manipulation and intervention using appropriately configured user and system interfaces.

Thus, in embodiments, in the course of the optionally iterative execution of one or more elements in the DTS Culling stage employing DTS-based (and/or DTS-enabled and/or DTS-accessible) content-sensitive and content-responsive methods and procedures and interfaces, each surviving potential initiative may be indexed to an Outcome Model (in implementations, along with other ancillary information) that may be assumed to be complete to the degree possible but may not, in all cases be fully representative of each target to the degree that may be required to obtain a fulsome or meaningful ranking. Thus, the target may be subjected to repeated cycles of DTS Prospecting, the pre-qualification stage where target information is assumed to be primordial and thus must be subject to grosser processing and then re-submitted to DTS Culling, Ultimately, the goal is to reduce the number of targets with as-complete-as-possible information so that modalities of Assertional Simulation (as well as other methods) may be effectively applied, although, in variations, modalities of Assertional Simulation may be conditionally and partially invoked on less-than-complete information. The goal of each reapplication of these nominally-concatenated but not-always-sequential stages is to obtain a smaller number of targets which have enough information to be nominally eligible for inclusion within Assertional Simulation computations. Thus, in the context of this disclosure, one or more modalities of Assertional Simulation may be initiated in the final stage (DTS Initiative), and an Assertion-Apportionment pair may be nominated and parametrized using any or all of the means enumerated in the foregoing (and others that may be applicable) and thus applied to a set of possible targets, creating a collection of Outcome Models.

In one variation of the application of Assertional Simulation that may be applied in either of the stages (DTS Prospecting or DTS culling), each target may be compared to a synthetic version of an "ideal" target. In this instance, one or more users and/or system processes create one or more Outcome Models representing the "ideal" target where, in embodiments, there may be many such ideals formulated by different users and/or representing different categories or target types. Using DTS-based (and/or DTS-enabled and/or DTS-accessible) methods and procedures and interfaces, each target may be seen as an Outcome Model and may be ranked based upon its degree of correlation to the ideal Outcome Model. This approach itself is not dissimilar to other commonly employed correlation-based evaluation tools, but within DTS, the novel tools of Assertional Simulation may be applied.

Specifically, one strategy may be to deploy the "multiple-Assertion-multiple-Reference-Model" modality of Assertional Simulation depicted in FIG. 14. In this non-limiting example case, there are N Reference Data Models (which are, as described in the current use-example, the potential initiatives or targets) depicted as reposed within data store Reference Data Model 1 12000 through Reference Data Model N 12001 and indicated by callout Two or More Reference Data Models 12001, noting that in the present example, there are clearly more than two such models. Note that in this case, however, one which is exemplary of the "multiple-Assertion-multiple-Reference-Model" modality of Assertional Simulation, there are many Assertion Models (data stores 13000 and 13002 designated by callout 13001, as described in the connection with FIG. 13, each with one or more associated Apportionment sub-Models (data stores 11100A and 11100B designated by callout 11001, as described in the connection with FIG. 11 and other figures). The control mechanisms that execute the selection of which Reference Model upon which to apply which Assertion-Apportionment pair(s) (blocks 13003, 12003 and 11002) operate as described in other examples and as depicted in other figures wherein these operations may be user-initiated and controlled and/or maybe executed by means of full or partial system control, where one or more elements of such control are executed by means of methods and procedures depicted within composite functional block 1104 and subsumed within control flow 1111 as shown FIG. 1 and other figures. In any such instances, any of all of the looped, iterative and recursive operations in any of the configurations and modalities may be applied here where such techniques are described throughout this disclosure. As in previous figures and examples and descriptions, blocks 1102, 1116 and 1103 receive input from prior stages (shown as subsumed within composite data flow 14000 entitled "All Models" and output the resulting Outcome Models to either block 1119 ("Manage Selection, Formatting, Processing of Models for DTS-based/DTS-enabled Analysis and Visualization 1119") which subsumes DTS-based (and/or DTS-enabled and/or DTS-accessible) methods and procedures and interfaces that enable user- and/or system-driven application of visualization and analysis. In this case, such analysis may be applied to the Outcome Models, but as discussed in this disclosure, this capability is pervasive through a Platform 1000 and may be invoked any time and in any context upon any information.

Note that in FIG. 14, the Outcome Models are shown as subsumed within data stores Candidate Outcome Model 1 12004 through Candidate Outcome Model M 12005 and data stores Cardinal Outcome Model 1 12006 through Cardinal Outcome Model Q 12007, but in the present example, as well as in others, there may be only Cardinal Outcome Models and no Candidate Models. This is because in the current case, Outcomes are ranked relative to one another in a non-zero-sum game, a variation on the layered game-theoretic characteristic that, as described, pervades DTS Platform 1000.

Continuing the present example of the final stage of the evolution process, each user in a business development environment may apply their own evaluation criteria, parameters that are embodied in their respective Assertion-Apportionment pairs. Each user then applies their formalized judgments to each instance of Reference Data Models from the collection 12001 through the execution described in the foregoing. In embodiments and in some applications, there may be a number of Apportionment sub-Model parameterizations applied to different sections of the Reference Data Models, and in variations, there may be different Assertion-Apportionment pairs applied, as well (or instead, based upon application of one or more content-sensitive and content-responsive methods and procedures and interfaces within the execution chain.

In all cases, each user ultimately ends up with an ordered list, ranking the relative value of each potential initiative as embodied in a Reference Data Model, and any or all previously described DTS-based (and/or DTS-enabled and/or DTS-accessible) methods and procedures and interfaces may be applied to construct and maintain any element of the execution chain that produces these results. Note as well that in variations, there may be many such ranked lists for each user based on different criteria and different parametrizations within or associated with one or more Apportionment sub-Models. But note that in some instances, instead or in addition, such re-orderings or permutations of the ranking lists may result from application of one or more analytic, pattern recognition and other techniques (such as may be found in data mining applications) as made available through DTS-based (and/or DTS-enabled and/or DTS-accessible) methods and procedures and interfaces, resources that, as mentioned, are available in any context throughout a DTS Platform.

Thus, in the current example, of the many lists that may be generated by the business and sales personnel participating in this ranking process, in general, one list is selected as Cardinal thus indicating which potential initiatives are most worth pursuing and which have the greatest chance of success. Thus, this example and this modality of Assertional Simulation ("multiple-Assertion-multiple-Reference-Model") exemplifies a variation of the layering of non-zero-sum results within an overall zero-sum outcome where, in this instance, there may be at least two non-zero-sum competition types: the application of Assertional Simulation in the non-zero-sum modality described in the accounting example with respect to apportioning within a child set in a hierarchy; and the overall ranking of Outcome Models where, as mentioned each user many create many such non-zero-sum results. But also, as noted, in implementations and in some contexts, one such non-zero-sum ranking is selected, thereby designating a zero-sum winner.

This exercise may be repeated at intervals, and since, in general, all the information generated in the course of these operations is preserved, the overall Shannon entropic richness within the platform is increased, an aspect of DTS Platforms 1000 that, as described, may be leveraged by such capabilities as machine learning, pattern recognition and other AI-related functionalities. Note, that as in the previous example, metrics and analysis may be extracted comparing how well certain selected initiatives actually perform, again comparing projected to actual performance. In one variation, one or more elements of such actual-versus-predicted metrics may be used to optimize both the structure and parametrization of Assertion-Apportionment pairs but also the structure of Reference Data Models, where such information may reveal which information is more important and in what manner than others. Moreover, such information may be used in earlier stages to optimize the DTS-based (and/or DTS-enabled and/or DTS-accessible) methods and procedures and interfaces that execute that functionality, (including interpreting such information to adjust any or all of the elements within the applicable dynamically invoked content-sensitive and content-responsive methods and procedures and interfaces). In addition, such metrics may be used to improve and otherwise modulate such synthetic or derived "ideal" representations as described in the foregoing, where use and dynamic modification of such synthetic entities may be invoked in many contexts throughout a DTS Platform 1000. In all cases, such information may be widely used both within DTS Platforms 1000 (in the previously referenced in-App metric capabilities, for example) as well as in external systems through appropriate DTS-based (and/or DTS-enabled and/or DTS-accessible) methods and procedures and interfaces. This is another example of the use of Assertional Simulation as a predictive analytic resource (DTS Subjectal Prediction).

Returning to FIG. 1, and DTS Assertional Simulation Operations 1103 subsumes compound function block Manage DTS Competitive and Collaborative Simulation Environment with Optimization 1117, depicted as adjacent to block 1116. This arrangement graphically conveys the functional relationship that may, in embodiments, exist between the methods and procedures and interfaces within each respective block, a contextual interoperation between these computational constituents. But as with other graphical conveniences mentioned in this disclosure, such arrangements should not imply any type of mandatory interconnection between 1116 and 1117, nor between any of the respective constituent elements, nor any sort of required order of execution or precedence. In all events, as is the case with blocks 1116 and 1117, this represents a collection of functionally similar but separable (and in embodiments) distributed methods and procedures and interfaces unified in many contexts by a focus upon the execution and facilitation of the various and pervasive competitive, collaborative and comparative functionality within a Platform 1000. Note, however, that, in embodiments, these collections of methods and procedures and interfaces may also contain additional functionality as described in any or all aspects of the foregoing, including, in a non-limiting example, the interfaces and entity management capability within and as may (in embodiments) be associated with or other accessible to APM and RAMS System Capability and TCM (Topical Capability Mediation), any or all of the content-sensitive and content-responsive methods and procedures and interfaces previously described as well as any of the elements associated with the execution chains surrounding and related to Assertion Simulation and the attendant Models and ancillary structures.

Note, however that while some execution blocks described in the foregoing may seem nominally unconnected to the competitive, collaborative and comparative aspects of Assertional Simulation and the broader capabilities of a Platform 1000, in the execution environments contained within 1116 and 1117, in embodiments and as impelled by computational-, user- and system-driven intentionality and contexts, such capabilities may provide (in a non-limiting example) one or more predicate variables, intermediate and ancillary informatic structures and other elements that may be used within the scope of the competitive, collaborative and comparative functionality. This competitive functionality has been cited in examples and descriptions in the previous paragraphs and, as described represents a pervasive characteristic throughout a Platform 1000, elements of which that may be invoked and executed in many contexts and at any time. Given this interoperability and system-context independence, block 1117 is appropriately titled "Manage DTS Competitive and Collaborative Simulation Environment with Optimization" and should be understood as broadly depicting collections of DTS-based (and/or DTS-enabled and/or DTS-accessible) content-sensitive and content-responsive methods and procedures and interfaces that may be dynamically assembled to enable, to enhance and, in general, to facilitate this operational capability, providing direct and indirect support of the pervasive capability in a Platform 1000 implementation to foster, encourage and execute competitive, collaborative and comparative functionality. As noted, however, in embodiments, many such constituent elements may also perform other non-related functions, such as, in a non-limiting example, providing computational assistance for variables that may be used within the in-App metric and analysis capabilities (as described throughout this disclosure and as depicted in composite block 1107 in FIG. 1). But note, as well, that in a manner similar to block 1116, block 1117 combines related but, in some cases, contextually discrete functionality by including optimization within its composite functionality. As noted in the foregoing text, optimization within a DTS Platform 1000 and in connection with one more operations related to and/or assisting in the execution of Assertional Simulation (and/or ancillary operations) may, in embodiments, compose diverse, varied and complex operations, including (but not limited to) those outlined in connection to block Manage Looped, Iterative and Recursive Operations 1105 and control signal/data flow Optimization Control 1108B.

FIG. 1 combines this functionality since though discrete in some contexts, the competitive, collaborative and comparison environment has important commonalities within the optimization capabilities provided throughout Platforms 1000. This may be clear at a colloquial conceptual level since one objective of competitive, collaborative and comparison capabilities is to attempt (by whatever means) to optimize some set of results (Outcome Models, for example) or to select which results among a collection of is optimal, where in many cases, "optimal" is defined by the current computational-user- and system-driven intentionality and contexts. But note that in technical and implementation terms, the graphical interconnection is more mundane and practical: in embodiments, users and system processes most often (but not exclusively) initiate and execute many of the optimization operations in the computational and interface-based context of the competitive, collaborative and comparison environment, and in this sense, it is appropriate to combine this functionality in the context of the high-level teachings depicted in FIG. 1. But note, again, as well, that this combination does not imply dependence, priority or any other connection requirement.

Continuing within integrated compound functional block 1103, compound function block Select and Store Cardinal and Candidate Assertional Simulation Outcome Models 1118 represents, in embodiments and in many computational contexts, a less complex and variegated aggregation of functional capabilities than those depicted as subsumed within 1116 and 1117 (and 1112, 1113 and 1114 within compound function block 1103), or represents, at least, a collection that may have few capabilities with a lesser degree of Platform-wide interconnectedness, but one that is no less important. This functionality has appeared in previously provided examples and descriptions and the context-based assembly of this collection of DTS-based (and/or DTS-enabled and/or DTS-accessible) content-sensitive and content-responsive methods and procedures and interfaces. Note that, as in the previous explanations, the graphical adjacency shown in FIG. 1 should not imply any order of executional precedence and that the methods, procedures and interfaces provided by 1118 should be understood as available at any time and by other elements within 1103. Such flexibility may be seen in the depiction of the bidirectional flow 1120 (as discussed in the foregoing text), and the selection and storage functionality should be understood as prevalent but, of course subject to the strictures exerted by the elements with control flow RAMS and TCM Control 1109.

Finally, within compound function block 1103, composite functional block Manage Selection, Formatting, Processing of Models for DTS-based/DTS-enabled Analysis and Visualization 1119 is connected in the same pervasively-available and random-access fashion as other system-wide capabilities and should therefore be understood here as available to other functional blocks as required by any operational and functional context within present in embodiments of DTS Platform 1000. The DTS-based (and/or DTS-enabled and/or DTS-accessible) methods and procedures and interfaces within block 1119 have described throughout this disclosure and in many examples and use-cases. The suite of functional capability within composite block 1119 has many practical and varied applications, including but not limited to the application of non-destructive analytic routines, such as, for example, situations where versions of Reference Data Models may be projected forward by applying linear regression algorithms upon certain elements within the data and recalculating and comparing results across different iterations. In this context, as one example, as described in previous examples, such results may be fed-back into previous stages in the derivation of Reference Data Models, even integrating new information as outlined in previous discussions. It will be appreciated in light of the disclosure that the collective functionality within composite block 1103 enhances and extends the usefulness of DTS Reference Data Models, not only once composed but in the composition and assembly process itself.

In addition to the capabilities enumerated in other sections of this disclosure, composite block 1119 may also, in embodiments, provide a broad and highly configurable content-sensitive and content-responsive suite of methods and procedures which, as with other aspects of such collections of methods described in the foregoing, may be DTS-based (and/or DTS-enabled and/or DTS-accessible) and may in context be assembled dynamically to facilitate these evaluations and comparisons. Thus, any number of tools may be available to users and system processes including (but not limited to): i) visual inspection by one or more users through any number of DTS-based (and/DTS-enabled) numeric and graphical interfaces; ii) application of DTS-based (and/DTS-enabled) analytic, statistical and other mathematical algorithms which may also be deployed for standalone application but which may also integrate in the context of a broader optimization effort (where such techniques may be employed in an execute once configuration but which may alternatively participate in iterative and self-modifying and/or adaptive loops, as in the foregoing); iii) application of DTS-based (and/DTS-enabled) pattern recognition and rule-based and inference-based procedures to discover relationships within the subject data and, through any of the means cited herein, make modifications to the subject data using DTS-based (and/DTS-enabled) methods; iv) application of DTS-based (and/or DTS-enabled) techniques typically associated with machine learning environments (as described in the foregoing and in other sections of this disclosure), including (but not limited to) techniques that may be used to operate upon one or more elements within the subject data based upon (or executed as a result of) relational or compositional information that may be discovered on the basis of content-emergent and/content-based inferences and/or upon information otherwise embedded within the subject data information and which may be mined from such subject data and which may have been extracted from or inferred from (using techniques typically used in related disciplines), and which may deploy content-responsive optimization methods. As described throughout this disclosure and as illustrated in various examples and graphical depictions, such evaluations and comparisons may be applied to (one or more) Models (or sections therein) in conjunction with and/or in addition to and/or as a part of any or all the techniques cited in the foregoing and, additionally, as may be associated with DTS looped refinement as embodied in iterative/recursive looping 1115, as described in the foregoing.

FIG. 2 provides an alternate representation of the functionality shown in FIG. 1 and much of the same functionality described in the foregoing descriptions, examples and graphical depictions are shown here. Composite functional block 1200 ("Execute Projective Assertional Simulation—Create and Manage Candidate Reference Data Models, Assertion Models and Apportionment sub-models and Outcome Models 1200") in conjunction with previously described block 1117 is shown in the context of its interconnection with other functions as may be present in implementations of Platforms 1000. In this representation, information flows 1201 and 1202 entitled "Candidate Models" and "Cardinal Models", respectively, as bi-directionally connected to both blocks 1200 and 1117 which conveys the manner in which the DTS-based (and/or DTS-enabled and/or DTS-accessible) methods and procedures and interfaces with content-sensitive and content-responsive methods and procedures and interfaces within each block may pass information to these Models in a variety of computational contexts. As in other example representations and descriptions, and as a reflection of the functionality through Platforms 1000, control/data flow 1111 is shown as connected to all the functional blocks within FIG. 2. Note, however, that the absence of such a graphical representation should not imply the lack of interconnection of any of the components within a given block but is merely a convenience when the availability of such control and data is understandable from the context disclosed herein.

The previously referenced and described composite functional block 1117 provides output to data stores data stores Candidate Reference Data Models 1206, Candidate Assertion Models 1207 and Candidate Apportionment sub-Models Data Models 1208 through bi-directional data flow designated by callout 1201 and to Cardinal Reference Data Models 1209, Cardinal Assertion Models 1210 and Cardinal Apportionment sub-Models Data Models 1211 through bi-directional data flow designated by callout 1202. As indicated throughout this disclosure, block 1117 and these representative data stores are depicted here to convey their ubiquity and flexibility in the contexts and applications described in this disclosure and in other such applications that may be enabled within or by one or more components within a Platform 1000. In the context of the current representation, and as may be seen by the functionality within the DTS-based (and/or DTS-enabled and/or DTS-accessible) methods and procedures and interfaces within block 1117, including but not limited to those described and illustrated in this disclosure (such as, for example, the variety and variations made possible by the content-sensitive and content-responsive methods and procedures and interfaces that, in embodiments, may be assembled in computational and information-derived contexts), the output of block 1117 is a compound control/data flow 1203A (entitled "Outcome Models 1203A") from which information is subsumed within data stores Cardinal Outcome Models 1204 and Candidate Outcome Models 1205. Note that a data/control flow permits these Outcome Models to be resubmitted for reconsideration (or re-competition) and may be made available for any other reason to other functional blocks throughout Platform 1000, an interconnection exemplified by compound control/data flow 1203B (entitled "Re-compete Cycles 1203B").

Compound functional block 1119 ("Manage Selection, Formatting, Processing of Models for DTS-based/DTS-enabled Analysis and Visualization 1119"), also previously described in various examples and descriptions within this disclosure (and as depicted in FIG. 1 and other figures) receives the compound control data flow signals 1213 (entitled "Selected Outcome Model(s) 1213") from data stores 1204 and 1205 but also information from data stores 1206-1208 (representing the collection of Candidate Models and from data stores 1209-1211 (representing the collection of Candidate Models and Cardinal Models, respectively, as described in the foregoing) depicted as subsumed within compound control/data flows 1212 (entitled "Selected Candidate Models 1212") and 1214 (entitled "Selected Cardinal Models 1214"). The access and selection mechanism by means of which such selections may be managed and executed by such capabilities as user and system process interfaces are represented within compound control/data flow 1111 but are administered and modulated within possible constraints imposed by methods and procedures and interfaces within and associated with APM functionality as well as the mediation mechanisms of access and system operational capabilities within and associated with RAMS. These data/control flows are also subsumed within compound control/data flow 1111 where such access is dynamically and contextually administered as described and depicted in figures throughout this disclosure.

Note, however, that in FIG. 2, more detail is shown depicting additional but non-limiting example outputs from block 1119, compound control/data flows 1215 (entitled "Selected DTS Simulation Model(s) 1215"), 1216 (entitled "DTS-based and DTS-enabled DTS Analytic Data 1216"), 1217 (entitled "DTS-based and DTS-enabled DTS Graphics and Visualization 1217"). These control flows, in embodiments, available through interfaces throughout a Platform 1000 depict the depth and breadth of the analytic and visualization capabilities that may be employed by users and system processes, capabilities that have been elucidated in previous exemplary descriptions and examples and referenced with figures throughout this disclosure. This functionality is expressed in FIG. 2 as subsumed within compound control/data flows 1218 (entitled "Selected DTS Simulation Model(s) 1215") and presented to the compound functional boxes 1219 and 1220 (entitled "Manage, Distribute and Store DTS-based and DTS-enabled Analysis, Data and Visualization 1219" and "Format, Store, Distribute and Export DTS Data, Analytic and Data Visualization Reports 1220", respectively). The DTS-based (and/or DTS-enabled and/or DTS-accessible) methods and procedures and interfaces these composite boxes represent include (but are not limited to) capabilities to access, manipulate and index the numerous instances of DTS-facilitated analysis and graphical representations and capabilities that permit users and system processes to create, manage, format, index and provide access to DTS-created and DTS-facilitated reports. Note that such capability is common in many parts of the data analytic arena and many applications and services provide a wide variety of functionality and capability in direct and indirect support of report and presentation preparation. The DTS Platform provides its own suite of such capability, most especially in embodiments that reflect particular needs that may derive from and may be a consequence of the novel capabilities it provides. But, in embodiments, Platforms 1000 also provide the ability to integrate such non-DTS capability by means of such facilities as API's, methods and procedures and interfaces supporting direct and indirect import and export of information and other control mechanisms and data transfer integration techniques.

FIGS. 3 and 4 provide example representations and additional details for a collection of ancillary and support functions present in embodiments that augment and extend the operation and capabilities of the methods and procedures and interfaces surrounding various modalities of Assertional Simulation, including such related platform-wide functionality as the competitive, collaborative and comparative components, the plethora of analytic and optimization services and other computational components provided within a Platform 1000 and described within this disclosure (and others which may be achievable by those fluent in these and related arts). Such ancillary and enhancement services and features extend throughout a Platform 1000 and the following enumeration of examples of these adjuncts and assistive elements should not be considered exhaustive nor fully comprehensive, but rather, as providing non-limiting exemplifications of the many ways that the core functionality of Assertion Simulation may be extended and enhanced, including (but not limited to) the various Assertion Simulation modalities of the, the computational and informatic byproducts, transient states and transformed forms which may be spawned in the course the execution of any of the modalities of Assertional Simulation, and the concomitant (but in embodiments, optional) skein of APM indexing and RAMS mediation facilities. These ancillary operations and extensions may be applied in context throughout a Platform 1000 and, in embodiments, are designed to be widely accessible for application within many user- and system-based functional blocks.

FIG. 3 provides an example illustration of the functional process and execution flow associated with the DTS-based (and/or DTS-enabled and/or DTS-accessible) methods and procedures and interfaces that compose the main ancillary capabilities that, in embodiments, may be applied to Reference Data Models. Noting at the top of FIG. 3, two data sources (Internal and External Data Sources 1300 and Current Reference Data Models, Assertional Models and Apportionment sub-Models 1301 provide data flow into the contiguous, unified blocks Manage Internal User Control, Interfaces and External Data and API Access 1104 (previously described in the foregoing) and Manage Selection and Acquisition of New, Supplementary and Ancillary Reference Data and Data Sets 1177. Additional control of this data and access is supplied by means the pervasive control signal Platform-wide Controls and Interfaces 1111. Data signal Selected Multi-Domain Data Sets 1304 provides the result of such operations (1104 and 1177) to compound function block Structure, Assemble, Filter, Normalize, Re-Reference Multi-Domain Data into Hybrid Domain DTS Reference Data 1180 (described in various descriptions and figures). FIG. 4 depicts processes that may be applied to Internal and External Data Sources 1300, Cardinal and Candidate Assertion Models and Apportionment sub-Models (1300 and 1209, 1210, 1206 and 1208). As shown in this example representation, functional block Select Existing Cardinal and Candidate Assertion Models and Apportionment sub-Models and Select Additional Data 1400 controlled by means of composite control signal 1111 select data from previous cited data stores (1209, 1210, 1206 and 1208) as well as from Internal and External Data Sources 1300, also cited in the foregoing (and shown in FIG. 3). Furthering this example processing flow, the composite functional blocks Create/Modify/Maintain Assertion Model Structure 1401 and Create/Modify/Maintain Apportionment sub-Model Values 1402 interact with Revised Candidate Assertion Models and Apportionment sub-Models 1403 from data stores 1209, 1210, 1206 and 1208. As shown in the variation depicted in FIG. 4, therefore, data from data stores 1209, 1210, 1206 and 1208 as well as from 1400, 1401 and 1402 via Revised Candidate Assertion Models and Apportionment sub-models 1403 may be presented to composite box Manage Assertion and Apportionment Models 1404. This block consolidates (again for pedagogic purposes) functional blocks Index Associated Information to Assertion Model Structure 1405, Permutation: Clone, Filter, Scale and Modify Assertion Model Structure 1406, Attach Ancillary Data Information to Assertion Model Structure 1407, Intangible Data: Attach & Reference Intangible Information to Assertion Model Structure 1408. Note that since most of the operations and capabilities represented in most of the functional blocks in FIGS. 3 and 4 have been described and represented in various figures and examples throughout this disclosure (except for 1308-1310 and 1405-1408 and data stores Enhanced Candidate Assertion Models 1410 and Enhanced Candidate Apportionment sub-Models 1411), and since these data stores and composite functional blocks retain their earlier titles and annotations, unless otherwise noted, in the following description, these previously described blocks as shown within this example process and execution flow operate with substantially the same functionality as in other cited instances. Note also that the functionalities depicted within FIGS. 3 and 4, as they apply to Reference Data Models (FIG. 3) and to Assertion Models and Apportionment sub-Models (FIG. 4) operate in similar fashion and the following explanations and descriptions may combine these functions without loss of specificity as may apply to the appropriate DTS Models, and without loss of general applicability to other contexts throughout the services provided within a Platform 1000.

Finally, note that blocks 1308-1310 and 1405-1408 are depicted as composited but adjacent collections of interconnected functionalities, and this is intentional as well as functional and pedagogical. The DTS-based (and/or DTS-enabled and/or DTS-accessible) content-sensitive and content-responsive methods and procedures and interfaces subsumed therein are, in embodiments, highly interconnected and share many common methods and interfaces and modes of operation, though, as mentioned, specific differences may indeed surface in practice and in context as these methods are applied in different DTS Models. Therefore, as in other such presentations and descriptions throughout this disclosure, this adjacency should not, in itself, imply or specify any particular computational sequences, any particular mandated executional arrangements nor any required order of execution, and neither should they specify or imply any required or particular order of precedence (unless otherwise specified). That is, in implementations and variations of DTS functionalities and DTS-enabled capabilities, any or all of these procedures may be arranged and interconnected as specific circumstances and context may require but which also accomplish the same functional goals. Thus, for example, functional blocks 1308 and 1310 may share some functionality and may interact with and share control, interfaces and information as required, though such interconnection may not be shown here.

Referencing FIG. 3 and FIG. 4, composite functional blocks 1308 ("Index and Associate Reference Data Sets to Associated and Ancillary Information 1308"), 1309 ("Permutation: Clone, Filter, Scale and Augment Reference Data Sets 1309"), 1310 ("Index, Scale, Augment and Modify Reference Data Sets with Intangible Data 1310") and their FIG. 4 equivalents 1405 ("Index Associated Information to Assertion Model Structure 1405"), 1406 ("Permutation: Clone, Filter, Scale and Modify Assertion Model Structure 1406") operate in substantially the same manner. This collective functionality makes available, singly or in any combination and in any sequence, a suite of variegated content-sensitive and content-responsive supplementary capabilities, any of which may be conditionally applied based on any system-based or user-referenced variable or state. These capabilities may be applied to any or all of the computation-produced products and system processes throughout a Platform 1000 as may be generated, modified, transformed or otherwise mutated. Such additions of and changes to existing computation products and system processes may result from (or may be implied by or may be inferred based upon) execution of any or all of the DTS-based (and/or DTS-enabled and/or DTS-accessible) methods and procedures and interfaces described in this disclosure and within variations and as may be present in concrete implementations.

The composite blocks 1308 and 1405 (FIGS. 3 and 4, respectively) represent an adjunct to the APM indexing capabilities described in the foregoing. Recall that, in embodiments, APM indexing is pervasive throughout operations within a Platform 1000 and has been cited as most often present in certain process structures such as interfaces within interconnected program elements. But elements that execute and manage and maintain the extended associational capability cited throughout this disclosure, and which make such indexing available as needed throughout the platform may, in some contexts be specific to one or more elements within DTS Models and related to derivative structures (as described in the foregoing). As noted in earlier examples and descriptions, the novel combinatorial and permutational capability that may be invoked (and is often an important characteristic) in modalities and variations of Assertional Simulation also spawn and mutate versions of associated information, and these are often defined and relevant to one or more nodes or groups of nodes within DTS Models. In many instances, this is not only context and DTS-model specific but must also be integrated into the variations associated with different content types, internodal structures and content-related domain-based differences, as described in the foregoing. Thus, functionality adjunctive to APM (as described previously) are presented as subsumed within blocks 1308 and 1405, providing an interoperable suite of DTS-based (and/or DTS-enabled and/or DTS-accessible) content-sensitive and content-responsive methods and procedures and interfaces.

Blocks 1308 and 1405 provide the ability for users and groups of users (and, in embodiments, system processes and groups of systems processes as well as discrete aggregates of information) to mandate the instantiation of supplementary information, to initiate association with such information and to execute logic associated with such information with respect to all information within the relevant DTS Models. As a consequence, for example, specific Reference Data Models (and any attached or associated data) may be indexed to a specific user or group of users (and, in embodiments, system processes and groups of systems processes as well as discrete aggregates of information) where such ownership imputed by operations within block 1308 may be executed, modified, and otherwise maintained by means of interfaces and procedures as described in the foregoing according to the information within control/data flow 1111, also as described. Further, as with other processes, such ownership imputed by operations within block 1308 (and in the case of Assertion-Apportionment pairs, block 1405) may operate according to limitations and parameters imposed by RAMS access and transaction mediation, as described throughout this disclosure. Finally, ownership imputed by operations within blocks 1308 and 1405 (and between other functional blocks as in the foregoing) may employ any aspect of DTS looped, iterative and recursive techniques and optimization modalities, as referenced previously.

Moreover, the composite blocks 1308 and 1405 may, in embodiments, index and associate one or more elements within the respective DTS Models to and with other associated and ancillary information not associated with those DTS Models and which may be referenced to other users and groups of users (and, in embodiments, system processes and groups of systems processes as well as discrete aggregates of information). This capability permits the instantiation and maintenance of both information stores and procedural methods and processes independently of a Reference Data Model or an Assertion-Apportionment pair but such that these data stores may be indirectly referenced to one or more specific elements within such Models. This associated and ancillary information may optionally also be indexed to (and thus owned by) one or more users and/or groups of users (and, in embodiments, system processes and groups of systems processes as well as discrete aggregates of information). But note that such ownership of such associated and ancillary information may be conditional in that a particular DTS Model (and thus any attached or associated data) in the original or some combinatorically spawned or permuted state, may also be indexed to that user or group of users. (and, in embodiments, system processes and groups of systems processes as well as discrete aggregates of information). Thus, the content-sensitive and content-responsive methods and procedures and interfaces within blocks 1308 and 1405 provide additional indexing of associated and ancillary information based upon permuting and dynamically changing ownership as executed by the APM interfaces and the RAMS access control and mediation, a capability that may arise and may be applicable in cases and in contexts that may require special mediation not only within the control purview provided by RAMS but, in variations, using purposed user and system interfaces.

The composite blocks 1309 and 1406 ("Permutation: Clone, Filter, Scale and Augment Reference Data Sets 1309", and "Permutation: Clone, Filter, Scale and Modify Assertion Model Structure 1406" in FIGS. 3 and 4, respectively) represent system-wide and pervasive capability that provides mechanisms by means of which a DTS Platform 1000 may execute the extensive and detailed combinatorial and duplicative functions as described in connection with various modalities of Assertional Simulation but which may be applied throughout the operations of the Platform. These include the variations of permutational operations exemplified by the described contexts as "clone-and-modify" operations, the suite of DTS-based (and/or DTS-enabled and/or DTS-accessible) content-sensitive and content-responsive methods and procedures and interfaces that may be invoked to execute duplicates (or clone) one or more elements within a DTS Model (or other aggregation of information) or sections thereof, where such sections may not necessarily be contiguous, nor necessarily drawn from a single version of a given data element or DTS Model. In variations, such cloned versions (or sections, as described) may be indexed by DTS using the content-sensitive and content-responsive methods and procedures and interfaces within blocks 1405 and 1408, thereby conferring a unique logical (and possibly physical) identity that may preserve ownership provenance and relation to those newly-spawned objects or which in some instances also permutes such associations.

The interconnected suite of DTS-based (and/or DTS-enabled and/or DTS-accessible) methods and procedures and interfaces subsumed within composite blocks 1309 and 1406 operates in conjunction with the functionality within composite blocks 1309 and 1406 to provide users and groups of users (and, in embodiments, system processes and groups of systems processes as well as discrete aggregates of information) extended combinatorial and permutational capability combined with the detailed content-sensitive and content-responsive and contextually dynamic indexing and provenance-preservation functionality previously described. These combined capabilities include but are not limited to functionality wherein: i) (one or more) elements within duplicated objects (as in the foregoing) may be optionally (reductively) filtered and/or elided (and/or selectively eliminated) and/or augmented such that the duplicated objects(s) upon which such filtering operations may be applied may also be indexed, thereby also attaining a unique logical (and possibly physical) identity distinct from the original progenitorial (that is, both original and pre-filtered) object(s); ii) (one or more) elements within duplicated objects (as in the foregoing) may optionally be scaled or otherwise modified in value; iii) (one or more) elements within duplicated objects (as in the foregoing) may optionally (and, again optionally, repeatedly) execute any combination of the foregoing operations and, using any or all resulting computational products, may augment or enhance (one or more elements) of the duplicated data with such additional information within each such iteration or epoch such that these operations (especially the filtering or augmentation aspects) as described in the various combinatorial modalities of Assertional Simulation and may be executed in any of the looped, iterative recursive operations and optimization procedures described in the foregoing.

Further, any of the computational results produced by combinations of the foregoing methods and procedures (and as may exist, for example, within iterations of looped operations, and as may be embodied within intermediate versions of the subject objects) may also (optionally) be instantiated as logically and physically discrete and unique (as in the foregoing) and these versions may be preserved and made available to other DTS-based (and DTS-enabled) operations. In variations, such operations may be applied repeatedly (optionally creating new (and possibly indexed and preserved) objects as a result of each iteration) such that any (or all) iteration(s) may be compared to other iterations, other objects and any number of metrics and where in the event that such repetitions produce different objects, such objects may be additionally and optionally be combined, compared and otherwise utilized by evaluative, normative and/or normalizing operations.

The suite of functional capability within composite blocks 1309 and 1406 have many practical and varied applications, including but not limited to the application of non-destructive analytic routines, such as, for example, situations where versions of Reference Data Models may be projected forward by applying linear regression algorithms upon certain elements within the data and recalculating and comparing results across different iterations. In this context, such results may be fed-back into previous stages in the derivation of Reference Data Models, even integrating new information as outlined in previous discussions.

Finally, composite blocks 1310 and 1408 ("Index, Scale, Augment and Modify Reference Data Sets with Intangible Data 1310", and "Intangible Data: Attach & Reference Intangible Information to Assertion Model Structure 1408" in FIGS. 3 and 4, respectively) subsume a collection of DTS-based (and/or DTS-enabled and/or DTS-accessible) content-sensitive and content-responsive methods and procedures and interfaces that may be contextually and dynamically assembled (as described in other connection in this disclosure) by means of which users and groups of users (and, in embodiments, system processes and groups of systems processes as well as discrete aggregates of information) may create and manipulate multi-factor and/or multi-dimensional quantitative (that is, numeric) measures of non-numeric qualities. These measures are called in DTS Intangibles or intangible quantities. Users (and/or processes) may deploy a variety of interfaces (offered through (and by means of) elements within compound control/data flow Platform-wide Controls and Interfaces 1111) to create, maintain, modify and parameterize these objects, providing numeric measures to ineffable or even descriptive qualities. The functionality within composite blocks 1310 and 1408 provide but one example of the content-responsive capability described throughout this disclosure in connection with many services within a Platform 1000 but as may be seen in DTS semantic de-referencing as well as various modalities of Assertional Simulation. DTS Intangibles may be invoked and parametrized and applied (and even dynamically created) in response to the presence of non-arithmetic information (or, in variations, information that may be numeric but upon which a normative overlay may be imposed) which must be processed but may also be combined with non-numerical qualities (or information inferred or extracted from such information).

DTS Intangibles should be understood in this context in the broadest possible sense since, in embodiments, they have nearly universal application to aggregates of information both within DTS Models and/or as may be attached or referenced to one or more elements within such DTS Models (as may be administered, for example, by one or more elements within blocks 1308 and 1405, as described in the foregoing) and which may be contextually invoked, created, modified and parametrized. These flexible and, in some contexts highly dimensional objects may be based upon and/or may be applied to and/or may reference (but may not be limited to (any of all) of the following (in any combination): i) qualitative (that is, non-numeric) data, information node(s) and/or point(s); ii) subjective evaluation (or opinion) as may be obtained from (one or more) users and entered by means of graphical or other user and/or system interfaces; iii) quantitative (that is numeric) data (as in the foregoing) that is mapped through one or more processes or procedures. In addition, any of types and variations of multi-dimensional DTS Intangibles may also be constructed or invoked or re-parametrized (dynamically, permanently and transiently) based upon (but not limited to) any computational results that may be generated by any or all operations described in this disclosure, including within the modalities of Assertional Simulation and which may be required in the course of execution of any aspect and within any computational context that may arise in the construction of hybrid-domain DTS Models. Variations of this responsiveness are broadly instantiated within a Platform 1000 and may include the explicit and implicit results produced by operations performed upon DTS Models, upon forms and variations of DTS Models, upon ancillary and associated information associated with DTS Models and their various forms as well as results based on operations executed upon other information that may be internal or external to the DTS Platform 1000.

As may be expected, any such information that may be explicitly or implicitly supplied by application of one or more such DTS Intangible structures may be indexed to or otherwise associated with any DTS user, entity or object (as in the foregoing) and may be included within any of the other composite blocks within the blocks depicted in FIGS. 1-4 and other figures and descriptions within this disclosure. Moreover, any or all the previously described operations and methods to create and manipulate DTS Intangibles may be included within any DTS looped, iterative, recursive, and optimization operations As with any such operations, the DTS-based (and/or DTS-enabled and/or DTS-accessible) methods and procedures and interfaces associated with the creation and manipulation of DTS Intangibles as well as the products of such operations operate under RAMS access control and mediation.

The output of these operations, however they may be invoked or executed, as described in the previous descriptions is represented by control/data flow designated by callouts 1311 and 1049 ("DTS-enhanced Reference Data Models 1311", and "Assertion Models and Apportionment sub-Models augmented by Ancillary, Associated and Intangible Data 1409" in FIGS. 3 and 4, respectively). In FIG. 3, the output control/data flow 1311 is presented in two places: to the previously-described composite block combination of 1117, 1219 and 1220 (in FIG. 2 and other figures; and is added to the collection of Candidate DTS Models represented by data stores 1206 and 1209 ("Candidate Reference Data Models 1206" and "Cardinal Reference Data Models 1209", respectively, as depicted in FIG. 2 and other figure) and made available to other processes throughout a Platform 1000.

In many situations, modeling and simulation activities involve sensitive information of an enterprise. This may include information that only can be accessed or used by certain individuals inside the enterprise or that can only be shared under conditions, such as confidentiality agreements, with specific individuals outside the enterprise. For example, the chart of accountants of a business may contain highly sensitive information that managers of the enterprise may wish to maintain confidential except with respect to a very small set of individuals. However, certain information contained within confidential information like a chart of accounts may be very useful for modeling and simulation activities such as those contemplated throughout this disclosure. Accordingly, a need exists for a system for controlling access to the information used in the platform.

In many cases, the modeling and simulation activities that can be undertaken using the platform can be quite sensitive. For example, each of a series of Models that proposes a different apportionment of costs across the profit centers of an enterprise could, if adopted as a definitive apportionment, have a significant impact on the personnel within the profit centers, such as affecting any profit-based compensation that would be awarded to the personnel. A manager or modeler using the Platform 1000 to explore different apportionment approaches may wish to confine access to the alternative Models to a very limited set of individuals. Meanwhile, some other modeling activity (potentially using at least some of the same underlying information) may be underway, for which an entirely different confidentiality arrangement needs to be applied. Accordingly, a need exists to provide quite granular control not only over the underlying reference information used to create Models, but also over the contents of Models themselves (including Reference Data Models, Assertion Models, Proposal Models, Apportionment models, etc.).

In some cases, access to information handled by the Platform 1000 (such as in the various Models described throughout this disclosure) may need to be controlled based on the context of the proposed use. For example, in some cases information, such as in an accounting system, about a small series of transactions might not be very sensitive (because each is a small part of the overall picture), but cumulative information about all such transactions might be much more sensitive (as it might provide significant insight about the business). In other cases, (such as in cases involving regulated personally identifiable information (PII) or sensitive health care information) the opposite may be true. Aggregate information might not be very sensitive, while data relating to individual transactions might contain highly sensitive information. Accordingly, a need exists for an access control system that is context-sensitive.

In embodiments, the access control system may include a content/context-based, object-based security and access control system that can be applied to a variety of multiple-user, content-diverse computational environments. In embodiments, the access control system is referred to herein as Recombinant Access Mediation System (RAMS), and references to an access control system should be understood to encompass embodiments involving a Recombinant Access Mediation System except where the context indicates otherwise.

Access control is a requirement, for example, when using the platform described herein for accounting applications. By providing modeling tools to managers at different levels within a company, those managers may need to have access to elements of the company's Charts of Accounts (COA), which may be sensitive. More generally, platform users likely would have limited access to data within a traditional permission scheme. But in order to actually utilize many features within the platform described herein, users would (in many likely scenarios) require access, at least certain kinds of access and within certain operational modes.

As noted above, due to the need to access (and control access to) sensitive information in order to both use and protect the information of an enterprise, an effective access control system for the platform described may need to be modulated to accommodate the requirement that users be able to access (in some fashion) otherwise-forbidden information since that very information may frequently need to be included in various platform-enabled calculations. Specifically, platform-enabled capabilities (such as undertaking a budgetary projection or creating a "what-if?" scenario) would, in most cases, require a degree of computational access to a company's financial data that would likely exceed that permitted for most users within an enterprise.

In embodiments, to enable access control, systems may be provided which include elements of object-based, attribute-based, user-centric and/or central policy-based designs. For example, some access control features may use elements of a Role-based Access Control (RBAC) approach, such as modeled on a read-write-view permission scheme (such as used in UNIX) (which in turn may be mapped to role-centric hierarchical structure). However, conventional RBAC may lack the flexibility to handle the requirements of complex simulation and modeling activities. For example, as noted above, many valuable simulations may involve information (such as information in the chart of accounts) that varies in sensitivity based on the context of the information, such that merely assigning a set of roles that have permission to access the information is not sufficient to handle the context-dependence. These challenges may be present not only with respect to accounting information like the chart of accounts, but to various other heterogeneous data sets, such as the non-nested, subsumption hierarchical structures described elsewhere in this disclosure, as well as other data sets used in the data science industry, such as for business analytics. In fact, any system that provides sophisticated transformational or re-organizational capability may benefit from an access control fabric that adapts to that transformation and/or re-organization. The platform described herein enables various embodiments of extraction of data and transformation of information drawn from various often heterogeneous data sets, where the permission structure that may have been imposed on the data set(s) prior to Assertional Simulation using the platform may not comport with realistic post-operational requirements (such as for use of the Assertional Simulation). The prior permission structure may be, for example, both under-inclusive (such as forbidding access to underlying data needed by users to run the simulation) and over-inclusive (such as permitting access to results of the simulation to those who had access to the reference data but should not be permitted to see the simulation).

If an access control fabric is to be secure and effective, it must typically balance flexibility (with respect to requirements that may change as the structure of the data changes) with potentially burdensome requirements for human-mediated supervision. Accordingly, an adaptive access control system may be beneficial for a wide range of data science systems, ETL systems, and the like, including for the platform described herein. Thus, in embodiments, the RAMS described herein may be used for any data management system wherein data is re-structured but must still retain access control.

An embodiment of a RAMS is provided below, described in the context of departments of a business; however, it should be understood that embodiments that involve a wide range of data sets are intended to be encompassed herein, except where the context indicates otherwise.

Figure 24:
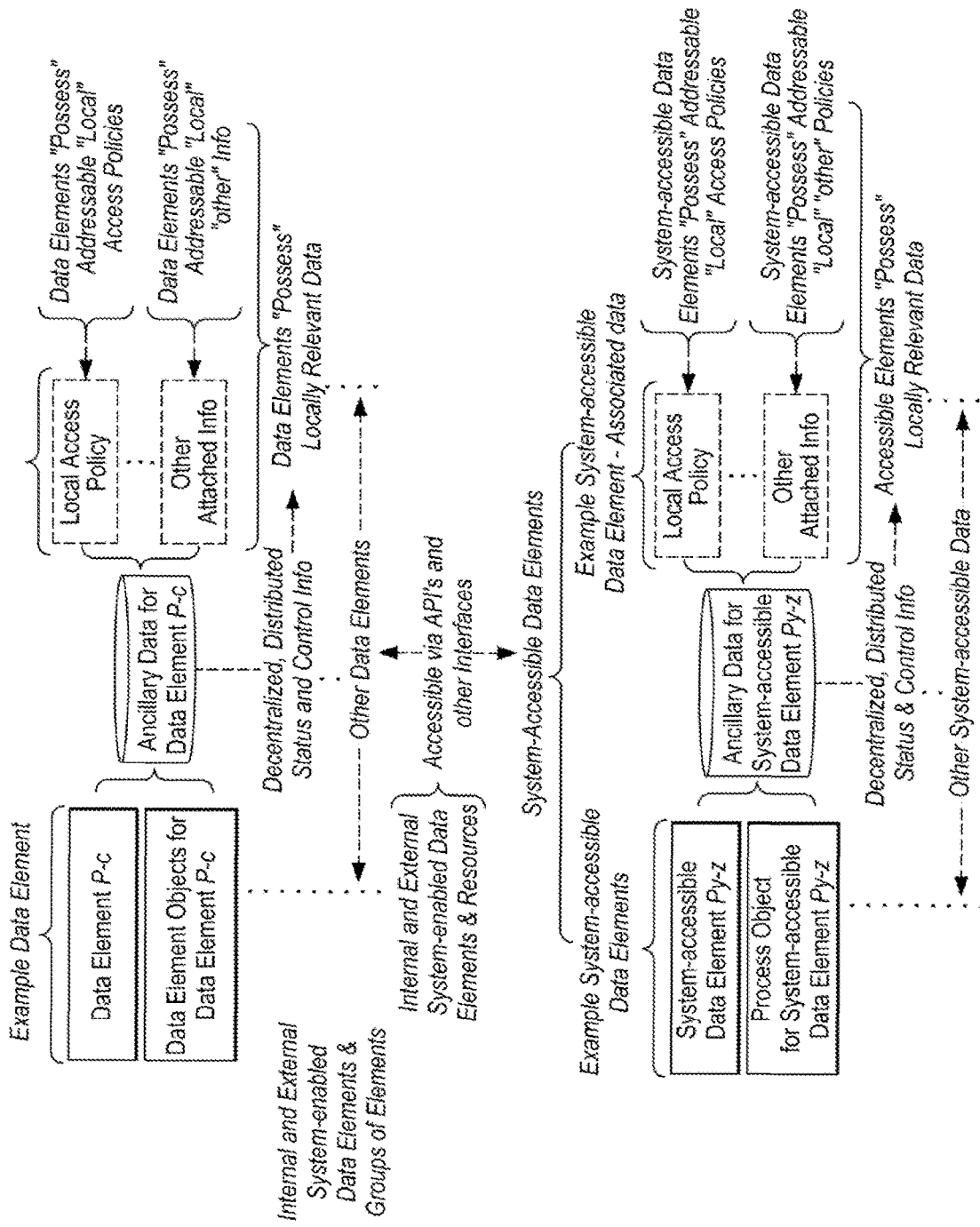
FIG. 24 illustrates association of internal and external system-enabled data elements and groups of elements.

Referring to FIG. 24, Manager A and Manager B are assumed to be responsible respectively for parallel Department A and Department B, each reporting to Manager 1 within Department 1 of an enterprise. Department A and Department B are assumed to be subordinate to Department 1 in this example. As shown in FIG. 24, Manager 1 has multiple departments under management and in most enterprises, would typically have full access to all the accounting information within those subordinate departments, while Manager A and Manager B might have access only to accounting information for their respective departments.

An enterprise might have many departments reporting up in this form; however, without limitation, the impact of a RAMS approach may be seen in the respective (and relative) access rights provided to Managers A and B with respect to accounting information associated with (and as may apply within) their respective departments.

In an embodiment, Department A and Department B may be modeled as profit centers A and B within profit center 1 of an enterprise, and the enterprise's chart of accounts may have been mapped (such as using projective modeling) such that income and expenses have been allocated to each department. As noted, one may further assume that it is company policy, as typical, that Manager A has full access rights only to all the chart of accounts items associated with Department A and that, likewise, Manager B has full access rights to only all the chart of accounts items associated with Department B. Assume further that managers of other "siblings" departments (ones that report directly to Department 1) have the same circumscription of rights to their departments. As noted above, the manager of the "parent" department (Manager 1) is assumed to have full rights to information attached to the "child" departments. Thus, note that there is at least some information attached to Department B that Manager A cannot access, and vice versa. In this example, such information would be called "sensitive" and would carry one or more access restrictions, such as restricting access to Manager B and Manager 1 for the sensitive information of Department B, etc.

Figure 25:
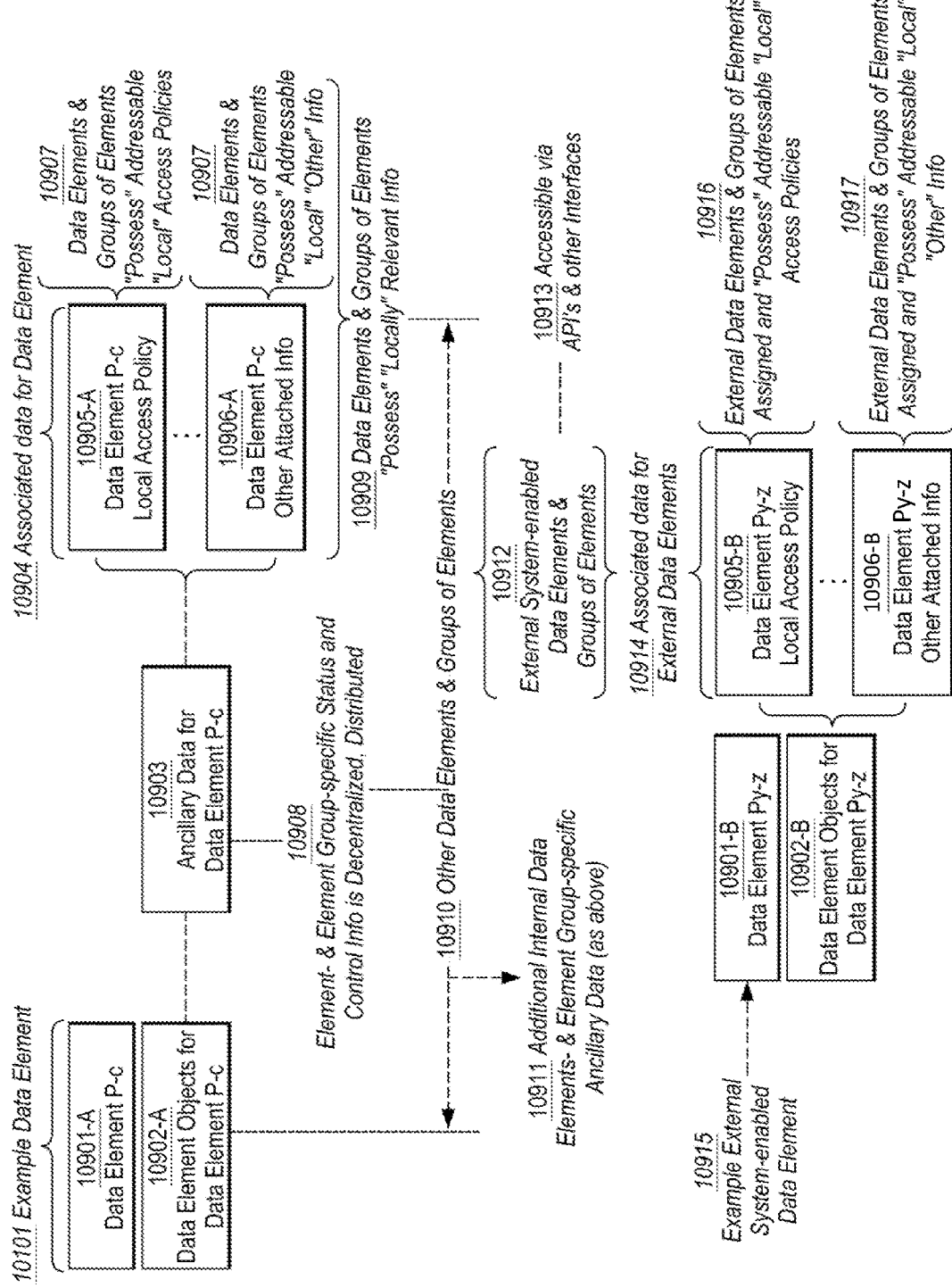
FIG. 25 illustrates association of local access policies to various data elements.

FIG. 25 illustrates the challenges where restrictions imposed by company policy are applied in the context of an Assertional Simulation.

In the course of normal activity associated with the platform as described in various embodiments described herein, any of Manager A, Manager B and Manager 1 could be expected to use projective modeling and simulation, such as to explore the impacts of the allocation of indirect expenses under their management. These activities can include forward projection (as in budgetary proposals), "what-if?"-type backward projection (wherein a manager can create results based on proposed changes to the Assertional Models (or even to Reference Data Model sets), as well as the application of many visualization, "drill-down" and statistical analytic techniques. As may be expected in a typical accounting environment, each "subordinate" or "sibling" profit center (mapped as Departments A and B—as well as those not shown) shares resources allocated to the parent profit center (Department 1). Thus, for example, Department 1 (the parent) may have $X allocated for the (designated-by-accounting) indirect portion of marketing expenses, and each subordinate department within Department 1 (that is, the children of Department 1) would assume a portion of that cost, perhaps with some portion also be applied to the parent Department 1 in order to account for the administrative cost associated with the parent's role of this aspect of the business. But suppose that the COA item "marketing" (within the indirect expenses tree) has subordinate COA items, some of which are "sensitive" (as defined by company policy). In this context, this means that based on the foregoing, only Manager 1 would have access to all the information of Department 1, while the respective managers of the subordinate departments would have full access to the sensitive items assigned to their departments, but not to those assigned to their sibling departments.

In a typical modeling activity, there may be a Cardinal version of the profit center cost Allocation Model, one reflecting the "officially accepted" allocation of resources as they are mapped (e.g., proportionally) to the various profit centers represented by the Departments. In order to arrive at this Cardinal Outcome Model, there may have been various Assertional Simulations (such as involving reapportionment, scaling, and the like) and, to the degree that there were disagreements, resolution may have been reached. When business centers compete for shared resources, there will typically be some disagreement, negotiation and compromise, and the platform may be used to model various assertions and Outcome Models as described throughout this disclosure. However, as noted above, Managers A and B, who would typically contribute to this activity (and who have a stake in the Outcome Model) are not permitted (in a typically access control system) to have full access to the information they may need, despite the fact that it is stipulated that only SOME of the data is "sensitive" (that is, only a subset of the data has limited access). This complexity is not atypical: indirect employee expenses often include confidential items, such as benefits and other payments to that employee (assuming, for this example, that the enterprise structures salary as a direct expense and associates other indirect expenses with each employee), whereas some other expenses have no sensitivity and thus could be accessible to anyone.

Further, in a typical environment, the hierarchy composed within these items can be quite deep (e.g., as deep as 6 levels or more) and thus, each node in the hierarchy can have different access rights. These restricted nodes can be somewhat randomly distributed throughout the structure.

Also, note that this data is typically dynamic and may change month-to-month and even simulation-to-simulation. Moreover, every time period may be composed of different nodes and different access requirements, company policy may stipulate changes to any set of access rights, and new managers may arrive that may carry different privileges.

Also, apart from changes with respect to a time-evolving Cardinal Outcome Model, the platform also provides the capability to create proposed changes to allocations that inherently involve (and may create) sensitive data. Manager 1 may, for example, propose changes to Department 1 in a budgetary proposal that could, for example, add new employees (or move employees from other departments). Details of such employee-related indirect costs may be confidential, yet other managers who may be called upon to evaluate (or propose changes to) this Model. In these cases, the appropriate managers may not, in a simple, department-based access control approach, have the required access to fully evaluate the consequences. Accordingly, an access control system is needed that balances the need to protect information with the need to enable Assertional Simulation Modeling, such as for cost accounting and other activities. Any ETL scheme, such as for data science, including business analytics, where data is restructured (regardless of the mechanism by which this is done, whether using Assertional Simulation Modeling or any other system), will tend to have the same issue, where at least some of the subject data has access limitations prior to application of the ETL processes and the post-transformed data needs to have at least some access restriction.

In many cases, post-transformation data may be cast within a new ontological frame and may be governed by a different vocabulary-defined relationship structure. Thus, in practical terms, the pre-transformation access restrictions may not map effectively to the re-structured data (and in fact do not map in a formal, mathematical sense).

Therefore, any system that needs to preserve the fidelity of access restrictions across pre- and post-transformation operations may require a restatement of these restrictions within the new reference frame. The RAMS described herein preserves access restrictions across transformation operations (pre- and post-transformation) and provides for restatement of restrictions within one or more new frames of reference.

Returning to the example of a projection involving the chart of accounts of an enterprise, among challenges addressed by the RAMS are the need to avoid inappropriate disclosure of accounting data elements, such as via direct access (wherein a given user must be prevented from directly accessing information forbidden to them, where the access may result from intentional, deliberate and rational manipulation by a user or accidental circumvention of a disclosure expectation such that a user may, in the course of permitted activity, gain access to which they not entitled) and via inferential access (wherein a given user may be able to deduce or otherwise determine the nature and value of data forbidden to them based upon information to which they have access). The RAMS may thus address practical hazards (by implementing robust, system-based solutions that prohibit accidental and inadvertent circumvention that may occur in the course of permitted system activity) and moral hazards (by implementing robust, system-based solutions that address the "clever-user" problem wherein a user may manipulate information access within the constraints of activities permitted to them but such that (with intentionality) the user may determine (or otherwise obtain or infer) prohibited information). The RAMS may also avoid limitation of the capabilities of the platform for modeling and simulation; for example, the RAMS may help avoid prohibition of access to information required for a simulation where that simulation activity is otherwise permitted for a user (such that a permitted simulation activity may fail to be executed or may execute but may produce incorrect or anomalous results and/or such that the results of a permitted simulation activity might not be investigated or "drilled into" as typically desired in use of the platform). The RAMS may also avoid access delimitation that precludes proper calculation of results as a result of one or more elements contributing to the results are inaccessible to a user.

Accordingly, the platform may include an access control system that governs access to information using the platform (such as information contained in one or more informational Models, such as Reference Data Models, Assertion Models, Proposal Models, Partitioning models, Apportionment models, etc.). The access control system may include or use components or sub-systems that provide for authentication of a user's identity (such as password controls, biometric identification, multi-factor authentication, etc.), components of sub-systems for rights managements (such as for data rights management, such as providing for role-based permissions that govern what users or roles are permitted to access what content or information for what purposes), and supporting components and sub-systems to enable the foregoing (such as cryptographic key management systems, including public and private key cryptography systems). In embodiments, the access control system may be a content-adaptive access control system. Thus, a content-adaptive and context-adaptive access control system may be provided as part of, integrated with, or associated with a modeling and simulation system, which may include a modeling and simulation system for projection of portioning and/or apportionment schema upon one or more Reference Data Models, such as to produce one or more Outcome Models for each projection. References to an access control system throughout this disclosure should be understood to encompass embodiments that involve such a content-adaptive and/or context-adaptive access control system, except where the context indicates otherwise. The access control system may provide access control to the platform, as well as for one or more Reference Data Models (also referred to in some cases herein as Subject Models, one or more Proposed Partitioning Models (which may include, for example Assertion Models and/or Proposal models), one or more Apportioning sub-Models and one or more Outcome Models. As noted elsewhere in this disclosure, an Outcome Model results from the simulation of Proposed Partitioning Models and/or Apportioning sub-Models upon the Reference Data Models, such that one or more of the Apportioning sub-Model and the Outcome Model may be attached to (and optionally take the structural form of) a Reference Data Model or a Proposed Partitioning Model.

The access control system may control access by one or more users, such as users within an enterprise or users between enterprises, such as users of an enterprise network, a cloud resource, a hosted environment for collaboration, or other environment enabled by information technology components, such as networking and computing components described throughout this disclosure.

As described throughout this disclosure, an Assertional Simulation may be initiated using the platform, which may be populated, parameterized, modified, viewed, accessed, copied, or otherwise acted upon by one or more permitted users (which may include users specified by individual identity, by role, by group, or the like). The Assertional Simulation may use an Assertion Model for modeling the impact of an Assertion Model for modeling a proposal. An Assertion Model may optionally include an Apportionment sub-Model, which may be subordinate to the Assertion Model. The Assertional Simulation may project the Assertion Model (with any applicable Apportionment sub-Model) across one or more Reference Data Models to produce one or more Outcome Models. In embodiments, the elements composing each Assertional Simulation are each uniquely assigned to and associated with a defined user, group, or role, such as, in embodiments, the initiating user or a group or role defined by the initiating user. In alternative embodiments, the access controls for the elements of an Assertional Simulation may be defined by a manager of an enterprise, by an administrator, or the like.

In embodiments, the access control system may include a content/context-based, object-based security and access control system that can be applied to a variety of multiple-user, content-diverse computational environments. In embodiments, the access control system is referred to herein as Recombinant Access Mediation System (RAMS), and references to an access control system should be understood to encompass embodiments involving a recombinant access mediation system except where the context indicates otherwise.

The RAMS may encompass a novel combination of a number of access security components to provide content- and context-aware control at a granular level of the elements used in an Assertional Simulation or other activity that involves diverse, multi-party access to, and/or creation of sensitive data, such as of an enterprise. This may include a wide range of activities involved in modeling, simulation, and business analytics, including activities of the type disclosed in the use cases described herein.

Figure 15:
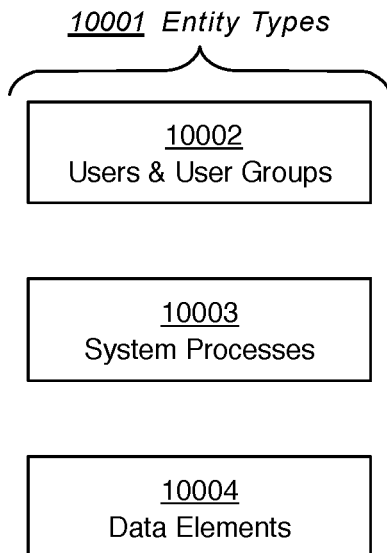
FIG. 15 illustrates certain entity types that may be involved in DTS Assertional Simulation.

Referring to FIG. 15, an access control system is provided, which in embodiments may comprise an adaptive, decentralized access-control, privilege administration and execution-regulation system. The access control system may be applied to multi-user and/or multi-process environments. In embodiments, the access control system is the Recombinant Access Mediation System (RAMS), which may consist of a collection of components, processes, procedures, and modules as more particularly described herein. The RAMS is a mediation system in that upon a triggering event it mediates access control and regulates execution in situations where computational activities involve constituent entities that are subject to access control policies. The RAMS is recombinant in that upon the triggering event it may synthesize a policy using the various access control policies that apply to the constituent entities that are involved in a given computational activity that is governed by the RAMS. More particularly, the RAMS is event-triggered and is initiated by one or more computational events, each referred to herein as a "RAMS-eligible computational event." RAMS-eligible constituent entities can initiate, contribute to and participate in one or more RAMS-eligible computational events. Each RAMS-eligible constituent entity may be associated with (such as by being indexed or bound to) an access policy, referred to as applied to a given constituent or entity as a "local access policy" for that constituent entity. The local access policies may be stored in a data store, such as being subsumed within a more general information store relating to the constituent entities, referred to herein as the entity-associated ancillary data 10101 store. Upon initiation of a RAMS-eligible event, RAMS-eligible constituent entities submit (and optionally may mutually exchange) their respective local access policies to the RAMS, which in embodiments may occur by reference to the entity-associated ancillary data 10101 store within which the applicable local access policy is stored. Upon of a RAMS-based event, one or more RAMS procedures (among various methods and procedures that may be associated with the control fabric of the RAMS) may generate and store one or more event access control policies. Each event access control policy may be synthesized by the RAMS for (and may be indexed to) the particular event that triggered the use of the RAMS and for the particular entities involved in the event. The event access control policy is synthesized by the RAMS based on the access privileges assigned to each of the RAMS-eligible constituent entities, e.g., by recombining the access privileges assigned to each of them as reflected in the local access policies stored in the entity-associated ancillary data 10101 store (or pulled from or supplied by any other source of such local access policies). Thus, the event-triggered policy synthesis process (created "recombinationally") may be understood as a RAMS-executed "mediation" or reconciliation of the collective access information submitted by or applicable to RAMS-eligible constituent entities. It may be noted that in some instances, a synthesized event policy may be re-applied to an identical event, such as where all the participating elements are identical, and all participating elements retain identical access information. In these cases, the synthesized event policy may be saved (and re-used) in subsequent RAMS-controlled computations. Such re-use may help optimize the RAMS operations (such as by bypassing repetitive operations). Saving event access control policies may also be used to create logs and "audit trail" information.

FIG. 15 illustrates a general expression of the "entity-centric" modeling of the RAMS architecture, where constituent entity types include users, system processes and data elements that may have local access control policies and may be involved in computational processes, access requirements, or the like that benefit from event access control policies like those created using the RAMS. Entities may include, in embodiments, users (including, as applicable, user groups) 10002, system processes 10003, and data elements 10004.

A "user" may represent one or more operators or agents (or, in variations, automated or semi-automated proxies which may act on behalf such operators or agents, where any such "user" may, in some contexts and applications, comprise combinations of the foregoing) that may assert control and/or may interact with a system that uses the RAMS (e.g., where access control for some aspect of the system is under RAMS control). These may include individuals or groups of humans, enterprises and other legal entities, and semi-automated or fully automated agents, such as computational agents. Each entity may represent a distinct operational construct operating in the context of the RAMS (e.g., interacting with or within a control fabric of the RAMS), such as through one or more interfaces.

Figure 16:
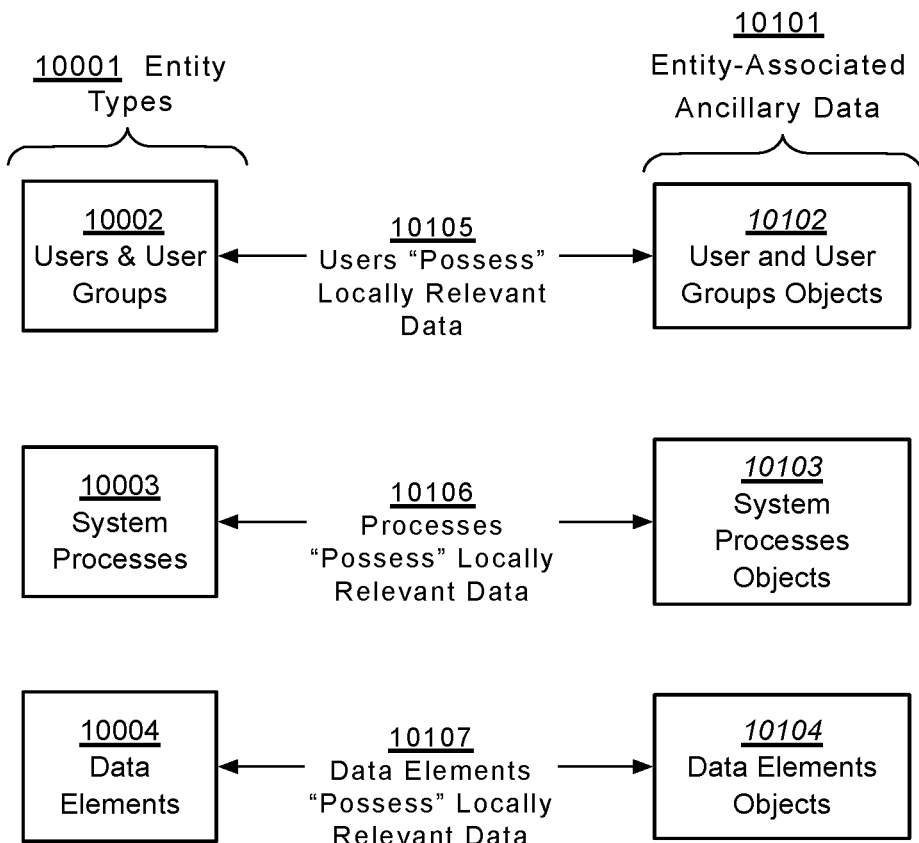
FIG. 16 illustrates relationships between entity types and entity-associated auxiliary data in execution of DTS Associational Process Management and DTS RAMS and DTS TCM.

FIG. 16 illustrates the association of ancillary data with entities, where each type of entity "possesses" or "owns" associated, locally relevant entity-associated ancillary data 10101, as denoted by elements 10105, 10106 and 10107, respectively. Thus, users 10002 own user (and user groups) objects 10102, system processes 10003 own system process objects 10103 and data elements 10004 own data elements objects 10104.

Note that the RAMS-based entity-associated ancillary data 10101 refers to "local" data associated for each of the entities, where "local" may be defined within RAMS in terms of computational context (e.g., associated with a local computational capability or storage system), in terms of informational content (e.g., the content is local to a particular user or group of users, such as having been created by that user or group), and the like. In general, locality of the data reflects and composes information germane to the logical (and in some cases, physical) disposition of the referenced entity, where the information composed within the entity-associated ancillary data 10101 (and/or within the applicable local access control policy) may include, without limitation, the identity of the associated entity (such as, for example, one or more cryptographic signatures, passwords, or other unique identifier(s)), where such information may include one or more tokens (as in the foregoing) which may serve to validate or otherwise verify the identity and/or disposition of the associated entity.

The data structures and information composed within the entity-associated ancillary data 10101 may also include one or more blocks which may (directly or indirectly) represent or encode (and/or optionally encrypt or otherwise obfuscate) privileges, such as computational privileges, exchange privileges, access privileges, associational rights or licenses, and the like, as well as other computational dispositions. Such information relative to access and privileges may compose the local access policy germane to that entity. Such local access policy informational blocks may be accessible via a bi-directional exchange interface as may be applied to and from other discrete entities. In other cases, the exchange may be multi-lateral and/or multi-directional, involving many entities (as may be seen in broadcast or publish-subscribe architectures). In the context of a RAMS-triggered event, one or more entities may attempt to associate with, use or otherwise process the information encompassed by and/or referenced by the associated entity.

The information composed within the entity-associated ancillary data 10101 may further include one or more discrete conditional and/or logical formulations wherein local or system-based (or system-accessible) or user-initiated conditions may be specified, on the basis of which information may be, for example, accessed, indexed or otherwise associated with a discrete entity. While often primarily informational, such entity-associated objects may also contain or may reference executable logic, conditional procedures and other constructs that can be processed for most than merely informational purposes.

The information composed within the entity-associated ancillary data 10101 may also include one or more informational blocks (or references to other informational blocks) that may represent or encode past interactions, such as may have been executed within a previously executed RAMS-based event. Such a history may represent or encode, for example, the disposition of or with respect to the associated entity within such events.

While in certain examples provided herein regarding a RAMS system, the entity-associated ancillary data 10101 structures are informational only, entity-associated ancillary data 10101 structures that include executable logic, conditional procedures, or other operational elements are intended to be encompassed, except where the context indicates otherwise.

Figure 17:
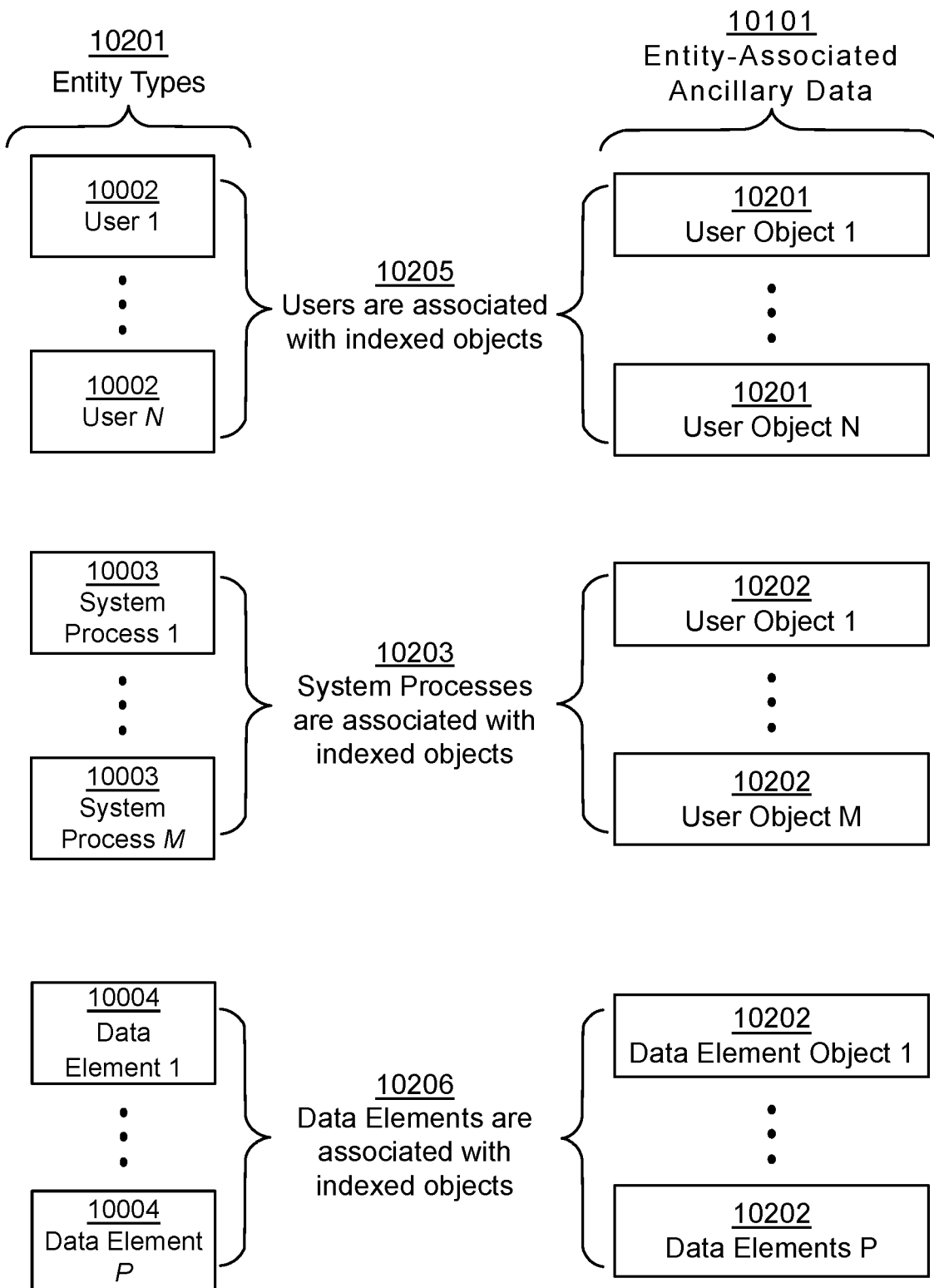
FIG. 17 illustrates indexing entities with objects in execution of DTS Associational Process Management.

FIG. 17 illustrates an embodiment of a data architecture for a RAMS system involving entity-associated ancillary data 10101 structures, such as may be deployed in a computational system that enables a community of users, having a suite of system-based (or system-enabled) procedures and processes and system-resident (and system accessible) data elements. In this example, users, system processes and data elements are each respectively associated with indexed entity objects. Various users 10002 may be associated with indexed user objects 10201 in a process 10205. Various system processes 10003 may be associated with indexed system process objects 10203 in a process 10203. Various data elements 10004 may be associated with data element objects 10202 in a process 10206.

However, entities and entity-associated ancillary data 10101 structures need not always be handled as separate, discrete elements. For example, in practice (and in some implementations) ancillary data structures may be integrated with or subsumed within the subject data structure for an entity; however, such integration or subsumption does not diminish the discrete and separable nature of that information in the context of the functionality provided by the control fabric of the RAMS. Thus, in the disclosure herein relating to RAMS, the entity-associated ancillary data 10101 structure, whether or not explicitly shown, is assumed to be present and logically (and in some cases, physically) distinct and discrete.

An embodiment of an entity-associated ancillary data 10101 structure used in a RAMS system may comprise a certificate. Such a RAMS certificate may comprise a standalone entity-associated ancillary data 10101 structure with which the RAMS system may operate or may optionally comprise an element within an informational store that has a broader purpose than the RAMS system. Thus, except where the context indicates otherwise, in this disclosure a RAMS "certificate," an "entity-associated ancillary data 10101" and the "local access policy" embodied in a certificate or entity-associated ancillary data 10101 structure may be understood to serve the same or similar purposes, and references to one of them should be understood to optionally encompass similar embodiments that use any of them.

In embodiments, the information exchange surrounding a RAMS-based event may utilize subsets (e.g., "tokens") of an entity-associated ancillary data 10101 structure, such as a RAMS certificate. RAMS certificates and tokens may be uniquely indexed to or referenced by one or more entities. In some embodiments, RAMS operations may include both certificates and tokens, such as where a RAMS certificate comprises a superset of the information typically composed within a RAMS token. In embodiments, a RAMS certificate may contain more than one token. A RAMS token may in some cases contain less control information than a certificate, but a token may typically compose a RAMS-valid identifier of its associated entity.

RAMS certificates or tokens may be associated with or indexed to RAMS-eligible constituent entities in numerous (typically non-exclusive) arrangements, including without limitation any or all of the following (as well as in combinations of the following). In embodiments, a central, global repository (such as a registry) may be provided composing a system-wide information store accessible to RAMS-eligible constituent entities. In such embodiments, one or more certificates or tokens may be composed within this central store and indexed to (or otherwise associated with) one or more RAMS-eligible constituent entities. In some cases, such repositories may be logically and/or physically arranged by a type of RAMS-eligible constituent. In other embodiments, a partitioned global repository or registry may be provided reflecting a sectioning of an otherwise system-wide global store (as in the foregoing example), such that the partitions integrate a limited access scheme for RAMS-eligible constituents based upon one or more partitioning criteria, such as system partitioning, user partitioning, and the like. In embodiments, a peer-based, decentralized distribution of certificates or tokens may be provided, wherein RAMS-eligible constituent entities integrate one or more RAMS certificates or tokens within or associate one or more RAMS certificates or tokens with the logical structure of the entity. A RAMS overlay may integrate more than one of the foregoing configurations, such that, by its recombinatorial nature, RAMS permits dynamic re-organization of these configurations (both transiently and permanently) depending on computational, content and other system- and user-based contexts, as well as based on input and other conditions.

RAMS certificates or tokens (as may be distributed as noted above) may be exchanged by means of numerous (non-exclusive) techniques, including without limitation any one of or any combination of the following. In embodiments, centralized or global certificate and/or token management may be provided, wherein the RAMS control fabric is managed by a centralized set of methods of procedures within or accessible to the system. In embodiments, partitioned certificate or token management may be provided, where a global or centralized system is partitioned. In embodiments, peer-to-peer (including intra-constituent and inter-constituent) direct exchange of certificates may be enabled. In embodiments, a RAMS overlay may integrate more than one of the foregoing exchange techniques, such that, by its recombinatorial nature, the RAMS permits dynamic redefinition of these deployment configurations (both transiently and permanently) depending, as in the foregoing, on computational, content and other system- and user-based contexts, input and other conditions.

RAMS certificates or tokens may optionally integrate one or more cryptographic and/or encoding techniques wherein RAMS certificates (or tokens) may integrate (or otherwise possess or may be indexed to) one or more unique cryptographic keys, signature(s) and/or other authentication-related elements. Such techniques may be used for any number of reasons including without limitation verification and/or validation of the identity of the RAMS-eligible entity, verification and/or validation of the information within the certificate or token, and/or verification and/or validation of the computational context within which the RAMS-eligible event may be executed. A typical RAMS-integrated validation scheme may include one or more methods and procedures. For example, a validation scheme may generate multi-party homomorphic keys, homomorphic signatures and other similarly configured multi-party authentication-related encodings, distribute such keys and signatures and encodings, and validate such keys and signatures and encodings, thereby validating the associated information. Such methods and procedures may be organized in any number of configurations as in the foregoing, ranging from global-based to partition-based to peer-based process implementation, or combinations of them. Such validation techniques may be dynamically and conditionally invoked, bypassed or modified based on upon any number of conditions, including but not limited to the system context, specific content within or related to a RAMS-eligible event and/or one or more qualities contained within, composed within, referenced by, related to, and/or associated with one or more of the participating entities. Such conditional invocation criteria may be system-based and/or user-invoked and may be applied at the system-wide or applied locally to one or more subsections within a system.

The RAMS may be seen as at least partially entity-based in that, as described in the foregoing, certificates, tokens and associated local access policies may be bound to an entity (or group of entities). As described, RAMS-eligible entities include but are not limited to any or all of the following (or logical representations of the same): system users and/or groups of users, system-based (or system-accessible) processes and procedures and/or groups of such processes and procedures, and data elements and/or groups of data elements, as well as various combinations of the same that may be composed within or accessible to the system in which the RAMS is used or with which the RAMS is integrated or associated. Variations of RAMS implementations may further include "hybrid entities" that may combine one or more properties associated with any of the foregoing entities. Such "hybrid entities" may, for example, include devices and/or groups of devices. Such devices and/or groups of devices may, in some cases, be contextualized as "entities" within the system, thus possessing one or more of the characteristics of the foregoing entities. For example, a user's dedicated device may in some cases be treated as the user for purposes of the RAMS. In embodiments, certificates, tokens and associated local access policies may be permanently or transiently bound to one or more subject entities based upon various factors, such as computational context, event-related criteria, and/or a specific (e.g., ontologically-defined) content-based characteristic within or associated with the subject entity (such as a meaning that may itself be fungible). Records or binding history may be maintained and referenced and/or reused for various purposes.

Based upon this entity-centric nature, the RAMS control fabric may be optionally and dynamically applied and/or extended throughout a system or part therefore to manage access, interaction and association to, by and among users, data elements, and system processes.

RAMS-based recombinatorial mediation may modulate and control (optionally and contextually) on a per-element and selective basis permission-based functionality encompassing, but not limited to, any or all of the following. In embodiments, RAMS mediation may limit or permit access to and between constituent entities. In embodiments, RAMS mediation may conditionally attenuate or extend access to, by and among constituents. In embodiments, RAMS mediation may also add, elide, edit or otherwise modify policy-based (or policy-derived) logic as may apply in the context of a subject event and with respect to any subject entities. Such access-related adaptations or mediations may be applied to any or all of a wide range of inter-entity and intra-entity arrangements. These may include execution of one or more computational operations utilizing discrete data elements or groups of discrete data elements (including other informational stores indexed to but logically (or physically) independent such elements), where such data elements may have one or more independent RAMS indices and where each computational operation may also have one or more independent RAMS indices. Arrangements to which RAMS may be applied also may include computational or associational indexing between discrete data elements (and groups of discrete data elements). Embodiments may include utilization of and/or access to discrete data elements (and groups of discrete data elements) as in the foregoing within and by one or more discrete system-based or system-accessible computational methods and procedures (or groups of such by system-based or system-accessible computational methods and procedures), where such discrete procedures may have (one or more) independent RAMS indices. Embodiments may include utilization of and/or access to discrete data elements (and groups of discrete data elements) as in the foregoing by system users (or groups of system users), where system users (and groups of users) may have (one or more) independent RAMS indices. Embodiments may include utilization of and/or access by system-based or system-accessible discrete computational methods and procedures as in the foregoing by system users (or groups of system users) as defined in the foregoing.

While RAMS is entity-centric, its architecture is further characterized by its event-driven functionality. An event handled by the RAMS provides a computational pivot point around which complex multi-factor permission mediation may be executed. This may occur in a wide variety of environments and conditions.

Figure 18:
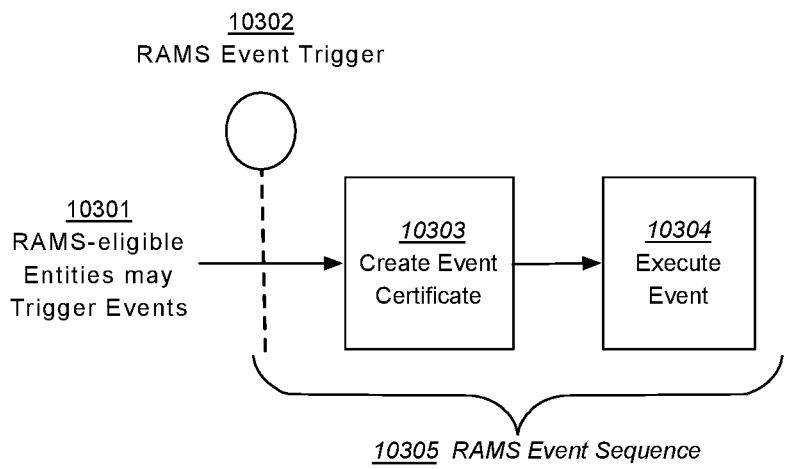
FIG. 18 illustrates elements of Recombinant Access Mediation System (RAMS) execution sequence.

Referring to FIG. 18, a RAMS event sequence 10305 is illustrated. At a step 10301 RAMS-eligible entities may (directly or indirectly) cause, or may cause to be triggered, a RAMS event, resulting in a RAMS event trigger 10302. A RAMS event should be understood as any computation event executed within the context of, in association with or as may be indexed by a RAMS control fabric. This may include almost any activity within a computational environment in which information may be exchanged, processed, presented, modified or utilized.

In embodiments, the event trigger results in the creation of an event certificate at a step 10303. This may lead to the execution of an event at a step 10304. The event certificate may comprise a pre-requisite for the execution of a RAMS-eligible event; however, exceptions may apply to this requirement in some cases as noted elsewhere in this disclosure.

Figure 19:
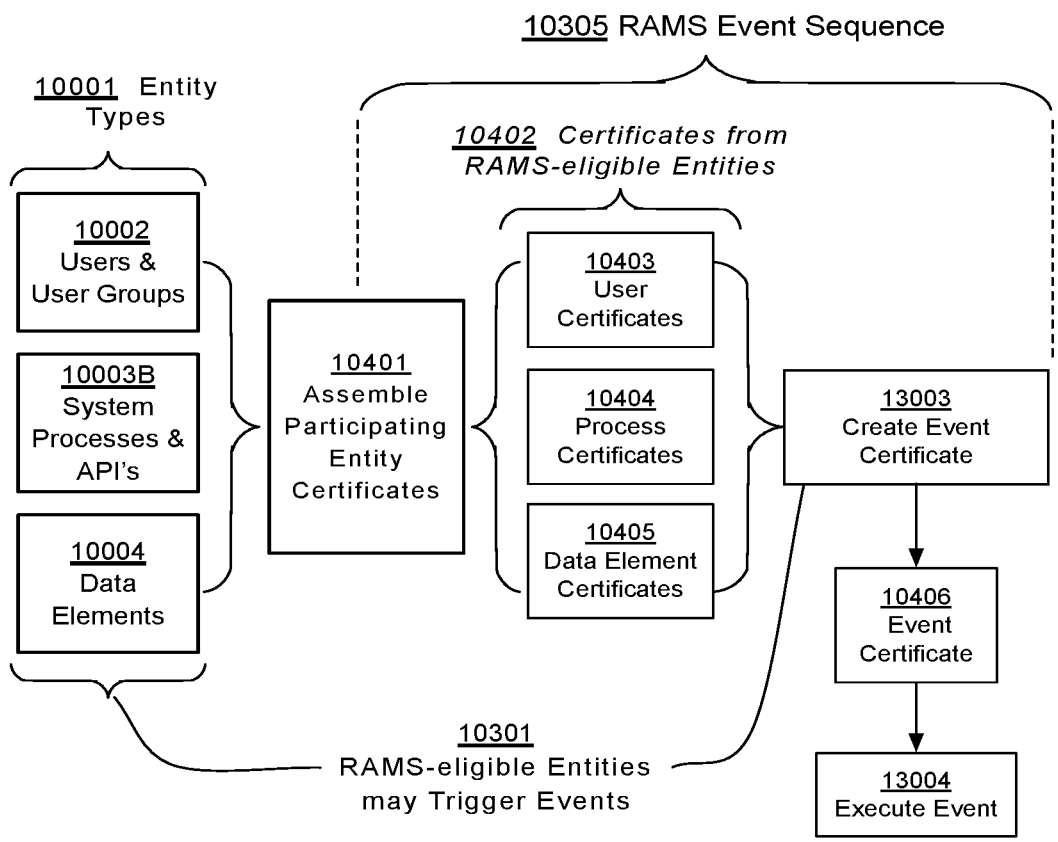
FIG. 19 illustrates elements of an event sequence involving a RAMS.

FIG. 19 provides one example (among many possible examples) of an event-based sequence 10305 that is characteristic of the occurrence of an event in the RAMS. One or more RAMS-eligible entity types 10001 may trigger an event in a process 10301, involving assembly at a step 10401 of participating entity certificates 10402 or tokens (such as user certificates 10403, process certificates 10404 and data element certificates 10405). The RAMS system may create, at a step 10303, a RAMS event certificate 10406 based on the various participating entity certificates and other factors as noted above. Then the RAMS system may execute the event at a step 10304.

In embodiments, RAMS event sequences may be initiated by a process or system external to the RAMS control fabric, such as through an external-facing API or other interface, such that a RAMS-based event may, in response, be executed within the purview of the applicable RAMS control fabric. Such an external process may also in some cases be covered under a different RAMS control fabric. In some such cases, two or more such control schemes may co-exist within a host system.

Referring still to FIG. 19, one or more RAMS-based methods and procedures assemble the certificates associated with the participating entities (as detailed in the foregoing). The assembled certificates (or elements therein) are passed to a generalized process, such as, in this example illustration, the "Create Event Certificate" process 10303. As noted in the foregoing, such certificates or tokens may form a part of a larger information store associated with those entities. The certificate or token (or the larger information store) may comprise the "local access policy" for that entity. In this manner, the RAMS event sequence mediates RAMS-validated computational events. Such events are generally conditionally executed upon dynamic synthesis of event certificates (as described in the foregoing) according to the privileges and constraints embodied within the contributed certificates. This event certificate provides enablement of authentication for execution of the subject event with the participation of the associated entity or entities. Such enablement may proceed within various scenarios, including but not limited to, single computational events; one or more series of connected or correlated computational events; and/or one or more collection of discrete or distributed (and nominally unrelated) computational events (events, that is, which may be unconnected within the current ontological context except as bound by the certificate-based enablement). Any or all such scenarios (as described elsewhere in this disclosure) may, in some cases, be contained within (or referenced by or produced as a result of) one or more looped (or conditionally repetitive) sequences, and/or one or more recursive and/or self-modifying operations.

RAMS event certificates may generally (but not necessarily always) contain a "certificate identifier," which may be, for example, cryptographically valid or otherwise secure signature. The certificate identifier may be unique to the event and the entities designated for participation in the event.

Figure 20:
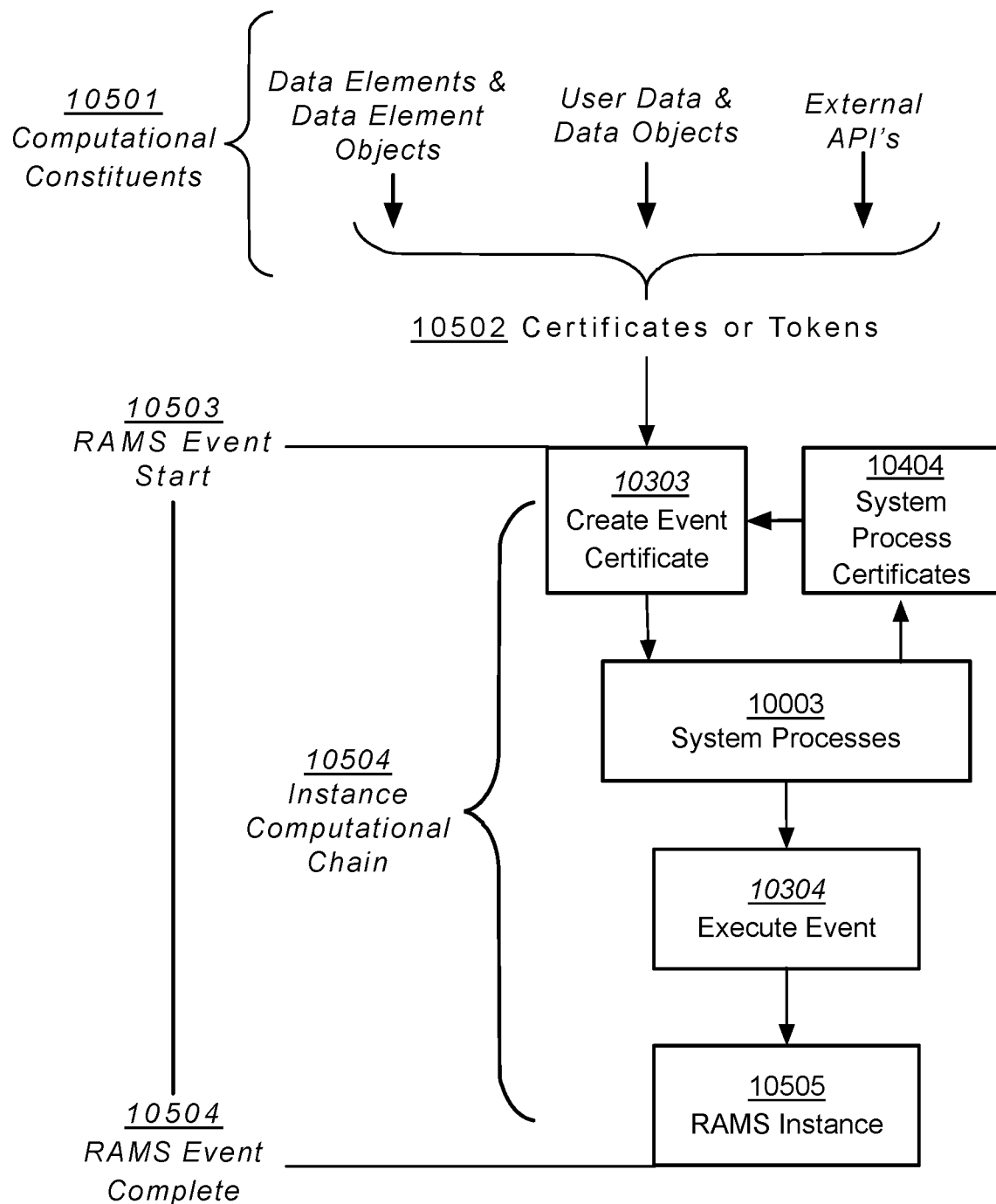
FIG. 20 illustrates an execution flow involving a RAMS events and RAMS certificate generation.

FIG. 20 provides a different view of the event sequence, where the result of the computation resulting from the event sequence is referred to as a RAMS instance 10505. In this simple illustration of the concept of RAMS-based event triggering, RAMS-eligible user and data objects, as well as data elements and external APIs, are termed computational constituents 10501. The computational constituents may be involved in the creation of certificates or tokens at a step 10502, described in more detail elsewhere in this disclosure. At the start of a RAMS event 10503, upon validation of the "credentials" (certificates or tokens) associated with these computational constituents 10501, one or more processes produces a computational result. This sequence, referred to as an instance computational chain 10504, produces, as the RAMS event is completed 10504, a RAMS instance 10505. The instance computational chain 10504 may include the creation of an event certificate 10303, after which one or more system processes 10003 may produce system process certificates 10404 that may be included in or associated with the event certificates for the event. Once this has occurred, the event may be executed at a step 10304 and the RAMS instance 10505 created.

RAMS event sequences embody the recombinant aspect of RAMS in that the creation of the RAMS event certificate is made possible by combining the elements contributed by each RAMS-eligible participating entity. Further, the RAMS event certificate embodies the mediation aspect of RAMS in that each RAMS-eligible entity participating in the creation of an instance is granted a set of rights, privileges and dispositional logic unique for that entity in relation to (and valid for) that computational event. These event-bound rights, privileges and dispositional logic constructs may be composed within the event certificate and indexed to or otherwise associated with the subject entity. Thus, the RAMS control fabric is both entity-based and event-driven, where a central operational feature is the synthesis of an event-bound and event-germane control object (the event certificate) that is based upon the disparate access and privilege information provided by each RAMS-eligible entity.

As outlined in the foregoing, RAMS-eligible entities are fundamental to the operation of the recombinatorial mediation processes. In order to address the demands of a variety of conditions in various implementations these entities and associated ancillary entity information may be configured in a variety of ways, such that they may possess, be indexed to, or otherwise associated with, a variety of information stores (the entity-associated ancillary data 10101 noted above).

Figure 21:
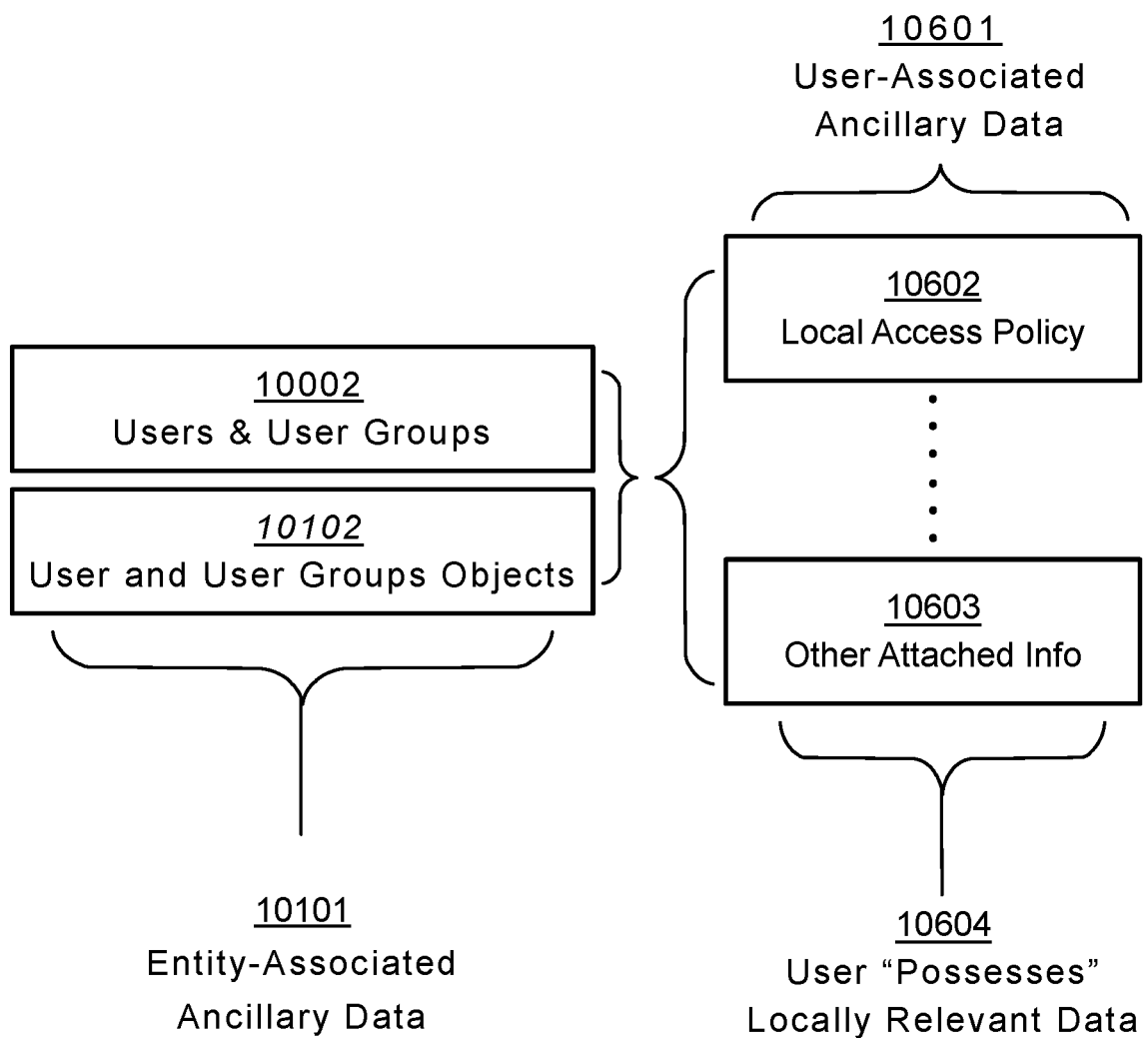
FIG. 21 illustrates relationships between entities and associated ancillary data used in of DTS Associational Process Management and DTS RAMS and DTS TCM.

FIG. 21 provides a generalized overview of the user entity and illustrates one possible configuration among many possible configurations. In this illustration, a system user (the term including users and user groups 10002) possesses, is assigned and/or is indexed to or otherwise associated with a user object 10102 (including user and user groups objects). In this example, the entity-associated ancillary data 10101 is referred to as user-associated ancillary data. The RAMS-relevant aspect composed within this user-associated ancillary data (referenced by callout User-Associated Ancillary Data 10601) is referred to as a local access policy 10602, which comports with descriptions outlined in the foregoing. Other information 10603 may be attached to this user-associated ancillary data object, including but not limited to both RAMS-related data and data unrelated to the RAMS information but otherwise germane to the user. The RAMS-related information within the local access policy is considered "local" in that it applies to the particular user as applied in the context of RAMS-based event. This association is illustrated in this example by callout User Possesses Locally Relevant Data 10604. The local access policy may include without limitation the information required to execute the subject user's disposition with respect to any RAMS-based events within the mediation provided by RAMS.

Figure 22:
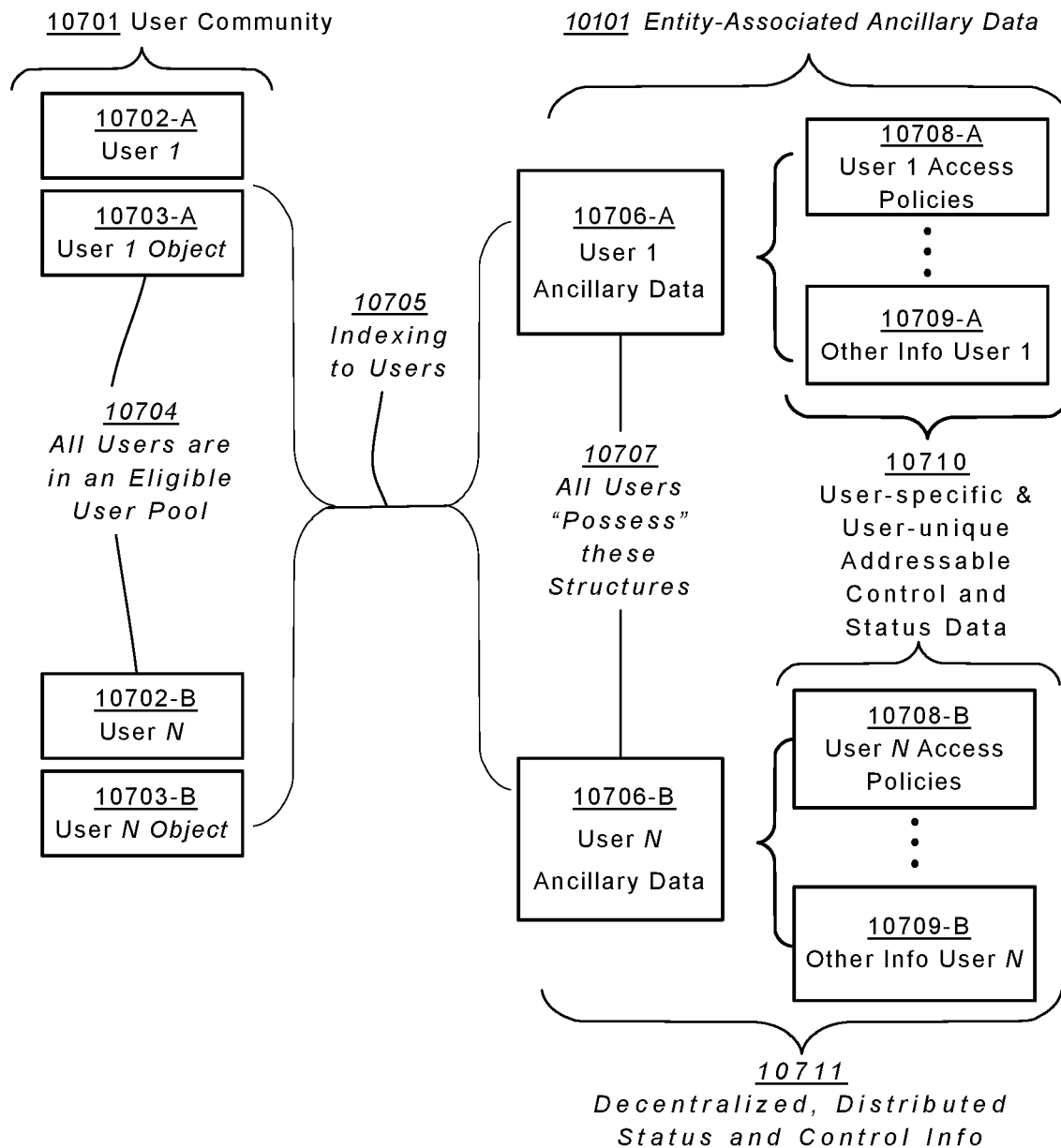
FIG. 22 illustrates indexing of ancillary data to user objects and association of related policies to the data.

FIG. 22 illustrates the manner in which a RAMS system may operate within a community of users 10701 (sometimes collectively referred to herein as a "user pool" or an eligible user pool 10704). Each RAMS-eligible user 10702-A through 10702-B where eligible user pool 10704 depicted in FIG. 22 as composed of User 1 through User N and where each such user possesses a unique, corresponding (in this example) user object 10703-A (User 1) and 10703-B (User N). This is one example among many possible examples of a context within which RAMS-eligible users may interact with other users and other processes (such as decentralized and distributed status and control information) in the presence of the RAMS control fabric. By an indexing process 10705, ancillary data 10706-A (for User 1) and ancillary data 10706-B (User N) may be possessed by the users in the eligible pool 10704, as noted by callout 10707 where, in this example, ancillary data 10706-A and ancillary data 10706-B are composed as part of user objects 10703-A (User 1) and 10703-B (User N). This ancillary data (10706-A (User 1) and ancillary data 10706-B (User N) comprising of at least two primary structures: user access policies 10708-A and other optionally included user info 10709-A (User 1) and user access policies 10708-B and other optionally included user info 10709-B (User N). These may be used to provide user-specific and user-unique addressable control and status data as noted by callout 10710 (User-specific & user-unique addressable control and status data). The ancillary data 10706-A and 10706-B, including user access policies for Users 1 and User N 10708-A and user access policies 10708-B, respectively, and other user information for Users 1 and User 10709-A and 10709-B respectively may optionally be used to provide decentralized and distributed status and control information 10711.

Figure 23:
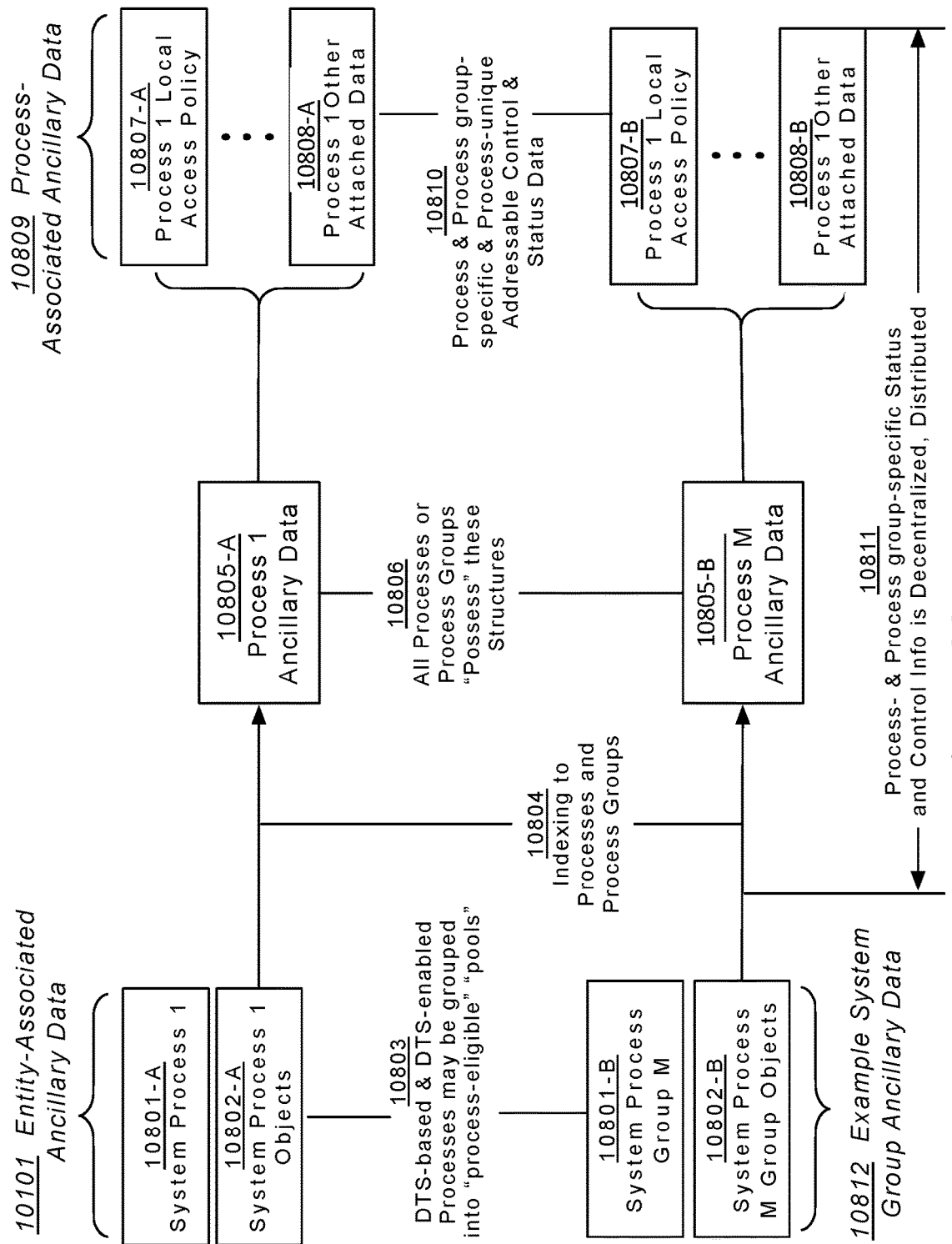
FIG. 23 illustrates indexing of ancillary data to processes and association of related policies to the data.

FIG. 23 shows one example (among many possible examples) where one or more system processes (which may be internal or external system processes and which may use internal or external resources with respect to the system to which the RAMS is applied) may each be characterized by one or more unique system process objects, 10802-A and 10802-B (shown in this example as associated with system process 1 and system process M, respectively), noting that individual system processes and system process groups that may be grouped into process eligible pools referenced by callout 10803 (DTS-based & DTS-enabled processes may be grouped into process-eligible pools), with each process or group including a unique identifier and which are shown in this example as composed of system process 1 (10801-A) through system process group M (10801-B). Note, also that this example shows both an individual system process (system process 1 10801-A) where in this instance (among many possible variations), system process 1 10801-A represents an instance of a process whereas system process group M (10801-B) represents a collection of processes. Callout 10812 "Example System Group Ancillary Data" highlights that the representation in FIG. 23 depicting such pools and groupings (referenced in the foregoing and depicted by callout 10803) is merely one of many possible arrangements. Each process and process object may be indexed or associated with entity-associated ancillary data 10101 in one or more steps 10804 (Indexing to Processes and Process Groups) where this data is composed, in this example, within 10805-A, 10805-B, where the collective results are referred to in this example as process associated ancillary data 10809. Each process may thus "possess," or be associated with ancillary data structures as referenced by callout 10806 (All Processes or Process Groups "Possess" these Structures), locally relevant data and may be subject to one or more local process access policies 10807-A and 10807-B (referenced to system process and/or process groups 1-through-M, respectively), such that the execution of the process may be mediated by the RAMS, such as by conditioning execution of the process upon one or more conditions expressed in an applicable local access policy. Each process may also include other attached information 10808-A and 10808-B (again referenced to system process groups 1-through-M, respectively). As with users, process and process-group specific and/or unique, addressable control and status data 10810 may be enabled based on the process-associated ancillary data 10809. Process and process-group-specific status and control information may be decentralized and distributed as indicated by callout 10811.

System processes and system-enabled processes (and groups of such processes) each have associated process objects 10802-A and 10802-B and have per-process (and per process group) ancillary data 10805-A and 10805-B, including local access policy information 10807-A and 10807-B for the process and other attached information 10808-A and 10808-B, collectively comprising process-associated ancillary data 10809. Each system process and each system-enabled process can possess local access policies and other data relevant to the system process or system-enabled process, respectively. Data for a system process or a system-enabled process may be supplied to the RAMS or pulled by the RAMS through various sources, such as from one or more distributed data sources (such as located within the computing environment of an enterprise or located in the cloud), through use of one or more APIs or other interfaces to one or more external systems, or the like. The RAMS system may handle many such systems processes and systems-enabled processes with their respective objects and process-associated data (including local access policies).

Referring to FIG. 24, in embodiments, system processes may also include "native" or internal data elements (such as data elements occurring within the system to which the RAMS is applied) and external data elements (such as data elements in a system to which the RAMS is applied, or accessible to the system to which the RAMS is applied, or the like).

Referring to FIG. 25, example data element 10101 depicts data element 10901-A (referenced to example data element P-c) and including data objects associated with data element P-c 10902-A. The data objects composing 10902-A are depicted in this example representation as associated with ancillary data for data element P-c 10903. In this example, ancillary data 10903 may, in turn, contain (and/or may reference and/or may have logical access to) a collection of data elements grouped (in the FIG. 25 example depiction) within (or logically associated with) associated data for data elements grouped as cited by callout 10904. In implementations, this section of 10903 may include multiple informational elements related to, in this example, data element P-c 10901-A via 10902-A. Such a constituent is shown in this figure as an attached local access policy represented by data element P-c local access policy 10905-A. In addition, as shown, 10904 may, in variations, also include additional information represented in data element P-c other attached info 10906-A. The depicted variation of 10905-A and 10906-A is further referenced by two-part callout 10907 (data elements & groups of elements "possess" addressable "local" access policies, and data elements & groups of elements "possess" addressable "local" "other info", respectively). Callout 10909 (data elements & groups of elements "possess" "locally" relevant information) further elucidates this variation of the informatic structure revealed by 10904 (and its example sub-elements 10905-A and 10906-A). Further, as noted by callout 10908 (element- & element group-specific status and control info is decentralized and distributed), the objects and ancillary data associated with data element P-c 10901-A (10902-A, 10903, 10905-A and 10906-A) as well as Other Data Elements & Groups of Elements 10910 may in variations be decentralized, distributed. Callouts 10910 (other data elements & groups of elements) and 10911 (additional internal data elements- & element group-specific ancillary data) convey in FIG. 25 that, in implementations, the example arrangement of affiliated objects described in the foregoing may include or be associated with elements 10910 and 10911 via 10910. In addition to "internal" data elements (e.g., 10911), external data may be accessible through use of one or more APIs or other interfaces to one or more external systems 10913. Element 10915 (example external system-enabled data element) may indicate an exemplary system-enabled external data element as depicted in 10901-B (data element Py-z) and, in this variation among many other possible variations, reflects similar associated data objects (10902-B) as previous outlined in the foregoing for 10901-A and 10902-A. Likewise, 10914 (associated data for external data elements) describes 10905-B (data element Py-z local access policy) and 10906-B (data element Py-z other attached info) may be similar in structure and relationship to local access policies and other attached data for 10904 Associated data for Data Element. Likewise, callouts 10916 and 10917 (external data elements & groups of elements "possess" addressable "local" access policies, and external data elements & groups of elements "possess" addressable "local" "other info", respectively) detail some properties of 10905-B and 10906-B respectively. Callout 10912 (external system-enable data elements & groups of data elements) is bracketed with an indicator pointing above to callout 10910 (and therefore to any or all of the elements associated with 10910 in the exemplary embodiment of FIG. 25) to show that external system-enabled data (exemplified by elements 10915, 10901-B, 10902-B, 10905-B, 10906-B, 10916 and 10917) may, in variations, be treated as logically (or virtually) contiguous therewith. Further External system enabled data (e.g., 10912) may reference, through use of one or more APIs or other interfaces, one or more external systems 10913, or the like.

Figure 26:
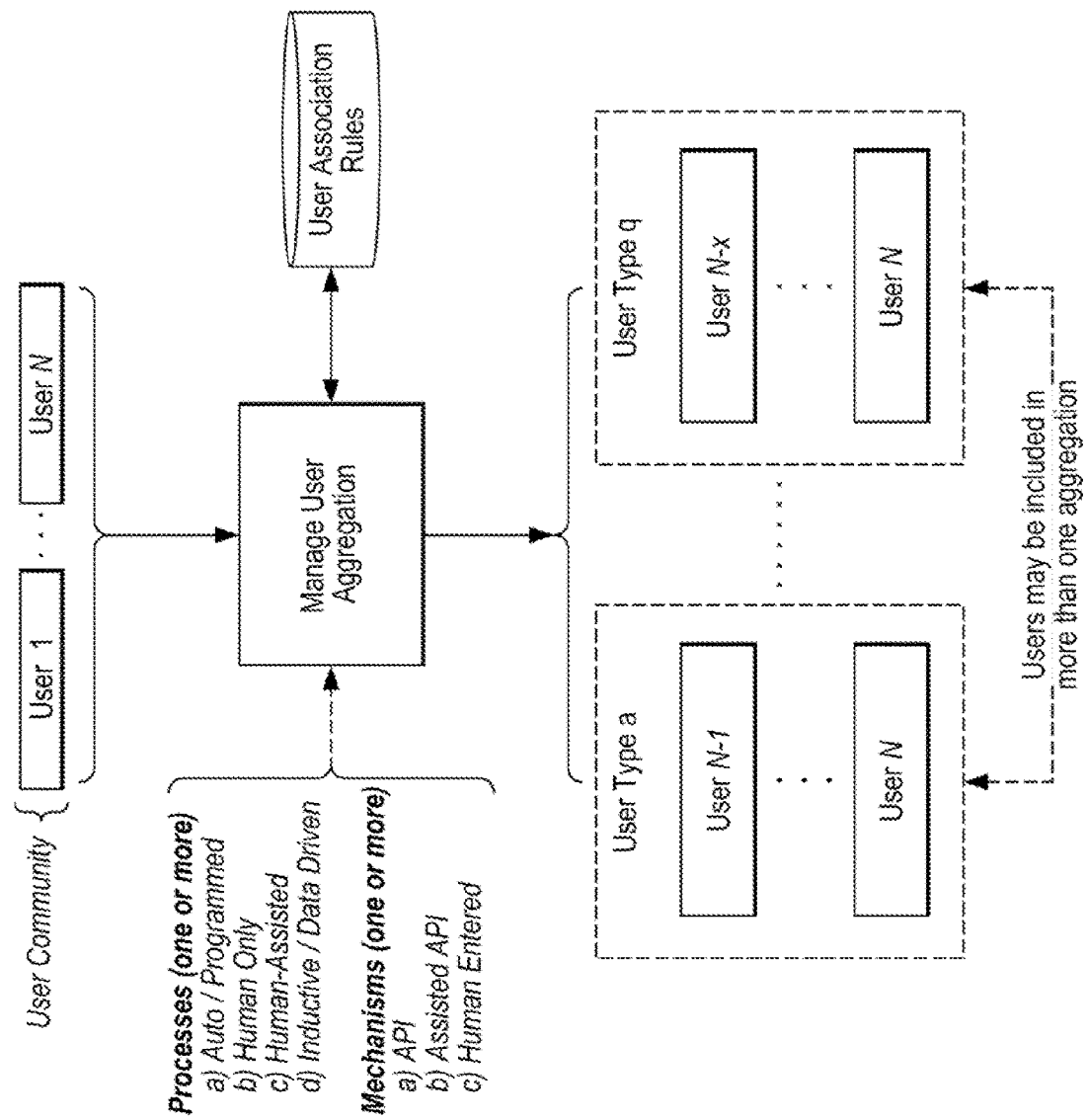
FIG. 26 illustrates an example among many possible examples of an implementation of entity grouping of user entity aggregation.

Referring to FIG. 26, RAMS entities of any type may be (transiently or permanently) clustered or grouped or aggregated, optionally without limitation, but optionally as modulated or limited by one or more constraints mandated by or through the system, such as by a host or operator of the system. In the absence of constraints, such aggregations may also in one or more obverse operations be de-clustered or ungrouped or disaggregated. RAMS entities may be aggregated (or disaggregated) as may be required by or as may be desirable for any reason in the operational context of a given system and may result from, without limitation, various groupings. Embodiments may include system-mandated groupings, wherein groupings or aggregations may be initiated by or dissolved by or otherwise modified under system-based command, such as may be administered by an appropriate user (or agent) through one or more interfaces. Embodiments may include user-mandated groupings, such as wherein groupings or aggregations may be initiated by or dissolved by or otherwise modified under user command through one or more user interfaces. Embodiments may include context-based groupings, such as wherein groupings or aggregations initiated or required by one or more computational elements. Embodiments may include content-based groupings, such as wherein groupings or aggregations are initiated or required by one or more aspects composed within or associated with an entity. Embodiments may include installation-mandated groupings, such as wherein entity groupings may be required by or may be desirable for any reason in the operational content of an instance of a given system. Embodiments may include context-derived groupings, such as wherein entity groupings may be required by or may be desirable for any reason based upon a computational or operational condition particular to an instance of the system but which may not be present in all systems. Embodiments may include content-based groupings, such as wherein entity groupings may be required by or may be desirable for any reason based upon the content within one or more entities. Embodiments may include history-based groupings, such as wherein entity groupings may be required or may be desirable based upon one or prior events or occurrences or mandates related to any or all of the foregoing. Embodiments may include external input or mandates via one or more interfaces or API's, such as where such external requirements may be based upon any combination of the foregoing, within the subject external system or otherwise accessible to it.

RAM entity groupings may be spawned transiently or permanently, but in any case, such RAM entity groupings may be preserved and indexed and thereby made addressable within the system and thus may be seen as accessible within or by the host system. Such addressability does not require accessibility, merely that a grouping may have a logical identity if composed.

The boundaries animating RAMS entity groupings may be defined by one or more conditions embodied within an informational entity referred to here as an "entity-association rule." An entity-association rule may be dynamically created, such that the criteria may be generated within or in response to a computational or content-derived context (and/or in response to factors linked to or otherwise indexed to such factors). An entity-association rule may be statically created, such that the criteria may compose or may be derived from one or more rules (or rule-sets) which govern the grouping of entities irrespective of dynamic considerations. An entity-association rule may be statically created but dynamically modified, such that one or more entity-association rules, which may have instantiated as static, may be dynamically modified or otherwise changed based upon the foregoing, where such modifications may be transient or permanent, such that the criteria as may be embodied within an entity-association rule.

FIG. 26 shows an example among many possible examples of an implementation of entity grouping of user entity aggregation. The entity-associated ancillary data 10101 structures noted above are not shown but present. User aggregation may be managed by various processes, including automatic (e.g., programmed) processes, human-managed processes (such as enabled by one or more interfaces of the RAMS system), human-assisted processes, and/or inductive and/or data-driven processes. Aggregation may be implemented by one or more interfaces, such as application programming interfaces.

The element manage user aggregation refers to the net functionality whereby a subset of users may be selected for inclusion within one or more groupings. This illustration conveys example functionality revealing selection of users to create an aggregation (or selection of additional users to augment an existing aggregation), similar capabilities can be used for de-selection and/or disaggregation. Among other things, user aggregation allows a RAMS system to handle groups of users and appropriate user access policies (such as ones that apply at the group level).

Figure 27:
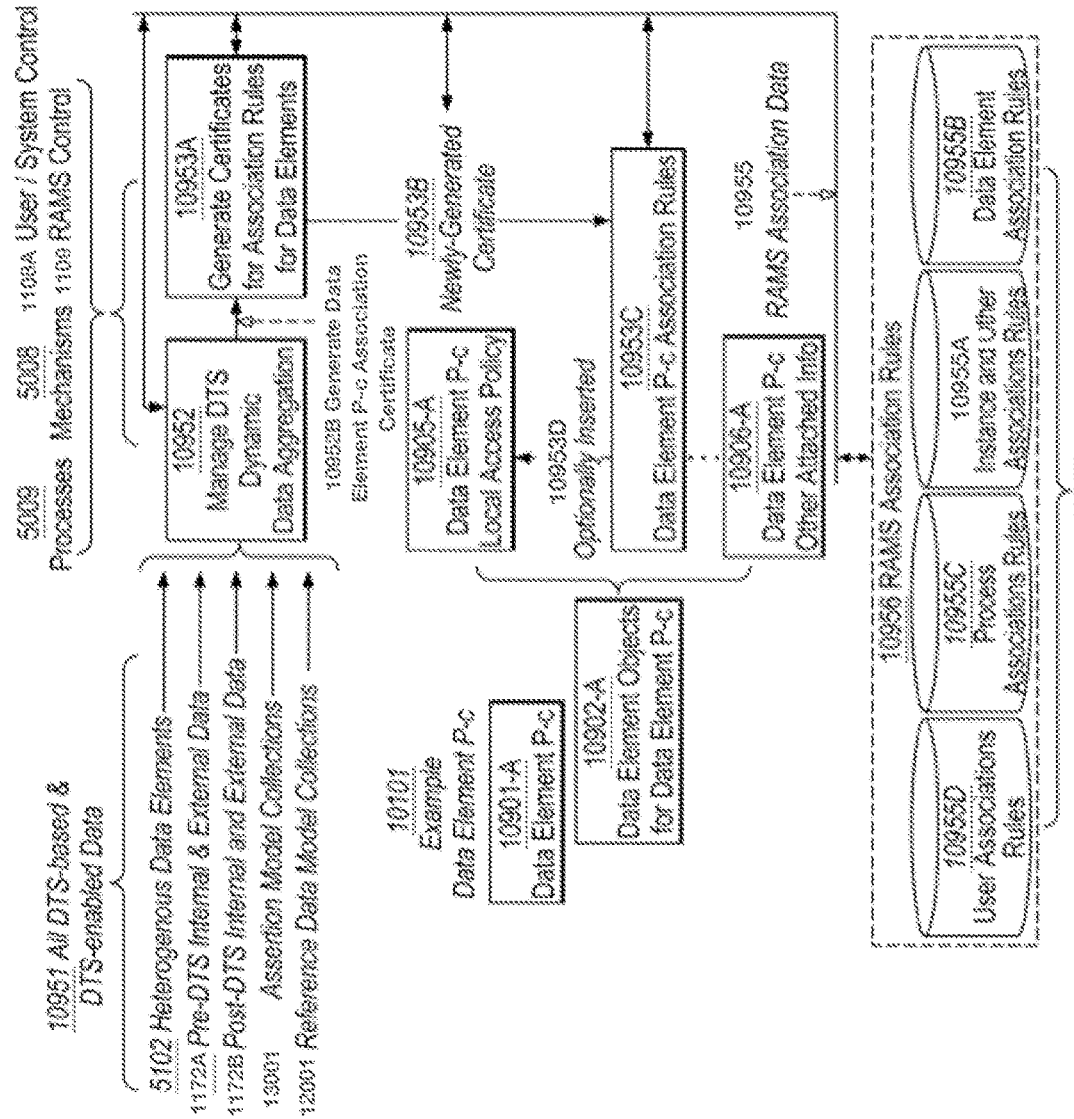
FIG. 27 illustrates elements of dynamic data aggregation and generation of certificates in a RAMS.

Referring to FIG. 27, system processes and system-enabled processes, such as those described above may also be grouped or aggregated, using similar capabilities and mechanisms described for user aggregation in connection with FIG. 26. This may occur under governance of one or more process aggregation rules. Similar capabilities may be used to disaggregate or un-group processes from one another. System processes may thus be handled as groups, such as where a given local access policy governs an entire group of system processes. In an example implementation in FIG. 27 (one of many possible variations of these methods), functional block 10952 (manage DTS Dynamic Data Aggregation) is shown as receiving input from many possible sources and of many possible types denoted by callout 10951 (all DTS-based & DTS-enabled data) which may include: a) 5102 (heterogeneous data elements); b) 1172A (pre-DTS internal & external Data—data not yet processed in any DTS process, as described in the foregoing); c) 1172B (Post-DTS Internal and External Data 1172B—data previously processed in a DTS process, as described in the foregoing), d) 13001 (Assertion Model Collections, as described in the foregoing); and e) 12001 (collections of Reference Data Models, as described in the foregoing). Functional block 10952 provides its output to composite block 10956 RAMS Association Rules denoted in this example representation as consisting of data stores 10955D (User Association Rules), 10955C (Process Association Rules), 10955A (Instance and other association rules), and 10955B (Data element association rules). Note, however that the following functional blocks and data elements also contribute to the compositions within 10956, including (but not in all variations limited to): a) functional block 10953A

(Generate certificates for association rules for data elements); b) 10905-A (data element P-c local access policy—an example detailed in reference to FIG. 25 and in other descriptions in this disclosure); c) 10953C (data element P-c association rules); and d) 10906-A (data element P-c other attached info—also described, among other places, throughout this disclosure). These components comprising the data stores within 10956 are referenced for convenience as a compound data signal 10955 (RAMS association data). Note also that 10101 (example data element P-c) composed of 10901-A and 10902-A, as described in the foregoing represent the associated data element and ancillary data objects from which 10905-A, 10953C and 10906-A may, in variations be referenced or reposed. Note, as well that 10905-A is shown in this example as optionally inserted, a variation denoted by callout 10953D. Callout 10952B (Generate data element P-c association certificate) details a variation wherein 10905-A passes information to functional block 10953A (as does 10952) which, in implementations, may compose methods and procedures that produce association rules for data elements. In variations, 10953A may also provide one or more certificates to example data element 10953C as depicted by callout 10953B. Further, composite data signal 10955 is depicted as possessing bi-directional input/output functionality to convey variations in which the operations described in FIG. 27 as optionally executing bidirectionally). Callouts 5009, 5008, 1008A and 1109 denote that these operations may, in variations, be associated with these select processes (5009), mechanisms (5008) and controls (1108A and 1109) within Platform 1000.

Figure 28:
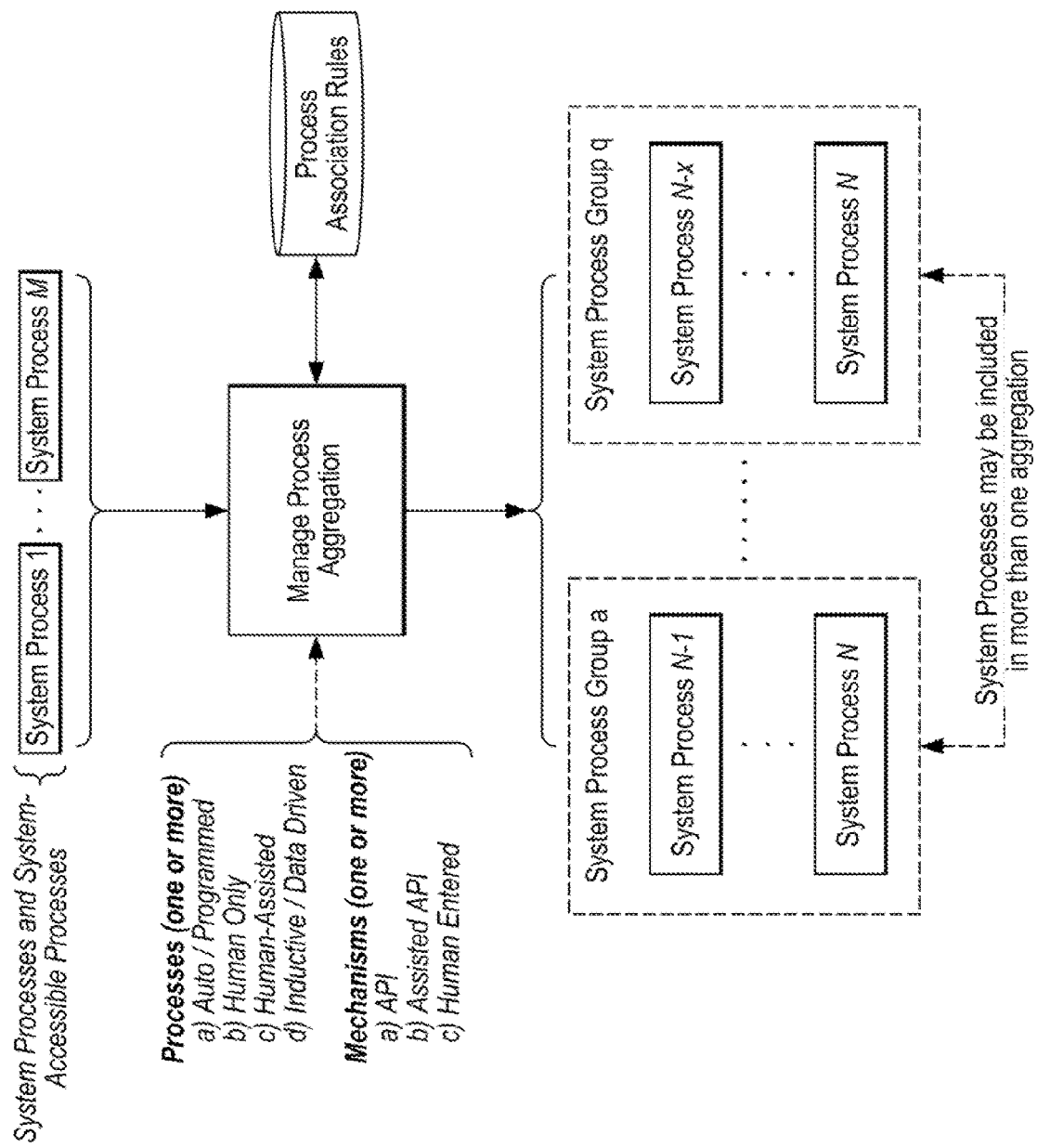
FIG. 28 illustrates aggregation of system processes and system-enabled processes.

Referring to FIG. 28, data elements, such as those described above may also be grouped or aggregated, using similar capabilities and mechanisms described for user aggregation in connection with FIG. 26 or system process aggregation in connection with FIG. 27. This may occur under governance of one or more data element association or aggregation rules. Similar capabilities may be used to disaggregate or un-group data elements from one another. Data elements may thus be handled as groups, such as where a given local access policy governs an entire group of data elements.

Figure 29:
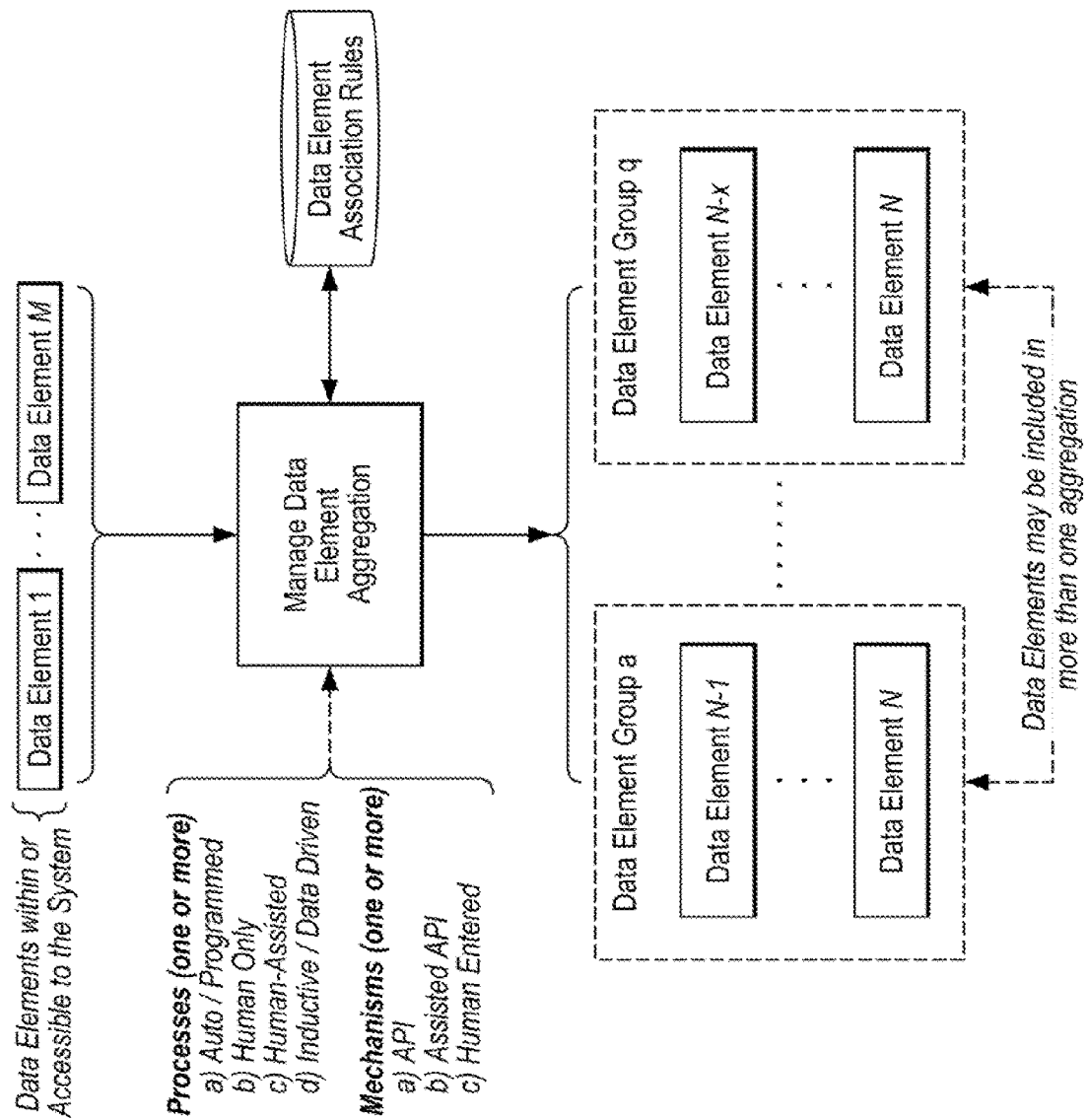
FIG. 29 illustrates aggregation of data elements.
Figure 30:
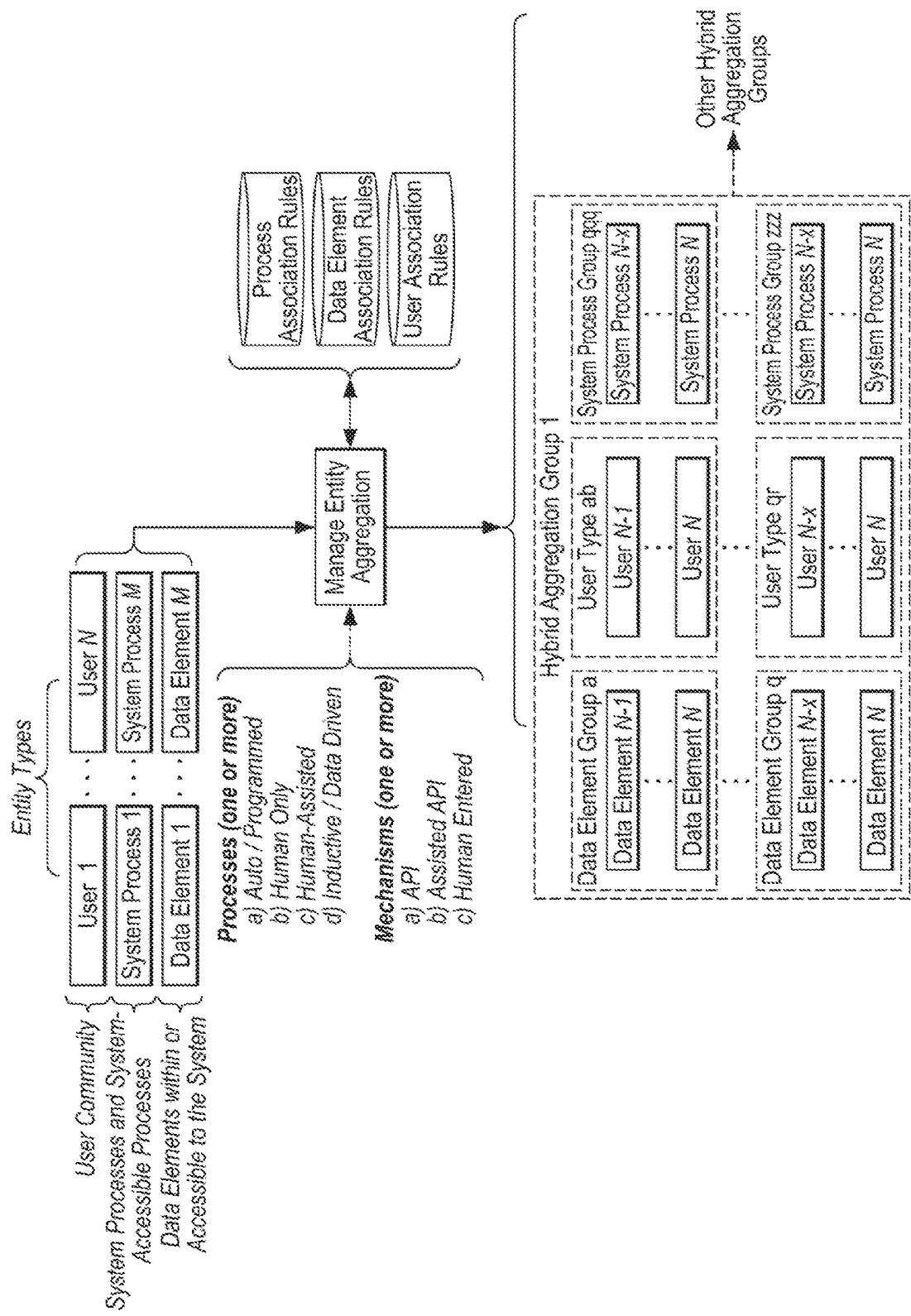
FIG. 30 illustrates aggregation of various entity types, including users, system processes and data elements.

FIG. 29 and FIG. 30 show aggregation of various entity types, including users, system processes and data elements, using capabilities like those described for each of the entity types above. Disaggregation can be accomplished by similar capabilities. As seen in FIG. 30, this may result in hybrid aggregation groupings, such as grouping a set of data elements with a set of users and with a set of system processes, or sub-combinations of those.

Figure 31:
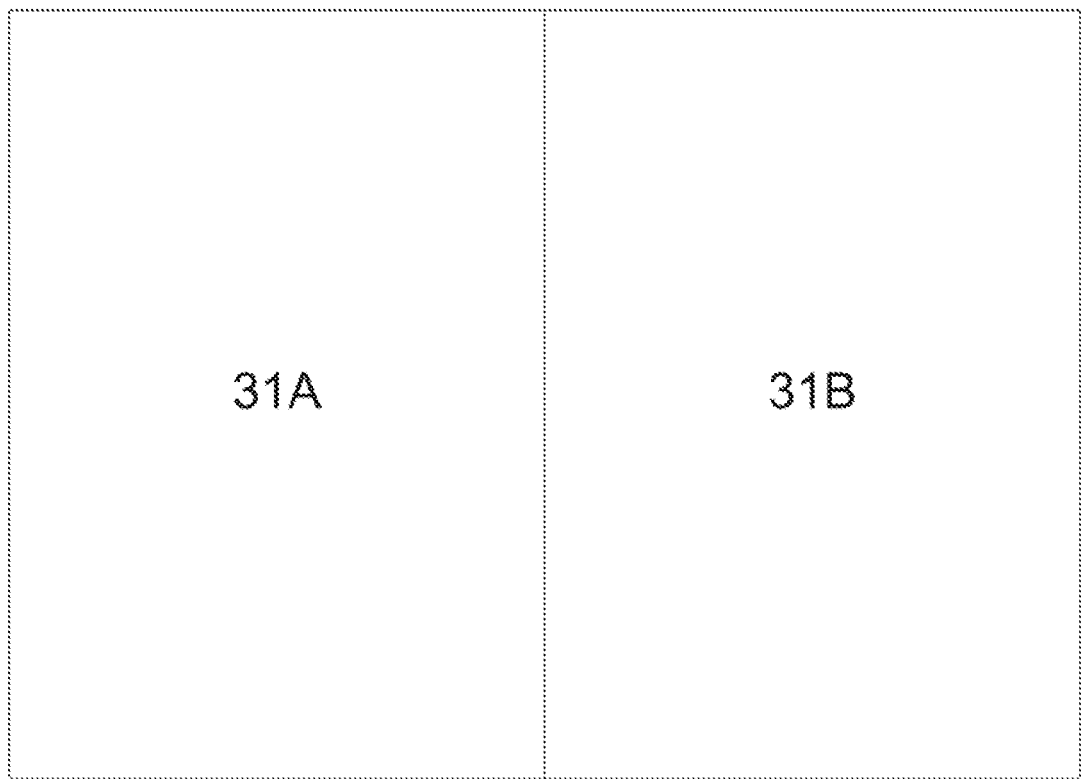
FIGS. 31, 31A, and 31B illustrate a flow involving generation of certificates in connection with the RAMS system.
Figure 31A:
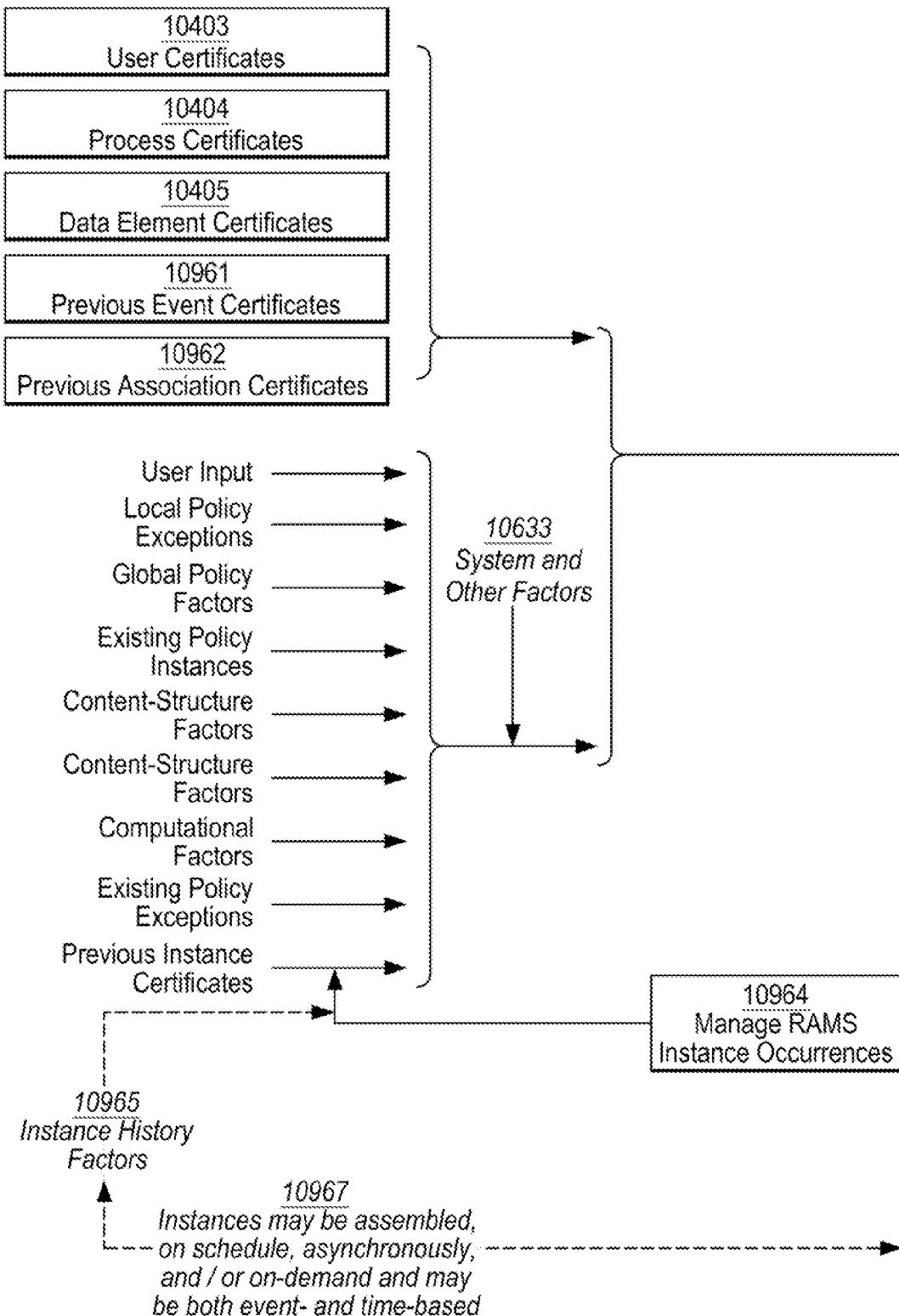
Figure 31B:
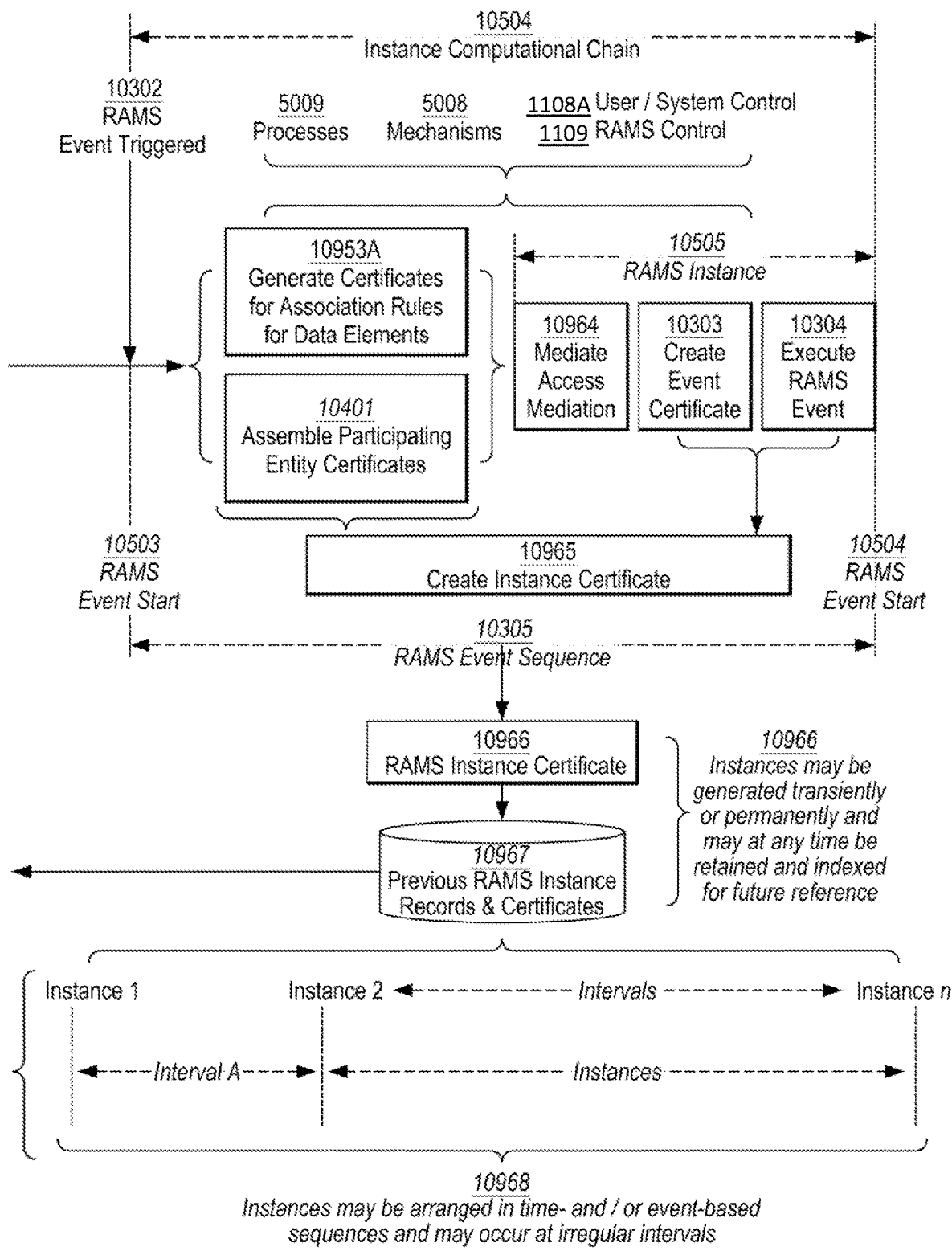

FIGS. 31, 31A, and 31B illustrate a flow involving generation of certificates in connection with the RAMS system. An instance computational chain 10504 is triggered when a RAMS event is triggered 10302. The computational chain may involve a variety of certificates associated with entities, such as user certificates 10403, process certificates 10404, data element certificates 10405, previous event certificates 10961 and previous association certificates 10962. Processes 5009 and mechanism 5008 involved in the generation of certificates may be under user control 1110 and/or RAMS control 1111. The computational chain 10504 may account for various system and other factor 10633, such as user input, local policy exceptions, global policy factors, existing policy instances, content-structure factors, computational factors, existing policy exceptions, and/or previous instance certificates. At a RAMS event start 10503, the RAMS system may generate certificates for association rules for data elements at a step 10953A and may assemble participating entity certificates at a step 10401. For a RAMS instance 10505, the RAMS may mediate access 10964 for the instance, create an event certificate 10303 and execute a RAMS event 10304, resulting in an instance certificate 10965. In a RAMS event sequence 10305, a RAMS instance certificate 10966 may be generated (transiently or permanently) and may be retained and indexed, such as for future reference, such as in a store 10967 of previous RAMS instance records and certificates. A facility of the RAMS 10964 may manage instance occurrences. Instances may be assembled for various time intervals 10967, such as on schedule, asynchronously, and/or on-demand and may be event-based, time-based, or both. Note also, that as described in the foregoing, RAMS instances may be executed and the various certificates instantiated (as described in the examples above) at irregular intervals but further, in variations, may be arranged in irregular intervals as shown in the timeline referenced by callout 10968 (instances may be arranged in time- and/or event-based sequences and may occur at irregular intervals).

Figure 32:
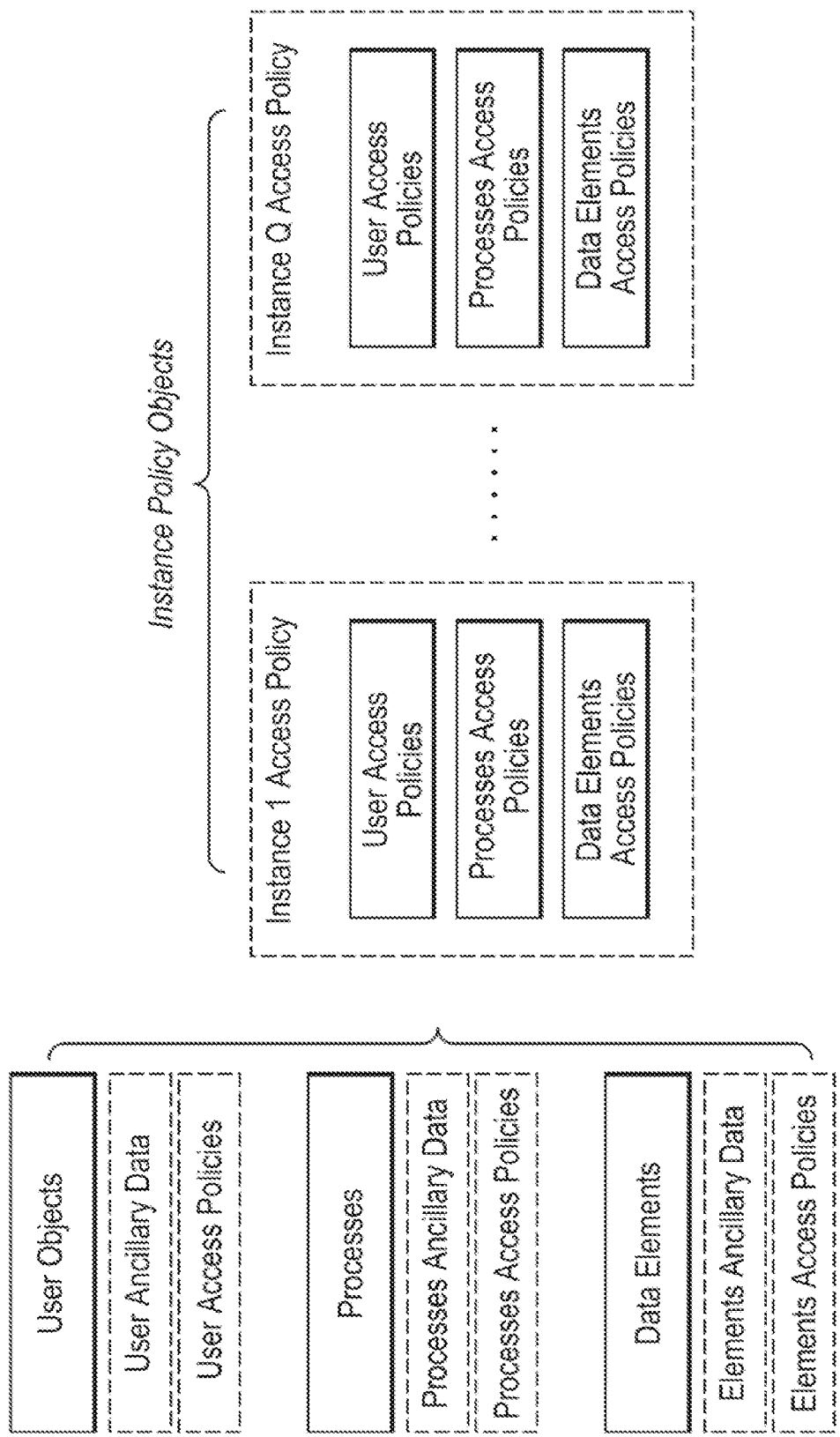
FIGS. 32 and 33 illustrate operation of a RAMS system upon one or more object-based, dynamic, access-control and access-permission objects.
Figure 33:
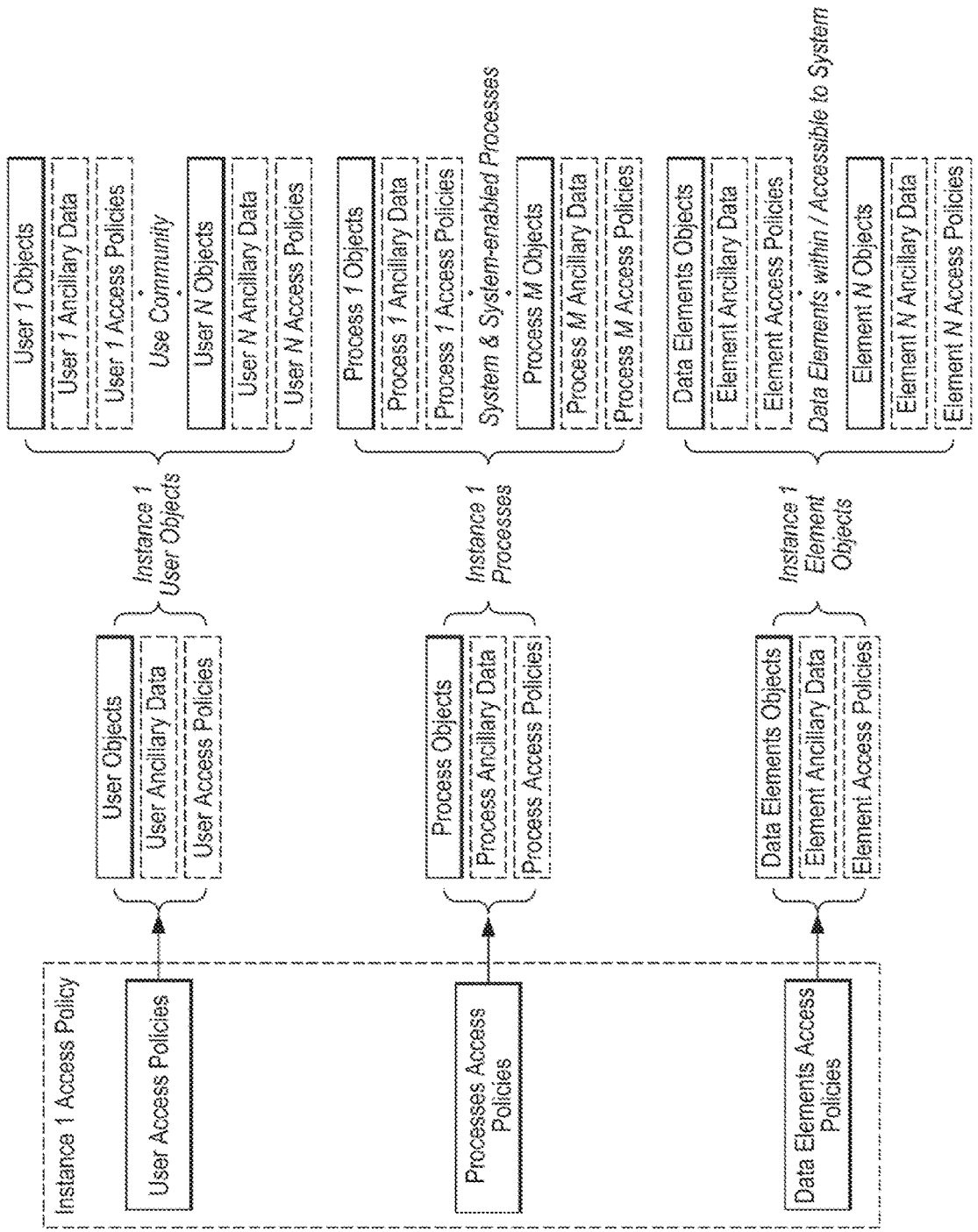

Referring to FIG. 32 and FIG. 33, in embodiments, the RAMS system may include and operate upon one or more object-based, dynamic, access-control and access-permission objects, each referred to as an instance policy object. An instance policy object may contain information from local access policies for each of user access policies, system process access policies, and data element access policies that are involved in a given situation (i.e., based on the users, system processes and data elements involved in an event that triggers or is handled by the RAMS). This content may come from the user objects, process objects, and data element objects described above (including their ancillary data, including local access policies for each).

Figure 34:
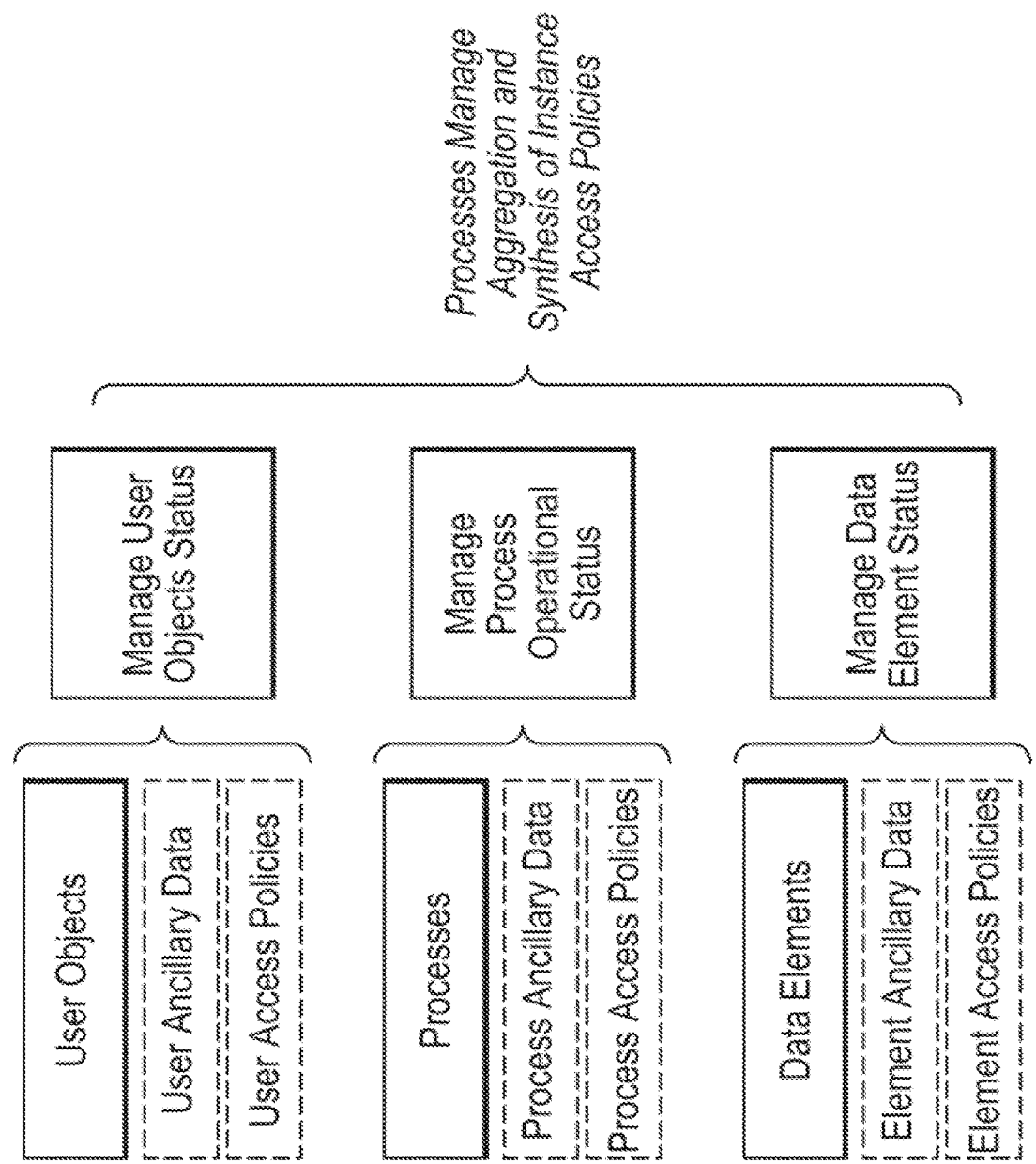
FIG. 34 illustrates components of a RAMS system that manages status for user objects, process objects and data elements.

Referring to FIG. 34, the RAMS may include components that manage status for objects of each of the object types, including user objects, process objects (including for managing the operational status of processes) and data elements. These processes may feed processes that manage aggregation and synthesis of instance access policies.

Figure 35:
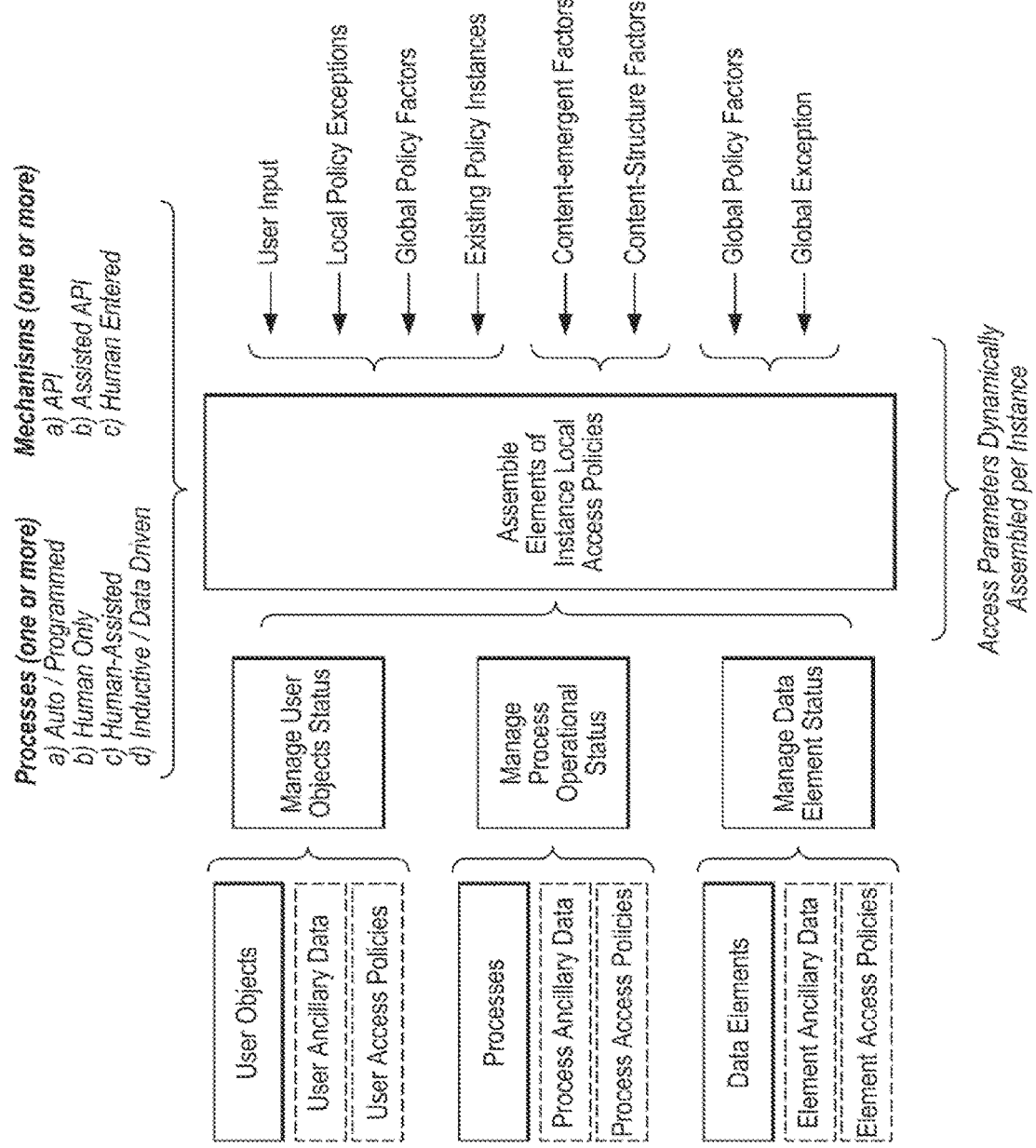
FIGS. 35 and 36 illustrate assembly of an instance policy object based on elements of local access policies.
Figure 36:
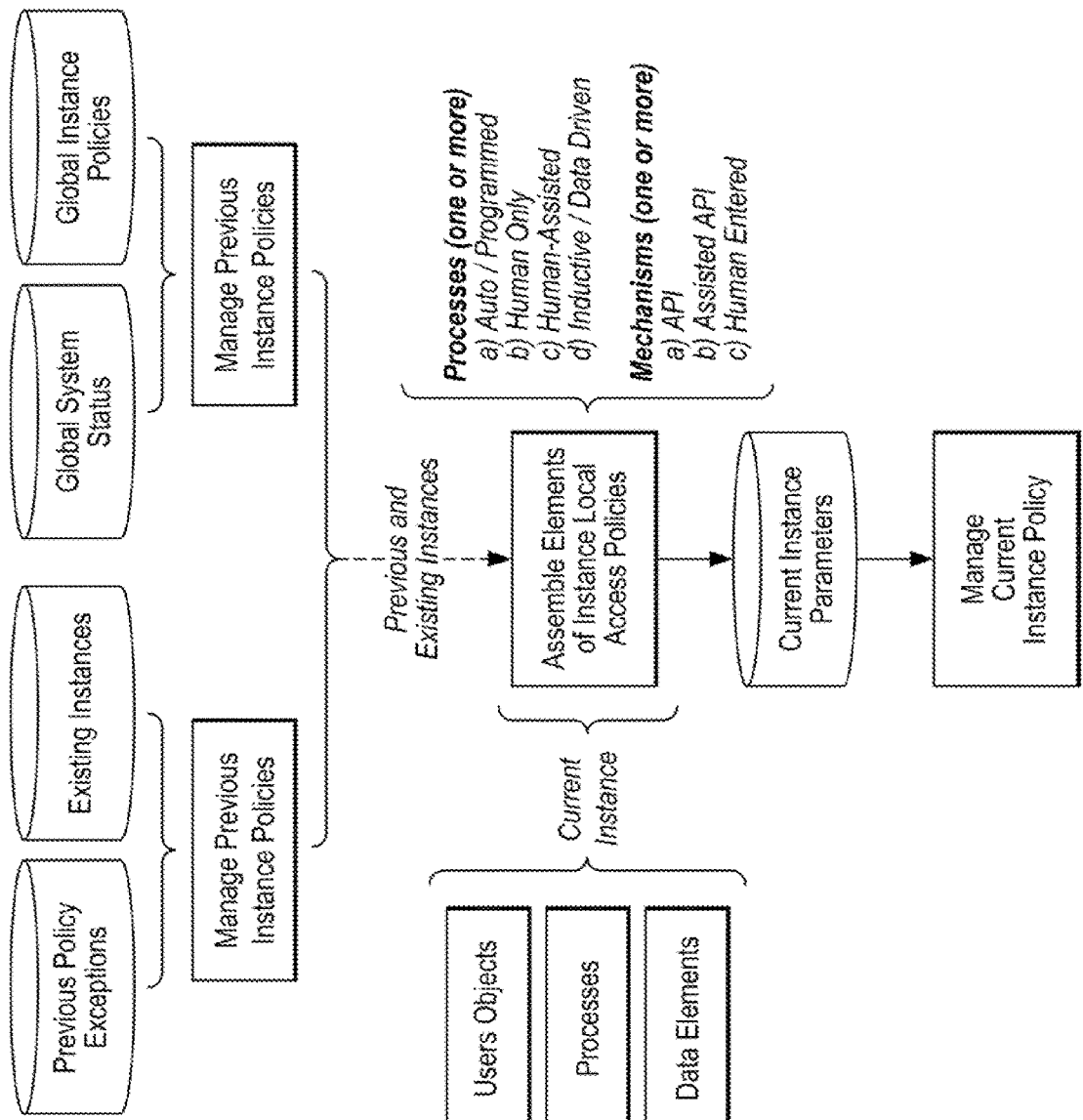
Figure 37:
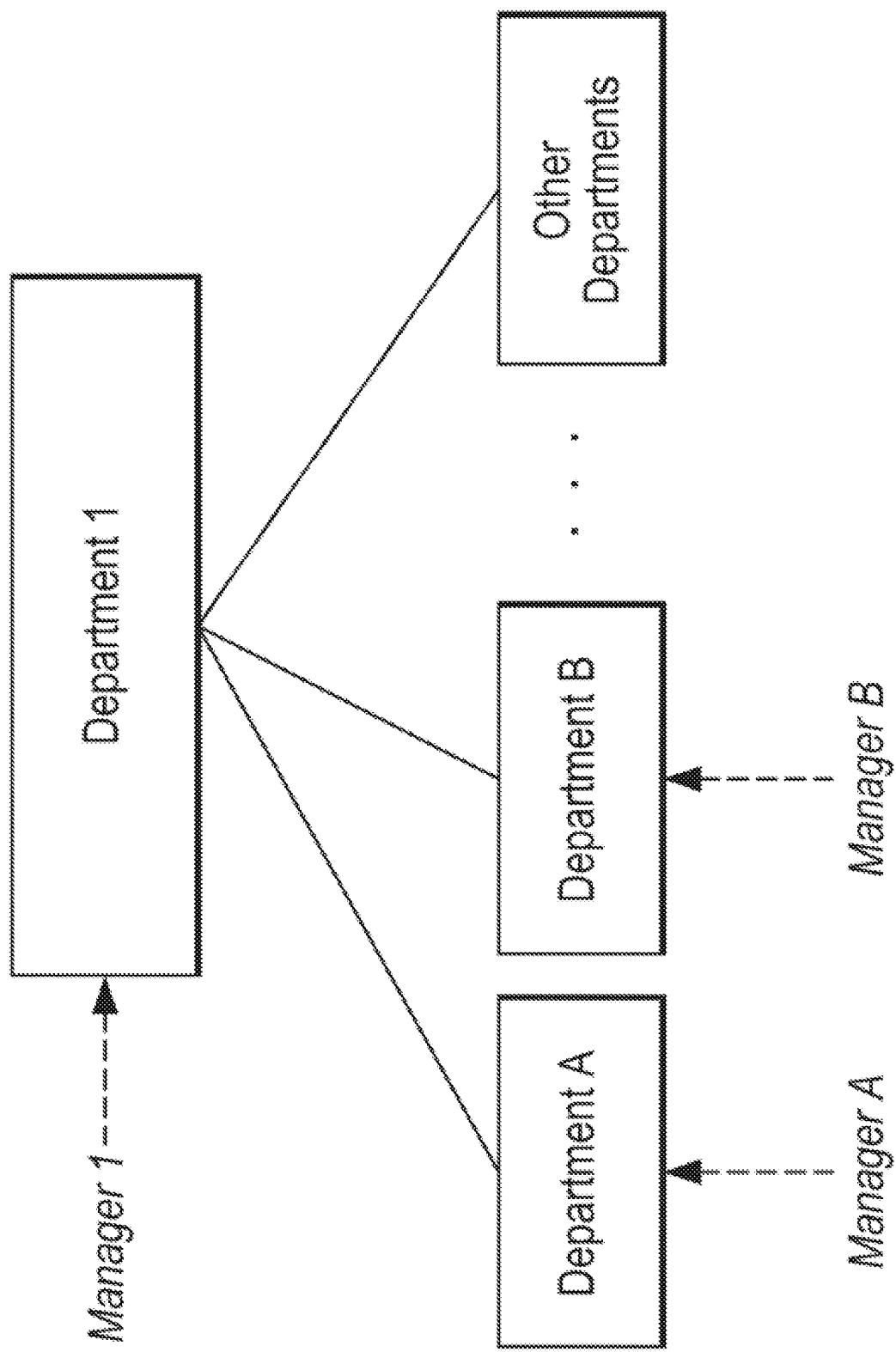
FIGS. 37 and 38 illustrate an embodiment of use of a RAMS in the context of organization of departments of a business.
Figure 38:
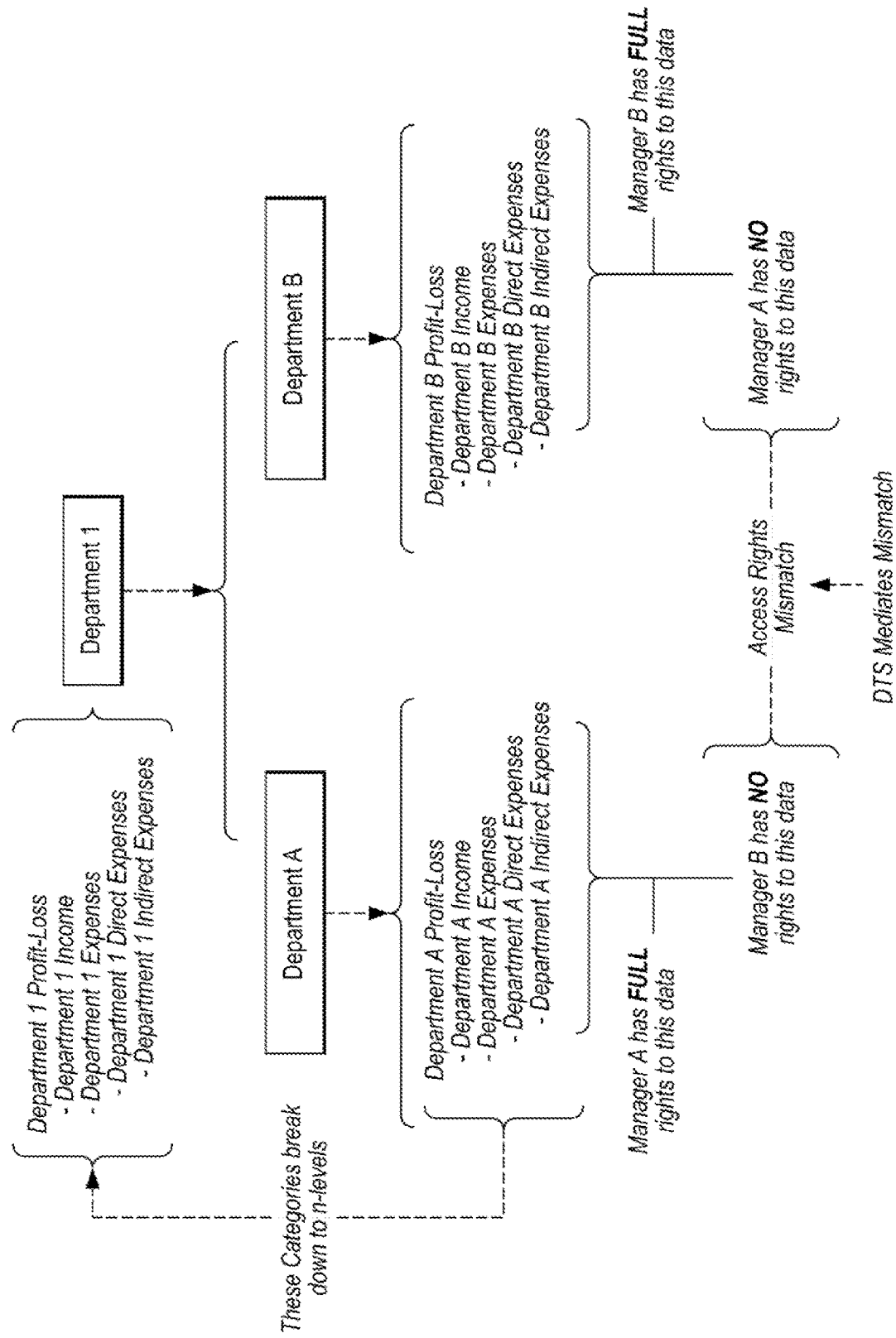

Referring to FIG. 35 and FIG. 36, optionally based on various optional input factors, including user input, exceptions to local policies that are handled by the system, global policy factors, the nature of existing policy instances, content-emergent factors, content structure factors, and global exceptions), elements of local access policies may be used to assemble an instance policy object, which may occur entirely automatically (by a computer program, such as based on data, context, or the like, including in an inductive process) or with human intervention (such as via a computer-based interface to a RAMS system). Assembly may be implemented by various mechanisms, including application programming interfaces, user interfaces, and the like. This may include applying elements that contributed to prior instance policy objects (including applicable exceptions), as well as applying current instance parameters, such as ones that may indicate a variation from previous instances. Once applied, these allow the RAMS or a user of the RAMS to manage a current instance policy object, such as for a given instance associated with a given event.

Based upon the foregoing, in RAMS-enabled environments, entities may grant and receive "multilateral" access to other entities on a "mixed peer" communication basis, where "mixed peer communication basis" refers to a fungible hierarchy that may (at one extreme) possess a "flat precedence geometry" and in another limit, may have a strict hierarchical geometry. A flat precedence geometry refers to schema wherein constituents are unordered and (in this context) entities may communicate without limit with any other constituent and without reference to any nominal ordering, inter-constituent protocol or peer-based precedence. By contrast, a "strict hierarchical geometry" refers to an arrangement wherein constituents are constrained to operate within a set of hierarchical rules, such as where certain entities have priority over other entities. A "mixed" arrangement encompasses optional re-ordering such that, in conditions, peers and groups of peers may be ordered (into, a hierarchy, for example), thus constraining inter-peer communication. "Multilateral" refers to situations where the peers are highly (optionally massively) interconnected and may communicate with more than one peer, such that in the limit any peer may communicate with any other.

Figure 39:
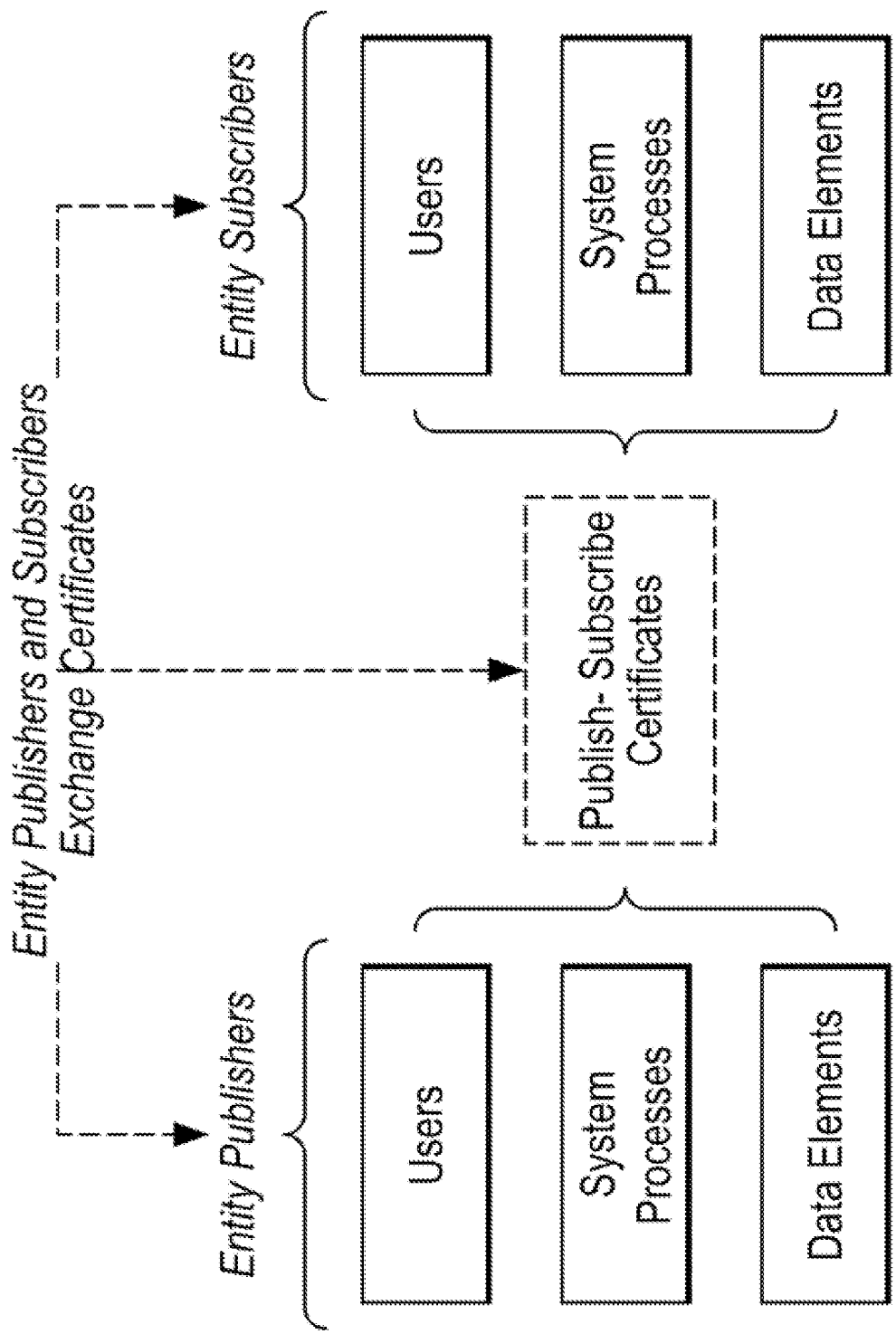
FIG. 39 illustrates exchange of certificates among entity publishers and subscribers.

FIG. 39 illustrates the exchange of publish-subscribe certificates among entity publishers and subscribers, each of which may include users, system processes, and data elements. Publish-subscribe certificates may provide evidence for or certify, for example, access control rights for a given user, system process or data element.

Figure 40:
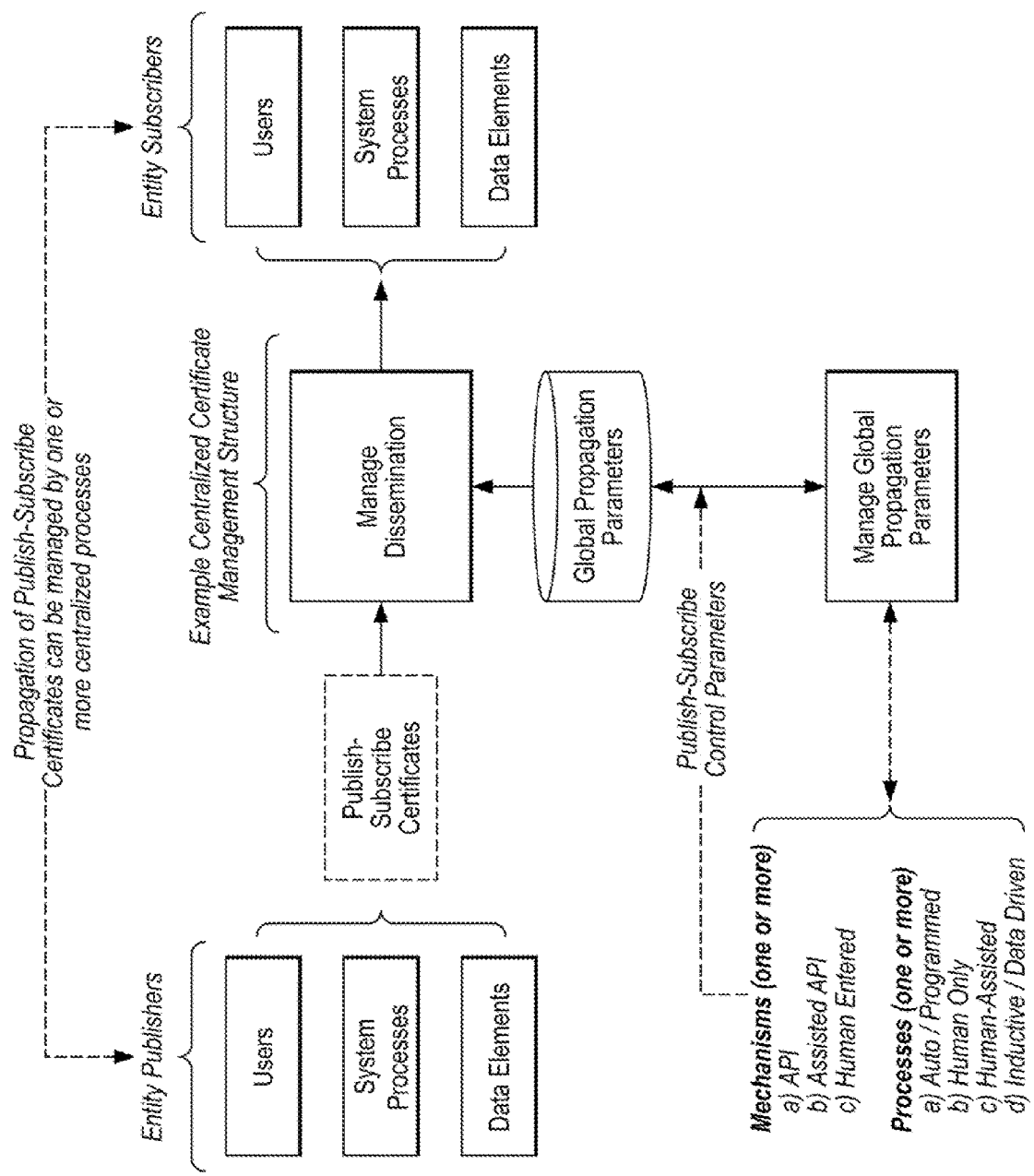
FIG. 40 illustrates elements for management of propagation of publish-subscribe certificates.

FIG. 40 illustrates elements for an embodiment of the system that provides for management of propagation of publish-subscribe certificates. Management may be by one or more centralized processes and may be performed based on global propagation parameters, which in turn may be managed using one or more mechanisms, such as by an API, an assisted API, or via a human using a user interface and via one or more processes, such as automatic or programmed processes, a human using a user interface, an automatic process assisted by a human, or an inductive or data-driven process.

Figure 41:
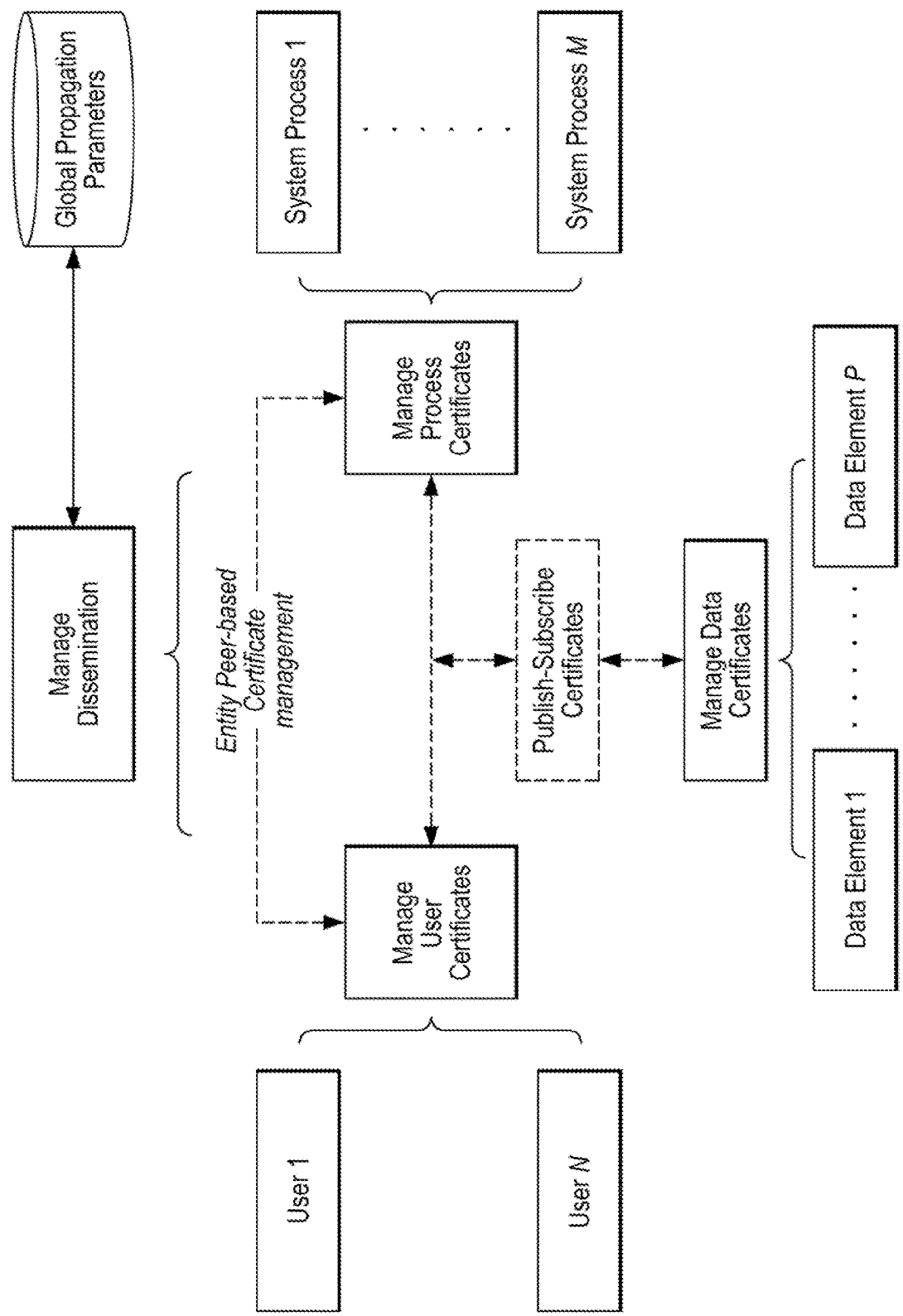
FIG. 41 illustrates elements for management of dissemination of certificates based on global propagation parameters.

FIG. 41 illustrates elements for management of dissemination of certificates based on global propagation parameters and based on entity peer-based certificate management, where entities, such users, system processes and data elements may manage respective certificates in a peer-based system that involves communication and interaction among them.

Figure 42:
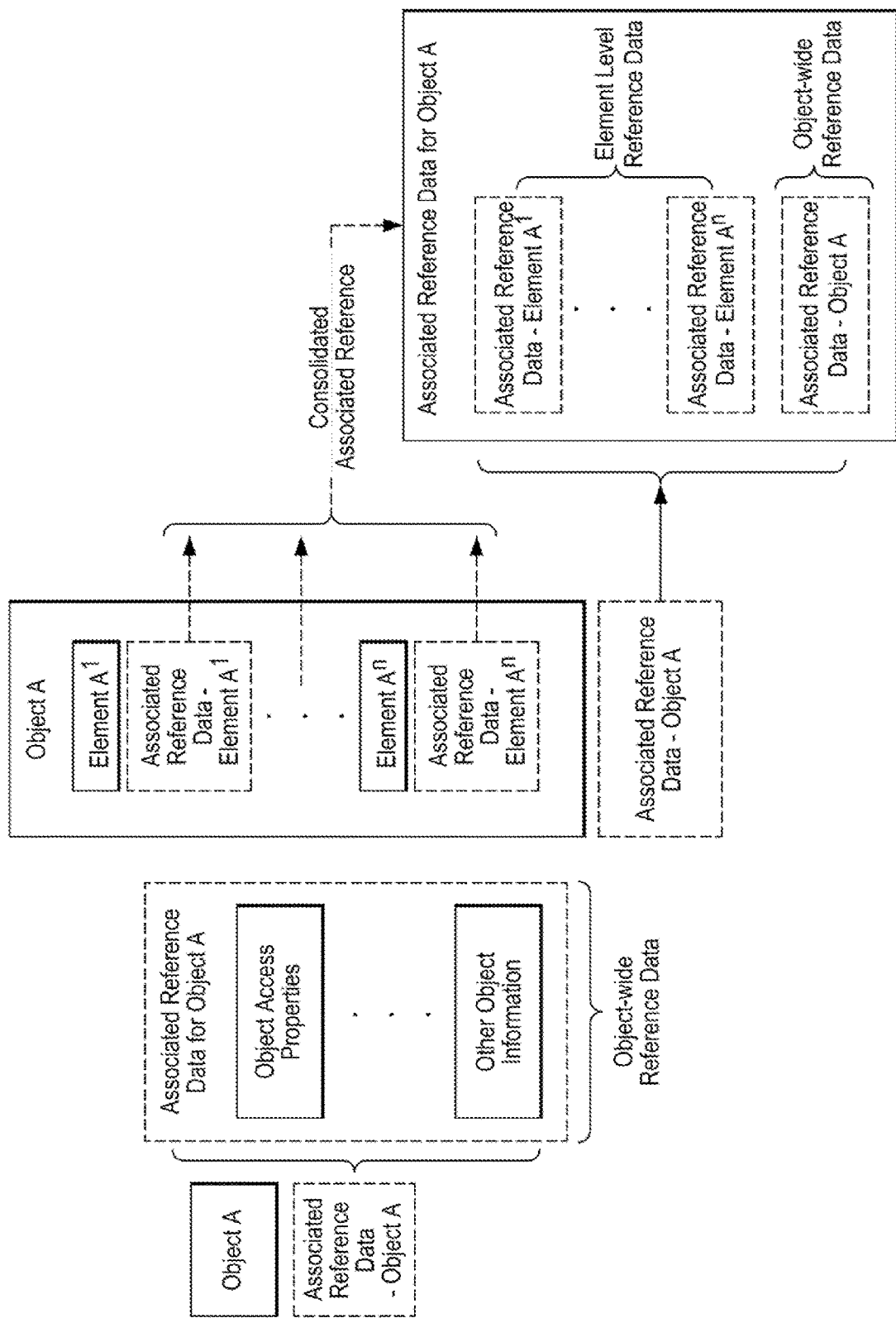
FIG. 42 illustrates association of associated reference data with an object.

FIG. 42 illustrates the association of associated reference data with an object. Associated reference data may include object access properties for the object and other information. Associated reference data, including access properties, may be associated with the object and, in embodiments, may be associated with elements within the object, such that access properties may be varied even among the elements within an object. For example, access properties for a header or metadata element within an object may be different than access properties for other data within the object. A consolidated set of associated reference data may thus include element-level associated reference data and object-wide reference data.

Figure 43:
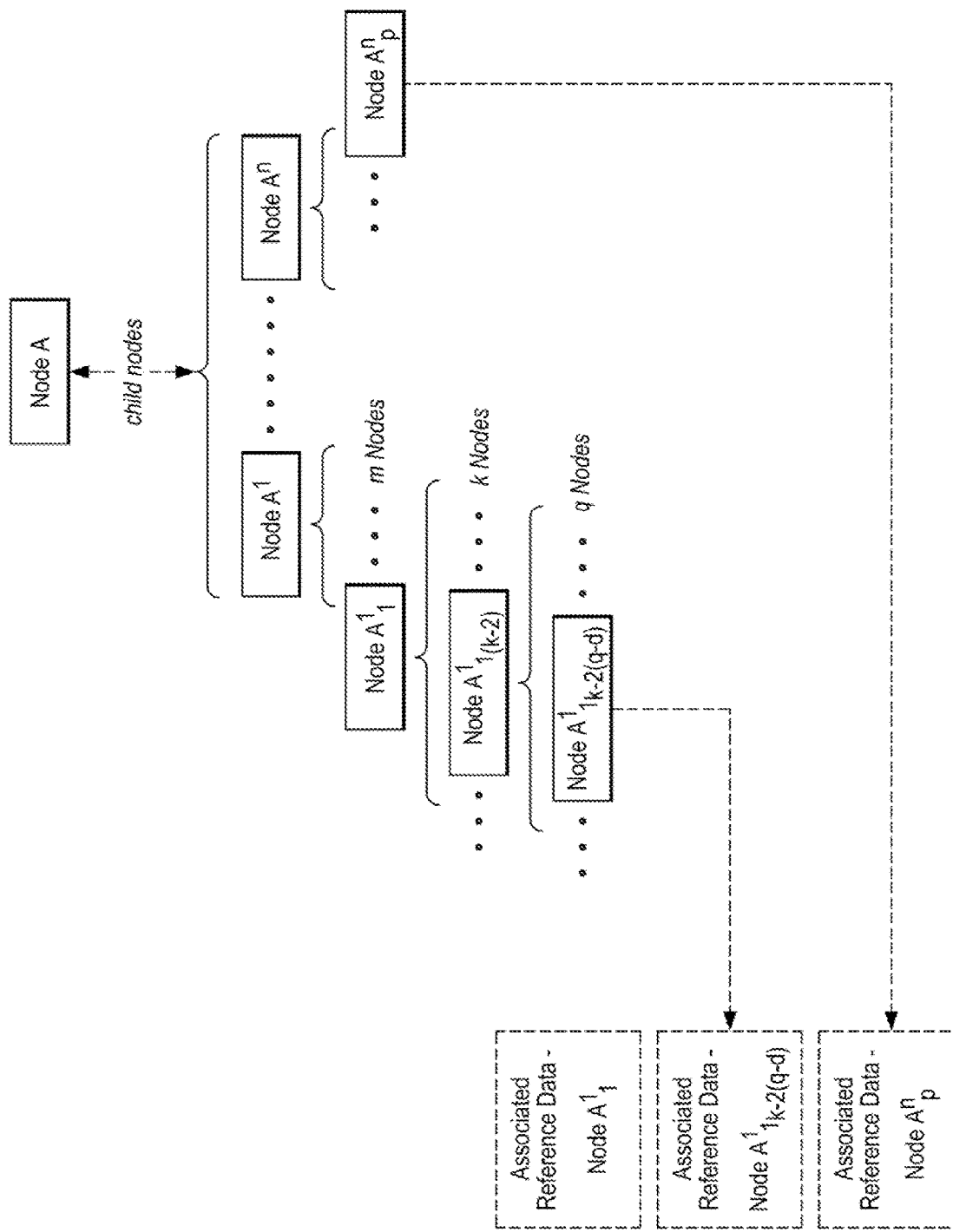
FIG. 43 illustrates associated reference data for child nodes of a node.

FIG. 43 illustrates associated reference data for child nodes of a node in an embodiment. Associated reference data, such as access properties, may be associated with nodes of a hierarchy, such that each node may have a unique set of associated reference data.

Figure 44:
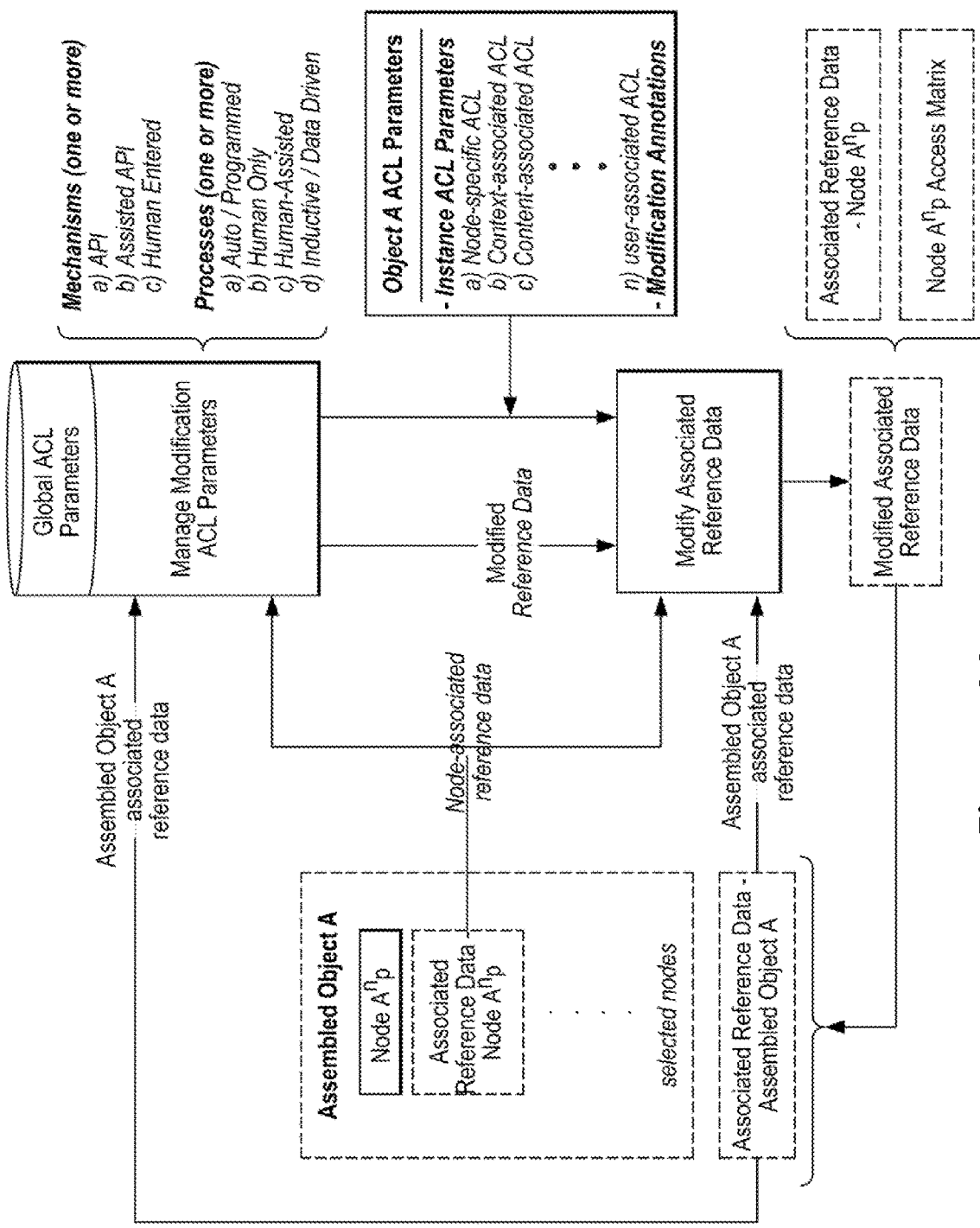
FIG. 44 illustrates elements of an embodiment involving modification of access parameters and associated reference data for an object.

FIG. 44 illustrates an embodiment involving modification of Access Control Logic (ACL) parameters and associated reference data for an object. As noted above, an assembled object may have associated reference data that in turn may have access properties for the object. The object may be associated with a node in a hierarchy or network, which in turn may have node-associated reference data, such as including access properties for the node. Access parameters and associated reference data (including access properties for nodes and objects) may be managed and modified, such as based on a variety of parameters, including global parameters and object-specific parameters (which may include node-specific parameters, user-associated parameters, content-associated parameters, and context-associated parameters). Management of modification may be by various mechanisms and processes, including by one or more application programming interfaces, by a human using a user interface, by an automated process, by an inductive or data-driven process, by a human-assisted automatic process, or the like. In embodiments, associated reference data may include a node access matrix that stores associated reference data, including access policies, for objects associated with the nodes of a hierarchy or network.

Figure 45:
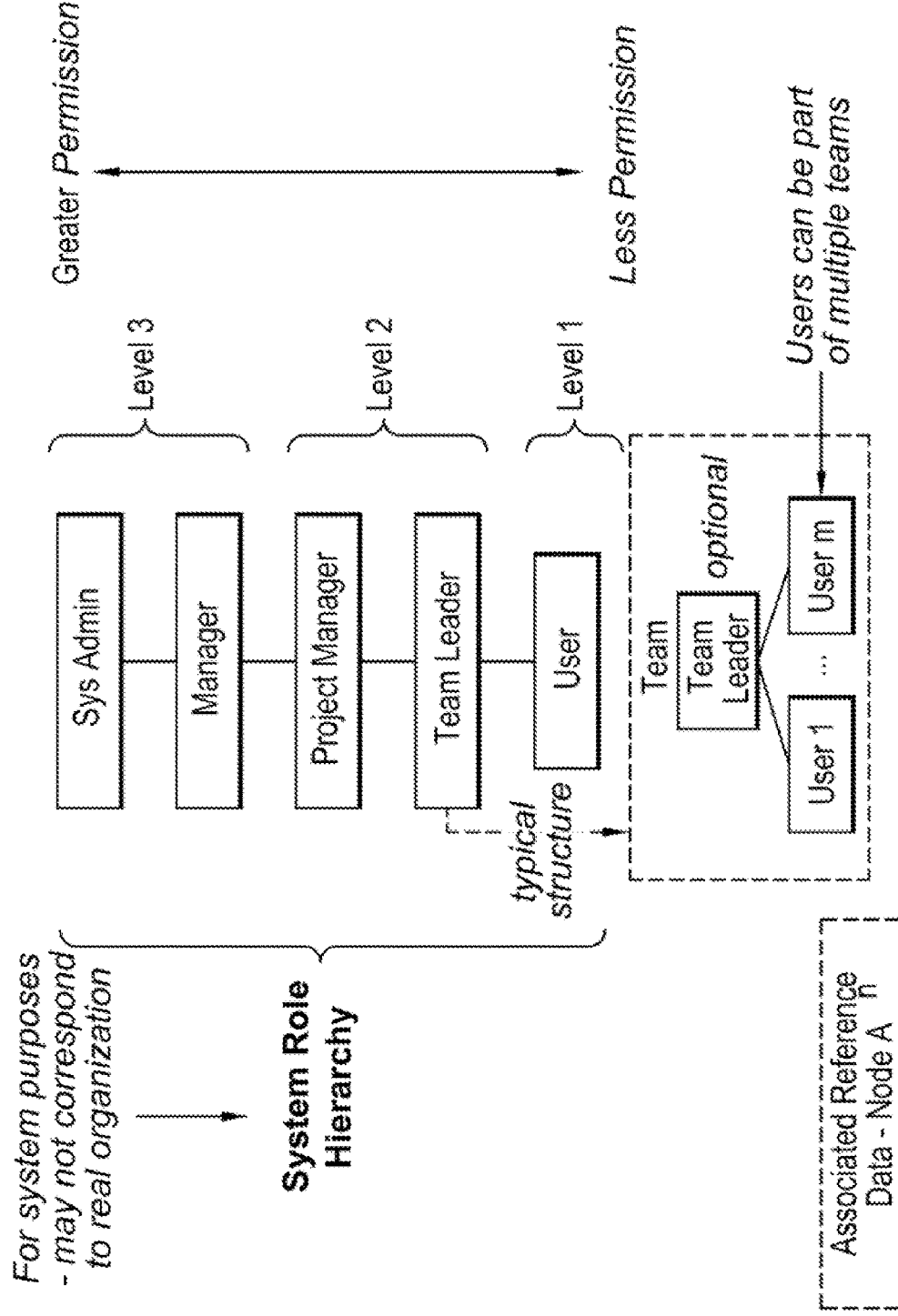
FIG. 45 illustrates a system role hierarchy to which various levels of access may be provided.

FIG. 45 illustrates a system role hierarchy, where nodes correspond to roles in an organization, for which various levels of access may be provided. Greater or less permission may be given to users in the hierarchy, ranging from a basic user to a team leader, a project manager, a manager and a system administrator. Users can be grouped or associated with one or more teams. Associated reference data, including access policies, can be set for each node in the hierarchy, where a node represents each member of the role hierarchy.

As described in the foregoing, methods, procedures, and interfaces within and accessible to RAMS may, in variations, be dynamically configured (or, in some contexts, dynamically re-configured) to operate within and/or in conjunction with a variety of hardware and software architectures and environments, including but not limited to combinations of integrated, semi-integrated, as well as fully or partially distributed computational environments, and/or within standalone, non-networked, integrated, networked or semi-networked, and/or fully or partially virtualized computational spaces (any of which may at various points be dynamically or statically so-configured). In any such variation, the methods, procedures, and interfaces composed within RAMS (and other similar such facilities that may be accessible to RAMS and/or which may be utilized by RAMS) may exhibit and may implement such adaptive dynamic configurations in numerous ways, including but not limited to: (i) invocation of methods of adjusting or modifying one or more operating and initialization parameters; and/or (ii) one or more procedural structures; and/or (iii) memory-based or derived conditionals; and/or (iv) elements within one or more interface structures, where any of all such adjustments, in further variations, may be instantiated temporarily or as semi-permanent or permanent changes, where, in other variations, one or more such modifications may be (permanently and transiently) grouped and indexed as a group, and where one or more so-indexed single modifications and/or groups of modifications may be stored and accessed on-demand. Invocation of any of the foregoing, including access and invocation of stored adjustments (as described) may occur in response to one more operating conditions, in response to internal and/or external factors as well as to current, past, and future characteristics as may be composed within or referenced by one or more subject entities within a RAMS-controlled event or sequence, including but not limited to: (i) entity content; and/or (ii) entity structure; and/or (iii) entity type; and/or (iv) in response to the computational context within which the RAMS-referenced event or sequence may be executed; and/or (v) in response to one or more user or system mandates. Such adaptability, in variations, may extend as far as fungible transformation of methods, procedures, and interfaces (and components and constituents therein) where such transformation may be permanent, semi-permanent, and/or temporary.

This flexibility provides RAMS-based activity with a variety of layered, dynamic, automated, semi-automated, and human-assisted/semi-automated compatibility mechanisms and, in further variations, may provide the means to implement optimization strategies suitable for parallel and/or simultaneous deployment in diverse operating conditions and environments as well as within heterogeneous hardware and firmware executable frameworks as well as in microcontroller-based execution spaces. In variations and in some applications, the parameters that may impact such dynamic, layered, and conditional orientation (or re-orientation) of computational, procedural, and interface components within RAMS may be pre-set (or pre-parameterized) by one or more users and/or by one or more local or remote system facilities, but, in further variations, combinations of such explicit choices may be joined with or may be operated in conjunction with both operating condition-dependent factors and/or with operating condition-independent mandates, invocation cases that may be based upon or result from one more interfaces or other input methods.

In variations, RAMS executable components may optionally execute such adjustments (transiently or permanently) "on-the-fly", and such execution-sensitive orientation (or re-orientation, parameterization or re-parameterization) may, in implementations, be based upon one or more aspects within or referenced by numerous factors within or referenced by the subject computation including but not limited to: (i) relevant entity content; and/or (ii) entity structure; and/or (iii) entity type and/or (iv) computational or identity-related context; and/or (v) logical or inferred conclusions based upon one or more internal or external conditionals; and/or (vi) user or system mandates; and/or (vii) other local or remote inputs or other internal or external operational states. Moreover, in some conditions, such adjustments may be global, impacting the entire array of entities within a RAMS-control fabric but may also be local, applying only to one or more sub-sets of RAMS-enabled entities or one or more groups of sub-sets of such entities, where such local and "regional" adaptivity may emerge (and in some conditions, revert) as a result of any or all of the previously described forms. In some variations, parameters invoking and/or resulting from such dynamic adjustment may be integrated within the previously described RAMS associated information, and, in some embodiments where APM may co-exist with RAMS, may be indexed to or otherwise associated within the DTS Entity Management Fabric, noting that, in some cases, such changes may be optionally included with and/or managed by the identity management services provided therein.

The integrated operational flexibility provided within the RAMS-based control fabric and its distributed capacity to dynamically adjust to locally diverse and locally changeable and independently variable operating conditions (as exemplified in any of the foregoing (example) execution configurations) may, in variations, serve to extend RAMS-based control across multiple heterogeneous operating environments, thereby providing a unified, cross-environment (and possibly cross-device) entity control skein. In variations, therefore, one or more functional elements composed within the RAMS control fabric operationally unify dispersed and distributed RAMS-controlled entities, thus forming an integrated communication fabric among and between distributed RAMS-eligible entities, a distributed execution platform capable of spanning a variety of devices and execution environments through various interconnection schemes. This inter-operative communication capability is supplemented by, is coincident to, and in variations, is interactive with the previously described operational adaptive flexibility, providing a locally-sensitive, locally-responsive, cross-device, and cross-domain inter-operable control exchange layer in support of any or all of the described RAMS functionality.

In embodiments, therefore, distributed RAMS-eligible entities (and entities subject to one or more elements of RAMS-based security fabric) may be arbitrarily composed within, may reside physically or virtually within, or may be accessed as an operating component of, or may be partially or fully otherwise dispersed or distributed throughout not only integrated but separate, discrete computational units, where, in some variations, both the integrated or discrete nature of such units may be physical or virtual, or a combination thereof, and such that one or more sections of any such unit may be transiently, permanently or conditionally accessible via one or more network or sub-net connections and/or within and/or by means of one or more operating components provided by or as part of one or more virtualized computational spaces.

Moreover, in the same manner that, in variations, RAMS-based methods, procedures, and interfaces may dynamically adapt to diverse, changeable, and variable operating environments (as described above), the described communication mechanisms that transmit RAMS access control information to and between entities embedded within such diverse distributed environments (as described) may also implement the same degree of locally-sensitive and locally-responsive adaptability to changing global and/or local conditions. Such variability may be present in collections of interconnected heterogeneous discrete, virtualized, or networked hardware, firmware, and/or software devices and systems, as outlined in but not limited to those referenced in the foregoing descriptions.

In embodiments, therefore, RAMS may provide the means to integrate, manage, and to otherwise provision numerous information propagation configurations, including, but not limited to, such varied communication techniques as unidirectional, bi-directional, and multi-casting schemes, where such protocols may be further enhanced to enable and optimize propagation and dissemination of RAMS-based control information across, within, and throughout diverse and discrete operating platforms and devices. Any or all of the variegated informational structures associated with a given RAMS event-driven (or condition-driven) permission mediation action (however such mediation may be configured, and by whatever means it may be communicated) may, in embodiments, be stored within one or more data storage structure options, where such choices may in some instances, depend on the current or local operating environment. On demand, RAMS information may then be communicated to, amongst, and between local as well as distributed RAMS-based entities using any or all of the means described in the foregoing. In variations, therefore, RAMS may at any time and in response to variable conditions employ assorted communication modalities that may leverage various storage-based information access configurations including but not limited to: (i) storage within and dissemination from one or more centralized repositories (which, in variations, may be physically or virtually co-located with one or more subject events and entities); (ii) dissemination from one or more distributed "local" or "regional" repositories (where any or all such repositories may, as in the foregoing, be fully or in part physically or virtually co-located with one or more subject events and entities); and/or (iii) dissemination utilizing one or more peer-based communication and/or inter-entity method-based information propagation architectures wherein the relevant control information may be passed directly (or in variations, indirectly) among and between RAMS-controlled entities where in such variations, the relevant information may, in one non-limiting example, be passed through one or more collections of mutually interlocking and context-optimized formatting and interface procedures that may be attached to or associated with one or more entities (and/or may be referenced by or indexed to or may be interposed between any of the RAMS associated information, as described previously).

In such peer-based or peer-oriented, direct inter-entity communication environments, RAMS certificate storage and dissemination may, in some variations, also use numerous information exchange protocols including but not limited to: (i) identity-based, address-based, and/or other entity-specific packet-switched communication procedures; and/or (ii) peer-based or grouped-peer-based identity-specific communication conventions; and/or (iii) global, regional, or unit-based broadcast techniques, which may include (but may not be limited to): unicast, bi-lateral-cast, and/or multicast propagation. In RAMS-based distributed communication schemes that use peer-based or peer-oriented architectures, such dissemination techniques may optionally (and, as in the foregoing, transiently in response to one or more conditions) utilize such example inter-entity propagation methods as publisher-subscriber techniques, subscriber-only broadcast, and multi-cast protocols as well as other similar inter-entity information exchange practices, such as may be deployed in parallel or mesh communication environments.

In this context, therefore, recall that the DTS Entity-Management Fabric may subsume, in variations, both RAMS functionality as well as the related (but not inter-operationally required) APM (Associational Process Management) identity management services. Apart from the assorted functionality provided by and within the methods and procedures within and enabled by these entity-centric fabrics, one characteristic that is relevant in the current context and, in particular, with respect to the security layers built into RAMS-based access control, centers about an assumption of the validity or legitimacy of the identity of entities embraced within RAMS-sanctioned events.

Identity authentication assumes a unique position in RAMS architecture for a number of reasons but in the present connection, mainly because entities (users, computational blocks and data elements) are functionally equivalent in many RAMS-specific levels but in this context, most relevantly at the associational and aggregation level (though it will be appreciated in light of the disclosure that each entity-type is different in certain operational functional respects). Given this "entity peerage" architecture and the many ways in which RAMS, in variations. leverages this novel capability (as outlined in the foregoing), the authentication of entity system-level identity assumes a key role in its security scheme. Identity authentication in this connection not only requires that "entity 1" is actually "entity 1" (in system terms) and that the cryptographically-protected access policy associated with "entity 1" is a valid association, but that "entity 1" is also of the entity-type it claims to be. In the latter case, for example, given RAMS-based "entity peerage", a data element may falsely (and possibly maliciously) be misidentified as a user, and the consequences could represent a security breach of a RAMS-triggered event.

In a simple, non-limiting example that utilizes a variation of RAMS-based activity, one that generally illustrates the role of entity identity validation, assume the following: 1) process components $C_1$ and $C_2$ are indexed as a RAMS-sanctioned and indexed entity group. $C_{12}$, and, as described, possess a cryptographically-protected, RAMS-generated Process Aggregation Certificate (sometimes called an entity association policy), $CI_{12}$. as described in the foregoing; 2) assume entity-type user $U_1$ initiates action to perform computational operations reposed within group, $C_{12}$ where these operations are to be performed upon data element $D_1$. As described previously, in variations, this action by user $U_1$ triggers a RAMS-event and, in this example, the RAMS fabric generates an instance policy for this event by assembling and analyzing the access policies associated with entity-type user $U_1$, entity-type data element $D_1$ and the entity association policy $CI_{12}$. Assume further that the result of the RAMS mediation of the rights within these policies is confirmation that the subject entities indeed have rights to participate in this sequence, and further that this mediated result is embedded within cryptographically protected instance certificate, $I_1$. Note that in this simple example, one underlying assumption is that each of the participating entities ($C_{12}$, $U_1$ and $D_1$) are indeed those entities associated with the policies submitted for mediation, and therefore that the mediated permission embedded within instance policy $I_1$ is valid for the current RAMS triggered event sequence. If any of the entities are, through some malicious (or even benign) condition, falsely (or incorrectly) identified in the mediation process, it will be appreciated in light of the disclosure that this nominally RAMS protected event may represent a compromise of the system. Suppose, for example, that data element $D_1$ is actually a different data element but is incorrectly associated with the access policy of D1. Or suppose the entity named $D_1$ (indexed to the access policy for $D_1$) is actually a user or process assuming the identity of $D_1$. Such an imposter may request that RAMS spawn an association and the result may be the creation of an entity association policy based upon false assumptions. There are, of course, multiple ways to attack any security system, and RAMS is no exception, and while this simple example is illustrative of one type of RAMS vulnerability, it does indicate that the veracity of entity identity is an important element in the integrity of RAMS control fabric. Such entity identity masquerading and other attack vectors may tend to emerge in certain environments, especially within the cross-domain and cross-device environments described in the foregoing, but those skilled in these matters may see that such threats may also be present in any integrated, distributed, or virtualized environment.

In the RAMS operating sphere, validation and legitimacy of the identity of entities are relevant in at least two primary ways: 1) the system-legitimized identity or unique instantiation of entities; and 2) the right of such validated entities to communicate, where this "doorbell" access right (a type of "ask-before-contact" capability requirement or a "first-principle right to communicate" protocol) is. in the context of a RAMS-based control fabric, considered to be separate and distinct from the broader array of access and computational rights. Note that in RAMS, misappropriation of an access policy from one entity to another is considered a special case of an entity identity fault.

In the first case, identity validation and authentication of legitimacy requires some type of verification of the actual (that is, system-defined) identity of a RAMS-managed entity. Note, therefore that, irrespective of whether a set of RAMS-controlled entities (or group of entities) coexists with an APM structure where, as discussed. RAMS does not require APM. and nor does APM require RAMS, the advocacy of the veracity of identity is neither inherent in, nor is it required in. all variations or embodiments of RAMS. When implementations of RAMS wherein such verification requirements are present, in embodiments. RAMS may rely upon one or more external processes or facilities to validate or to provide authentication that the nominal or stated identity of an entity (as submitted in the context of a RAMS-controlled event or sequence) actually comports with its "true" identity (as may be defined in the context of the system within which RAMS operates). Note, however, that in other implementations, one or more aspects of identity verification may be integrated within a RAMS event, and that in such cases such variations may include "traditional" authentication techniques (as outlined in the following) but, in further variations, may include novel RAMS-based solutions. The methods, procedures. and interfaces associated with these variations are most evident not only in the initial identity validation but in authentication required in ongoing and context-sensitive RAMS-based execution sequences and/or events.

There are many examples of processes that may satisfy even the most stringent identity validation requirement, and which may comprise one or more elements in any of the previously described validation variations (including those integrated within RAMS). Such validation processes include but may not be limited to bio-metric hardware and software, multi-factor authentication, and hardware-based "dongles", to name merely a few. Any such procedures may be included within a RAMS fabric, or, in variations, may simply be accessible to such implementations through one or more interfaces. Note, however, that such validation techniques are usually applied to users, machines, computers, or even to programs. Most of these methods are typically utilized initially to gain access to these machines, computers, programs, etc. and are not generally deployed or required in the course of the types of events and configurations covered within RAMS-triggered event sequences. Moreover, these techniques are not typically employed with respect to the activities in which RAMS-covered entities engage within the APM and/or RAMS fabric. Further. in many situations. especially in the context of APM and/or RAMS-controlled events, identity validation often requires positive "in-the-moment" responses, including, in non-limiting examples bi-lateral, response-required communication, or other user response-based modalities that are not always practical or feasible in these "in-the-moment" required responses.

The second aspect of RAMS-based validation and legitimacy is related to inter-entity communication rights. Methods and procedures that manage this aspect may be present in some but not all variations of RAMS, but may also be conditionally invoked within certain operating environments described in the foregoing. Specifically, this RAMS-based (or RAMS-enabled) facility may be seen as a type of "first-principle" validation which authenticates the ability (or permission) of a RAMS-sanctioned entity (or group of entities) to communicate and/or associate with another RAMS-sanctioned entity or groups of entities. This layer is separate and distinct from the previously described access rights mediated by the RAMS fabric. Rather, this RAMS-enabled communication security layer may be termed a "doorbell" security consideration, an "ask-before-contact" capability or a "first-principle right to communicate" protocol. This feature may be optionally present and, if present, optionally active in some RAMS implementations and in such variations, may be waived by any number of means or may be vitiated by other functionality. But in other instances, variations or environments, the "ask-before-contact" capability may be permanently waived or may not be required at all. There are many possible reasons for this "doorbell" requirement, including but not limited to protection against modes of attack involving certain types of "man-in-the-middle" techniques, and variations of certain masquerading attacks. These and related types of vulnerability may be more prevalent within the previously described distributed, heterogeneous, cross-domain, multi-device, and possibly hostile or not always fully secure environments within which entities may be arbitrarily distributed, as described in the foregoing. Thus, in distributed and heterogeneous and adaptive operating environments, as described previously, the "first-principle right to communicate" may, in embodiments, provide a novel security layer unique to RAMS.

To illustrate this RAMS feature, assume that: 1) there is an identity-authenticated entity ("originating entity") that wishes to communicate with a similarly identity-authenticated entity ("receiving entity"); and 2) that the access rights assigned to both the originating and the receiving entities are encrypted and reposed within the to-be-communicated structure (in this case, a certificate), one that, in the normal course of RAMS-event sequencing may be transmitted by one of the previously cited means from the originating entity to the receiving entity (and in variations, bi-directionally). Thus, in embodiments of RAMS wherein the "right-to-call" is not active or present or is in some manner vitiated, the originating entity, in response to a RAMS-sanctioned event or sequence, simply routes its certificate to the receiving entity by any of the broadcast and/or communication means described in the foregoing, noting that such facilities may be subject to any of the environmental operating condition variability and responsiveness also described previously. Upon receipt by the receiving entity, the RAMS control fabric mediates the request and, based upon the mutual relevant array of access rights, a resolution is reached.

In variations and in some conditions where the "right-to-call" may be present, required, and active, a further validation may be required in order to establish and authenticate whether the originating entity is even permitted to attempt to access the receiving entity in the first place, even if that submission comprises an attempt to deliver the secure certificate. But note that, in this example case, the required information cannot be accessed since, in a procedural paradox, the RAMS fabric controlling access to the receiving entity cannot determine whether the originating entity has the right to even try to communicate with the receiving entity because the information that mediates that right is hidden in the encrypted certificate.

This example paradox and other procedural barriers that may emerge by virtue of the presence of a "right-to-call" requirement may, in embodiments and in some operating and computational contexts be addressed and resolved by one or more definitional solutions wherein this first-principle "doorbell" access right is treated as a special case of an ordinary access right, where "special" in this context means that its resolution comprises a prerequisite for other actions and, as such, functions as a gatekeeper, conditionally qualifying initiation of other mediation activity. In some variations, such antecedent rights mediation may be accomplished by invocation of one or more RAMS-based or RAMS-enabled methods and procedures and interfaces wherein an actual user or system response is required; in other variations, the "doorbell" may be satisfied by secure access to one or more data stores (as described in the foregoing) where such access and such information may be specifically configured and/or enabled for such gatekeeping purposes.

In other embodiments, however, such solutions may not always be possible and or feasible. This inadequacy may, in some cases, be due to time constraints, efficiency requirements, or even to user inconvenience. But in embodiments and in some contexts within some variations, such procedural issues may alternatively be addressed and resolved through RAMS-based methods and procedures embedded within (or available to) RAMS that may be invoked if and when such paradoxes emerge. In some such variations, as but one example of many possible solutions, the "right-to-call" access rights would be encrypted separately from the larger access rights information. Thus, the parameters required to actuate RAMS mediation of the "right-to-call" may first be transmitted from the originating entity to the receiving entity (utilizing one or more of the example broadcast protocols cited in the foregoing) under a form of commonly-known public-private key exchange. In further variations and refinements, such antecedent "doorbell" techniques may additionally deploy one or more bi-lateral (or multi-lateral) "ack-nack" (acknowledgment-no-acknowledgment) protocols wherein the subject entities exchange positive affirmation in the context of multiple public-private key exchanges. In such example cases (and variations of RAMS permits many others), these "doorbell" technique solutions, however implemented and however resolved in practice. establish or disallow the right of vulnerable entities to communicate, and thus satisfy the prerequisite security requirement.

The methods, procedures and interfaces described in the foregoing provide example variations that illustrate (without diminishing the possible utility nor foreclosing possible applicability and potential suitability of other or additional or supplemental methods) the means by which RAMS may deploy one or more cryptographically secure "micro-information" exchange protocols to address not only the entity identity and "right-to-call" challenges, but other security issues. as well. In embodiments, these and other such techniques may be integrated within one or more RAMS control fabrics and are generally applicable to any RAMS-protected environment. In variations, these "micro-information" exchange protocols may be variously parameterized and configured to provide a variety of levels of protection, and in this sense, may be useful in even relatively secure, homogeneous environments. In less secure environments. however, deployment of more stringent parametrization (and in variations, the addition of other RAMS-based methods) may provide a desirable security stratum and a higher degree of protection. where such enhancements may be appropriate in operating environments where the integrity of RAMS-protected entities may be especially important. But further, irrespective of the sensitivity of any aspect within a RAMS-embraced system, the described RAMS-based "outer" wall, main-message-antecedent information exchange techniques may provide a suitable component in RAMS-protected distributed, heterogeneous. locally variable and distributed networks and sub-networks, as described above. Note, however, that in embodiments, RAMS-based methods, procedures and interfaces that may provide control over or operate upon the parametrization and operation of these "micro-information" exchange routines may, in variations, additionally incorporate any or all of the previously described adaptability and responsiveness measures and techniques. where such techniques may relate to and may be responsive to change within (but may not be limited to) any or all of the following: entity content, entity structure. RAMS ancillary data, computational context and possibly variable operating conditions factors, as well as emergence or detection of threat, attack and other operational fault, where such "security alerting" processes may, in variations, be integrated within RAMS and/or may be otherwise accessible to or otherwise communicated to RAMS and/or RAM-enabled methods, procedures and interfaces.

In embodiments, the security techniques described in the foregoing may be utilized to supplement, enhance and extend the inherent security provided for RAMS-subsumed entities, but, in addition to deployment of one or more of the cited (or non-cited but appreciated in light of the disclosure) example techniques (for instance, the public-private key exchange solution mentioned as an option in the "right-to-call" sequence), alternatives techniques may, in some implementations, prove efficacious. One such alternative is called "DTS entity chaining" (which may be equivalently referred to as "entity chaining", "DTS chaining", "chaining" or "enchainment"). The following description of DTS entity chaining represents but one embodiment out of many possible variations and is framed, for the purposes of illustration in terms of two aspects of RAMS as described in the foregoing: the "entity peerage" architecture and the event-driven structure. Note that many other descriptive frames of reference could be equally valid, and the present pedagogical choice should not imply loss of general applicability of methods and procedures composing DTS entity chaining (and variations appreciated in light of the disclosure) to other systems and contexts.

In the same spirit, DTS entity chaining will also be described below in terms of the two security hazards described previously, namely, the entity identity and the "right-to-call" hazards, but note, as well, that the choice of these particular hazards is arbitrary and that these threats have been selected for convenience and purely for the purpose of illustration, and thus, the application of DTS entity chaining to these particular instances should not foreclose general applicability to other contexts. In this context, again for the purposes of explaining DTS chaining, the following description will cite only one of the many potential hazards that may arise in connection with the entity identity and "right-to-call" issues, a threat vector here called "masquerading". In masquerading, the following description deals only with two cases. both malicious (though many other manifestations are possible): 1) "entity 1" is not actually "entity 1" but has misappropriated the identity of entity 1, including any associated information (as in the foregoing) but in so-doing, attempts to pose as the same entity-type (as a user, for example); 2) "entity 1" is not actually "entity 1" as in the foregoing but is posing as a different entity-type (substituting entity-type "user" for entity-type computational process, for example).

Note, however, that, in general, responses to masquerading most often involve utilization of one or more of the authentication techniques cited in the foregoing (such as two-factor authentication or biometric input). But since the following discussion is centered around DTS entity chaining, for simplicity and focus, it will be assumed that each entity has been so-authenticated at least once. Thus, "entity 1" will have been fully validated to the current required level of reliability, both with respect to its nominal system identity as well as its entity-type. As described in the foregoing, each such entity has an associated Entity Certificate which, in embodiments, may be cryptographically-protected but further, the two aspects of identity (system-level identity and entity-type) may be additionally encoded, obfuscated and protected.

Note further that, notwithstanding the choice of RAMS-based features or aspects to frame descriptions of methods and procedures within DTS entity chaining. the techniques described (and the numerous variations that may not be specifically mentioned but which may be appreciated in light of the disclosure) may be applied in numerous non-RAMS settings and environments, and further. may find additional application in non-security computational and data analysis contexts.

As may be the case in many security-sensitive environments, some level of authentication of the identity of each RAMS-embraced entity is often (but not in all implementations) a requirement within RAMS, and the minimum required level of validation may vary, not only as a function of and in relation to the requirements of a given instantiation, installation or application (and in variations, in relation to the one or more entities) but may also be adjustable in light of any system and/or operating condition variabilities cited in the foregoing, where such adjustability may, in further variations, be dictated dynamically or in response to changeable or changing conditions.

While such veracity is often a prerequisite in many other systems, RAMS operations may differ given the nature of its "entity peerage" architecture wherein users, computational processes and data elements are treated as equivalent objects. This difference is in part due to the fact that, as a consequence of the lack of clear-line distinction between entity-types, certain protection layers are easier to implement (at least in some embodiments) and at the same time harder to "spoof". These characteristics may be due to certain properties inhered in this equivalency, including but not limited to the fact that some conditions and/or relationships between entity-types should never be possible under non-malicious operating procedures, and attempts to actuate such things may be detectable. Further, RAMS-events and RAMS-embraced entities interact according to a knowable set of parameters and rules and, thus, the by-products of legitimate interaction will create and follow certain repeatable patterns, repeatable, that is, within some set of parameters. In variations, such parameters may be mandated or may be inferred or may be derived over time and/or event lines and/or sequences. In one non-limiting example, since entity-types are equivalent, let entities within a system be configured as nodes in one or more (possibly connected) graph structures (or alternatively, as nodes within one or more neural net structures). Over time and event sequences (the instantiation of which may, in variations, become quite complex by incorporating, for example, one or more conditional tests and other internal or external information), a set of patterns reflecting the interaction of those nodes will evolve, and a "normal" (i.e. non-malicious) pattern will emerge. Deviations from such patterns could trigger security alerts, and remedial action may be taken. In variations of this pattern detection, behavior emergent architecture, Instance Certificates that result from successfully mediated RAMS-events may be used in place of entities, but in other variations, such elements might be combined. In embodiments, therefore, the "democracy" amongst users, data elements and processes may be leveraged by methods and procedures within the RAMS control fabric to detect and to vitiate certain types of malicious activity.

In embodiments, upon initiation of a qualified RAMS-event sequence, the access rights of participating entities may, in variations, be encoded within an Instance Certificate (and optionally cryptographically-protected), as described in the foregoing. As previously noted, an Instance certificate may, in variations, encode a great deal of information about the subject RAMS-event, including but not limited those detailed in FIGS. 31A and 31B. As also noted in FIG. 31B, RAMS may, in variations, retain and store Instance Certificates (see data store 10967 in FIG. 31B), and in so doing, will create an index (and optionally a name). In a further variation of this "logging" operation, the index itself may be cryptographically-protected, encoded or otherwise obfuscated, and in some implementations, this encrypted index may form all or part of a shared secret distributed to or accessible by entities that are eligible for this access. Note that, in embodiments, optimization and efficiency-promoting techniques may be desirable since RAMS-qualified events may occur frequently and may often involve the same participating entities, especially users, and the indexing and storage of Instance Certificates provides one such optimization.

Note, however, as mentioned previously, for the present purposes, the authenticity of each of the participating entities has been verified initially, so that both aspects of entity identity (system-level and entity-type) for each of the participating entities are assumed here to be authentic. Thus, the validated mediated access rights as well as the authenticated identity of the participating entities are composed, along with other information, within the stored Instance Certificate. As outlined in the previous discussion, in variations, upon successful mediation of access for each of the participating entities, methods and procedures composed within RAMS may then generate a set of cryptographic products, which in the present (non-limiting) example may include one or more sets of multi-party homomorphic keys (noting, of course, that in other variations, other cryptographic and secure data management techniques may also or in addition be used). Each of the participating entities may be granted an instance of such a key and this, in variations, may serve as one means by which a participating entity may access the Instance Certificate at a future time. In embodiments, once in possession of such a key, an entity may submit the key to one or more methods within the RAMS control fabric, a communication that, in variations, may be made "in the clear" or which may use a public-private key exchange or which may take place under the rubric of some other cryptographic scheme (such as a secure shell) but which in any case constitutes a "request" to access or operate upon or to associate (or take some other action) in relation to or with one or more of the entities participating in the subject Instance Certificate.

Returning to the previous example involving a set of RAMS entities, recall that computational group $C_{12}$ subsumes a set of computational entities $C_1$ and $C_2$ where each computational entity represents a set of methods and procedures that may be permitted to be logically grouped based upon one or more process association rules, where, if permitted. the resultant aggregation comprises a sub-set of methods and procedures drawn from a larger set of available methods and procedures. a grouping that may be instantiated, in variations, through user and/or system mandate or in response to other means and conditions. Recall also that in managing the association of computational entities $C_1$ and $C_2$, methods and procedures within RAMS generate a Process Aggregation Certificate (sometimes referred to as an entity association policy) which in the present example is called $CI_2$. In a manner similar to the previously described Instance Certificate $I_1$, $CI_{12}$ subsumes information including but not in all variations limited to information surrounding its creation, information about the entity identity (and type) of its constituents, information about the mediated access rights associated with each of the computational entities $C_1$ and $C_2$ as well as the combined access rights now associated with computational group $C_{12}$. Finally, in variations, as with the previously described Instance Certificate $I_1$, the information within $CI_{12}$. may be encoded and/or cryptographically-protected, and then indexed and stored. Note that in the present example, the entity identity and entity-type of computational entities $C_1$ and $C_2$ have been authenticated.

In the present example, assume that the previously described entity-type user $U_1$ and entity-type data element $D_1$ participate in the activity in the prior example, combining with computational group $C_{12}$ to trigger a RAMS-event, which, as described, results in Instance Certificate $I_1$. Recall, as well that both entity-type user $U_1$ and entity-type data element $D_1$ have been authenticated (as described in the foregoing) and, therefore, that all the information composed within and related to Instance Certificate $I_1$ is similarly valid. Next, as with the previously described certificates in this example, assume that the information within Instance Certificate $I_1$ has been encoded and cryptographically-protected, and then indexed and stored. Finally, suppose that the RAMS-event represented by Instance Certificate $I_1$ is one of n such events, each possessing a unique Instance Certificate, where the nth such event is associated with Instance Certificate $I_n$. Assume also that, as in the foregoing, all such Instance Certificates as well as the participating entities have been authenticated, as in the case of Instance Certificate $I_1$ and that each of the n such Instance Certificates has been likewise encoded, cryptographically-protected and then indexed and stored. Each of the n Instance Certificates therefore possesses a unique set of keys which, in the present example, will have been distributed amongst the relevant participating entities.

But suppose that at some point in time after the creation of Instance Certificate $I_1$ entity-type user $U_1$ re-initiates the same action previously validated and covered by Instance Certificate $I_1$. In this present example, assume that the nominal entity-type user $U_1$ is in possession of the previously generated homomorphic key assigned to entity-type user $U_1$ upon the creation of authenticated Instance Certificate $I_1$ and thus, in the nominal case, entity-type user $U_1$ is able to execute the associated RAMS-event. But there is no guarantee that entity-type user $U_1$ is not another user or even another entity-type masquerading as entity-type user $U_1$. In variations, there may be other methods that may reduce some of the risk in such situations, but such hazards may not always be fully vitiated.

"DTS entity chaining" represents one solution to this dilemma and a continuation and expansion of the present example may serve to illustrate an example embodiment of the constituent enchainment processes. Assume that each of the n events cited in the foregoing (and associated with n Instance Certificates) occurred at some quantifiable and unique discrete point in time within the host system or with respect to some shared-resource clock (noting, of course, the existence of an edge case wherein two events might somehow occur at exactly the same time. but further noting that in variations, such "collisions" may be detected and prevented). Suppose further that. in the current example, multi-party homomorphic keys are employed in the access mediation process and that methods and procedures composed within RAMS that manage the generation of these multi-party homomorphic keys ensure, for each event instance, that each key-set is unique, an operation that, in variations, could use any number of parameters unique to the event including but not limited to time stamp (as in the foregoing). place and context in which the event certificate is created. Thus, each key in the set of multi-party homomorphic keys associated with any event would be unique. An entity participating in the nth event would, for example, possess a key from the set that is uniquely generated in conjunction with and which is made to operate only with Instance Certificate $I_n$. The DTS enchainment process mandates that each such Instance Certificate be linked to another, where the method of inter-Certificate referencing may use any number of techniques, some of which may be as simple as singly or doubly linked lists structures but which, in variations, may also and/or instead employ one or more encoding and/or cryptographic methods. In any case, when two or more Instance Certificate are enchained, methods and procedures associated with the DTS entity chaining capabilities ensure that the order of enchainment remain inviolate, where the specific order may be based upon any number of factors or upon a combination of factors, including but not limited to: a timeline, an event or sequence line, one or more system and/or external conditions, one or more elements composed within at least Certificate or a combination of any or all such factors.

Note, however, that the use of Instance Certificates is but one choice in DTS enchainment. Other variations of DTS entity chaining may also or instead use one or more elements that may be associated with any entity-type, where examples of such elements are included but may not be limited to those shown in FIGS. 22-25. In variations, since much of this ancillary information may be unique to a given entity, this data may be collected and filtered and may be made subject to a variety of encoding and formatting processes which may then be used in as an element in a DTS enchainment scheme. The important point in this context is that the entity-type structure within DTS and RAMS (and as may be managed by APM) is rich in entity-specific information, any portion of which may be used both to validate identity and/or as a factor in binding the entity within a DTS entity chain.

As those familiar with these arts may see, DTS entity chaining is essentially a type of blockchain schema or distributed ledger system, and in variations, DTS entity chaining may bear some similarity to known and popular "mainstream" distributed ledger architectures. In crypto-currency systems such as Bitcoin™ and other crypto-currencies, a unit-of-value is spawned as the result of successful completion of a cryptographic brute force 'mining operation', and this "unit" may be seen as analogous to DTS-spawned entity-related structures, such as, for example, Instance Certificates cited in the foregoing example, DTS entity chaining, in this example variation is analogously similar crypto-currency systems in that Instance Certificates may only be placed in an enchained sequence upon successful performance of a task, where in this example variation, the task is the successful creation of mediated set of rules and the subsequent creation of a set of multi-party homomorphic keys. Thus, in the present example, successful enchainment of a given Instance Certificate conveys authentication of the event with which it is associated; this validation implicitly authenticates its participating entities. as well as the rights conveyed in the Certificate. Therefore, in the context of the present example using Instance Certificates, if an entity may be successfully (and authentically) correlated with at least one instance of itself within an enchained Instance Certificates, the identity of that entity is validated by virtue of its position as a constituent within a "unit" in the chain. In embodiments, methods and procedures and interfaces within RAMS and within the DTS enchainment processes provide the means to validate these connections.

In addition, in embodiments of DTS entity chaining, the order and terms of linkage of the enchained certificates may be protected in a number of ways, including but not limited to traditional cryptographic means as well as various other methods of obfuscation. In variations, the enchained certificates, whether encoded, encrypted or otherwise obscured, may also be "published" and attached to, distributed to and/or associated with any of the elements covered within the RAMS control fabric. and/or other DTS objects and/or in other non-DTS internal or external locations, so that tampering with an enchained certificate could be detected by means typically employed by distributed ledgers. Protection by publication, essentially a type of shared secret, is another way that DTS entity chaining may be seen as similar to a distributed ledger system.

In embodiments, methods and systems for entity chaining are described herein and include a wide range of techniques for securing entity information found, for example in and through Instance Certificates, Aggregation Certificates, Event Certificates, Associational Certificates and the like. Other entity information that may be secured may include Entity Root Certificates and the like. Described below are additional techniques for securing information available in the DTS Platform, including entity information and the like.

Variously throughout this disclosure, methods and procedures for managing access by and to entities to other entities (e.g., user, data, processes and the like), information associated with and/or linked to entities (e.g., the exemplary Certificates mentioned above and elsewhere herein), are described and depicted in accompanying figures. On such embodiment comprises one or more variations of the described Recombinant Access Mediation System (RAMS), such as mediation for access by a first entity to a second entity. An example of such access may include aggregating two entities into a group or team that, once formed, can perform additional access functions.

Mediation for access produces an outcome that may include a certificate that may represent an authentication of the requested access (e.g., a pair of user entities joining to form a group may be authenticated by an Aggregation Certificate generated in association with mediation by the pair of user entities, and the like). As described herein, a certificate that represents an outcome of access mediation may be generated for any type of access between and among entities. Additionally, execution of processes within the DTS platform result in an Event Certificate that facilitates, among other things, identification and tracking of participating entities, source and generated data, and the like.

Also, as described herein, each certificate derived from a mediation event, such as mediation for access, is linked to a root certificate for the participating entity/entities. In a basic example, a user entity may request access to a data entity (e.g., a document). Upon successful mediation, a certificate (e.g., Instance, Event, and the like) is generated and linked to a root certificate for the user entity and the data entity. If the user entity is an aggregated user entity (e.g., a group of two or more user entities), the mediation certificate generated when the group is granted access to the document will reference the Aggregation Certificate for the user group and the root certificate for the document entity. The referenced Aggregation Certificate will reference the root certificates for the user entity-members of the group. Therefore, a link can be established from a mediation generated access certificate (a group of users accessing a document) indirectly to the root certificates of the individual user entities in the group.

Securing this multi-dimensional certificate linkage and the content of the certificates may be accomplished by enchaining the certificates to form Multi-Dimensional Enchained Certificates (MDEC). Each certificate in a MDEC chain may be encrypted with a key that is shared among the entities identified in (and therefore authenticated to access) the certificate. The secure access certificate may include information that facilitates identifying a next chained certificate, but may not alone provide the unique shared key for this next chained certificate. Only entities identified in this next chained certificate may be provided the shared key to decrypt it. In this way, access to associational and related certificates generated by RAMS enforces entity authentication at each certificate in an MDEC chain based on a unique shared key for the certificate. Without this shared key, even visibility to the next certificate in the MDEC chain is not accessible.

In an example of MDEC, a first user entity may mediate for access to an owned data entity that is owned by a second user entity. Note that the first user entity may have a root certificate referred to in this example as U1RC. The owned data entity by the second user entity may be a result of access mediation such that the owned data entity for which the first user is mediating access may be represented by a certificate (e.g., an association certificate and the like), called for convenience Owned Data Certificate (ODC) that links to a root certificate of the second user entity (U2RC) and to the root certificate of the source data entity (SDRC). Upon successful mediation for access to the owned data entity, a certificate representing this access may be generated (U1AC) and enchained to the owned data certificate (ODC) that is, as described in this example, enchained to the root certificates of the second user entity (U2RC) and to the source data entity (SDRC). In this example, the first user entity may modify the owned data entity, causing, for example an event certificate (U1EC1) to be generated. This modified owned data entity may then be published, effectively causing a second event certificate (U1EC2), to be generated. In this example, three MDEC chains are formed:

U1EC2.0 1 EC1.0 1 AC.U1RC
U1EC2.U1EC1.U1AC.ODC.U2RC
U1EC2.U1EC1.U1AC.ODC.SDRC

Each MDEC chain terminates at an entity root certificate. Alternatively, a branched MDEC chain of certificates is formed that starts with the most recent event (publishing) and carries down through three branches to a root certificate for each entity. The MDEC chain starts U1EC2.U1EC1.U1AC. It then branches three ways: (i) U1RC; (ii) ODC.U2RC; and (iii) ODC.SDRC.

Securing this MDEC chain(s) may include using any of the certificate security and enchaining techniques describe herein and may further include encrypting U1EC2 with a shared key that is securely communicated to the root entities, namely user 1 entity, user 2 entity, and source data entity. Each certificate in this MDEC chain may be encrypted with a shared key that is shared with the root entities. Additionally, the certificate for user entity 1 modifying the owned data entity (U1EC1) may only be visible by traversing the MDEC from U1EC2 by first decrypting and accessing the content of U1EC2. By applying this chain-following technique, access to, for example an entity's root certificate requires multiple dimensions of decrypting with shared keys that are only accessible by the root users.

In embodiments, an MDEC chain of certificates may facilitate decrypted access to a shared certificate that is next in the chain by decrypting an adjacent certificate. In this example, entities that decrypt U1EC2 may gain access to a decrypted version of U1EC1, such as by accessing a partial decryption key for U1EC1 in certificate U1EC2. However, accessing U1EC1 in this example may be limited to entities that are identified in and therefore authenticated to access U1EC1. In the branching example above, user entity 1 may reveal the partial decryption key for ODC when accessing the shared certificate U1AC; however, because user entity 1 is not a party to the owned data and therefore is not identified as authenticated to access the ODC, user entity 1 may be prevented from accessing the ODC, which may for example reveal information about the participants in the owned data that those participants may wish to conceal.

In yet other implementations, the certificates themselves may be securely shared with the root entities and may represent shared keys for traversing the MDEC chain from the last event to the root entity. While all entities may have access for decrypting to all shared certificates (e.g., U1EC2, U1EC1, U1AC, those certificates that are formed on a branch separate from one or more of the root entities in the shared certificates may not have access to these certificates or to the branch in which they occur. In this example, only user entity 1 may have access to its root certificate (U1RC) but does not have access to the owned data certificate (ODC) that is formed by user entity 2 owning source data. Both user entity 2 and source data entity may have access to the owned data certificate (ODC) in which each is a participant. However, only user entity 2 has access to root certificate U2RC and only the source data entity has access to root certificate SDRC.

In some embodiments, DTS entity chaining and any of its variations and derivative structures can also or instead be applied as a component within other distributed ledger system where, in a variation, one or more Instance Certificates (or other DTS object, as in the foregoing) may be "enveloped" in a blockchain wrapper and may either participate as a unit or may be linked to another such unit within that blockchain structure. Blockchain employed to secure digital assets, such as digital currencies and the like is generally known as a mechanism for providing improved security for such assets. However, security of a block chain, distributed ledger and the like may be enhanced further by controlling access to the assets and/or mechanisms by which the assets are manipulated through use of methods and procedures of a DTS platform, such as without limitation access mediation as may be described herein, including in association with a Recombinant Access Mediation System (RAMS). RAMS presents an opportunity to enrich access control that goes beyond conventional mechanisms such as two-factor authentication, secret keys and the like through use of access mediation control capabilities of RAMS. RAMS employs algorithms that, among other things, determine correlations between and among digital representations of aspects of entities, such as without limitation matches between values representing capabilities of entities and the like. RAMS mediation algorithms may perform correlation between two or more entities, such as two users attempting to perform a digital currency exchange by determining correlation of a range of data that is descriptive of the users, which may include activities conducted through or in association with the DTS platform that may be determined to be associated with the users, such as prior digital currency exchanges and the like.

A DTS Platform 1000 including at least a RAMS portion thereof, may further facilitate block chain security through mediation of one or more entities and a digital asset being protected by the block chain. As described herein, each entity, including at least users, data/digital assets, and processes may be treated equally by mediation so that elements that describe capabilities, preferences, and history of any such entity may be applied in a mediation with another entity to determine access by one entity to/of the other. In a block chain example, an entity, such as a user operating a computer may wish to perform a function on a block chain-protected digital asset. RAMS mediation may, in this or another order, mediate access by the user to the computer, by the user-computer combination to a digital asset manipulation function, and by a user-computer-manipulation function to the digital asset. If any such mediation were to produce results that were indicative of an unsuccessful mediation, such as a lack of access rights, the mediated access (e.g., the user-computer combination executing the digital asset manipulation process) could be denied, further ensuring security of the digital asset and/or of the block chain protection system.

DTS-based RAMS mediation further facilitates security of the block chain protection system by ensuring that aspects mediated for combined entities (e.g., a user and a computer) represent those aspects that, for example, both entities share. Therefore, an entity that does not have certain capabilities (e.g., certain digital asset access rights) cannot merely combine with another entity with such rights and therefore gain access to the digital asset. In the example above, while a user may have access rights to execute a digital asset manipulation function, the computer on which the user is requesting to access the function may be restricted from such access based, for example, on previous activity performed through the computer that compromised the security of the computer. In this way, an unknowing user who accesses an unsecured computer to access his digital assets, such as remotely will be protected, as will the integrity of the block chain.

Embodiments of DTS-based RAMS mediation that may facilitate protection of block chains and block chain protected assets through, for example, mediated access to entities of a block chain environment (e.g., users, computers, distributed ledgers, digital assets, functions thereof, and the like) by using representational domain concepts, such as directed graphs and the like that are described elsewhere herein. As an example, data representing capabilities (e.g., security and related capabilities) of a user, computer, digital asset and the like may be converted into a plurality of directed graphs (e.g., acyclic graphs and the like) that may be collocated so that correlations among the graphs may be determined, such as by intersections in the representation domain of capabilities of two users seeking to share a digital asset. If intersections of the graphs fail to meet an access criterion, then the digital asset may be secured from being shared (e.g., transferred from one to the other) by the two entities.

The diverse and broad and pervasive functionality provided by RAMS throughout a Platform 1000 and the methods and procedures and interfaces that administer and maintain System Capabilities is reflected in the similarly ubiquitous TCM (Topical Control Mediation). As noted, and described in earlier sections of this disclosure, the RAMS and TCM control and mediation capabilities along with the Associational Process Management (APM) services, in embodiments, form the core (though, in variations, not the only) operating elements within the DTS Entity-Management Fabric (E-FM), the suite of functional components which provide an array that support specialized functionality and extended capabilities for DTS entities (users, data aggregates and processes). The Entity-Management Fabric (E-FM) binds and integrates and supports the interoperative functionality of its constituents but also, through interfaces, facilitates (but does not, in instances, fully manage) the integration of its subsumed functionality with other elements within the DTS Platform operation environment. In embodiments and in concrete practice, E-FM is implemented through a collection of user- and system-parametrized control blocks and a suite of interconnected and distributed interfaces which, as with many operational components within a DTS Platform, explicitly integrate the DTS-ubiquitous content-sensitive and content-responsive methods and procedures which, in embodiments, may be reactive to content types and operating conditions and may, in context and on demand, dynamically assemble one or more appropriate computational elements to be employed to execute its functionality.

In contrast to RAMS which controls and mediates entity associational and execution capabilities within a DTS Platform 1000 (DTS System Control), TCM provides control and mediation over entity associational capabilities (and in variations, execution of certain system-provided or facilitated functionality) based upon system- and user-defined topics which are assigned relationships with each entity-types. This control skein may, in embodiments, be variably-applicable and conditionally-applied and may be modulated by both users and system processes by means of elicited parameterizations, initialization schemes and other interactive user interfaces which, in many cases may, at user and/or system option, variably, conditionally and by degree and in context, exert regulatory control upon an array of control and mediation parameters, ranging in precision and accuracy from highly granular and detailed to grossly broad and general. Such user and system control overlays may also gather and elicit input and other relevant information from any sources, information aggregates and/or other resources within a DTS Platform (subject, of course, to RAMS control and mediation and other system-fostered control mechanisms), controls and data flows that, in embodiments may be effectuated through one or more methods and procedures and interfaces subsumed with or associated with the E-FM, as described previously. In addition to system initialization and direct and indirect user input, additional system-based input and modulating information may also, in embodiments, include one or more parameters provided by any or all of the methods and procedures and interfaces associated with the previously-described DTS In-App activity logging and metric functionality (as depicted within block 1107 in FIG. 1 and other figures and as described throughout this disclosure).

Despite its moniker and its described focus as being centered upon the mediation and control of the capability of one or more entities to associate with other entities based upon one or more system-defined topics, TCM centered about a particular class of information associated with each entity in a DTS or DTS-enabled system. Referencing FIGS. 15-17 and recalling the descriptions of the various information aggregates associated with, bound to and indexed to each entity, (where in those figures and descriptions, these aggregates are referred to as objects), each entity is assigned at least one such object. In the non-limiting descriptions presented in previously paragraphs which detail example operational modalities and implementations of RAMS, the information and parameters required for mediation of collective DTS System Capabilities associated with participating entities in a given associational or execution context are shown in an example representation as in FIG. 22 as subsumed within information aggregates shown as blocks. While FIG. 22 provides an example configuration of a schematic presentation of such information, details may vary in changing contexts, between different entity types and in variations of these methods. Thus, the examples in FIG. 22 depict the information blocks as they may be configured in one instance for entity-type users while other figures and descriptions detail optional variations as they may apply in other situations and to other entity-types (system processes and data).

Referencing FIG. 22, note that User 1 10702-A has an information block User 1 Object 10703-A, an aggregation of information which is bound to and associated with that user and which, in variations, may be optionally encoded and/or encrypted and/or otherwise obfuscated. But note that information block 10703-A is depicted as composed of a number of sections and subsections revealed in progressive detail from left to right in FIG. 22. These subsections start with information block User 1 Ancillary Data 10706-A which in turn is represented as composed of information blocks User 1 Access Policy Data 10708-A and Other Info User 1 10709-A. Note that, as described previously and as announced by callouts 10707 and 10710 (All Users Possess these Structures and User-Specific & User-unique Addressable Control and Status Data, respectively), each entity (including all entity types) must possess such a structure and that each such structure is unique and specific to that entity and finally is addressable by one or more elements within a Platform 1000. While shown as contiguous in these depictions, note that this information need not be physically or logically continuous, and in variations, and in consideration of certain system considerations, any or all such instances for any entity may be discretely and randomly distributed in randomly variable chunks, and may, in further variations, be independently and/or separately encoded, encrypted and/or reposed within various enchainment schemes, as described in the foregoing.

In the present context, however, note that this variegated entity-associated object contains a variety of information including all the information, in whatever form and format required for the methods and procedures and interfaces within the Entity-Management Fabric and its constituents RAMS, APM and TCM) to execute implement their respective functionality: System Capability mediation and control (RAMS), Associational, identity, indexing and ownership control (APM) and Topical Mediation Control (TCM), respectively.

The information required for TCM and for RAMS, while related, differ in substantial and substantive ways but in variations, may be subsumed in the same repository structure as shown in FIG. 22, for example, as reposed within User 1 Access Policy Data 10708-A. In such an instance, the TCM-relevant information would comprise a separate subsection and, in embodiments, may be distributed within a separate series of database tables. Other arrangements are, of course, possible. Note also that the numerous sources of information and variety of types and formats that may modulate or may be factors in executing functionality for both RAMS and TCM (and other functionality within a DTS platform) may be reposed here and/or may be referenced, encoded or otherwise represented. Topical mediation of entity association is based upon a type of variegated entity-centric aggregation of information similar to a profile called in DTS-terminology the DTS Topical Capability Profile or (DTS TC Profile or simply TC Profile). This unique structure forms the core of each entity's topical identity and defines not only its capability with respect to a given topic but other parameters that assists in the complex associational mediation functionality executed by TCM. Note that the example structure of the TC Profile is described in the following paragraphs in relation primarily in terms of entity-type "users", but these non-limiting descriptions and examples apply equally to other entity types, as well, although, whether and to what extent exceptions exist for a given entity, such exceptions will be noted. Further, any or all of the DTS-based (and/or DTS-enabled and/or DTS-accessible) methods and procedures and interfaces that may be used in the process of creating, maintaining and executing any aspect of TCM as described in this disclosure and variations that may be evident to those skilled in these and related arts, may also apply fully or in part to one or more functional elements within RAMS, but as well as to other aspects within or associated with the E-MF.

The DTS Topical Capability Profiles (TC Profiles) are, in general, germane to a given topic or topics, which, as described previously, may be defined by platform operators and/or by system processes and/or by users. Thus, in implementations, there may be many topics managed by TCM so that, as a result, there may be many discrete instances of such topic-specific TC Profile structures any or all of which may be attached to any entity and/or which may be detached from any entity, dynamically, permanently, transiently and repeatedly based upon any internal or external condition and/or for any reason nominated by platform operators and/or system processes and/or users. Note, however, that, in implementations, and in contexts, any or all such TC Profile's may be combined based upon any number of reasons, including those listed in the foregoing but also based upon information that may be extracted from one or more DTS-based (and/or DTS-enabled and/or DTS-accessible) content-sensitive and content-responsive methods and procedures and interfaces which may, for example, dynamically optimize the operation of TCM based upon (but not limited to) such things as patterns of system usage.

In embodiments, DTS TC Profiles may contain variations of one or more descriptive informational categories such in the following non-limiting example. In variations, such categories may be defined by the platform operator and/or by DTS-based (and/or DTS-enabled and/or DTS-accessible) methods and procedures and interfaces within Platform 1000 and/or by users but may also vary based upon one or more aspects of applicable topic or topics. Such descriptive informational categories within (or implied within) a TC Profile may include (but may not be limited to) any or all of the following in any combination: i) things that an entity is; ii) things that an entity has been; iii) things that an entity can be; iv) things that an entity can do in any of i-iii above; v) given things that an entity can do as in iv) above (in any or all of i-iii) what may this thing as an entity may do and/or be done upon—that is, given an entity (defined as it currently it is and/or as it may have been in the past and/or as it may (or can) become in the future) what things can this entity do and what can it do that thing upon. Note that each element may be interpreted in a number of ways within TCM depending, for example, on such things as the nature of the topic, the context and the possible mediation modalities.

In a simple non-limiting example, let thing T be an entity-type "user" but as a "user" is an instance of user-category A domiciled in location 1 within country C. An instance of entity-type "user" of user-category A can be in one of a number of places, in this case, place X (the living room), place Y (the dining room) and place Z (the kitchen). Let there are two tasks, task Q and task P and two objects, object O and object M. In this example, let the following country-wide rule be applicable throughout Country C such that it overrides all local laws: an entity-type "user" of user-category A can only perform task Q upon object O and can only perform task P upon object M. Thus, in Country A, in no case can an entity-type "user" of user-category A ever apply task Q to object M and can never apply task P to object O. In addition, let there be a rule that applies only in location A (but does not apply country-wide) to all instances of entity-type "user" of user-category A: when entity-type "user" of user-category is in place X (the living room), the entity can perform either task Q or task P, when in place Y (the dining room), can only perform task Q and in place Z (the kitchen), can only perform task P. Thus, in the living room (place X), thing T can either perform task Q or task P (due to the location 1 rule) but if thing T chooses task Q, thing T can only perform task Q on object O (due to the country-wide rule) and if thing T chooses task P, can only perform task P on object M (also due to the country-wide rule). Likewise, in the dining room (place Y), thing T can only perform task Q (location 1 rule) and (due to the country-wide rule) can only perform task Q on object O. Finally, of course, when thing T is in the kitchen (place Z), thing T can only perform task P on object M but cannot do anything with object O since when in the kitchen thing T is prohibited from executing task Q (due to the location 1 rule), the only task permitted for object O. This example can continue but the basic concepts of the relationship of an entity to its Topical Capability Profiles (TC Profile) are clear.

In this simple case, the enumeration of the rules that govern the capabilities of thing T are embodied within one or more Topical Capability Profiles (TC Profiles) and methods and procedures and interfaces embodied within TCM (and within related and associated computational components within RAMS, APM and throughout a Platform 1000) enforce these associational capabilities. Note, however in this case, there is only one entity-type defined, entity-type "user", and only one instance of this entity-type (thing T) and only one category within entity-type "user" (user-category A). Thus, in this simple but possible case (one supported by embodiments of DTS and TCM), there is only one Topical Capability Profile (TC Profile) in place. But in reality, even in simple situations, there may be not only many instances of entity-types (that is, many instances of entity-type "user"), each with a distinct TC Profile, but there may also be other possible categories within which any such instances may be allotted (in embodiments, entity-types may have more than one category) and many additional conditions ("places" in the earlier example) in which each such categorized instance may be, again requiring more types of TC Profiles (or extending current profiles). Such situations are possible in DTS environments wherein TCM must integrate a combinatorically large and possibly growing collection of discrete and different capabilities embodied within TC Profiles attached to an entity-type.

Moreover, the present example only enumerates a single entity-type, a situation that while possible and supported by TCM and DTS, is a simplification of the more typical situations in which there may be multiple entity-types, as, for example, in DTS environments where, as described, there are at least 3 entity-types and there may be more categories and variations within each entity-type. In the first instance, in an extension of the non-limiting simplified single entity-type example, not only could there be many more instances of entity-type "users" (such as, for example, additional user-categories B through Z) but any such additional user-category may have many variations. Each such user-category type and each variation as well as combinations of these categories and variations may each have a separate and distinct set of capabilities and thus, a discrete instance of a TC Profile. Further, as mentioned, there could be other entity-types, each with their own categories and variations and a separate suite of capabilities may apply to each instance, thereby also increasing the instances of TC Profiles.

The simple case presented in the single entity-type example, and the extensions introduced by the addition of more categories and variations, as well as the presence of additional entity-types provides insight into the powerful and novel capabilities provided by TCM. In variations, additional properties may be present in a capabilities enumeration which may include addenda and extensions based upon but not limited to computational and semantic context, subject and state of the one or more aspects of the relevant content, various states of the constituent entities as well as time-based variations and the prior or projected states of one or other conditions. Thus, in light of the foregoing and as discussed in the following paragraphs and examples, and throughout this disclosure with to respect such operations as the combinatorial modalities of Assertional Simulation, the many variations and permutations of topical capabilities within the entity-centric environment of DTS and the application of the multi-modal, multi-layered content-sensitive and content-responsive associational mediation executed upon these capabilities by methods and procedures and interfaces within and associated with DTS Topical Mediation Control, is a unique contribution to the current art, one that extends and enhances the capabilities of current systems, enabling new and novel capabilities.

In embodiments, a DTS Topical Capability Profile (TC Profile) may consist of one or more sections. Note, however, that in many situations, there at least two such structures, called TCM Properties and TCM Characteristics and, often, optional additional sections as may be required in embodiments and with respect to different topics. In general, but not exclusively, these sections are structured identically but contain different nodal values. The following examples and descriptions depict an example implementation of an exemplary TC Profile using a particular taxonomic hierarchical structure for three sections: a nested subsumptive containment hierarchy (or a nested partially ordered set or nested poset), but with the following non-exhaustive and non-limiting list of rules: i) nodes are comprised of at least a key (a label) and a value where no children (siblings) of the same parent may have the same label (noting that in other examples, additional information and references may be present); ii) a node in the hierarchy must either have a child or must be a child of another node; iii) a child may have one and only one parent (noting that this is a property of nested containment sets) and that a label attached to child is non-unique (another property of nested containment sets) so that each node is unique only by virtue of the conjunction of its label and its parentage—that is, a node must be defined and may only be addressed by using both its label and its unique path to the apex of the tree; iv) each child of a parent node inherits at least one of the characteristics of its parent. In embodiments, and in more complex examples, other rules may apply but, in all cases, when this form of hierarchy is used, all the rules of nested containment subsumptive hierarchies apply, even those not listed here, but, in some cases, additional conditions and rules may apply.

Note again, however, that the choice of structure as a nested containment subsumptive hierarchy is purely pedagogic and, in implementations, many other structures may not only be employed but may be optimal for the content, context and the application of the associational mediation control provided by TCM. Note also that as mentioned, such structures may co-exist with other structures and the properties described in the foregoing apply here, as well.

Further, recall that some applications and variations may require or may execute or may conditionally permit TCM functionality to be employed using hybrid or mixed structure Topical Capability Profiles (TC Profiles) and in these instantiations, the structure and content of the informatic aggregation may be transformed bi-directionally and, in instances, dynamically in response to, for example, one or more context-derived and/or content-dependent state, which any such state may be ephemeral, transient or permanent, and/or which may result in the synthesis of a new, discrete instantiation of one or more elements within a TC Profile. As may be noted, this dynamic adaptivity is a near-universal property within a DTS Platform 1000 and applies throughout TCM as well as within the related APM and RAMS components.

These example modalities indicate the many variations that a TC Profile that may exhibit, some simultaneously by means of transformative cloning operations but in all cases potentially combinatorically, based on the dynamic, content-sensitive and content-responsive and context-derived mutability, variability and transformative nature of this unique structure, a property that extends, through the dynamic nature of this profiling structure, to the execution of associational mediation provided by TCM. Note, as well, that any or all such properties may also be applied to and used by one or more elements in the creation, maintenance and execution of equivalent profiling structures and capability mediation as may be present in and RAMS and in variations.

In implementations, therefore, each component element in a DTS Topical Capability Profile (for example the TCM Properties and TCM Characteristics components as well as additional structures) may be created and maintained by the operator of the platform and/or by users and/or by methods and procedures and interfaces associated with various DTS-based (and/or DTS-enabled and/or DTS-accessible) system processes where the relevant operations may include (but may not be limited to) operations that synthesize, add to and subtract from and which may otherwise update and maintain the composition and structures within these aggregations. Note, as well, that, as mentioned, in embodiments, since multiple discrete instances of TC Profile instances may coexist within a Platform 1000, where, in a few non-exhaustive examples among many, each may be germane to one or more different topics and/or may be germane to one or more characteristics or conditions or contexts associated with the subject entity, any such discrete instances may be transiently or permanently spawned in response to any or all the conditions and user-based drivers as in the foregoing and described throughout any of the functionality within a DTS Platform.

Moreover, as mentioned, since TC Profiles may also and/or instead contain multiple topics which may, as well, in variations, coexist with single separately embodied instances, such multi-topic Topical Capability Profiles may be deconstructed transiently or permanently and at any time, as in the foregoing. Such combinations are consistent with the combinatorial mutability referenced earlier and throughout examples and descriptions of the functionality provided within a DTS Platform, and any or all such transformative variations listed in those connections may apply here, as well as others not listed but. Further, as before, any or all such transformative variations and mutational functionality also may apply to any aspect of RAMS.

Note also, that any or all of the previously described DTS-based (and/or DTS-enabled and/or DTS-accessible) content-sensitive and content-responsive methods and procedures and interfaces that may be used in any aspect of the construction, permutation and maintenance of any of the Assertional Simulation Models may also be used in any context and in any combination within TCM but also to create, augment, supplement, operate upon, or otherwise manipulate or modify one or more of the component structures within a DTS Topical Capability Profile (or one or more elements composed therein), where such methods and procedures and interfaces that may be applied to any aspect of TCM and to TC Profiles may include but may not be limited to any or all of those enumerated in (or as may be inferred as applicable within) previously presented figures, descriptions and examples related to Reference Data Models (and other informatic entities), utilizing, for example, any or all content-sensitive and content-responsive methods and procedures and interfaces associated with DTS semantic de-referencing capabilities as well as any or all of the methods and procedures and interfaces that may have been described that incorporate, include, integrate and reconcile mixed ontology and hybrid-domain information from disparate sources as well as from previously-created DTS Models and ancillary information. In addition, any or all of the operations cited above with respect to DTS TC Profiles may be additionally supplemented by any of the previously cited looped, iterative and recursive and optimization capabilities within or available to DTS where any or all such operations may utilize the diverse technical capabilities previously cited, including but not limited to data mining techniques, natural language processing, content-emergent and feature-mapping techniques as well as the plethora of machine learning, evolutionary and AI-based technologies as may be employed in these connections. Note as well, that such dynamic and adaptive construction and modification techniques may apply as well to any aspect of RAMS and its constituent elements.

Returning to the current non-limiting example, the sections within the TC Profile (the TCM Characteristics and TCM Properties hierarchies) are similar but compositionally distinct in that, in embodiments, topic-centric capabilities included in TCM Properties (which are, in DTS-terminology called capability properties in relation to the entity associated with a TC Profile) are those things that may either qualify or disqualify an entity from an association with one or more other entities, for any reason. On the other hand, TCM Characteristics provide information that is itself neither qualifying nor disqualifying but which are descriptive or clarifying in nature and may provide additional such ancillary information as, for example, identity-based, performance-related and supplementary functional information about the subject entity's relationship or disposition to a topic but such that, in embodiments, any or all such ancillary information reposed within the TCM Characteristics hierarchy may also and/or instead be related to or derived from a topic in such a manner that this information may (in embodiments, optionally or conditionally) be used within as a consideration (or variable) within a given associational mediation action and/or which may be otherwise included as a modulating consideration within such a mediation which may (in embodiments, conditionally and optionally) be given some degree of relevance in a given context, sequence or in combination with other properties and characteristics. Note, however, that, in general, the decision as to whether an item should be included within either the TCM Properties or TCM Characteristics sections may be made by platform operators and/or by system processes and/or by users but, in variations, may be context-bound and/or content-related and, in any case, may be dynamically modified or changed at any time.

Finally, recall that in the earlier example involving an entity-type "user" having various capabilities to invoke or exert various actions upon certain objects, this user had different capabilities depending on what condition they were in—in that example, this mutable capability was shown as dependent upon which room they were in. This simple example reinforces the DTS-wide property of the context-based (and in embodiments, content-responsive) mutability of information within a Platform 1000. This mutability property is present within all the elements of the DTS Entity-Management Fabric, including in RAMS and in APM and, in the current connection, in TCM. In TCM, this principle may be seen in TC Profiles in that each entity may possess different capabilities depending on differences in "who they are". In implementations, as stated in descriptions of APM operations referenced in the foregoing, entity-types are identically unique but may have different states, or in DTS-terminology, different "roles". The DTS usage of the term "role" is somewhat different from other usages in these and related contexts within DTS: the comprehensive system-based definition of that entity is anchored to and associated with the role that entity has currently assumed. In DTS-terminology this characteristic is called a DTS Capability Role, a moniker adopted to avoid confusion with the associations implied by usage of the term in other computational contexts and in colloquial connections. Note, however, that in embodiments, another modality of entity typing may exist, namely that there is an additional quality that may attach to an entity called "variety", In these implementations, there are differences between an instance of an entity-type assuming a different DTS Capability Role and an entity-type being of a different variety. Though in some ways, the differences are in degree but more substantial disparities manifest in the manner that associated information may be managed within the DTS Entity-Management Fabric and by APM, RAMS and TCM and other DTS and DTS-based computational components (such as, from example, the In-App Activity and Metrics capabilities). Thus, an instance of entity-type "user" may be of variety 5 and in this variety may have 6 distinct Capability Roles but the same instance of entity-type "user" may also be of variety 3 and may have 2 Capability Roles. Note, however, that while entity-type varieties are optional extensions within implementations (whereas the requirements associated with the binding of DTS Capability Roles to instances of entity-types may not be), in practice, these restrictions are transparent since a DTS embodiment may permit any of its entity-types to have only one variety and may permit one DTS Capability Role for such instance. Note finally, that as with other aspects within TCM and the TC Profile, such configurations may, in embodiments, be modified and controlled and maintained by platform operators and/or by system processes and/or by users but, in variations, may be context-bound and/or content-related and, in any case, may be dynamically modified or changed at any time.

In all cases, an entity may exist as variety of a given entity-type (if this quality is present in the subject DTS embodiment) but must be in a DTS Capability Role at all times and may exist in one and only one at any given time, noting that, in implementations, entities may have a "primary" or default Capability Role. This is shown in FIG. 22 and other figures and described in the context of RAMS but also in relation to the ownership and inheritance properties executed by and managed by APM and the various modalities of Assertional Simulation, but, as stated, these and other characteristics apply equally within TCM (and in other areas within a DTS Platform, as well).

Thus, the entire edifice and skein of information related to an entity, as enumerated throughout examples and descriptions of DTS and Assertional Simulation, DTS System and Topical capabilities ownership and activity history is tied to a specific role. As that entity changes to or assumes a new role, it remains the same instance of that entity but the entire complex of information and functionality associated with the entity in the previous may change, including but not limited to: i) the entire range of ancillary information associated with that entity; ii) the APM-managed identity, ownership, inter and intra-entity aggregation information as well as other identity-centric and identity-related information; iii) RAMS-mediated System Capabilities; iv) TCM-mediated Topical Capabilities; v) In-App Activity Tracking information. In embodiments, any or all of that information may also permute and be passed into association with that entity within a newly-assumed (or newly-spawned) role and, in embodiments, all such information may be modulated or modified or supplemented through direct user intervention and/or DTS-based (and/or DTS-enabled and/or DTS-accessible) methods and procedures and interfaces.

Note as well that one or more elements of the information associated with a Capability Role associated with an entity may change when joining an aggregation of entities (as in the associational proprieties executed in RAMS) but may also change (or be forced to changed) when any aspect of any such aggregation changes or is modified where such changes may include (but may not be limited to) changes in membership composition and/or changes in any or all of the role-associated ancillary information tied to a member of that aggregation and/or changes to any aspect of the RAMS-mediated and/or TCM-mediated associational rules that permitted any member of the aggregation to participate. Further, entities may assume Capability Role(s) for extended periods and/or may pass transiently through Capability Role(s), and Capability Role(s) themselves may, in embodiments, be transiently spawned in the context of one or more operations executed within DTS. Moreover, in the same fashion, as discussed in connection with RAMS mediation, any or all information associated with a Capability Role may be transiently, temporarily, permanently or conditionally changed or modulated in any way in any context, depending on factors present throughout a DTS Platform 1000, including but not limited to factors based upon or derived from the presence of one or more other Capability Roles (or combination of Capability Roles) that are associated with an entity (or associated with that entity within an aggregation). As may be seen, there are many such combinatorial and context-responsive mutations and permutations of any aspect within any component of entity-associated ancillary information, and to the degree that any variation is not enumerated here, the generalized combinatorial principles that motivate this characteristic (which are, as mentioned, present throughout DTS components) accommodate such variants.

These changes are managed by the combined functionality within DTS-based (and/or DTS-enabled and/or DTS-accessible) methods and procedures and interfaces within or associated with the DTS Entity-Management Fabric (as described in the foregoing) and within the content-sensitive and content-responsive methods and procedures and interfaces within its components, APM, RAMS and TCM and associated operational aspects of a DTS Platform. Indeed, the high degree of fungibility characteristics of entity-associated roles and the mutational-role and context-centric nature of the variegated information associated with an entity is another example of the adaptive flexibility that suffuses a DTS Platform, present, in embodiments, throughout its constituent and affiliated computational components, methods and procedures and interfaces.

As a concrete non-limiting example of how TCM and the its described characteristics may be used, recall the earlier example of buyers and sellers in an exchange. In a variation of this example use-case which employed an exemplary but non-exhaustive embodiment of a DTS Platform 1000 and cited the use of various modalities of Assertional Simulation and associated capabilities to assist in the management of a counter-party transactions, let an instantiation of a DTS Platform 1000 be operated as an exchange facilitating financial transactions, specifically, facilitating loan transactions. In this simplified non-limiting example, assume that there are a variety of lender types (that is, a number of Capability Roles for entity-type "user"), both institutional and private, which may offer numerous loan types to a variety of borrowers from different lines of business such that the proposed (and actual) transactions reflect a variety of types and structures of the loans. Note also that the previously referenced "seekers" are those that wish to obtain a loan and the "providers" are those who wish to provide the loans. But in this example, let a third player be present, a broker who, in general, may represent the borrower but may, in some cases, instead may represent the lender. Finally, a minor set of players in this example exchange are called Service Providers who may provide deliverables to any of the other parties such as accounting and audit services.

Note here that the "topic" is financial instruments, and, as in the previously presented marketplace example, each seller possesses a representation of themselves, in this case treated as a Reference Data Model which embodies the tangible-within-the-platform representation of the lender and, in this example, substantially consists at least of the DTS Topical Capability Profile (TC Profile) for that borrower, lender, broker or other service provider. In this part of this example, applied to other parts, as well, let this Reference Data Model be associated with a system user represented in DTS as entity-type "user" who has assumed the Capability Role lender. Let this lender be called Lender 1. Further, let this Reference Data Model be called the Lender 1 Profile, an entity-type "data" that represents the entity-type "user", in this case, Lender 1, in the DTS Capability Role "lender". But note that there are there are two entities here, entity-type "user" and entity-type "data". In this example, Lender 1 (entity-type "user" in Capability Role lender) spawns the Lender 1 Profile (entity-type "data") and thus, in this instance, Lender 1 (entity-type "user" in Capability Role lender) owns the Lender 1 Profile (entity-type "data"). Therefore, based upon the APM-managed ownership schema in DTS, Lender 1 Profile (entity-type "data") inherits all the entity-associated information (as detailed in the foregoing and exemplified in FIG. 22) of Lender 1 (entity-type "user" in Capability Role lender), including all the previously described ancillary information, including but not limited to RAMS, TCM and APM and other associated information.

As an exemplar of this type of Reference Data Model (that is, an instance of a variety of a Reference Data Model that subsumes (at least) an entity's Topical Capability Profile (TC Profile)), note that, in variations, such TC Profiles contain, in addition to the aforementioned, another collection of information (cited in FIG. 22 within block 10709-A Other Info User 1). In the present example, this potentially variegated collection of information may include such things as biographical data, location information, personal information from outside the system, some of which may be curated by the user (entity-type "user" in whatever Capability Role they happen to be in) but some of which may be supplemented and/or enhanced by other entities inside and outside the Platform 1000. In the current example, a Lender Profile (the Reference Data Model associated with that user) may contain such information but additional information, as well, such as may be provided by one or more other users in the system, other lenders, brokers or service providers, for example. Note, however, that some such informatic elements may or may not be visible to some or all of these users such as those that may fall within the same general category as biographical info and addresses, but that others may not be visible at all, while may always be visible. The ability to access and view such information and to control these abilities is a function of both RAMS and APM and is imputed and thus under the control, through APM, of the owner of entity within which such information may be reposed. Thus, in embodiments, examples of non-visible, non-accessible elements that may be subsumed in some such aggregates may include (but may not be limited to) one or more system-generated metrics related to this user and/or to other users in relation to this user and/or to other activity and associational of the Platform 1000, metrics that may be provided by and/or may have been derived from and/or which may be otherwise obtained by means of and/or in conjunction with one or more of the content-sensitive and content-responsive methods and procedures and interfaces previously described in relation to In-App Activity functionality and other such measurement and monitoring capabilities within a Platform 1000. While, as described, one or more elements of these capabilities may lie outside the user's control or purview and may not be accessible to the lender, other elements may indeed fall under direct user control, especially, in variations, one or more elements related to the user's System Capabilities (RAMS elements) and in such instances, this control may be presented and managed through a series of interactive user-facing interfaces.

In the current example, the Lender Profile for Lender 1 also contains the DTS Topical Capability Profile (TC Profile) for that user in his Capability Role as lender, as described in the foregoing. The TC Profile is used within this simplified example exchange implementation in a variety of ways such as, for example, as a useful information source for other users participating in the various party-counterparty transactions that may be invoked in these environments and may not only provide useful explicit information but may also facilitate and enable other capabilities provisioned with a DTS Platform 1000 in such modalities. Thus, as described, a DTS Topical Capability Profile (TC Profile) is comprised of both the two main profiling elements: Topical Mediation Control Properties (TCM Properties) as well as Topical Mediation Control Characteristics (TCM Characteristics), in this example configured as hierarchies as well as other auxiliary information, as described in the foregoing.

In embodiments, the elements that compose these hierarchies may, as described, be initialized and maintained by platform operators and/or by system processes and/or by users based upon one or more defining schemata and other definitional mechanisms, but the assignment of any capabilities to a specific entity is, in general (but not in all cases) executed by the owner of the subject entity, which may be either the entity itself ("self-owned") or by one or more of the entities in the ownership skein within which the subject entity exists. In this example, let Lender 1 be self-owned and is thus free to populate his TCM Properties hierarchy. The lender may employ one or more interactive user interfaces to select one or more appropriate elements from this hierarchy, to define, in this instance, what type of lender they are—or, in the previously described terminology, "who they are". In this instance, there are two main lender types configured as the second level in the TCM Properties hierarchy tree in level 2, Bank and Private Individual. In this non-limiting case, the platform operator has determined (and defined in the governing schema) each of these lender types Capability Role(s). Thus, the Lender 1 may select either of these properties (or both) as Capability Roles. Assume in this example, that Lender 1 works for a commercial bank and thus selects the property "bank" and, in the next level, the property "commercial". In some cases, the lender may be presented with many more choices and may select a wide variety of other properties but in interest of brevity, assume that this comprises a full explication for the properties of this lender defining "what this lender is".

The next element in the TCM Properties aspect of the TC Profile is to address "what can this entity in this Capability Role do"? In this case, though in some instances, there may be a variety of loans types a commercial bank may make, assume that Lender 1 selects just one loan type, the property "debt" (under bank/commercial) and within the debt property, selects the child properties "Line of Credit" and "Term Loan". Next, the lender selects child properties of Line of Credit, "Physical, Collateralized" and "Personal Guaranteed" and child properties of Term Loan, "Physical, Collateralized" and "Personal Guaranteed". Note that, as described, though the child properties of "Line of Credit" and "Term Loan" share the same moniker, they are distinct properties by virtue of their parentage. Since these properties are representations of activities in which a commercial bank may participate, these properties address the question posed previously, "given what I am, what might I do"?

In practice, this process may continue to produce a detailed set of properties for each DTS Capability Role, where the nominal lexical and grammatical representations and the granularity and precision of the properties are determined by the schemata created and managed by platform operators and/or by system processes and/or by users (as described previously), ontological definitions now de-referenced from their original reference frames and recast in the now-DTS-defined frame of reference embracing this topic (in this case, financial transactions). This de-referencing may be seen in many facets of the composition of the TCM Properties hierarchy but most generally, and in manner that is largely pre-emptive of other considerations, any or all of the terms within the tree have different specific meanings in different organizations, in different jurisdictions and in different contexts. While, in general, such a term as "line of credit" may have an industry-standard meaning, it is not necessarily universally accepted in its full semantical and relational depth in all relevant sectors and in all organizations, even within the same jurisdiction. Thus, the DTS-based (and/or DTS-enabled and/or DTS-accessible) content-sensitive and content-responsive methods and procedures and interfaces executed by both RAMS and by Topical Mediation Control (TCM processes that define the semantical characteristics of topics and the representations of various aspects of these topics) may deploy any or all of the previously described DTS semantical re-referencing functionality, as described, and this is another novel use of this DTS capability.

Lender 1 may now augment the properties within the TCM Properties hierarchy with information within the related Topical Mediation Control Characteristics (TCM Characteristics) hierarchy, as mentioned. In this case, let the lender select a top-level characteristic "Services" and two child nodes, "Insurance" and "Local Relationship Management". Note again, that these are not properties in that they do not themselves provide a determination as to whether the lender may associate with another entity but rather are supplemental aspects that assist in optimizing such associations. These characteristics contribute to the question "what might I do" but are directed slightly differently in that they address the question "what things might I be able to add to what I have stated I might do that enhance those first set of things", where, again, such enhancements are not determinative but supplemental to the associational mediation executed by TCM.

Finally, in this instance the lender must answer the question "given what I am and given both what I can might do and what I might do to enhance those things I might do, what might I do those things upon"? Once again, this is a domain-defined question, but in this instance, given that the domain and frame of reference created in the course of constructing these hierarchies, as previously described, in this example, there is third hierarchy defining the objects upon which the activities are directed—in this case, who the businesses lender may wish to make loans to. This hierarchy may be constructed and maintained as in the previous hierarchies and is here called the Business Type hierarchy. This can be an extremely detailed structure as may be seen in the widely-accepted Standard Industrial Classification Codes Systems (SIC Codes), a hierarchy listing the many types and sub-types of businesses in many industries. Thus, the lender may select any number of businesses with which they would like to do business from this list. Note again, however, that not only are SIC Codes from a different domain than that occupied by a financial services institution, since SIC Codes are used across the business world and not only by banks, but DTS semantic de-referencing may be applied to coopt the text strings and to disconnect the meaning and recast the semantical frame within the same that encompasses the other elements within the DTS Topical Capability Profile.

This example of a DTS Topical Capability Profile is not finished being processed in this case since there is no guarantee that the terms that reference capabilities within the hierarchies are compatible. In the current example, the rules and regulations that govern the activities of the users within this embodiment of a DTS Platform configured as a loan-oriented financial services exchange are highly complex and changeable with the many nuances of the applicability of laws and regulations which may be subject not only to interpretation but may be jurisdictionally defined. Moreover, such jurisdictions may have striations wherein different administrative levels exert authority differently and with different rules over different subject matters. Thus, in the US, for example, certain laws are promulgated by the Federal Government and supersede State laws, while others are left to the States, but in such conditions, some States may permit local jurisdictions to exercise control while others do not, and in any case, any one of those outcomes may differ across local jurisdictions.

In embodiments, this problem is addressed by considering the user-generated DTS Topical Capability Profile consisting in this case of the TCM Properties hierarchy, TCM Characteristics hierarchy and Business Type hierarchy, as an "unconditioned profile". In DTS-terminology, in the present example, applicable to any similar application of these capabilities, this expression refers to the state of the elements within a DTS Topical Capability Profile as "unconditioned" by any relevant laws and regulations. This moniker and the possible solutions that DTS Platforms may apply also apply to other such aggregations, as well. An unconditioned DTS Topical Capability Profile may not always be used effectively as an element in topical associational mediation since it may permit associations that are prohibited by applicable laws or may be conditionally permitted, or in some embodiments, may be forbidden or discouraged by customs and norms (again, in some instances, conditionally), and in further cases, may be excluded by platform-based policies. Moreover, users may also wish to prohibit certain associations or may wish to impose conditions upon such associations for users and other entity-types they "own" such as employees operating within a Platform 1000.

Thus, in embodiments, one or more or heuristic processes may be applied to one or more components (and to one or more elements within such components) within such unconditioned DTS Topical Capability Profiles (and, in embodiments, to other and such aggregations) to harmonize and resolve potential conflicts, conflict that may be of any form and have any etiology, as described in the foregoing. The DTS-based (and/or DTS-enabled and/or DTS-accessible) content-sensitive and content-responsive methods and procedures and interfaces within such rules-applying structures produce a "compliant DTS Topical Capability Profile", again, a DTS-engendered term that conveys that the elements within the DTS Topical Capability Profile(s) used in the TCM-based (and in some cases, RAMS-based) associational mediation comports with the platform-defined understanding of permissible association. Examples of the manner in which compliant DTS Topical Capability Profiles may be derived include (but are not limited to) one or more of the following: rules-based AI routines, machine learning techniques wherein elements within computational blocks may be trained to learn and execute rules and hybrid systems that may combine any or all of the preceding methods.

In embodiments, there are many ways to implement such a collection of heuristic processes, but the core intention in TCM-based mediation is not necessarily to create an artificial or automated "compliance officer" (for any industry), though in embodiments, such capability may well be implemented, either within or accessible to a DTS Platform but rather, to provide the system and users with compliant associational functionality, not the ruling on the legality of completing a given action within the context of that association. To the extent that such compliance mediation is unclear or conditional, in embodiments, one or more methods and procedures and interfaces may present users with interactive user interface components to resolve such issues. For example, if a certain association with a certain type of financial instrument requires a local license (a real estate license, for example), the user may be queried as to whether they have such a license. In embodiments, since regulations may change with some regularity, platform operators and/or by system processes and/or by users may maintain the rules within these methods through interactive user interface components, while in further refinements, changes mandated for certain rules may be signaled though one or more DTS-based (and/or DTS-enabled and/or DTS-accessible) methods and procedures and interfaces that may monitor and deliver such changes, again, in variations, with user assistance or automatically.

Another example method that may, in embodiments, be used to create or derive a compliant DTS Topical Capability Profile (presented without foreclosing other methods and variations that may be possible) is to invoke modalities of Assertion Simulation wherein, in the context of the present example, each of the hierarchies within the DTS Topical Capability Profile (the TCM Properties hierarchy, the TCM Characteristics hierarchy and the Business Type hierarchy) may be treated singly or combined into a single structure and designated as a Reference Data Model. Then, as one example among many possibilities, one or more "rules template" hierarchies may be embodied within a collection of Assertion Models, embedding such example properties as "Prohibited" or Allowed" or "Prohibited with conditions" (where the conditions may be enumerated in descendant levels) or "Uncertain, check with User" and so on. The apportionment sub-Model may then be instantiated but with only binary values. Thus, in a manner similar to that used to allocate indirect expenses to different profit centers, as described in the foregoing, a user and/or system process may, for example, instantiate the applicable rules by applying the binary values to the nodes in the Reference Data Model. In embodiments, the Assertion Models may be made to correspond to the rules for each administrative level within a jurisdiction, for example, or be made to comport with regional variations wherein customs and traditions and interpretations relative to a topic may differ. Thus, one or more Reference Data Models may be subject to one or more Assertional Simulations, arranged in one example configuration, in a cascade manner wherein the Outcome Model from one stage of Assertional Simulations provides the Reference Data Model for the next stage. Thus, in the context of the current example, the Assertion Model for the Federal laws and regulations would be coerced upon the Reference Data Model(s), producing Outcome Model 1. Then the Assertion Models for each State would be individually applied to Outcome Model 1, invoking 50 instances of Assertional Simulation upon Outcome Model 1, an operation that would result in the 50 Outcome Models. This process may be repeated until all the administrative levels within a jurisdiction have a unique Outcome Model. This collection embodies a compliant DTS Topical Capability Profile as it applies for a given topic (in this case, financial services).

Note, however, that, in embodiments, this process may be executed either before or after a user instantiates their profile, but in general, it may be more efficient to do such eliding Assertional Simulations before completion and to maintain the collection of a potentially larger number of Outcome Models from which users may select their properties and characteristics. This selection sequence permits, for example, the system to disallow the user picking conflicting properties, such as, in the present financial services example, certain activities that certain institutions may not execute. Note also that, in implementations, one or more heuristic, and/or machine learning or/and hybrid methods previously cited may also be used in any part of this sequence, and other DTS-based (and/or DTS-enabled and/or DTS-accessible) methods and procedures and interfaces apart from or in conjunction with Assertional Simulation.

Continuing in the present example, the other users in the DTS implementation of the loan-centric exchange, the borrowers and brokers, may also instantiate their versions of their DTS Topical Capability Profile but from a different perspective. For borrowers, after stating "who and what I am" (in this instance using, for example, the Business Type hierarchy), the next question is not "what might I do" but rather, "what would I like to do and how would I like to do it". This difference reflects the relative positions of lenders and borrowers in the party-counter-party arrangement. Thus, once the borrower makes their choice, in embodiments, from borrower-centric versions of the hierarchies within a compliant DTS Topical Capability Profile, this information may be incorporated within a "borrow loan proposal", a hybrid multi-domain proposal that may include such items as past and present financial statement and records, projections and budgetary proposals, text and graphical explanations and descriptions of the business and so on. Note that each of these documents embodies a multi-domain aggregation with hybrid ontologies and multiple frames of reference, as in the case with many Reference Data Models, and as with the lender profile, any or all of the DTS-based (and/or DTS-enabled and/or DTS-accessible) content-sensitive and content-responsive methods and procedures and interfaces (including those that may be used in DTS semantic de-referencing may be employed here. In this example, this proposal then becomes the DTS Topical Capability Profile for the borrower, and like that of the lender, may now be treated as Reference Data Model.

Assume that there are many lenders of many varieties, each with a different DTS Topical Capability Profile and that there are many borrowers who likewise have many DTS Topical Capability Profiles, wherein the former case, the TC Profile reflects what each lender can (or will) do (among other things) and in the latter case what business the borrower is in and what they are seeking. In implementations, depending upon the individual RAMS setting applied by the owner of each TC Profile, each side in the counter-party transaction may then view the other. If a party decides it would like to engage with a counter party, the TCM mediation is applied to each respective TC Profile to ascertain whether the two parties possess the shared capability to engage. There are many methods to accomplish this mediation, as described in connection with RAMS, including invocation of one or more correlation or probability-based calculations, but, in embodiments, other solutions may be used, including application of appropriate transforms to convert the various DTS Topical Capability Profile into other format and/or domains, and execute domain-specific computations such as may be found, for example, in computational geometry. Note, however, that for every role, there may be a different DTS Topical Capability Profile, and thus, a different set of mediations. If, for example, a lender chooses to aggregate with a group of other lenders, a collective DTS Topical Capability Profile is compiled for this aggregation but each lender has now assumed a different role within their lender identity.

Recalling the earlier example of the simple buyer-seller exchange, if the TCM mediation permits the two parties to associate, each party may then construct their own set of Assertion-Apportionment pairs and may invoke Assertional Simulation upon the respective Reference Data Models. In the case of lenders, they engage, in DTS-terminology, in Underwriting wherein each lender applies one or more Assertion-Apportionment pairs to the Reference Data Models (the loan proposals, in this example) of each eligible-by-mediation borrower (where the eligibility is the associational capability as mediated through the previously-described TCM processes). In the case of borrowers, as in the earlier example of a buyer-seller exchange, these users engage in a modality of Assertional Simulation called "Ranking", a DTS-engendered term referenced previously wherein a borrower evaluates eligible-by-mediation lenders. In both cases, the Outcome Models resulting from the Underwriting and Ranking executed by lenders and borrowers, respectively may be arranged in a number of ordered lists based upon any number of criteria.

Note that, in embodiments, there may be many optimizations and improvements to these processes and the use of DTS Topical Mediation Control (TCM) may be applied in different ways to different topics, in some implementations, within the same instantiation of a DTS Platform. In one instance, extending the present example, borrowers and lenders may both be queried during their parametrization of their DTS Topical Capability Profile as to their preferences. Such evaluations may, in embodiments be multi-dimensional, eliciting opinions from users, for example, reflecting how much a thing is liked and with what intensity. In addition, using one or more DTS-based (and/or DTS-enabled and/or DTS-accessible) methods and procedures and interfaces that may be subsumed within or associated with the aforementioned In-App Activity metrics functionality, a user's actual behaviors may be correlated with their expressed preferences. These capabilities and the resultant data points may yield useful information in both the Ranking and Underwriting exercises of Assertional Simulation that borrowers and lender invoke, respectively, contributing to accrued Shannon entropic richness within the system, information that may be used by numerous DTS-based (and/or DTS-enabled and/or DTS-accessible) methods and procedures and interfaces that may execute analytic and pattern mapping and recognition operations.

In embodiments, the methods and systems of Topical Capability Mediation (TCM) described herein associated with a DTS platform may be applied to a transaction management environment that may be embodied using, among other things marketplace concepts and the like. DTS platform functionalities, such as Assertional Simulation and its related functions (e.g., de-referencing, and the like), RAMS and others may be configured for facilitating many aspects of transaction lifecycles including, without limitation: pre-stage prospecting starting with, for example a large number of possible prospects from various sources that are reduced to a manageable number of targets that are then optimized for pursuit; drafting and/or generation of a proposal/profile to a counterparty or counterparties in a transaction; negotiating terms for a deal with a view of agreeing and executing, for example a letter of intent; and other transaction related activities including: transaction structuring, participant selection, access mediation, execution improvement, and the like. Some of these and other DTS platform capabilities will now be described in embodiments that facilitate transactions. One such functionality is the use of RAMS to, among other things, mediate entity access to and execution of a transaction.

RAMS includes, among other things, a mediation capability that facilitates managing access control by entities, which may include users in any number of roles, processes, and data, to other entities. Such mediation and related capabilities may be referred herein as RAMS transaction functionality and the like. Access mediation capabilities of RAMS may involve determining synergies for transactions among entities across a plurality of dimensions of data associated with and/or descriptive of entities which are generally representative of entity capabilities, entity preferences, and entity history. While not exclusively limited to user-type entities, users can appear in the DTS platform as many distinct entity-specific roles; each such role may be associated with its own set of capabilities that may form a subset of capabilities of the entity assuming the role. Alternatively described, an entity may have capabilities for each of a plurality of roles that the entity can put forth for the purposes of, for example, performing transactions and the like. Further to this concept, a user may seek to participant in transactions as a buyer, while that same user may seek to participate in other transactions as a seller. The reader may recognize this as being common in business; a company buys products, such as via a wholesale buyer role and sells those products, such as via a retail seller role. While the capabilities of this buyer and seller are rooted in the same company (e.g., embodied as an entity root certificate and the like), capabilities relevant to a buyer role may or may not have little if any relevance to that entity in a seller role. The infrastructure and capabilities of RAMS facilitates perform mediation and other functions with this role-specific access distinction while also ensuring that activities associated with each of these entity-roles is properly attributed to the root entity (e.g., again by updating, for example, a history portion of a root certificate for the entity assuming the role). In an example of entity-role handling by RAMS, a user may engage with another user to perform a transaction (e.g., co-brokers of a loan). This engagement may be depicted in RAMS as an aggregation of the two users, with each individual user retaining his root entity capabilities and the aggregation also retaining its aggregated capabilities (e.g., an aggregation certificate), yet the activities related to the aggregated entity can be linked to the individual user's entities for purposes of mediation and the like as described herein.

While a general case of entity capabilities is exemplarily described herein as entity-expressed capabilities (e.g., an entity, such as a user, can configure capabilities as the user desires). For at least a transaction-focused application of the DTS platform, entity capabilities are further refined programmatically, optionally using the methods and systems of Assertional Simulation of the DTS platform. An application of the DTS platform for transactions (herein and elsewhere referred to as DTS-Transaction) considers jurisdictional factors that may directly influence self-expressed or otherwise generated entity capabilities. A simple example, and one that expresses aspects of a real-world instance of DTS-Transaction involves a lender looking to loan money to borrowers. While capabilities of the lender and borrowers may, through access mediation, result in an access certificate that indicates a loan may be executed, jurisdictional factors are highly relevant to and can override that result. A borrower may seek to perform a loan agreement in a particular jurisdiction (e.g., Norfolk County, Mass., USA). A lender may wish to provide the loan in this agreement. Before the lender's capabilities can be correlated to the borrower's capabilities (and preferences, history and the like) via RAMS-transactions (e.g., via access mediation), the jurisdiction constraints are to be applied. Simply, this may be thought of as a form of legal vetting of the lender to practice in the target jurisdiction. Further in this example, lender A has capabilities for engaging in loan agreements. To determine if lender A can access a loan application of any borrower in jurisdiction C, lender A's capabilities must be vetted against the legal factors for a lending to borrowers in jurisdiction C. Described now is an example of using functionalities of the DTS platform, Assertional Simulation for this purpose.

Two basic prerequisites for performing Assertional Simulation include availability of a Reference Data Model (RDM) and at least an Assertion Model (optionally with Assertional Apportionment Models). In this example, lender A's capabilities may represent the RDM—a source of data with values that can be cast upon in Assertional Simulation. Jurisdiction C's requirements for a lender to practice therein may represent an Assertion Model—a description of requirements, expectations, conditions and the like that can be applied to source data through Assertional Simulation to produce a Candidate Outcome Model that may represent, among other things, a suitability of the lender to do business in the jurisdiction. Therefore, Assertional Simulation is performed by casting the jurisdiction Assertion Model over lender A's capabilities. Specifics of such casting are omitted from this example because it is described for other embodiments elsewhere herein. However, at least for DTS-Transactions, applying Assertional Simulation for determining a suitability for an entity to conduct transaction-related activity in a jurisdiction involves applying Assertional Simulation at a plurality of levels in a hierarchy of jurisdictions, specifically while moving down through the hierarchy of jurisdictions from a higher level parent jurisdiction (e.g., USA) to a lower level child jurisdiction (e.g., Massachusetts). While the target jurisdiction here may be Norfolk County, Mass. USA, the hierarchy of jurisdictions has at the top, for example the USA jurisdiction, followed below by a child representing the Massachusetts jurisdiction, which is followed below by further child representing the Norfolk County jurisdiction. Such a hierarchy may be useful in other ways that build on the concepts of ownership and inheritance present in the methods and systems of the DTS platform described herein.

As described herein, transactions, engagements, and the like may have an owner or lead who may retain control of certain functions of the transaction, engagement and the like. In the case of entity groups, a lead or owner of the group may retain control over other entities in the group; however, such control only extends to the entity's role or actions as part of the group. Ownership does not extend to an individual entity's root certificate, only to a certificate that is derived from the root certificate for a specific event, action, and the like. In an example, I am a broker who has arranged to attach to a string of lenders for conducting loans. As a broker, I see many loan requests (aka seeker proposal) and I can control which lenders see them or portions of them; I can control what part of a loan proposal each lender sees. My action of exposing some portion(s) of some portion(s) of the loan requests is a RAMS event for which a RAMS event certificate is generated, and a history for the participants in these exposing events is updated. In this way, the broker retains the lead or ownership of the lenders in events for which he is the lead. This notion of ownership is highly conditional and contextual. A broker may not literally own a lender but may, for the covenant arranged between the broker and lender, the broker appears as the owner in RAMS-based events including mediation and the like that involve the broker and lender.

As a DTS-Transaction example of such ownership and inheritance, requirements for conducting transactions in the USA, or more likely prohibitions related to conducting transactions in the USA will propagate down to a lower child level, such as at the state level in the hierarchy because, for example, such a hierarchy expresses ownership by the higher level (e.g., USA), within the context of laws for conducting transactions, of states (e.g., Massachusetts) for the purposes of propagating constraints. Something that is prohibited at the USA level of the hierarchy will be prohibited at the state level as well. Of note, each state, while potentially co-located at a common level in such a hierarchy may only be accessible by traversing up to the next higher level and down to the sibling state. Simply, this articulates the practice of law in the USA that each state can have independent laws, but all states must comply with USA laws and the like.

Therefore, in this exemplary application, lender A's capabilities are applied as a RDM in an instance of Assertional Simulation by casting an Assertion Model representing the constraints for conducting transactions in the USA jurisdiction. A result of this instance of Assertional Simulation, a Candidate Outcome Model, may represent the capabilities of lender A for conducting transactions in the USA. Further refinement may be performed in a subsequent instance of Assertional Simulation in which the lender A-USA Candidate Outcome Model is applied as a RDM along with the state of Massachusetts requirements for conducting business in Massachusetts applied as an Assertion Model. An outcome of this subsequent instance of Assertional Simulation, called for convenience lender A-USA-MA capabilities, may represent lender A's capabilities for conducting business in the US state of Massachusetts. This sequence may be repeated for the county of Norfolk (and further for individual towns, territories, addresses, and the like) to ultimately produce a set of capabilities for lender A that can be mediated with borrower(s) in the target jurisdiction for access to conduct transactions, using for example RAMS mediation.

Other embodiments of this process may be envisioned, such as using Assertional Simulation and/or the methods of RAMS mediation to produce an Assertion model for the specific jurisdiction, such as by combining requirements from all higher-level jurisdictions in the hierarchy. Any such capabilities narrowing process may be performed at a time of borrower interest or may be performed independent thereof, such as to produce a lender-jurisdiction-specific set of capabilities that can be cached for use at the time of borrower interest, for example. However, keeping in mind a need for ensuring that only the currently applicable requirements for each jurisdiction are applied, performing at least some portion of this process at the time of borrower interest may make sense. Yet further, an Assertion Model of jurisdiction transaction constraints may be configured for future constraints, such as when determining a potential impact on lenders of changing a jurisdiction's laws for operating as a lender in the jurisdiction. As described elsewhere herein, each instance of Assertional Simulation, including all entities, inputs, outcomes and the like may be tracked and retained for future access. Simply, this RAMS capability to capture and retain all relevant information, actions, outcomes and the like provides a benefit unavailable on existing simulation/modeling systems, which is that it increases the Shannon entropy of the platform through contextually relevant data generation, tracking and collection. Specific techniques within RAMS are described herein for such data collection and tracking, including without limitation the use of record numbers (rec-no) that facilitate unique identification and allocation of activities, data, and the like to individual entities.

In embodiments, DTS-Transaction capabilities may embody step-wise application of Assertional Simulation, a form of piece by piece convolution that is not statistical in a Bayesian sense; rather Assertional Simulation (e.g., casting an assertion over source data) is like a convolution at least because it involves applying the entire Assertion Model to each node in the RDM—e.g., applying each jurisdiction constraint to each element in the lender's capabilities RDM.

To finish the exemplary process of access mediation of lender A vis-a-vis borrower B's loan application in jurisdiction C, a final/select iteration of the Candidate Outcome Model representing lender A's capabilities in Jurisdiction C can be mediated with, for example the capabilities of borrower B to determine at least a portion of access rights/control of the entities. While capabilities processed in this way provide a portion of access rights/control of the entities, access control of lender A accessing borrower B's loan application, for example may be further enhanced/refined/reinforced through RAMS mediation of lender and borrower preferences and history.

Taking this example one step deeper into a technological realm, a plurality of directed graphs representing lender A's jurisdiction C-specific capabilities may be collocated with a plurality of directed graphs of borrower B's capabilities to determine points of intersection. Similar actions may be taken with graphs representing each entity's preferences and history. The points of intersection of these collocated graphs may be used to inform a decision regarding lender A accessing borrower B's loan application, for example. In embodiments hash-based approaches such as use of Merkle trees may optionally and in certain embodiments be used instead of directed graphs.

In embodiments, an application of DTS-Transaction may include use of a large array of jurisdiction and transaction-type requirements to facilitate generating jurisdiction-specific entity capabilities using, for example Assertional Simulation and the like. One such example is a data set that includes more than 100,000 individual statements of legal conditions and constraints for conducting business in one or more jurisdictions (or in a hierarchy of jurisdiction as in the example above). Each of these individual statements may represent entries in an Assertion Model that are cast via Assertional Simulation over lender A's capabilities reference model to generate a Candidate Outcome Model that can effectively be applied to a next level down of jurisdictional hierarchy.

A large array of jurisdiction requirements, such as that noted above, could include, for example all the things that banks, individuals, brokers and a whole range of legal entities are permitted and/or prohibited from doing for all variations of transaction (e.g., finance) vehicles. While such an array may cover a very large number of combinations of constraints, requirements, and the like for each type of financial vehicle across a large number of jurisdictions, efficiencies are gained by the inheritance described above of parent constraints by children nodes. One exemplary way in which efficiencies can be achieved involves omitting casting constraints for a given jurisdiction if the parent for the jurisdiction includes a prohibition thereof. If a parent (e.g., U.S.A.) prohibits lending to incarcerated criminals, then by default, such lending will be prohibited in all states of the U.S.A.; therefore, processing can be reduced when casting a State Assertion Model because the result of casting is known before the State Assertion Model is even applied, even if such a constraint that appears to be in conflict with the U.S.A. constraint is present in the State set of constraints.

While certain constraints can be coded in an Assertion Model of jurisdiction-specific transaction requirements as yes/no, or rather as prohibited or not prohibited in a jurisdiction, some constraints remain conditional, where a secondary condition must be met for a conditional "yes" response to become a complete yes response. An Assertion Model created from such a set of jurisdictional constraints may support all types of requirements, including yes/no absolute and yes-conditional and the like. As an example, that is relevant for DTS-Finance, lending money for a home improvement may be permitted in a given jurisdiction; however, a lender may be required to possess a valid license to do so in the jurisdiction. Therefore, while a capabilities certificate for a lender may indicate that the lender has such a capability, the capability may need to be validated, such as at the time that the Assertional Simulation is executed. In practice, an interface may be used to gather information that is needed in such conditional situations. One such interface may be an API-based interface between the DTS platform and a government database of lender licenses. Another may be a user interface through which a user can submit a scan of a license, a license number or the like. Another form of conditional constraint may include, for example, a capability to appeal a yes/no condition.

While this example is from the perspective of a lender seeking to attach to a loan deal of a borrower in a specific jurisdiction, the roles could be similarly reversed using the same or comparable techniques. In an example, a borrower may seek to make a loan agreement in a specific jurisdiction. Using the example above, borrower B may attach to a loan application, a resulting access certificate thereof may form the basis for a RDM that may be processed with Assertional Simulation through the same hierarchies as lender A's capabilities, effectively producing a jurisdiction specific set of capabilities for borrower B's loan application. Other entity-roles in loan transactions, such as a broker, banker, loan consolidator, and the like may have their entity-role specific capabilities processed similarly. At least one result could be a marketplace of jurisdiction-approved entities, such as lenders, borrowers, brokers, and the like (each represented by an access certificate that includes or makes available jurisdiction-specific capabilities, preferences, and history of the entities) in which RAMS type mediation could be used to mediate access of borrowers to lenders, and the like.

While a successful mediation may result in lender A lending money in jurisdiction C to borrower B, there may be many such attempts that result in failed mediation, such as lender A not being qualified to practice in jurisdiction C, or borrower B not having sufficiently high borrower quality (e.g., FICA score) to allow the borrower and lender to attach in a lending arrangement. Information that contributes to a failed mediation may provide valuable insight for the participating entities, other entities, and the DTS-Transaction platform overall to make improvements. Therefore, retaining and tracking such information, enabled by the RAMS capabilities of the DTS platform, can be used in a machine learning feedback improvement process that takes this information and adjusts, for example how mediation handles capabilities data, or suggests to a borrower aspects of a loan proposal (e.g., application) to adjust in future applications, and the like. All aspects of information and processes in a DTS platform may benefit from such feedback.

Information collected about mediation results, including information that does not correlate positively for two entities in a mediation process may also be presented in various interfaces to entity users and the like, as well as to pattern detection algorithms and the like to provide greater visibility and contextual value thereof.

DTS-Transaction approaches transaction mediation from a perspective that allows the ever-increasing Shannon entropy of the data available to the platform to facilitate determining and/or predicting, among other things winners and losers for transactions; not in the sense of good or bad deals, but in terms of, for example, successful attachment to transactions. This can be embodied as a range of metrics, examples of which might include a count of successful transaction attachments (e.g., mediation that results in entities being granted access to the resources of the transaction, and the like), rates of successful mediation, trends of mediation results, and others. Further information related to mediations, including for example history of access-granted participants in a transaction can be used as, for example, a yardstick for success. In this way, entities that practice strategies and techniques (e.g., as determined by activities in an entity history) consistent with entities that have successful transaction mediations and the like may be statistically more likely to successfully attach to transactions. Such information may be used in methods and systems, some of which are described herein and other that are known by those knowledgeable in the state of the art that enable ranking lenders, borrowers, proposals, strategies, and the like. The activities surrounding other similar loans or activities, the strategies employed and the like are factors in this underwriting and ranking—example: a strategy is selective reveal—what happens is a broker will reveal only a portion of a deal, another is I will expose that to fewer lenders.

Such notions of winners and/or success and the like that are driven by, among other things, measures of data generated in the platform, rather than by achieving arbitrary objectives may be implemented through graph techniques that rely on experiential data to strength certain nodal connections relative to others. As an example, a nodal connection may exist for a capability of an entity. By applying measures of preferences expressed by the entity that are relevant for the capability in a form of weighting, paths in the graph may gain value over others. Similarly, by applying measures of history (e.g., actions taken by or in association with an entity) may similarly weight such nodal connections. If, for example a lender has a capability to close loans with pig farmers, the lender's preferences with respect to such loans may strengthen or differentiate this capability relative to other capabilities (e.g., closing loans with sheep farmers) and relative to other lenders, and the like. Likewise, if the lender has a history rich with closing loans with pig farmers, the nodal connection representing the lender's capability to close loans with pig farmers may be strengthened by this history. Such ability to distinguish value of inter-nodal connections in a graph further may lead to intra-graph analysis (e.g., determination of which nodal connections represent a capability strength of an entity) and inter-graph analysis (e.g., which lender of a plurality of lenders has the strongest nodal connection for pig farmer loan capabilities).

Recombinant mediation for access control may take advantage of certain properties of entities, such properties characterizing access-related aspects of the entities. Access-related properties may include capabilities (e.g., what can the entity do, such as perform a type of real-world transaction), preferences (e.g., what does the entity prefer, such as types of real-world transactions), and history (e.g., what actions has the entity performed and what actions by others have affected the entity).

Access capabilities generally may be self-expressed by the entity (e.g., I am registered to practice Law in Rhode Island, I teach 10th grade public school math, and the like). Such entity access capabilities may connect to or be accessed through a root certificate of the entity. Evidence of access capabilities (e.g., a current license to practice law) may be found in or via the entity root certificate. This evidence may be used during forms of mediation, during Assertional Simulation or in external applications of the Platform (e.g., when evaluating a proposal for legal representation by an entity, an Assertion Model may be configured to check for such evidence). In certain applications of recombinant mediation for access control, such as performing transactions (e.g., financial transactions and the like), access capabilities may be generated through an instance of the Assertional Simulation process that is described herein. Further description of generated access capabilities is included with the explanation of transaction support within DTS (DTS-Transaction).

Entity preferences may also be self-expressed. Such entity preferences may also be expressed with an intensity to further refine with access mediation and other operations that benefit from attaching an intensity of a preference, such as when ranking entities against criteria and the like. In embodiments, while an entity may prefer small business clients over larger clients for certain transactions, the intensity of this preference may be specified on an intensity scale. Not only can this preference, but its intensity be used with mediation and other DTS-platform functions and applications. As an example, the lawyer who prefers small business clients a little more (e.g., with low intensity, say 2 out of 10) over larger clients may still rank highly by a larger client evaluating lawyers. Whereas if another lawyer strongly prefers small clients (e.g., with high intensity, say 9 out of 10) over larger clients, this other lawyer may not rank as highly by a larger client evaluating lawyers.

In embodiments, techniques for RAMS mediation may include applications of graphs, such as directed graphs (e.g., acyclic graphs, and the like), to represent nodal links among, for example preferences, capabilities and the like of an entity. Links to or among preferences may be influenced by an intensity thereof, such as by weighting a link correspondingly with the intensity of the linked preference.

RAMS mediation for access may further be based on entity activity history. Activities in which entities may engage, including use of DTS resources, processes, requests for access, mediation actions, Assertional Simulations, and the like are tracked and associated with, for example the root certificate of each participating entity. Activity history may be analyzed for trends and the like that may play into a mediation of access for the entity. In an example, the entity with a capability to finance pig farmers may have a history that includes all activity of the entity related to financing pig farmers. This history can be analyzed to determine, for example, a count of pig farmer financing transactions for the entity. In this example, the pig farmer financing history can inform mediation functions as to the relevance of the claimed capability, so that experienced pig farmer financiers could be distinguished from novice financiers, and the like. The recombinant access mediation system (RAMS) methods, systems, and infrastructure described herein facilitates such activity collection, tracking, and analysis through, for example RAMS system capabilities including, without limitation, Event Certificates and the like.

Embodiments of such mediation correlation may be based on representational domain concepts that facilitate determining points of intersection of data sets and the like. Each element of capabilities, preferences, and history to be correlated for mediation of access control may be represented as a shape determined at least in part by presence and intensity of attributes of the element, such as presence of a specific capability, intensity of a preference, and a history of the entity related to a domain, such as financial transactions and the like. The shape may be derived from a graph of entity capabilities, preferences, history and the like and may include directed graphs, acyclic graphs and the like. By collocating such graphs (e.g., assigning them a common origin, and the like) and determining their intersections, mediation for access control may be granted based on these intersections.

Recombinant mediation for access control may look for synergies among potential participants in a potential event for which mediation is being performed. In an example, two entities, call them entity 1 and entity 2 may be interested in conducting a transaction in a specific subject matter domain. Capabilities, preferences, and history of the two entities may be aligned to attempt to identify commonality or at least correspondence of capabilities in the transaction domain. In a simple example, a directed graph of the capabilities of entity 1 may be collocated with a directed graph of the capabilities of entity 2. Note the capabilities in these graphs may be a subset of each entity's capabilities, such as a subset that pertains to the subject matter domain of the transaction. These two directed graphs may further be collocated with a graph of capabilities of the transaction, such as terms of a deal. Mediation, based on points of intersection of these graphs may suggest that the capabilities of entity 1 correlate well with those needed for the transaction, whereas the capabilities of entity 2 do not. A result of mediation may be to deny access by entity 2 to the transaction, or at least a portion thereof. Note that such a result of mediation may be attached to each entity's activity graph, effectively marking that entity 2 did not sufficiently correlate with aspects of the transaction to warrant granting access, and the like. As noted above, this information may be used in future mediations for access by entity 2, where appropriate, to influence a suitability of entity 2 for access to a subject entity/deal through mediation.

Mediation for access control may include collocating graphs from multiple entities to determine intersections. As an example, capabilities graphs for two entities might be processed for intersection determination when a request is made by one or both to form a group of entities. Capabilities that correlate based on the determined intersections may become the foundation for a set of capabilities for the resulting group formed by the two entities. In embodiments, capabilities for a group of entities may include only those capabilities that each entity in the group shares. A group or aggregation certificate representing this set of capabilities might be formed as well for use in further processing. Although this example refers to capabilities graphs for two entities, in practice a capability graph for each type of capability of an entity (of which there may be many for an entity) may be formed and used in this mediation. As noted, each capability, preference and corresponding intensity, and history may be configured as its own graph. In an example an entity's history of advertising products and that same entity's history of selling the advertised product may be arranged as a graph that can be collocated for mediating access by the entity to, for example business deals with advertising agencies, distribution agreements with product distributors and the like.

In embodiments, the RAMS framework along with mediation techniques, such as those described herein may form a foundational operating environment for an exchange (e.g., a marketplace) for requesting and managing entity-to-entity attachments and the like.

While reference is made to entities, such as users, as having a root certificate and capabilities, access capabilities, preferences, and history, may be configured into entity-role specific certificates to facilitate mediation. A lender entity may, in one instance play the role of lender. That same lender entity may take on a role of buyer for services, such as underwriting, background checking and the like. This same entity may therefore be associated with two different access certificates. The relevant capabilities, preferences, and history related to the buyer role may appear in the buyer role certificate, whereas the lender certificate may express lender-related capabilities, preferences, history and the like. In this way a single entity-specific root certificate may retain all capabilities of the entity and may be maintainable by the entity as capabilities change or are added.

As noted above, entities may attach to form groups of entities. In examples, lenders may form syndicates, brokers may co-broke deals, borrowers may form borrower cartels, and the like. Each such group may be characterized by a group, or aggregated access certificate that may reflect the common access capabilities, preferences, and history of its entity-members.

Recombinant mediation for access control, as described herein, may additionally rely on activity history associated with an entity when mediating access by or to the entity. As noted herein, activities are tracked and linked to an entity, such as to an activity certificate and/or activity portion of an entity root certificate and the like. Entity activities that may be tracked and/or included in a history of activities of an entity may include activities surrounding an event to which the entity has attached (e.g., via mediation access as described herein) or attempts to attach to or participate in. Mechanisms for tracking entity activities are described herein with respect to RAMS, and the like. Any or all such mechanisms, structures, functionality, data bases, and the like, including without limitation use of a unique record number (herein rec-no) for each RAMS event may be employed for generating and managing entity history of activities. Activities that may contribute to mediation may include, for example use of platform services, including services associated with but not directly operated through the platform (e.g., analytic and other services). Platform and other applications or services may collect and generate in-app metrics that may be a source of activity history for entity access mediation. Non-limiting examples of in-app metrics may include failed log-in attempts, activity level of the entity in and/or to the application, and the like. Other activities may include strategies in the context of Assertional Simulation used by, for example borrowers when seeking loans. Entity roles, such as being a borrower and the like may employ strategies within an application domain of the DTS platform, such as performing transactions. Further discussion of mediation and operations of the DTS platform for transactions (referred herein variably as DTS-Transaction or DTS-Finance) are described elsewhere and include examples of strategies of entity roles such as borrowers, lenders, brokers, and the like.

While specific measures of entity activity and metrics derived therefrom may contribute to an outcome of mediation of access for an entity, intangible aspects may also be factored into access mediation. Machine learning and self-organizing functionality, such as fuzzy logic and the like may be applied to apply an intangible aspect (e.g. a preference) to mediation, such as by identifying a likelihood of an entity acting based on preference and the like.

Described herein, such as in context of RAMS, certificates that facilitate identifying events and activity related to access mediation are generated and saved for, among other things, facilitating tracking of such activity including, without limitation the entities involved. An outcome of access mediation may include attachment of two entities, such as a user and a process (e.g., a transaction process and the like), which may trigger generation of a RAMS certificate, such as RAMS event certificate, RAMS instance certificate and the like. A unique, at least within an instance of a DTS platform, record number or rec-no may be attributed to each RAMS certificate. All activities related to a RAMS certificate may be tracked and memorialized (e.g., for audit purposes and the like) by this rec-no. Information trackable by a rec-no may, for example, identify an access certificate for a group of entities (an aggregated certificate) when such a group has attached with another entity in a RAMS event and the like.

Each entity in the aggregated group of entities may be further identified by that aggregated certificate. Therefore, activities tracked by an individual rec-no can be ascribed to root certificates of participating entities, even when only the aggregated group (itself an entity (or at least a meta-entity) in the DTS platform) is granted access via a RAMS mediation process and the like. Thus, entity history of an individual entity may be influenced by RAMS events of any group to which the entity has joined. While aggregating entities into a group is described here, any attachment, of which aggregation is merely one example, of two or more entities is known and managed by RAMS and therefore is subject to the same associating activities of the individual entities in the attachment to the individual entity's history for, as an example, access mediation.

In an exemplary DTS-Transaction deployment of RAMS mediation, various types of activities that may be tracked through a rec-no may include all actions associated with the event identified by the rec-no, including in-app messages, changes to a proposed deal, lockdown (a specific DTS-transaction action described elsewhere herein) of the deal, and the like may all be tracked and influence an entity's ability to attach to future deals.

In embodiments, unlike conventional competitive game theory in which competitors are measured against some arbitrary objective (e.g., most runs in a ball game, most points in football, surviving in a survival game, and the like), the DTS platform, and more specifically the DTS-Transaction application of the DTS platform, determines winners based on the content or measures thereof. As noted above, a lender may be deemed to be successful (e.g., within the context of a DTS-Transaction marketplace, for example) in conducting transactions through a range of measures, not merely if the transactions are profitable. Indeed, such information (a real-world result of a transaction, such as a financial profit/loss result) may be outside the scope of DTS-Transaction. Nonetheless, winners in DTS-Transactions can be determined without consideration of extraneous factors, such as profit from a loan or default of a borrower because the data itself—data that represents the actions of the entities provides rich information that can be measured and analyzed. In a simple example, a winner of a competition for a loan may be deemed the lender chosen by the borrower. This lender is a winner of a zero-sum competition (only one lender is chosen); however, the techniques applied to determine this winner are found at least in part to be non-zero-sum (ranking lenders wherein a ranked scalar value may be assigned to each lender). Relative measures of a range of transaction-related factors, such as a degree to which a set of lender capabilities (e.g., as a Reference Data Model) aligns with jurisdiction and borrower requirements (e.g., as an Assertion Model) through the application of Assertional Simulation may result in ranking of lenders by the borrower (non-zero-sum); however, from this non-zero-sum application, a final winner in a zero-sum competition emerges (e.g., only one lender ultimately is chosen by the borrower). Note that even though this example indicates a single lender is chosen, even when multiple lenders collaborate on a loan, the result is still zero-sum.

A DTS-platform may facilitate accessing data for detecting patterns and the like that may not be accessible using state of the art deep learning techniques applied to existing data-rich domains through the manipulation of such domains with capabilities such as de-referencing, Assertional Simulation and the like. Current technology pattern and learning systems may be compromised in their ability to yield good results due to, for example, limitations placed on data by its source environment, such as by structural constraints (e.g., how data is organized, how it is constrained to be related to other data and the like). A DTS-platform may access de-referenced data through Assertional Simulation and the like to facilitate finding and/or representing alternative solutions to pattern recognition in complex, data-rich domains. An inherent property of Assertional Simulation in a DTS-platform is a gain in Shannon entropy that Assertional Simulation produces and that the DTS-platform capability RAMS and TCM facilitates being captured, tracked and accessed. This increase in visibility of information may facilitate, among other things, providing an environment in which techniques like set theory (e.g., helical search, and the like) may be fruitfully applied. Additionally, the methods and systems of Assertional Simulation and its associated components (e.g., Reference Data Models, Assertion Models, Apportionment sub-Models, and the like) may produce knowledge in the form of Outcome Models and the like that can be used for such purposes as seeding Artificial Intelligence systems with models based on reality (e.g., based on actual data representing a real-world situation, and the like). Such seeding of AI may be usefully applied in situations where, for example, deep learning fails to yield good results.

In embodiments, DTS entity chaining may be flexibly configured in a number of geometric and notional configurations. In one variation among many, using methods and procedures composed within or accessible to the DTS entity chaining process, the connections between Instance Certificates (or some other DTS objects) may be arranged but may not be limited to any of the following configurations: uni-directional, bi-directional, forward-backward looking, left-right looking and any combination thereof, but may also be "stacked" (and thus upward-downward looking) where the criteria defining levels and directionality may be context and/or content based and may, in variations be oriented based upon entity-type. Other variations involve the nature of the tasks DTS enchainment protects since system processes are known at the time of deployment, pre-arranged process associational certificates may be created and may be uniquely associated with certain other entity-types. In some variations, Instance Certificates may be considered nodes in a graph where the structure may be derived over a time and/or an event line and wherein the strength of the connections between Certificates may become one factor (of many, in some variations) in calculating or maintaining or contributing to the geometry of the chain. Other variations include methods that may dynamically arrange Instance Certificates (or other DTS objects) around one or more loci where each locus may be based upon one or more entity-types, where one result could be a type of distorted sphere that may be re-formed or deformed based upon selection of the loci and upon other factors. In further variations, in such an entity-oriented, locus-based geometric system, the strength of the connection between nodes may also be indicative of one measure of trust, thus expressing the nature of the trusted intermediary relationships in a geometric configuration. wherein, for example, the most trusted elements are closest to the center, with lesser proceeding outward.

In embodiments, a software platform for decision support is provided having an Assertional Simulation Modeling and Simulation system using at least one Reference Data Model and at least one of at least one Assertion Model and at least one Apportionment sub-Model to produce at least one Outcome Model. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a facility for user creation and ownership of multiple simulation-derived Outcome Models based upon per-user-modulated Assertion Models that are projected across shared reference data and per-user-modulated reference data. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system to manage ancillary parameters and executable logic associated with users, data models and data model elements within a user-modulated, content-adaptive, context-adaptive modeling and simulation system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having permutation and cloning of models, nodes and nodal properties in user-modulated Assertion Models projected upon Reference Data Models. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a collaborative, comparative and competitive environment for outcome simulation models with adaptive user-modulated Assertion Models that are projected upon Reference Data Models.

In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a content-adaptive and context-adaptive, role-based and object-based permission and access system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system for time and event progression of Outcome Models based on adaptive, user-modulated Assertion Models and Reference Data Models. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system for time and event progression of Outcome Models with multiple modal periodicity based on adaptive, user-modulated Assertion Models and Reference Data Models. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system for forward and backward projection of Outcome Models composed within a time or event based sequence using adaptive, user-modulated Assertion Models and Reference Data Models. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having Cardinality designation within collaborative and competitive modeling using user-modulated Assertion Models and reference data.

In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system for application of analytic and pattern recognition techniques to model pools within a user-modulated, content-adaptive, context-adaptive modeling and simulation system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having dynamic revision of Assertion and Reference Data Models via content-adaptive and context-adaptive recursion in Assertional Simulation within a user-modulated, content-adaptive, context-adaptive modeling and simulation system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having dynamic revision of associated data structures via content-adaptive and context-adaptive recursion in Assertional Simulation within a user-modulated, content-adaptive, context-adaptive modeling and simulation system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having dynamic revision of definitional vocabulary structures in heterogeneous ontologies within a user-modulated, content-adaptive, context-adaptive modeling and simulation system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system for adaptive revision of nodal structures using Assertional Simulation across reference data within a user-modulated, content-adaptive, context-adaptive modeling and simulation system.

In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system for adaptive permutation of relational structures using Assertional Simulation across reference data within a user-modulated, content-adaptive, context-adaptive modeling and simulation system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a user interface in which a user can model taxonomic assertions or other methods of data organization as applied to reference data for user-selected time intervals. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a simulation system using machine learning for modeling competing opportunities that depend on taxonomic assertions (or other methods of data organization) as applied to reference data. A software platform having a system for providing business simulation as a service. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a data integration facility for automated extraction, transforming and loading reference data from an accounting software system.

In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a simulation system for modeling alternative income and expense structures across profits centers of an enterprise. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a simulation system that handles nested, multi-level profit center models with user-selected time intervals. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a simulation system in which simulation models are required to be composed as nested subsumptive containment sets. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a simulation system wherein simulation is not based on time. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a simulation system that models a proposed taxonomic assertion (or other methods of data organization) with respect to a reference data set at more than one selected time or event interval. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a simulation system for modeling before and after effects of the composition and structure of a taxonomic assertion (or other methods of data organization) as applied to reference data for user-determined time intervals.

In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a facility for user-modulated, content-adaptive, and context-adaptive model reorganization. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a facility for user creation and ownership of multiple simulation-derived Outcome Models based upon per-user-modulated Assertion Models that are projected across shared reference data and per-user-modulated reference data. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system to manage ancillary parameters and executable logic associated with users, data models and data model elements within a user-modulated, content-adaptive, context-adaptive modeling and simulation system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having permutation and cloning of Models, nodes and nodal properties in user-modulated Assertion Models projected upon Reference Data Models.

In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a collaborative, comparative and competitive environment for outcome simulation models with adaptive user-modulated Assertion Models that are projected upon Reference Data Models. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a content-adaptive and context-adaptive, role-based and object-based permission and access system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system for time and event progression of Outcome Models based on adaptive, user-modulated Assertion Models and Reference Data Models. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system for time and event progression of Outcome Models with multiple modal periodicity based on adaptive, user-modulated Assertion Models and Reference Data Models. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system for forward and backward projection of Outcome Models composed within a time or event based sequence using adaptive, user-modulated Assertion Models and Reference Data Models.

In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having Cardinality designation within collaborative and competitive modeling using user-modulated Assertion Models and reference data. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system for application of analytic and pattern recognition techniques to model pools within a user-modulated, content-adaptive, context-adaptive modeling and simulation system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model having dynamic revision of Assertional and Reference Data Models via content-adaptive and context-adaptive recursion in Assertional Simulation within a user-modulated, content-adaptive, context-adaptive modeling and simulation system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having dynamic revision of associated data structures via content-adaptive and context-adaptive recursion in Assertional Simulation within a user-modulated, content-adaptive, context-adaptive modeling and simulation system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having dynamic revision of definitional vocabulary structures in heterogeneous ontologies within a user-modulated, content-adaptive, context-adaptive modeling and simulation system.

In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system for adaptive revision of nodal structures using Assertional Simulation across reference data within a user-modulated, content-adaptive, context-adaptive modeling and simulation system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system for adaptive permutation of relational structures using Assertional Simulation across reference data within a user-modulated, content-adaptive, context-adaptive modeling and simulation system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a user interface in which a user can model taxonomic assertions (or other methods of data organization) as applied to reference data for user-selected time intervals. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a simulation system using machine learning for modeling competing opportunities that depend on taxonomic assertions (or other methods of data organization) as applied to reference data. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a system for providing business simulation as a service.

In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a data integration facility for automated extraction, transforming and loading reference data from an accounting software system. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a simulation system for modeling alternative income and expense structures across profit centers of an enterprise. In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a simulation system that handles nested, multi-level profit center models with user-selected time intervals.

In embodiments, a software platform for decision support is provided having an Assertional Simulation Modeling and Simulation system using at least one Reference Data Model and at least one of at least one Assertion Model and at least one Apportionment sub-Model to produce at least one Outcome Model and having a simulation system in which simulation models are required to be composed as nested subsumptive containment sets.

Detailed embodiments of the present disclosure are disclosed herein; however, it is to be understood that the disclosed embodiments are merely exemplary of the disclosure, which may be embodied in various forms. Therefore, specific structural and functional details disclosed herein are not to be interpreted as limiting, but merely as a basis for the claims and as a representative basis for teaching one skilled in the art to variously employ the present disclosure in virtually any appropriately detailed structure.

The terms "a" or "an," as used herein, are defined as one or more than one. The term "another," as used herein, is defined as at least a second or more. The terms "including" and/or "having", as used herein, are defined as comprising (i.e., open transition).

While only a few embodiments of the present disclosure have been shown and described, it will be understandable by those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

The methods and systems described herein may be deployed in part or in whole through a machine that executes computer software, program codes, and/or instructions on a processor. The present disclosure may be implemented as a method on the machine, as a system or apparatus as part of or in relation to the machine, or as a computer program product embodied in a computer readable medium executing on one or more of the machines. In embodiments, the processor may be part of a server, cloud server, client, network infrastructure, mobile computing platform, stationary computing platform, or other computing platform. A processor may be any kind of computational or processing device capable of executing program instructions, codes, binary instructions and the like. The processor may be or may include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more thread. The thread may spawn other threads that may have assigned priorities associated with them; the processor may execute these threads based on priority or any other order based on instructions provided in the program code. The processor, or any machine utilizing one, may include non-transitory memory that stores methods, codes, instructions and programs as described herein and elsewhere. The processor may access a non-transitory storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, client, firewall, gateway, hub, router, or other such computer and/or networking hardware. The software program may be associated with a server that may include a file server, print server, domain server, internet server, intranet server, cloud server, and other variants such as secondary server, host server, distributed server and the like. The server may include one or more of memories, processors, computer readable media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, social networks, and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs, or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements. The methods and systems described herein may be adapted for use with any kind of private, community, or hybrid cloud computing network or cloud computing environment, including those which involve features of software as a service (SaaS), platform as a service (PaaS), and/or infrastructure as a service (IaaS).

The methods, program codes, and instructions described herein and elsewhere may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, EVDO, mesh, or other networks types.

The methods, program codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer-to-peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g. USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or intangible items from one state to another. The methods and systems described herein may also transform data representing physical and/or intangible items from one state to another.

The elements described and depicted herein, including in flowcharts and block diagrams throughout the figures, imply logical boundaries between the elements. However, according to software or hardware engineering practices, the depicted elements and the functions thereof may be implemented on machines through computer executable media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers and the like. Furthermore, the elements depicted in the flowchart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps associated therewith, may be realized in hardware, software or any combination of hardware and software suitable for a particular application. The hardware may include a general purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine-readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, methods described above and combinations thereof may be embodied in computer executable code that, when executing on one or more computing devices, performs the steps thereof. In another aspect, the methods may be embodied in systems that perform the steps thereof and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

The use of the terms "a" and "an" and "the" and similar referents in the context of describing the disclosure (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiment, method, and examples, but by all embodiments and methods within the scope and spirit of the disclosure.

Any element in a claim that does not explicitly state "means for" performing a specified function, or "step for" performing a specified function, is not to be interpreted as a "means" or "step" clause as specified in 35 U.S.C. § 1112(f). In particular, any use of "step of" in the claims is not intended to invoke the provision of 35 U.S.C. § 1112(f).

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

The invention claimed is:

1. A method of establishing event-specific trust in a multi-layer computer security system, the method comprising:
generating a mediated covenant of association among a plurality of entities of a plurality of different types of entities including at least one user-type entity, at least one process-type entity representing one or more computing system processes, and at least one data-type entity, the covenant comprising properties representing semantically interconnected topical capabilities sourced from ancillary data associated with one or more entity of the plurality of entities, wherein the covenant expresses an instance of trust among the plurality of entities at an association layer of the multi-layer computer security system;
constructing a security model enforceable by the multi-layer computer security system so that at least a subset thereof is associated with one or more nodes representing encoded aspects of resources protected by the computer security system, wherein links between nodes in the security model represent semantic relationships based on a security ontology associated with the multi-layer computer security system; and
producing a computer security event-specific model, which reflects impacts of at least one of the properties of the covenant at one or more of the nodes, via informatic convolution of the security model with the semantically interconnected topical capabilities of the covenant, wherein the at least one of the properties of the covenant takes on an event-specific meaning in the event-specific model based on the security ontology, and wherein the event-specific model is operable at an event-layer in the multi-layer computer security system by constraining a computing system action of the one or more computing system processes associated with the process-type entity that acts upon data structures of the data-type entity, the constraining based at least on part on the instance of trust expressed at the association layer.

2. The method of claim 1, wherein generating the mediated covenant of association includes recombinant mediated association among a plurality of entities that includes a first plurality of entities as represented in a first mediated covenant of association and at least one other entity, the mediated covenant of association including a second generation of diffusion of topical capabilities of entities in the first plurality of entities based on and including at least a portion of a root portion of topical capabilities sourced from the first mediated covenant of association for each of the entities in the first plurality of entities, the mediated covenant of association further including a diffusion of topical capabilities of the at least one other entity based on and including at least a portion of a root portion of topical capabilities of the at least one other entity that is sourced from at least one of a root certificate of the at least one other entity or a mediated covenant of association of the at least one other entity.

3. The method of claim 2, wherein generating the mediated covenant of association includes mediated association among the first plurality of entities, the first mediated covenant of association including a first generation of diffusion of topical capabilities of entities in the first plurality of entities, the first generation of diffusion based on and including at least a portion of a root portion of topical capabilities for each of the entities in the first plurality of entities, the portion of a root portion of topical capabilities sourced from a root certificate of a corresponding entity.

4. The method of claim 1, further comprising performing the computing system action responsive to validation of topical capabilities of each entity of the mediated covenant of association by traversing a chain of certificates, each of which represents a distinct generational mediated covenant, from a certificate representing the event-specific model to a root certificate of at least one of the user-type entity, the data-type entity, or the process-type entity.

5. The method of claim 1, wherein the mediated covenant of association represents an outcome of convolution of topical capabilities of a first mediated covenant of association upon topical capabilities of at least one other entity.

6. The method of claim 5, wherein the convolution includes node-by-node informatic convolution of a hierarchy of informational nodes present in the topical capabilities of the first mediated covenant of association upon hierarchy of informational nodes present in the topical capabilities of the at least one other entity.

7. The method of claim 1, wherein generating the mediated covenant of association comprises determining points of connection among a first directed graph representing topical capabilities of a first meditated covenant of association of a first plurality of entities and a second directed graph representing topical capabilities of at least one other entity.

8. The method of claim 1, wherein generating a mediated covenant of association represents a decimation of a taxonomy of a corresponding root portion of topical capabilities.

9. The method of claim 1, wherein producing an event-specific model comprises performing a sequence of informatic convolutions of the security model for each node along a directed path in the model of access requirements that includes the one or more of the nodes.

10. The method of claim 1, wherein constructing the security model includes:
    extracting a content portion of the resources protected by the security system;
    constructing a security assertion model from the security ontology; and
    producing the security model by performing informatic convolution of the security assertion model upon the extracted content portion.

11. The method of claim 10, wherein producing the event-specific model includes performing information convolution of the security assertion model upon a set of data representing at least one constraint imposed by the security ontology of the links between the nodes.

12. The method of claim 11, wherein constructing the security model includes induction-based content-centric feature mapping of at least one of the extracted content portion or the set of data representing at least one constraint imposed by the security ontology.

13. The method of claim 10, wherein constructing the security model includes excluding a relationship among at least two of the one or more nodes.

14. The method of claim 13, wherein excluding a relationship among at least two of the one or more nodes includes severing at least one semantic relationship among the at least two of the one or more nodes.

15. The method of claim 14, wherein the relationship is imposed by the security ontology.

16. The method of claim 10, wherein producing the security model includes excluding from the security model a meaning of at least one entry in the extracted content portion.

17. The method of claim 10, wherein performing the informatic convolution of the security assertion model upon the extracted content portion includes adapting extracted content portion data elements to comply with the security ontology optimized for event-specific use of the security model.

18. The method of claim 1, wherein the ancillary data includes a local access policy associated with a corresponding entity of the plurality of entities.

19. The method of claim 1, wherein the ancillary data includes a set of privileges for a corresponding entity of the plurality of entities, the set of privileges including at least one of computational privileges, access privileges, associational rights, exchange privileges, or licenses.

20. The method of claim 1, wherein the ancillary data includes a set of aspects of an identity of a corresponding entity of the plurality of entities, the set of aspects including at least one of a cryptographic signature, a password, a unique identifier, or an identity validating token.

21. The method of claim 1, wherein the ancillary data includes a historical context of a corresponding entity of the plurality of entities, the historical context including at least one of previous mediated association outcomes, or a disposition of the corresponding entity.

22. The method of claim 1, wherein the links between nodes that represent semantic relationships are further based on a determination of a semantic interconnect between linked nodes independent of content thereof.

23. The method of claim 1, wherein the event-specific meaning is imputed upon the at least one of the properties of the covenant during the informatic convolution.

24. The method of claim 1, wherein a portion of the ancillary data associated with two or more entities of the plurality of entities is dispositive as to whether and how the two or more entities establish trust.

25. The method of claim 1, wherein producing the computer security event-specific model is based on compositional factors and content factors of a corresponding computing system event.

26. The method of claim 1, further comprising performing the computing system action responsive to validation of the covenant of association by traversing a chain of certificates, each of which represents a distinctly mediated covenant, from a certificate representing the event-specific model to a root certificate of at least one entity of the plurality of entities.

27. The method of claim 26, wherein the certificates in the chain of certificates are enveloped in blockchain wrappers and enchainment data among the enveloped certificates is controlled by a blockchain.

28. A method of securing a computing system, the method comprising:
    generating a trusted set of semantically interconnected topical capabilities sourced from ancillary data associated with one or more of a plurality of entities;
    configuring the set of semantically interconnected topical capabilities into a covenant of trust among the plurality of entities;
    constructing a security model enforceable by the computing system so that at least a subset thereof is associated with one or more nodes representing encoded aspects of resources associated with the computing system, wherein links between nodes in the security model represent semantic relationships based on a first ontology; and producing a computing event-specific model, which reflects impacts of at least one capability of the trusted set of semantically interconnected topical capabilities at one or more of the nodes, via informatic convolution of the security model with the trusted set of semantically interconnected topical capabilities, wherein the at least one capability of the trusted set of semantically interconnected topical capabilities takes on an event-specific meaning in the computing event-specific model based on the first ontology, and wherein the computing event-specific model is operable in securing the computing system by constraining a computing system action of a process-type entity of the plurality of entities.

29. The method of claim 28, further comprising performing the computing system action responsive to validation of the covenant of trust by traversing a chain of certificates, each of which represents a distinctly mediated covenant, from a certificate representing the computing event-specific model to a root certificate of at least one of the plurality of entities.

30. The method of claim 28, wherein the links between nodes in the security model that represent semantic relationships are further based on a determination of a semantic interconnect between the linked nodes independent of content thereof.

31. A multi-layer computer security system comprising:
a recombinant access mediation system generating a mediated covenant of association among at least one user-type entity, at least one process-type entity representing one or more computing system processes, and at least one data-type entity, the covenant comprising properties representing semantically interconnected topical capabilities sourced from ancillary data associated with one or more of the at least one user-type entity, the at least one process-type entity, and the at least one data-type entity, wherein the covenant expresses an instance of trust among each of the at least one user-type entity, the at least one process-type entity, and the at least one data-type entity at an association layer of the multi-layer computer security system;
a processor-accessible security model constructed so that at least a subset thereof is associated with one or more nodes representing encoded aspects of computing resources, wherein links between nodes in the security model represent semantic relationships based on an ontology associated with the multi-layer computer security system;
a topical capabilities mediation system producing an event-specific model via informatic convolution of the security model with the semantically interconnected topical capabilities of the covenant, wherein the informatic convolution causes at least one of the properties of the covenant to take on an event-specific meaning in the event-specific model based on the ontology and the event-specific model reflects impacts of at least one of the properties of the covenant at one or more of the nodes; and
an event-layer in the multi-layer computing security system providing processor access to the event-specific model to constrain through application of the event-specific model an action of the one or more computing system processes of the process-type entity that acts upon data structures of the data-type entity, the constraining based at least in part on the instance of trust expressed at the association layer.

32. The multi-layer computer security system of claim 31, wherein the ancillary data includes a local access policy associated with a corresponding entity.

33. The multi-layer computer security system of claim 31, wherein the ancillary data includes a set of privileges for a corresponding entity, the set of privileges including at least one of computational privileges, access privileges, associational rights, exchange privileges, or licenses.

34. The multi-layer computer security system of claim 31, wherein the ancillary data includes a set of aspects of an identity of a corresponding entity, the set of aspects including at least one of a cryptographic signature, a password, a unique identifier, or an identity validating token.

35. The multi-layer computer security system of claim 31, wherein the ancillary data includes a historical context of a corresponding entity, the historical context including at least one of previous mediated association outcomes, or a disposition of the corresponding entity.

36. The multi-layer computer security system of claim 31, wherein the links between nodes that represent semantic relationships are further based on a determination of a semantic interconnect between linked nodes independent of content thereof.

37. The multi-layer computer security system of claim 31, wherein the event-specific meaning is imputed upon the at least one of the properties of the covenant during the informatic convolution.

38. The multi-layer computer security—system of claim 31, wherein a portion of the ancillary data that is associated with two or more entities is dispositive as to whether and how the two or more entities establish trust.

39. The multi-layer computer security system of claim 31, wherein the event-specific model is based on compositional factors and content factors of a corresponding event.

40. The multi-layer computer security system of claim 31, wherein constraining the computing system action is responsive to a result of validation of the covenant of association by traversing a chain of certificates, each of which represents a distinctly mediated covenant, from a certificate representing the event-specific model to a root certificate of at least one of the entities of the covenant.

41. The multi-layer computer security system of claim 40, wherein the certificates in the chain of certificates are enveloped in blockchain wrappers and enchainment data among the enveloped certificates is controlled by a blockchain.

* * * * *